United States Patent
Stoessel et al.

(10) Patent No.: US 11,005,050 B2
(45) Date of Patent: May 11, 2021

(54) METAL COMPLEXES

(71) Applicant: Merck Patent GmbH, Darmstadt (DE)

(72) Inventors: Philipp Stoessel, Frankfurt am Main (DE); Nils Koenen, Darmstadt (DE)

(73) Assignee: Merck Patent GmbH, Darmstadt (DE)

( * ) Notice: Subject to any disclaimer, the term of this patent is extended or adjusted under 35 U.S.C. 154(b) by 341 days.

(21) Appl. No.: 15/110,770

(22) PCT Filed: Dec. 17, 2014

(86) PCT No.: PCT/EP2014/003398
§ 371 (c)(1),
(2) Date: Jul. 11, 2016

(87) PCT Pub. No.: WO2015/104045
PCT Pub. Date: Jul. 16, 2015

(65) Prior Publication Data
US 2016/0365520 A1    Dec. 15, 2016

(30) Foreign Application Priority Data

Jan. 13, 2014 (EP) .................. 14000105
Jan. 30, 2014 (EP) .................. 14000345

(51) Int. Cl.
*H01L 51/00* (2006.01)
*C09K 11/06* (2006.01)
(Continued)

(52) U.S. Cl.
CPC ...... *H01L 51/0085* (2013.01); *C07F 15/0033* (2013.01); *C07F 15/0086* (2013.01); *C09K 11/06* (2013.01); *H01L 51/009* (2013.01); *H01L 51/0087* (2013.01); *H05B 33/14* (2013.01); *C09K 2211/1007* (2013.01); *C09K 2211/1011* (2013.01); *C09K 2211/1029* (2013.01); *C09K 2211/1033* (2013.01); *C09K 2211/1044* (2013.01); *C09K 2211/1059* (2013.01); *C09K 2211/1088* (2013.01);
(Continued)

(58) Field of Classification Search
None
See application file for complete search history.

(56) References Cited

U.S. PATENT DOCUMENTS

2007/0196690 A1    8/2007   Ikemizu et al.
2011/0284799 A1   11/2011   Stoessel et al.
(Continued)

FOREIGN PATENT DOCUMENTS

CN    102282150 A    12/2011
CN    102939296 A     2/2013
(Continued)

OTHER PUBLICATIONS

Machine English translation of Stoessel et al. (CN 102282150 A). Sep. 25, 2019.*
(Continued)

*Primary Examiner* — Jay Yang
(74) *Attorney, Agent, or Firm* — Faegre Drinker Biddle & Reath LLP

(57) ABSTRACT

The present invention relates to metal complexes and to electronic devices, in particular organic electroluminescent devices, comprising these metal complexes.

18 Claims, 1 Drawing Sheet

(51) Int. Cl.
*C07F 15/00* (2006.01)
*H05B 33/14* (2006.01)
*H01L 51/50* (2006.01)

(52) U.S. Cl.
CPC ............. *C09K 2211/1092* (2013.01); *C09K 2211/1096* (2013.01); *C09K 2211/185* (2013.01); *H01L 51/504* (2013.01); *H01L 51/5016* (2013.01); *H01L 2251/5384* (2013.01); *Y02E 10/549* (2013.01)

(56) References Cited

U.S. PATENT DOCUMENTS

| | | |
|---|---|---|
| 2013/0082209 A1 | 4/2013 | Stoessel et al. |
| 2013/0200340 A1 | 8/2013 | Otsu et al. |
| 2015/0171348 A1 | 6/2015 | Stoessel et al. |
| 2015/0318498 A1 | 11/2015 | Stoessel et al. |
| 2015/0333280 A1 | 11/2015 | Stoessel et al. |
| 2015/0349277 A1 | 12/2015 | Stoessel et al. |

FOREIGN PATENT DOCUMENTS

| | | |
|---|---|---|
| JP | 2012516831 A | 7/2012 |
| JP | 2013531652 A | 2/2013 |
| JP | 2013177361 A | 9/2013 |
| JP | 2015530982 A | 10/2015 |
| JP | 2016507490 A | 3/2016 |
| JP | 2016507491 A | 3/2016 |
| JP | 2016508127 A | 3/2016 |
| TW | 201437216 A | 10/2014 |
| WO | 2007097149 A1 | 8/2007 |
| WO | WO-2011/157339 A1 | 12/2011 |
| WO | 2014094960 A1 | 6/2014 |
| WO | WO-2014/094961 A1 | 6/2014 |
| WO | WO-2014/094962 A2 | 6/2014 |

OTHER PUBLICATIONS

First Office Action for Chinese Patent Application Serial No. 201480073054.9, dated Apr. 16, 2018.
"Transition Metal Cyclometalated 2-arylbenzimidazole Complexes as Blue Phosphorescent Materials for Organic Light-Emitting Devices", Chem. Abstracts Service, XP002736352.
Office Action dated Dec. 11, 2018 in Chinese Patent Application Serial No. 201480073054.9.
Office Action dated Sep. 7, 2018 in Japanese Patent Application Serial No. 2016-563244.
Office Action dated Oct. 2, 2018 in Taiwanese Patent Application Serial No. 104100734.

* cited by examiner

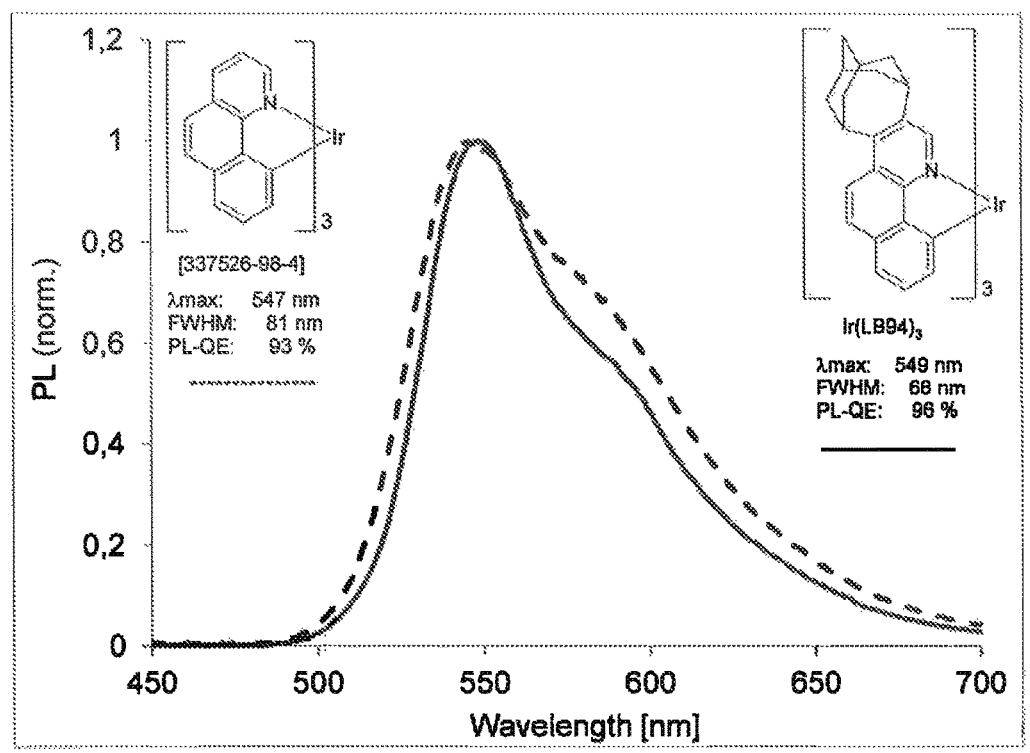

METAL COMPLEXES

RELATED APPLICATIONS

This application is a national stage entry, filed pursuant to 35 U.S.C. § 371, of PCT/EP2014/003398, filed Dec. 17, 2014, which claims the benefit of European Patent Application No. 14000105.8, filed Jan. 13, 2014, and European Patent Application No. 14000345.0, filed Jan. 30, 2014, both of which are incorporated herein by reference in their entireties.

The present invention relates to metal complexes which are suitable for use as emitters in organic electroluminescent devices.

The structure of organic electroluminescent devices (OLEDs) in which organic semiconductors are employed as functional materials is described, for example, in U.S. Pat. Nos. 4,539,507, 5,151,629, EP 0676461 and WO 98/27136. The emitting materials employed here are increasingly organometallic complexes which exhibit phosphorescence instead of fluorescence. For quantum-mechanical reasons, an up to four-fold increase in energy and power efficiency is possible using organometallic compounds as phosphorescence emitters. In general, there is still a need for improvement, in particular with respect to efficiency, operating voltage and lifetime, in the case of OLEDs which exhibit triplet emission.

According to the prior art, the triplet emitters employed in phosphorescent OLEDs are, in particular, iridium and platinum complexes. The iridium complexes employed are, in particular, bis- and tris-ortho-metallated complexes with aromatic ligands, where the ligands are bonded to the metal via a negatively charged carbon atom and a neutral nitrogen atom or via a negatively charged carbon atom and a neutral carbene carbon atom. Examples of such complexes are tris(phenylpyridyl)iridium(III) and derivatives thereof (for example in accordance with US 2002/0034656 or WO 2010/027583). The literature discloses a multiplicity of related ligands and iridium or platinum complexes, such as, for example, complexes with 1- or 3-phenylisoquinoline ligands (for example in accordance with EP 1348711 or WO 2011/028473), with 2-phenylquinolines (for example in accordance with WO 2002/064700 or WO 2006/095943), with phenylquinoxalines (for example in accordance with US 2005/0191527), with phenylimidazoles (for example in accordance with JP 2003/109758), with phenylbenzimidazoles (for example in accordance with US 2005/0008895) or with phenylcarbenes (for example in accordance with WO 2005/019373). Platinum complexes are known, for example, from WO 2003/040257. Although good results have already been achieved with metal complexes of this type, further improvements are still desirable here, in particular with respect to the efficiency and the lifetime of the complexes.

A further problem which some of the metal complexes in accordance with the prior art have is low solubility in organic solvents. Thus, for example, tris(benzo[h]quinoline)iridium(III) is virtually insoluble in a multiplicity of common organic solvents, for example in aromatic hydrocarbons or chlorobenzene. Besides the consequently considerably more difficult purification in the preparation of the complexes, the low solubility also makes the use of these complexes more difficult or prevents it entirely in the solution-processed production of OLEDs. Access to derivatives having higher solubility would therefore be desirable here, where the derivatisation should not impair their electronic properties. For processing from solution, improved oxidation stability would furthermore be advantageous.

There is furthermore a need for improvement in the case of the sublimation properties of some metal complexes in accordance with the prior art. Thus, these have a high sublimation temperature, which in turn means high thermal stress for these materials both during sublimation for purification after the synthesis and also during the production of OLEDs in vacuum-processed processes. Access to derivatives having a lower sublimation temperature would be desirable here, where the derivatisation should not impair their electronic properties.

The object of the present invention is therefore the provision of novel metal complexes which are suitable as emitters for use in OLEDs. In particular, the object is to provide emitters which exhibit improved properties with respect to efficiency, operating voltage, lifetime, colour coordinates, colour purity, i.e. width of the emission band, solubility and/or oxidation stability.

Surprisingly, it has been found that certain metal chelate complexes described in greater detail below achieve this object and are very highly suitable for use in an organic electroluminescent device. The present invention therefore relates to these metal complexes and to organic electroluminescent devices which comprise these complexes.

The invention thus relates to a compound of the formula (1), $$M(L)_n(L')_m \quad \text{formula (1)}$$

which contains a moiety $M(L)_n$ of the formula (2):

formula (2)

where the following applies to the symbols and indices used:

M is iridium or platinum;

CyC is an aryl or heteroaryl group having 5 to 18 aromatic ring atoms or a fluorene or azafluorene group, each of which is coordinated to M via a carbon atom and each of which may be substituted by one or more radicals R and each of which is connected to CyD via a covalent bond;

CyD is a heteroaryl group having 5 to 18 aromatic ring atoms, which is coordinated to M via a neutral nitrogen atom or via a carbene carbon atom and which may be substituted by one or more radicals R and which is connected to CyC via a covalent bond;

R is on each occurrence, identically or differently, H, D, F, Cl, Br, I, $N(R^1)_2$, CN, $NO_2$, OH, $COOR^1$, $C(=O)N(R^1)_2$, $Si(R^1)_3$, $B(OR^1)_2$, $C(=O)R^1$, $P(=O)(R^1)_2$, $S(=O)R^1$, $S(=O)_2R^1$, $OSO_2R^1$, a straight-chain alkyl, alkoxy or thioalkoxy group having 1 to 20 C atoms or an alkenyl or alkynyl group having 2 to 20 C atoms or a branched or cyclic alkyl, alkoxy or thioalkoxy group having 3 to 20 C atoms, each of which may be substituted by one or more radicals $R^1$, where one or more non-adjacent $CH_2$ groups may be replaced by $R^1C=CR^1$, $C≡C$, $Si(R^1)_2$, $C=O$, $NR^1$, O, S or $CONR^1$ and where one or more H atoms may be replaced by D, F, Cl, Br, I or CN, or an aromatic or heteroaromatic ring system having 5 to 40 aromatic ring atoms, which may in each case be substituted by one or more radicals $R^1$, or an aryloxy or heteroaryloxy group having 5 to 40 aromatic ring atoms, which may be substituted by one or more radicals $R^1$, or an aralkyl or heteroaralkyl group having 5 to 40 aromatic ring atoms, which may be substituted by one or more radicals $R^1$, or a diarylamino group, diheteroarylamino group or arylheteroarylamino group having 10 to 40 aromatic ring atoms, which may be substituted by one or more radicals $R^1$; two adjacent radicals R here may also form a mono- or polycyclic, aliphatic, aromatic or heteroaromatic ring system with one another; furthermore, two radicals R, one of which is bonded to CyD and the other of which is bonded to CyC, may form a mono- or polycyclic, aliphatic, aromatic or heteroaromatic ring system with one another; or CyC and CyD contain two adjacent carbon atoms, which are substituted by radicals R in such a way that the two carbon atoms, together with the substituents R, form a structure of the following formula (3):

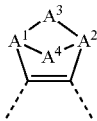

formula (3)

where the dashed bonds indicate the linking of the two carbon atoms in the ligand; the two carbon atoms explicitly drawn in are thus part of CyC and CyD;

$A^1$, $A^2$ are, identically or differently on each occurrence, $CR^2$ or N;

$A^3$, $A^4$ are, identically or differently on each occurrence, an alkylene group having 2 or 3 C atoms, in which one carbon atom may be replaced by oxygen and which may be substituted by one or more radicals $R^3$;

with the proviso that no two heteroatoms in $A^1$-$A^3$-$A^2$ and $A^1$-$A^4$-$A^2$ are bonded directly to one another;

$R^1$, $R^2$, $R^3$ are on each occurrence, identically or differently, H, D, F, Cl, Br, I, $N(R^4)_2$, CN, $NO_2$, $Si(R^4)_3$, $B(OR^4)_2$, $C(=O)R^4$, $P(=O)(R^4)_2$, $S(=O)R^4$, $S(=O)_2R^4$, $OSO_2R^4$, a straight-chain alkyl, alkoxy or thioalkoxy group having 1 to 20 C atoms or an alkenyl or alkynyl group having 2 to 20 C atoms or a branched or cyclic alkyl, alkoxy or thioalkoxy group having 3 to 20 C atoms, each of which may be substituted by one or more radicals $R^4$, where one or more non-adjacent $CH_2$ groups may be replaced by $R^4C=CR^4$, $C\equiv C$, $Si(R^4)_2$, $C=O$, $NR^4$, O, S or $CONR^4$ and where one or more H atoms may be replaced by D, F, Cl, Br, I, CN or $NO_2$, or an aromatic or heteroaromatic ring system having 5 to 40 aromatic ring atoms, which may in each case be substituted by one or more radicals $R^4$, or an aryloxy or heteroaryloxy group having 5 to 40 aromatic ring atoms, which may be substituted by one or more radicals $R^4$, or an aralkyl or heteroaralkyl group having 5 to 40 aromatic ring atoms, which may be substituted by one or more radicals $R^4$, or a diarylamino group, diheteroarylamino group or arylheteroarylamino group having 10 to 40 aromatic ring atoms, which may be substituted by one or more radicals $R^4$; two or more adjacent radicals $R^1$ here may form a mono- or polycyclic, aliphatic, aromatic or heteroaromatic ring system with one another, and/or two radicals $R^3$ may form a mono- or polycyclic, aliphatic ring system with one another, where ring formation between two radicals $R^3$ which are bonded to $A^3$ and $A^4$ is also possible;

$R^4$ is on each occurrence, identically or differently, H, D, F or an aliphatic, aromatic and/or heteroaromatic hydrocarbon radical having 1 to 20 C atoms, in which, in addition, one or more H atoms may be replaced by F; two or more substituents $R^4$ here may also form a mono- or polycyclic ring system with one another;

L' is, identically or differently on each occurrence, a ligand;

n is 1, 2 or 3;

m is 0, 1, 2, 3 or 4;

a plurality of ligands L here may also be linked to one another or L may be linked to L' via a single bond or a divalent or trivalent bridge and thus form a tridentate, tetradentate, pentadentate or hexadentate ligand system;

a substituent R here may also additionally be coordinated to M;

characterised in that the moiety of the formula (2) contains at least one structural unit of the above-mentioned formula (3).

The presence of a moiety of the formula (3), i.e. a condensed-on aliphatic bicyclic group, is essential to the invention. In the structure of the formula (3) depicted above and the further embodiments of this structure mentioned as preferred, a double bond is formally depicted between the two carbon atoms which are part of CyC and CyD. This represents a simplification of the chemical structure, since these two carbon atoms are bonded into an aromatic or heteroaromatic system of the ligand and the bond between these two carbon atoms is thus formally between the bond order of a single bond and that of a double bond. The drawing-in of the formal double bond should thus not be interpreted as limiting for the structure, but instead it is apparent to the person skilled in the art that this means an aromatic bond.

"Adjacent carbon atoms" here means that the carbon atoms are bonded directly to one another. Furthermore, "adjacent radicals" in the definition of the radicals means that these radicals are either bonded to the same carbon atom or to adjacent carbon atoms. In the above-mentioned moieties of the formula (2), CyC and CyD may furthermore also be linked to one another by ring formation of the substituents R. This may also result in CyC and CyD no longer representing independent aromatic systems, but instead forming an entire larger aromatic system through the ring formation. This is the case, for example, if CyC and CyD are bridged to one another by a group —$CR^1=CR^1$— or by an orthophenylene group, which is optionally substituted by $R^1$. This is explained diagrammatically below with reference to a phenylpyridine ligand:

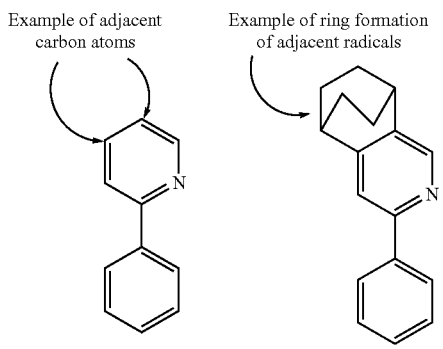

Example of adjacent carbon atoms

Example of ring formation of adjacent radicals

Example of ring formation
between CyC and CyD

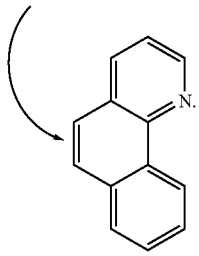

An aryl group in the sense of this invention contains 6 to 40 C atoms; a heteroaryl group in the sense of this invention contains 2 to 40 C atoms and at least one heteroatom, with the proviso that the sum of C atoms and heteroatoms is at least 5. The heteroatoms are preferably selected from N, O and/or S. An aryl group or heteroaryl group here is taken to mean either a simple aromatic ring, i.e. benzene, or a simple heteroaromatic ring, for example pyridine, pyrimidine, thiophene, etc., or a condensed aryl or heteroaryl group, for example naphthalene, anthracene, phenanthrene, quinoline, isoquinoline, etc.

An aromatic ring system in the sense of this invention contains 6 to 60 C atoms in the ring system. A heteroaromatic ring system in the sense of this invention contains 1 to 60 C atoms and at least one heteroatom in the ring system, with the proviso that the sum of C atoms and heteroatoms is at least 5. The heteroatoms are preferably selected from N, O and/or S. An aromatic or heteroaromatic ring system in the sense of this invention is intended to be taken to mean a system which does not necessarily contain only aryl or heteroaryl groups, but instead in which, in addition, a plurality of aryl or heteroaryl groups may be interrupted by a non-aromatic unit (preferably less than 10% of the atoms other than H), such as, for example, a C, N or O atom or a carbonyl group. Thus, for example, systems such as 9,9'-spirobifluorene, 9,9-diarylfluorene, triarylamine, diaryl ether, stilbene, etc., are also intended to be taken to be aromatic ring systems in the sense of this invention, as are systems in which two or more aryl groups are interrupted, for example, by a linear or cyclic alkyl group or by a silyl group. Furthermore, systems in which two or more aryl or heteroaryl groups are bonded directly to one another, such as, for example, biphenyl or terphenyl, are likewise intended to be taken to be an aromatic or heteroaromatic ring system.

A cyclic alkyl, alkoxy or thioalkoxy group in the sense of this invention is taken to mean a monocyclic, bicyclic or polycyclic group.

For the purposes of the present invention, a $C_1$- to $C_{40}$-alkyl group, in which, in addition, individual H atoms or $CH_2$ groups may be substituted by the above-mentioned groups, is taken to mean, for example, the radicals methyl, ethyl, n-propyl, i-propyl, cyclopropyl, n-butyl, i-butyl, s-butyl, t-butyl, cyclobutyl, 2-methylbutyl, n-pentyl, s-pentyl, tert-pentyl, 2-pentyl, neopentyl, cyclopentyl, n-hexyl, s-hexyl, tert-hexyl, 2-hexyl, 3-hexyl, neohexyl, cyclohexyl, 1-methylcyclopentyl, 2-methylpentyl, n-heptyl, 2-heptyl, 3-heptyl, 4-heptyl, cycloheptyl, 1-methylcyclohexyl, n-octyl, 2-ethylhexyl, cyclooctyl, 1-bicyclo[2.2.2]octyl, 2-bicyclo[2.2.2]octyl, 2-(2,6-dimethyl)octyl, 3-(3,7-dimethyl)octyl, adamantyl, trifluoromethyl, pentafluoroethyl, 2,2,2-trifluoroethyl, 1,1-dimethyl-n-hex-1-yl, 1,1-dimethyl-n-hept-1-yl, 1,1-dimethyl-n-oct-1-yl, 1,1-dimethyl-n-dec-1-yl, 1,1-dimethyl-n-dodec-1-yl, 1,1-dimethyl-n-tetradec-1-yl, 1,1-dimethyl-n-hexadec-1-yl, 1,1-dimethyl-n-octadec-1-yl, 1,1-diethyl-n-hex-1-yl, 1,1-diethyl-n-hept-1-yl, 1,1-diethyl-n-oct-1-yl, 1,1-diethyl-n-dec-1-yl, 1,1-diethyl-n-dodec-1-yl, 1,1-diethyl-n-tetradec-1-yl, 1,1-diethyl-n-hexadec-1-yl, 1,1-diethyl-n-octadec-1-yl, 1-(n-propyl)cyclohex-1-yl, 1-(n-butyl)cyclohex-1-yl, 1-(n-hexyl)cyclohex-1-yl, 1-(n-octyl)-cyclohex-1-yl and 1-(n-decyl)cyclohex-1-yl. An alkenyl group is taken to mean, for example, ethenyl, propenyl, butenyl, pentenyl, cyclopentenyl, hexenyl, cyclohexenyl, heptenyl, cycloheptenyl, octenyl, cyclooctenyl or cyclooctadienyl. An alkynyl group is taken to mean, for example, ethynyl, propynyl, butynyl, pentynyl, hexynyl, heptynyl or octynyl. A $C_1$- to $C_{40}$-alkoxy group is taken to mean, for example, methoxy, trifluoromethoxy, ethoxy, n-propoxy, i-propoxy, n-butoxy, i-butoxy, s-butoxy, t-butoxy or 2-methylbutoxy.

An aromatic or heteroaromatic ring system having 5-60 aromatic ring atoms, which may also in each case be substituted by the radicals mentioned above and which may be linked to the aromatic or heteroaromatic ring system via any desired positions, is taken to mean, for example, groups derived from benzene, naphthalene, anthracene, benzanthracene, phenanthrene, benzophenanthrene, pyrene, chrysene, perylene, fluoranthene, benzofluoranthene, naphthacene, pentacene, benzopyrene, biphenyl, biphenylene, terphenyl, terphenylene, fluorene, spirobifluorene, dihydrophenanthrene, dihydropyrene, tetrahydropyrene, cis- or transindenofluorene, cis- or trans-monobenzoindenofluorene, cis- or trans-dibenzoindenofluorene, truxene, isotruxene, spirotruxene, spiroisotruxene, furan, benzofuran, isobenzofuran, dibenzofuran, thiophene, benzothiophene, isobenzothiophene, dibenzothiophene, pyrrole, indole, isoindole, carbazole, indolocarbazole, indenocarbazole, pyridine, quinoline, isoquinoline, acridine, phenanthridine, benzo-5,6-quinoline, benzo-6,7-quinoline, benzo-7,8-quinoline, phenothiazine, phenoxazine, pyrazole, indazole, imidazole, benzimidazole, naphthimidazole, phenanthrimidazole, pyridimidazole, pyrazinimidazole, quinoxalinimidazole, oxazole, benzoxazole, naphthoxazole, anthroxazole, phenanthroxazole, isoxazole, 1,2-thiazole, 1,3-thiazole, benzothiazole, pyridazine, benzopyridazine, pyrimidine, benzopyrimidine, quinoxaline, 1,5-diazaanthracene, 2,7-diazapyrene, 2,3-diazapyrene, 1,6-diazapyrene, 1,8-diazapyrene, 4,5-diazapyrene, 4,5,9,10-tetraazaperylene, pyrazine, phenazine, phenoxazine, phenothiazine, fluorubin, naphthyridine, azacarbazole, benzocarboline, phenanthroline, 1,2,3-triazole, 1,2,4-triazole, benzotriazole, 1,2,3-oxadiazole, 1,2,4-oxadiazole, 1,2,5-oxadiazole, 1,3,4-oxadiazole, 1,2,3-thiadiazole, 1,2,4-thiadiazole, 1,2,5-thiadiazole, 1,3,4-thiadiazole, 1,3,5-triazine, 1,2,4-triazine, 1,2,3-triazine, tetrazole, 1,2,4,5-tetrazine, 1,2,3,4-tetrazine, 1,2,3,5-tetrazine, purine, pteridine, indolizine and benzothiadiazole.

Preference is given to compounds of the formula (1), characterised in that they are uncharged, i.e. are electrically neutral. This is achieved in a simple manner by selecting the charge of the ligands L and L' in such a way that they compensate for the charge of the complexed metal atom M.

In the complexes of the formula (1), the indices n and m are selected so that the coordination number at the metal M corresponds in total, depending on the metal, to the usual coordination number for this metal. For iridium(III) this is the coordination number 6 and for platinum(II) this is the coordination number 4.

In a preferred embodiment of the invention, M is iridium (III), and the index n stands for 1, 2 or 3, preferably for 2 or 3. If the index n=1, four monodentate or two bidentate or one bidentate and two monodentate or one tridentate and one monodentate or one tetradentate ligand L', preferably two bidentate ligands L', are also coordinated to the metal. If the index n=2, one bidentate or two monodentate ligands L', preferably one bidentate ligand L', are also coordinated to the metal. If the index n=3, the index m=0.

In a further preferred embodiment of the invention, M is platinum(II), and the index n stands for 1 or 2. If the index n=1, one bidentate or two monodentate ligands L', preferably one bidentate ligand L', are also coordinated to the metal M. If the index n=2, the index m=0.

In a preferred embodiment of the present invention, CyC is an aryl or heteroaryl group having 6 to 14 aromatic ring atoms, particularly preferably having 6 to 10 aromatic ring atoms, very particularly preferably having 6 aromatic ring atoms, or a fluorene or azafluorene group, which is in each case coordinated to M via a carbon atom and which may be substituted by one or more radicals R and which is bonded to CyD via a covalent bond.

Preferred embodiments of the group CyC are the structures of the following formulae (CyC-1) to (CyC-19), where the group CyC is in each case bonded to CyD at the position denoted by # and is coordinated to M at the position denoted by *,

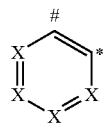 (CyC-1)

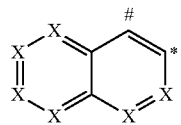 (CyC-2)

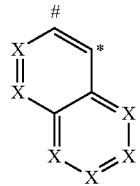 (CyC-3)

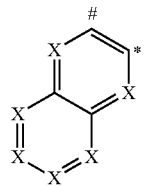 (CyC-4)

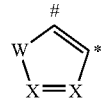 (CyC-5)

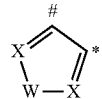 (CyC-6)

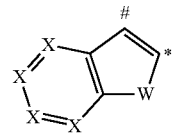 (CyC-7)

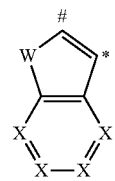 (CyC-8)

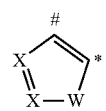 (CyC-9)

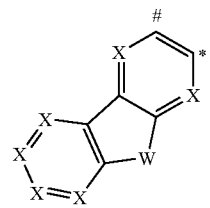 (CyC-10)

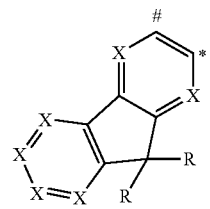 (CyC-11)

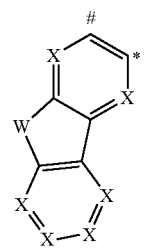 (CyC-12)

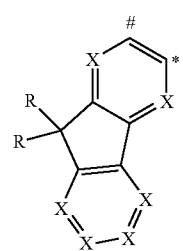 (CyC-13)

-continued

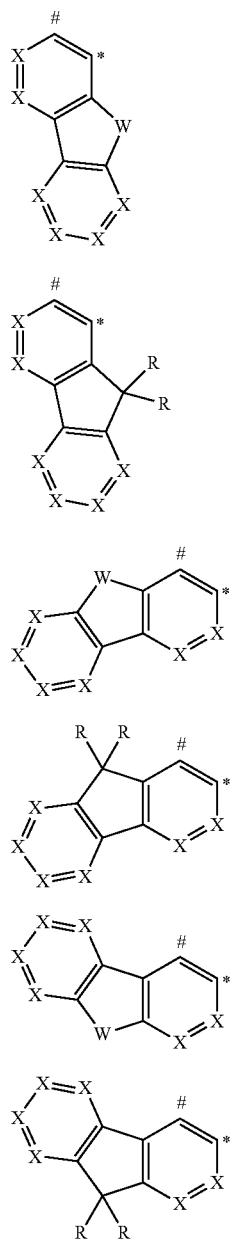

(CyC-14)

(CyC-15)

(CyC-16)

(CyC-17)

(CyC-18)

(CyC-19)

where R has the meanings given above and the following applies to the other symbols used:
X is on each occurrence, identically or differently, CR or N;
W is on each occurrence, identically or differently, NR, O, S or $CR_2$.

If the group of the formula (3) is bonded to CyC, two adjacent groups X in CyC stand for CR and these two carbon atoms, together with the radicals R which are bonded to these carbon atoms, form a group of the formula (3) mentioned above or described in greater detail below.

Preferably a maximum of three symbols X in (CyC-1) to (CyC-19) stand for N, particularly preferably a maximum of two symbols X in (CyC-1) to (CyC-19) stand for N, very particularly preferably a maximum of one symbol X in (CyC-1) to (CyC-19) stands for N. Especially preferably all symbols X stand for CR.

Particularly preferred groups CyC are therefore the groups of the following formulae (CyC-1a) to (CyC-19a),

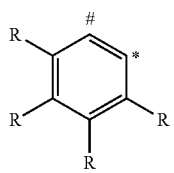
(CyC-1a)

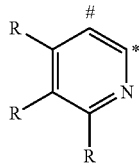
(CyC-1b)

(CyC-1c)

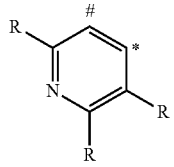
(CyC-1d)

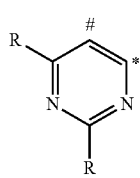
(CyC-2a)

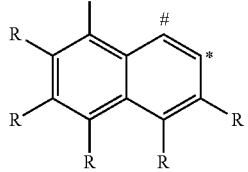
(CyC-2b)

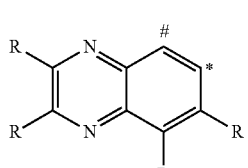
(CyC-3a)

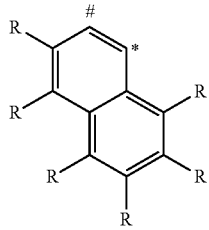
(CyC-3b)

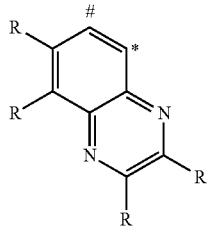

(CyC-4a)
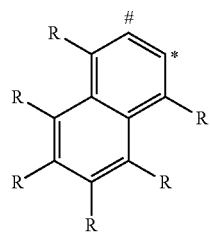
(CyC-4b)
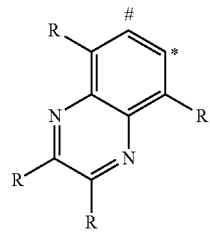
(CyC-5a)
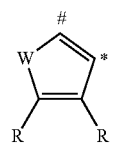
(CyC-6a)
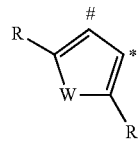
(CyC-7a)
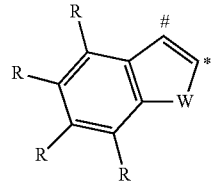
(CyC-8a)
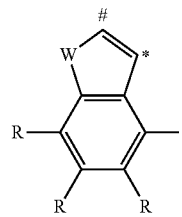
(CyC-9a)
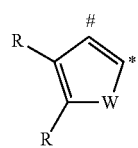
(CyC-10a)
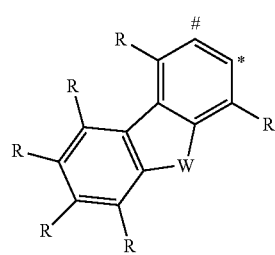
(CyC-11a)
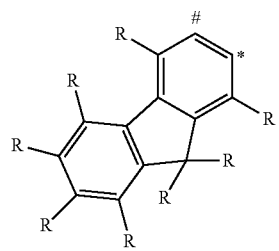
(CyC-12a)
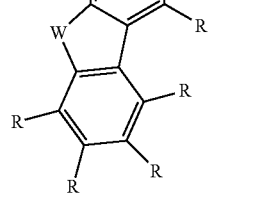
(CyC-13a)
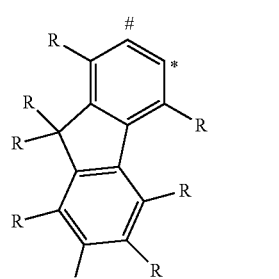
(CyC-14a)
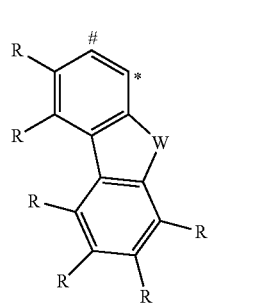
(CyC-15a)
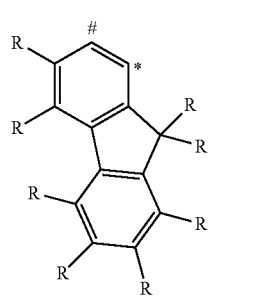
(CyC-16a)
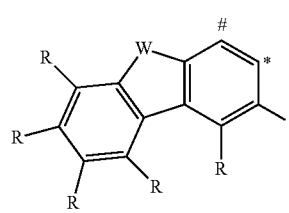

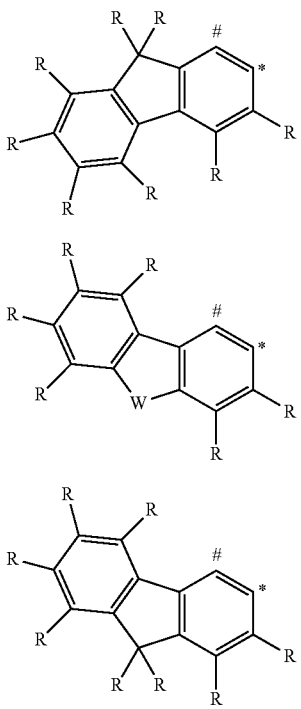

(CyC-17a)

(CyC-18a)

(CyC-19a)

where the symbols used have the meanings given above. If the group of the formula (3) is bonded to (CyC-1) to (CyC-19), two adjacent radicals R, together with the carbon atoms to which they are bonded, form a group of the formula (3) mentioned above or described in greater detail below.

Preferred groups amongst the groups (CyC-1) to (CyC-19) are the groups (CyC-1), (CyC-3), (CyC-8), (CyC-10), (CyC-12), (CyC-13) and (CyC-16), and particular preference is given to the groups (CyC-1a), (CyC-3a), (CyC-8a), (CyC-10a), (CyC-12a), (CyC-13a) and (CyC-16a).

In a further preferred embodiment of the invention, CyD is a heteroaryl group having 5 to 13 aromatic ring atoms, particularly preferably having 5 to 10 aromatic ring atoms, which is coordinated to M via a neutral nitrogen atom or via a carbene carbon atom, which may be substituted by one or more radicals R and which is bonded to CyC via a covalent bond. The group CyD is preferably coordinated to M via a nitrogen atom.

Preferred embodiments of the group CyD are the structures of the following formulae (CyD-1) to (CyD-10), where the group CyD is in each case bonded to CyC at the position denoted by # and is coordinated to M at the position denoted by *,

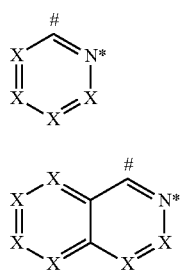

(CyD-1)

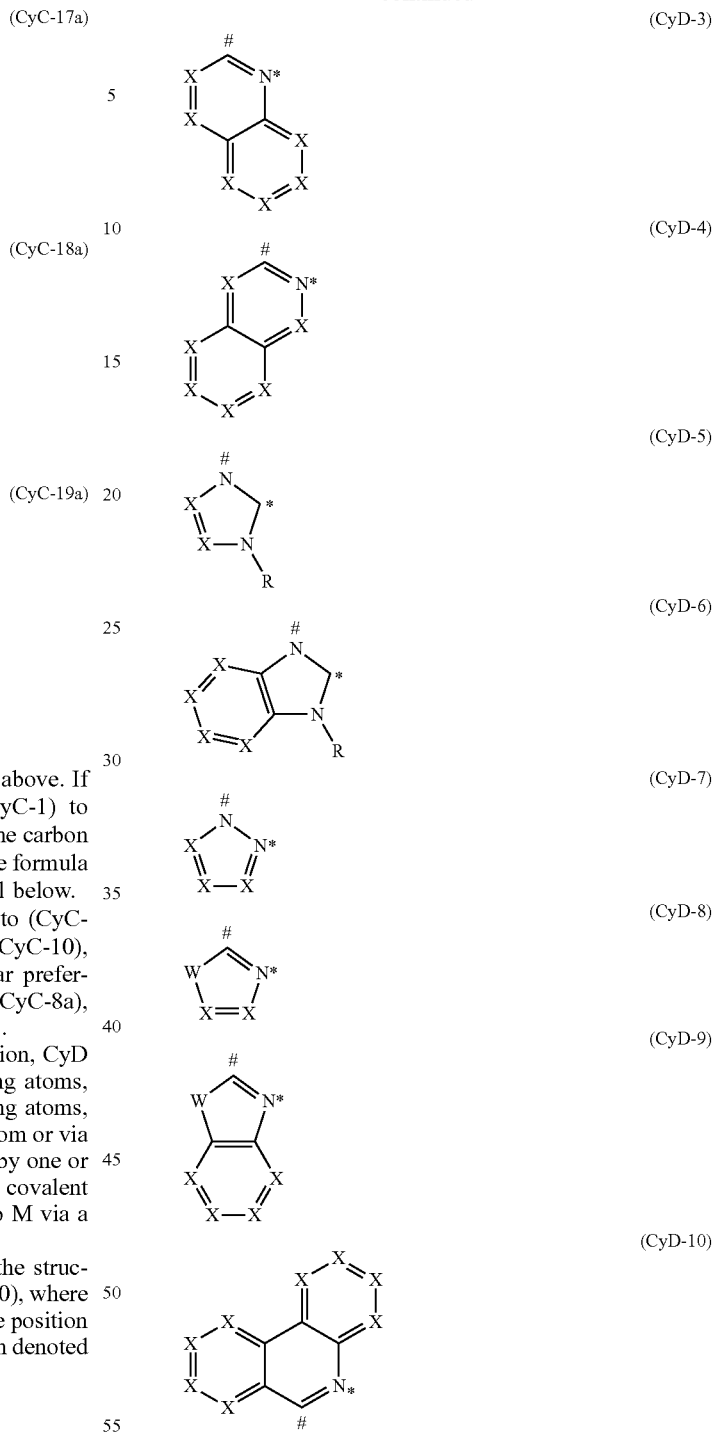

where X, W and R have the meanings given above.

If the group of the formula (3) is bonded to CyD, two adjacent groups X in CyD stand for CR and the two carbon atoms, together with the radicals R which are bonded to these carbon atoms, form a group of the formula (3) mentioned above or described in greater detail below.

Preferably a maximum of three symbols X in (CyD-1) to (CyD-10) stand for N, particularly preferably a maximum of two symbols X in (CyD-1) to (CyD-10) stand for N, very particularly preferably a maximum of one symbol X in (CyD-1) to (CyD-10) stands for N. Especially preferably all symbols X stand for CR.

Particularly preferred groups CyD are therefore the groups of the following formulae (CyD-1a) to (CyD-10a),

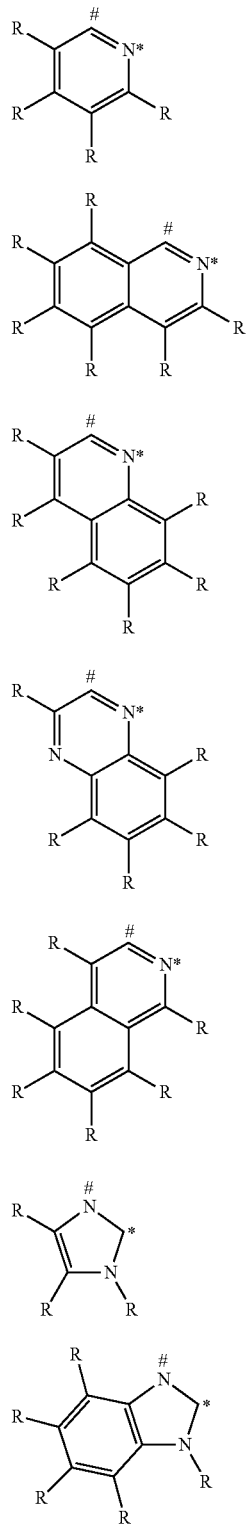

(CyD-1a)

(CyD-2a)

(CyD-3a)

(CyD-3b)

(CyD-4a)

(CyD-5a)

(CyD-6a)

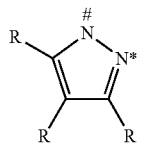

(CyD-7a)

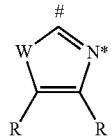

(CyD-8a)

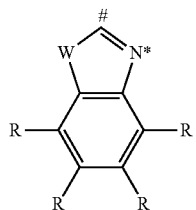

(CyD-9a)

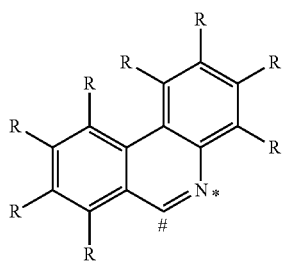

(CyD-10a)

where the symbols used have the meanings given above. If the group of the formula (3) is bonded to (CyD-1) to (CyD-10), two adjacent radicals R, together with the carbon atoms to which they are bonded, form a group of the formula (3) mentioned above or described in greater detail below.

Preferred groups amongst the groups (CyD-1) to (CyD-10) are the groups (CyD-1), (CyD-3), (CyD-4), (CyD-5) and (CyD-6), and particular preference is given to the groups (CyD-1a), (CyD-3a), (CyD-4a), (CyD-5a) and (CyD-6a).

The preferred groups CyC and CyD mentioned above can be combined with one another as desired. Preference is given to compounds in which CyC represents an aryl or heteroaryl group having 6 to 14 aromatic ring atoms and CyD represents a heteroaryl group having 5 to 13 aromatic ring atoms, each of which may be substituted by one or more radicals R. Particular preference is given to compounds in which CyC represents an aryl or heteroaryl group having 6 to 10 aromatic ring atoms and CyD represents a heteroaryl group having 5 to 10 aromatic ring atoms, each of which may be substituted by one or more radicals R. In particular, the following combinations of CyC and CyD are suitable in the ligand L:

| No. | CyC | CyD |
|-----|-------|-------|
| 1 | CyC-1 | CyD-1 |
| 2 | CyC-1 | CyD-2 |
| 3 | CyC-1 | CyD-3 |
| 4 | CyC-1 | CyD-4 |
| 5 | CyC-1 | CyD-5 |
| 6 | CyC-1 | CyD-6 |
| 7 | CyC-1 | CyD-7 |

-continued

| No. | CyC | CyD |
|---|---|---|
| 8 | CyC-1 | CyD-8 |
| 9 | CyC-1 | CyD-9 |
| 10 | CyC-1 | CyD-10 |
| 11 | CyC-2 | CyD-1 |
| 12 | CyC-2 | CyD-2 |
| 13 | CyC-2 | CyD-3 |
| 14 | CyC-2 | CyD-4 |
| 15 | CyC-2 | CyD-5 |
| 16 | CyC-2 | CyD-6 |
| 17 | CyC-2 | CyD-7 |
| 18 | CyC-2 | CyD-8 |
| 19 | CyC-2 | CyD-9 |
| 20 | CyC-2 | CyD-10 |
| 21 | CyC-3 | CyD-1 |
| 22 | CyC-3 | CyD-2 |
| 23 | CyC-3 | CyD-3 |
| 24 | CyC-3 | CyD-4 |
| 25 | CyC-3 | CyD-5 |
| 26 | CyC-3 | CyD-6 |
| 27 | CyC-3 | CyD-7 |
| 28 | CyC-3 | CyD-8 |
| 29 | CyC-3 | CyD-9 |
| 30 | CyC-3 | CyD-10 |
| 31 | CyC-4 | CyD-1 |
| 32 | CyC-4 | CyD-2 |
| 33 | CyC-4 | CyD-3 |
| 34 | CyC-4 | CyD-4 |
| 35 | CyC-4 | CyD-5 |
| 36 | CyC-4 | CyD-6 |
| 37 | CyC-4 | CyD-7 |
| 38 | CyC-4 | CyD-8 |
| 39 | CyC-4 | CyD-9 |
| 40 | CyC-4 | CyD-10 |
| 41 | CyC-5 | CyD-1 |
| 42 | CyC-5 | CyD-2 |
| 43 | CyC-5 | CyD-3 |
| 44 | CyC-5 | CyD-4 |
| 45 | CyC-5 | CyD-5 |
| 46 | CyC-5 | CyD-6 |
| 47 | CyC-5 | CyD-7 |
| 48 | CyC-5 | CyD-8 |
| 49 | CyC-5 | CyD-9 |
| 50 | CyC-5 | CyD-10 |
| 51 | CyC-6 | CyD-1 |
| 52 | CyC-6 | CyD-2 |
| 53 | CyC-6 | CyD-3 |
| 54 | CyC-6 | CyD-4 |
| 55 | CyC-6 | CyD-5 |
| 56 | CyC-6 | CyD-6 |
| 57 | CyC-6 | CyD-7 |
| 58 | CyC-6 | CyD-8 |
| 59 | CyC-6 | CyD-9 |
| 60 | CyC-6 | CyD-10 |
| 61 | CyC-7 | CyD-1 |
| 62 | CyC-7 | CyD-2 |
| 63 | CyC-7 | CyD-3 |
| 64 | CyC-7 | CyD-4 |
| 65 | CyC-7 | CyD-5 |
| 66 | CyC-7 | CyD-6 |
| 67 | CyC-7 | CyD-7 |
| 68 | CyC-7 | CyD-8 |
| 69 | CyC-7 | CyD-9 |
| 70 | CyC-7 | CyD-10 |
| 71 | CyC-8 | CyD-1 |
| 72 | CyC-8 | CyD-2 |
| 73 | CyC-8 | CyD-3 |
| 74 | CyC-8 | CyD-4 |
| 75 | CyC-8 | CyD-5 |
| 76 | CyC-8 | CyD-6 |
| 77 | CyC-8 | CyD-7 |
| 78 | CyC-8 | CyD-8 |
| 79 | CyC-8 | CyD-9 |
| 80 | CyC-8 | CyD-10 |
| 81 | CyC-9 | CyD-1 |
| 82 | CyC-9 | CyD-2 |
| 83 | CyC-9 | CyD-3 |
| 84 | CyC-9 | CyD-4 |

-continued

| No. | CyC | CyD |
|---|---|---|
| 85 | CyC-9 | CyD-5 |
| 86 | CyC-9 | CyD-6 |
| 87 | CyC-9 | CyD-7 |
| 88 | CyC-9 | CyD-8 |
| 89 | CyC-9 | CyD-9 |
| 90 | CyC-9 | CyD-10 |
| 91 | CyC-10 | CyD-1 |
| 92 | CyC-10 | CyD-2 |
| 93 | CyC-10 | CyD-3 |
| 94 | CyC-10 | CyD-4 |
| 95 | CyC-10 | CyD-5 |
| 96 | CyC-10 | CyD-6 |
| 97 | CyC-10 | CyD-7 |
| 98 | CyC-10 | CyD-8 |
| 99 | CyC-10 | CyD-9 |
| 100 | CyC-10 | CyD-10 |
| 101 | CyC-11 | CyD-1 |
| 102 | CyC-11 | CyD-2 |
| 103 | CyC-11 | CyD-3 |
| 104 | CyC-11 | CyD-4 |
| 105 | CyC-11 | CyD-5 |
| 106 | CyC-11 | CyD-6 |
| 107 | CyC-11 | CyD-7 |
| 108 | CyC-11 | CyD-8 |
| 109 | CyC-11 | CyD-9 |
| 110 | CyC-11 | CyD-10 |
| 111 | CyC-12 | CyD-1 |
| 112 | CyC-12 | CyD-2 |
| 113 | CyC-12 | CyD-3 |
| 114 | CyC-12 | CyD-4 |
| 115 | CyC-12 | CyD-5 |
| 116 | CyC-12 | CyD-6 |
| 117 | CyC-12 | CyD-7 |
| 118 | CyC-12 | CyD-8 |
| 119 | CyC-12 | CyD-9 |
| 120 | CyC-12 | CyD-10 |
| 121 | CyC-13 | CyD-1 |
| 122 | CyC-13 | CyD-2 |
| 123 | CyC-13 | CyD-3 |
| 124 | CyC-13 | CyD-4 |
| 125 | CyC-13 | CyD-5 |
| 126 | CyC-13 | CyD-6 |
| 127 | CyC-13 | CyD-7 |
| 128 | CyC-13 | CyD-8 |
| 129 | CyC-13 | CyD-9 |
| 130 | CyC-13 | CyD-10 |
| 131 | CyC-14 | CyD-1 |
| 132 | CyC-14 | CyD-2 |
| 133 | CyC-14 | CyD-3 |
| 134 | CyC-14 | CyD-4 |
| 135 | CyC-14 | CyD-5 |
| 136 | CyC-14 | CyD-6 |
| 137 | CyC-14 | CyD-7 |
| 138 | CyC-14 | CyD-8 |
| 139 | CyC-14 | CyD-9 |
| 140 | CyC-14 | CyD-10 |
| 141 | CyC-15 | CyD-1 |
| 142 | CyC-15 | CyD-2 |
| 143 | CyC-15 | CyD-3 |
| 144 | CyC-15 | CyD-4 |
| 145 | CyC-15 | CyD-5 |
| 146 | CyC-15 | CyD-6 |
| 147 | CyC-15 | CyD-7 |
| 148 | CyC-15 | CyD-8 |
| 149 | CyC-15 | CyD-9 |
| 150 | CyC-15 | CyD-10 |
| 151 | CyC-16 | CyD-1 |
| 152 | CyC-16 | CyD-2 |
| 153 | CyC-16 | CyD-3 |
| 154 | CyC-16 | CyD-4 |
| 155 | CyC-16 | CyD-5 |
| 156 | CyC-16 | CyD-6 |
| 157 | CyC-16 | CyD-7 |
| 158 | CyC-16 | CyD-8 |
| 159 | CyC-16 | CyD-9 |
| 160 | CyC-16 | CyD-10 |
| 161 | CyC-17 | CyD-1 |

| No. | CyC | CyD |
|---|---|---|
| 162 | CyC-17 | CyD-2 |
| 163 | CyC-17 | CyD-3 |
| 164 | CyC-17 | CyD-4 |
| 165 | CyC-17 | CyD-5 |
| 166 | CyC-17 | CyD-6 |
| 167 | CyC-17 | CyD-7 |
| 168 | CyC-17 | CyD-8 |
| 169 | CyC-17 | CyD-9 |
| 170 | CyC-17 | CyD-10 |
| 171 | CyC-18 | CyD-1 |
| 172 | CyC-18 | CyD-2 |
| 173 | CyC-18 | CyD-3 |
| 174 | CyC-18 | CyD-4 |
| 175 | CyC-18 | CyD-5 |
| 176 | CyC-18 | CyD-6 |
| 177 | CyC-18 | CyD-7 |
| 178 | CyC-18 | CyD-8 |
| 179 | CyC-18 | CyD-9 |
| 180 | CyC-18 | CyD-10 |
| 181 | CyC-19 | CyD-1 |
| 182 | CyC-19 | CyD-2 |
| 183 | CyC-19 | CyD-3 |
| 184 | CyC-19 | CyD-4 |
| 185 | CyC-19 | CyD-5 |
| 186 | CyC-19 | CyD-6 |
| 187 | CyC-19 | CyD-7 |
| 188 | CyC-19 | CyD-8 |
| 189 | CyC-19 | CyD-9 |
| 190 | CyC-19 | CyD-10 |

The groups CyC and CyD mentioned above as particularly preferred are particularly preferably combined with one another. Particular preference is thus given to the following combinations of CyC and CyD in the ligand L:

| No. | CyC | CyD |
|---|---|---|
| 1 | CyC-1a | CyD-1a |
| 2 | CyC-1a | CyD-2a |
| 3 | CyC-1a | CyD-3a |
| 4 | CyC-1a | CyD-4a |
| 5 | CyC-1a | CyD-5a |
| 6 | CyC-1a | CyD-6a |
| 7 | CyC-1a | CyD-7a |
| 8 | CyC-1a | CyD-8a |
| 9 | CyC-1a | CyD-9a |
| 10 | CyC-1a | CyD-10a |
| 11 | CyC-2a | CyD-1a |
| 12 | CyC-2a | CyD-2a |
| 13 | CyC-2a | CyD-3a |
| 14 | CyC-2a | CyD-4a |
| 15 | CyC-2a | CyD-5a |
| 16 | CyC-2a | CyD-6a |
| 17 | CyC-2a | CyD-7a |
| 18 | CyC-2a | CyD-8a |
| 19 | CyC-2a | CyD-9a |
| 20 | CyC-2a | CyD-10a |
| 21 | CyC-3a | CyD-1a |
| 22 | CyC-3a | CyD-2a |
| 23 | CyC-3a | CyD-3a |
| 24 | CyC-3a | CyD-4a |
| 25 | CyC-3a | CyD-5a |
| 26 | CyC-3a | CyD-6a |
| 27 | CyC-3a | CyD-7a |
| 28 | CyC-3a | CyD-8a |
| 29 | CyC-3a | CyD-9a |
| 30 | CyC-3a | CyD-10a |
| 31 | CyC-4a | CyD-1a |
| 32 | CyC-4a | CyD-2a |
| 33 | CyC-4a | CyD-3a |
| 34 | CyC-4a | CyD-4a |
| 35 | CyC-4a | CyD-5a |
| 36 | CyC-4a | CyD-6a |
| 37 | CyC-4a | CyD-7a |
| 38 | CyC-4a | CyD-8a |
| 39 | CyC-4a | CyD-9a |
| 40 | CyC-4a | CyD-10a |
| 41 | CyC-5a | CyD-1a |
| 42 | CyC-5a | CyD-2a |
| 43 | CyC-5a | CyD-3a |
| 44 | CyC-5a | CyD-4a |
| 45 | CyC-5a | CyD-5a |
| 46 | CyC-5a | CyD-6a |
| 47 | CyC-5a | CyD-7a |
| 48 | CyC-5a | CyD-8a |
| 49 | CyC-5a | CyD-9a |
| 50 | CyC-5a | CyD-10a |
| 51 | CyC-6a | CyD-1a |
| 52 | CyC-6a | CyD-2a |
| 53 | CyC-6a | CyD-3a |
| 54 | CyC-6a | CyD-4a |
| 55 | CyC-6a | CyD-5a |
| 56 | CyC-6a | CyD-6a |
| 57 | CyC-6a | CyD-7a |
| 58 | CyC-6a | CyD-8a |
| 59 | CyC-6a | CyD-9a |
| 60 | CyC-6a | CyD-10a |
| 61 | CyC-7a | CyD-1a |
| 62 | CyC-7a | CyD-2a |
| 63 | CyC-7a | CyD-3a |
| 64 | CyC-7a | CyD-4a |
| 65 | CyC-7a | CyD-5a |
| 66 | CyC-7a | CyD-6a |
| 67 | CyC-7a | CyD-7a |
| 68 | CyC-7a | CyD-8a |
| 69 | CyC-7a | CyD-9a |
| 70 | CyC-7a | CyD-10a |
| 71 | CyC-8a | CyD-1a |
| 72 | CyC-8a | CyD-2a |
| 73 | CyC-8a | CyD-3a |
| 74 | CyC-8a | CyD-4a |
| 75 | CyC-8a | CyD-5a |
| 76 | CyC-8a | CyD-6a |
| 77 | CyC-8a | CyD-7a |
| 78 | CyC-8a | CyD-8a |
| 79 | CyC-8a | CyD-9a |
| 80 | CyC-8a | CyD-10a |
| 81 | CyC-9a | CyD-1a |
| 82 | CyC-9a | CyD-2a |
| 83 | CyC-9a | CyD-3a |
| 84 | CyC-9a | CyD-4a |
| 85 | CyC-9a | CyD-5a |
| 86 | CyC-9a | CyD-6a |
| 87 | CyC-9a | CyD-7a |
| 88 | CyC-9a | CyD-8a |
| 89 | CyC-9a | CyD-9a |
| 90 | CyC-9a | CyD-10a |
| 91 | CyC-10a | CyD-1a |
| 92 | CyC-10a | CyD-2a |
| 93 | CyC-10a | CyD-3a |
| 94 | CyC-10a | CyD-4a |
| 95 | CyC-10a | CyD-5a |
| 96 | CyC-10a | CyD-6a |
| 97 | CyC-10a | CyD-7a |
| 98 | CyC-10a | CyD-8a |
| 99 | CyC-10a | CyD-9a |
| 100 | CyC-10a | CyD-10a |
| 101 | CyC-11a | CyD-1a |
| 102 | CyC-11a | CyD-2a |
| 103 | CyC-11a | CyD-3a |
| 104 | CyC-11a | CyD-4a |
| 105 | CyC-11a | CyD-5a |
| 106 | CyC-11a | CyD-6a |
| 107 | CyC-11a | CyD-7a |
| 108 | CyC-11a | CyD-8a |
| 109 | CyC-11a | CyD-9a |
| 110 | CyC-11a | CyD-10a |
| 111 | CyC-12a | CyD-1a |
| 112 | CyC-12a | CyD-2a |
| 113 | CyC-12a | CyD-3a |
| 114 | CyC-12a | CyD-4a |

| No. | CyC | CyD |
|---|---|---|
| 115 | CyC-12a | CyD-5a |
| 116 | CyC-12a | CyD-6a |
| 117 | CyC-12a | CyD-7a |
| 118 | CyC-12a | CyD-8a |
| 119 | CyC-12a | CyD-9a |
| 120 | CyC-12a | CyD-10a |
| 121 | CyC-13a | CyD-1a |
| 122 | CyC-13a | CyD-2a |
| 123 | CyC-13a | CyD-3a |
| 124 | CyC-13a | CyD-4a |
| 125 | CyC-13a | CyD-5a |
| 126 | CyC-13a | CyD-6a |
| 127 | CyC-13a | CyD-7a |
| 128 | CyC-13a | CyD-8a |
| 129 | CyC-13a | CyD-9a |
| 130 | CyC-13a | CyD-10a |
| 131 | CyC-14a | CyD-1a |
| 132 | CyC-14a | CyD-2a |
| 133 | CyC-14a | CyD-3a |
| 134 | CyC-14a | CyD-4a |
| 135 | CyC-14a | CyD-5a |
| 136 | CyC-14a | CyD-6a |
| 137 | CyC-14a | CyD-7a |
| 138 | CyC-14a | CyD-8a |
| 139 | CyC-14a | CyD-9a |
| 140 | CyC-14a | CyD-10a |
| 141 | CyC-15a | CyD-1a |
| 142 | CyC-15a | CyD-2a |
| 143 | CyC-15a | CyD-3a |
| 144 | CyC-15a | CyD-4a |
| 145 | CyC-15a | CyD-5a |
| 146 | CyC-15a | CyD-6a |
| 147 | CyC-15a | CyD-7a |
| 148 | CyC-15a | CyD-8a |
| 149 | CyC-15a | CyD-9a |
| 150 | CyC-15a | CyD-10a |
| 151 | CyC-16a | CyD-1a |
| 152 | CyC-16a | CyD-2a |
| 153 | CyC-16a | CyD-3a |
| 154 | CyC-16a | CyD-4a |
| 155 | CyC-16a | CyD-5a |
| 156 | CyC-16a | CyD-6a |
| 157 | CyC-16a | CyD-7a |
| 158 | CyC-16a | CyD-8a |
| 159 | CyC-16a | CyD-9a |
| 160 | CyC-16a | CyD-10a |
| 161 | CyC-17a | CyD-1a |
| 162 | CyC-17a | CyD-2a |
| 163 | CyC-17a | CyD-3a |
| 164 | CyC-17a | CyD-4a |
| 165 | CyC-17a | CyD-5a |
| 166 | CyC-17a | CyD-6a |
| 167 | CyC-17a | CyD-7a |
| 168 | CyC-17a | CyD-8a |
| 169 | CyC-17a | CyD-9a |
| 170 | CyC-17a | CyD-10a |
| 171 | CyC-18a | CyD-1a |
| 172 | CyC-18a | CyD-2a |
| 173 | CyC-18a | CyD-3a |
| 174 | CyC-18a | CyD-4a |
| 175 | CyC-18a | CyD-5a |
| 176 | CyC-18a | CyD-6a |
| 177 | CyC-18a | CyD-7a |
| 178 | CyC-18a | CyD-8a |
| 179 | CyC-18a | CyD-9a |
| 180 | CyC-18a | CyD-10a |
| 181 | CyC-19a | CyD-1a |
| 182 | CyC-19a | CyD-2a |
| 183 | CyC-19a | CyD-3a |
| 184 | CyC-19a | CyD-4a |
| 185 | CyC-19a | CyD-5a |
| 186 | CyC-19a | CyD-6a |
| 187 | CyC-19a | CyD-7a |
| 188 | CyC-19a | CyD-8a |
| 189 | CyC-19a | CyD-9a |
| 190 | CyC-19a | CyD-10a |

If the radicals R on CyC and CyD together form a ring, the following ligand structures (L1) to (L6) then preferably arise:

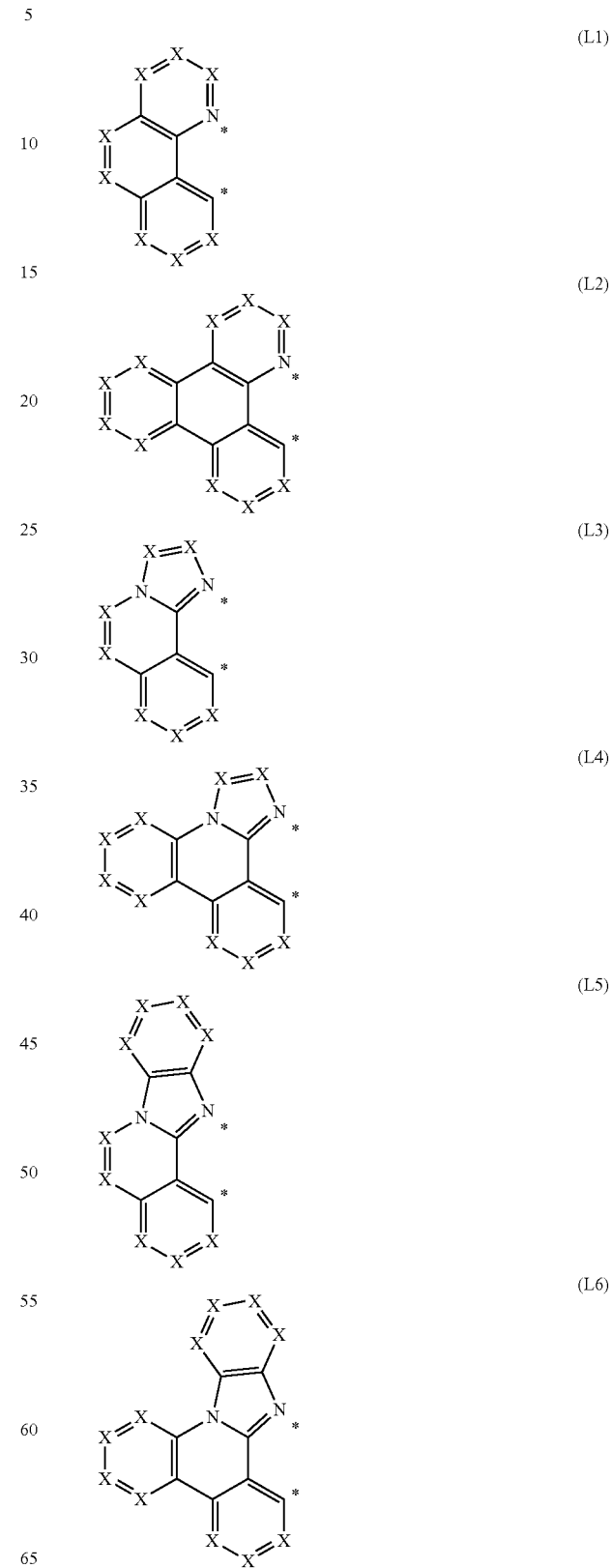

where X has the meanings given above and * indicates the position of the coordination to M.

As described above, it is essential to the invention that CyD and/or CyC or the preferred embodiments described above have two adjacent carbon atoms, each of which are substituted by radicals R, where the respective radicals R, together with the C atoms, form a bi or polycyclic structure of the formula (3) mentioned above.

In a preferred embodiment of the invention, the ligand L contains precisely one group of the formula (3). Either CyC or CyD here can have this structure. In general, the group of the formula (3) can be bonded to CyC or CyD in any possible position.

The preferred positions for adjacent groups X which stand for CR, where the respective radicals R, together with the C atoms to which they are bonded, form a ring of the above-mentioned formula (3), are in each case depicted in the following groups (CyC-1-1) to (CyC-19-1) and (CyD-1-1) to (CyD-10-1),

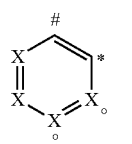
(CyC-1-1)

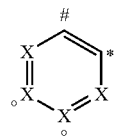
(CyC-1-2)

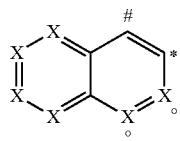
(CyC-2-1)

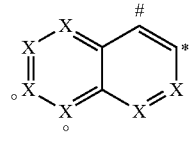
(CyC-2-2)

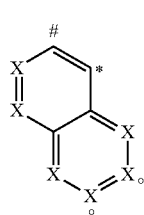
(CyC-2-3)

(CyC-3-1)

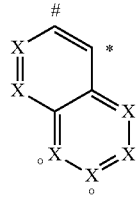
(CyC-3-2)

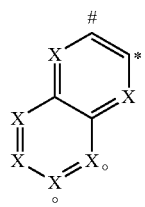
(CyC-4-1)

(CyC-4-2)

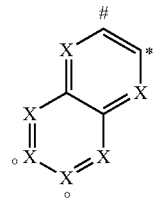
(CyC-4-3)

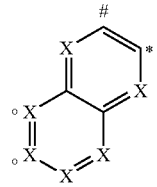
(CyC-5-1)

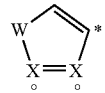
(CyC-7-1)

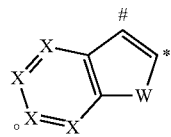
(CyC-7-2)

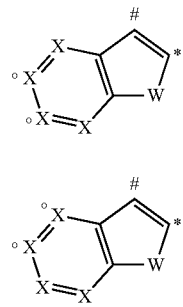
(CyC-7-3)

-continued
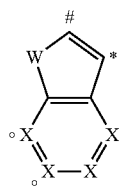
(CyC-8-1)
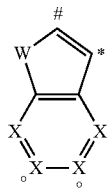
(CyC-8-2)
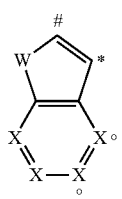
(CyC-8-3)
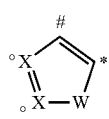
(CyC-9-1)
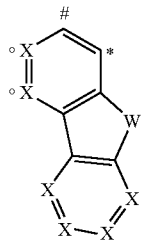
(CyC-14-1)
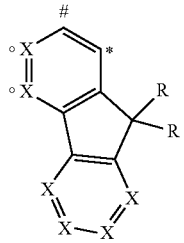
(CyC-15-1)
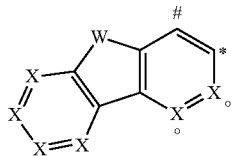
(CyC-16-1)
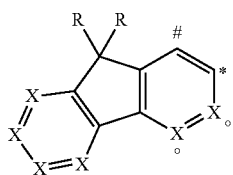
(CyC-17-1)
-continued
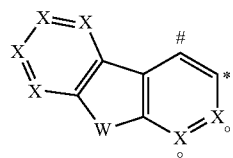
(CyC-18-1)
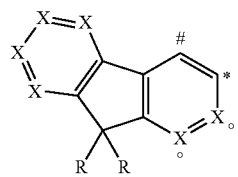
(CyC-19-1)
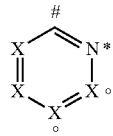
(CyD-1-1)
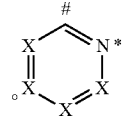
(CyD-1-2)
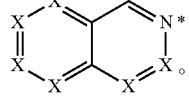
(CyD-2-1)
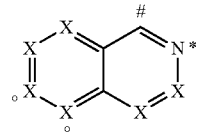
(CyD-2-2)
(CyD-2-3)
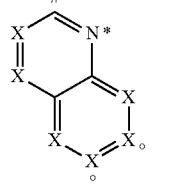
(CyD-3-1)
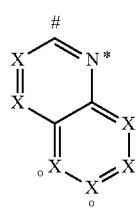
(CyD-3-2)

-continued
(CyD-4-1)
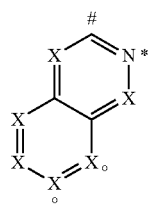
(CyD-4-2)
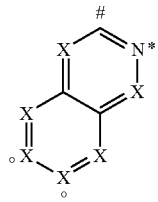
(CyD-4-3)
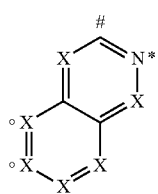
(CyD-5-1)
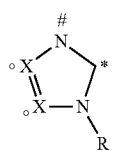
(CyD-6-1)
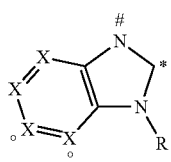
(CyD-6-2)
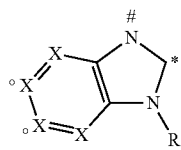
(CyD-6-3)
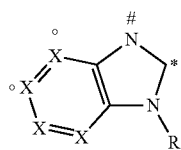
(CyD-7-1)
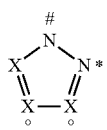
(CyD-7-2)
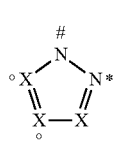
-continued
(CyD-8-1)
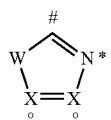
(CyD-9-1)
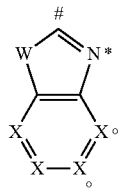
(CyD-9-2)
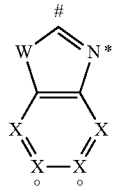
(CyD-9-3)
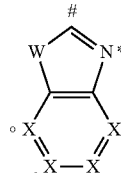
(CyD-10-1)
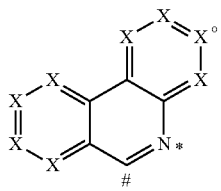
(CyD-10-2)
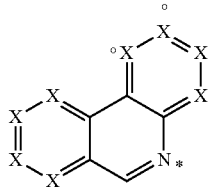
(CyD-10-3)
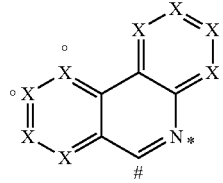

(CyD-10-4)

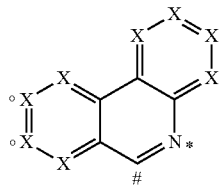

where the symbols and indices used have the meanings given above and ° in each case denotes the positions which stand for CR, where the respective radicals R, together with the C atoms to which they are bonded, form a ring of the above-mentioned formula (3).

For the combinations of CyC and CyD, the groups (CyC-1-1) to (CyC-19-1) and (CyD-1-1) to (CyD-10-4) respectively in the two tables shown above are likewise preferred instead of the groups (CyC-1) to (CyC-19) and (CyD-1) to (CyD-19) shown in the tables.

Preferred positions for the bonding of the group of the formula (3) in the ligands (L1) to (L5) are depicted in the following structures (L1-1) to (L5-6):

(L1-1)

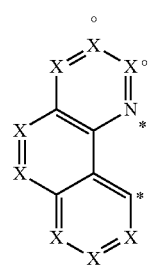

(L1-2)

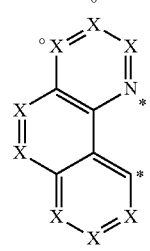

(L1-3)

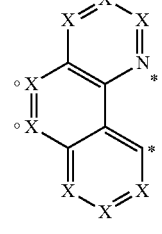

(L1-4)

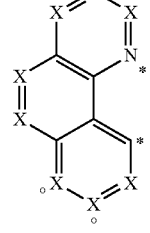

(L1-5)

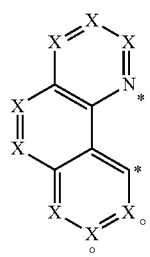

(L2-1)

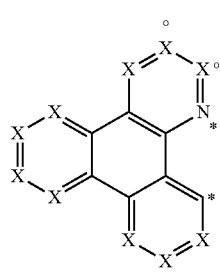

(L2-2)

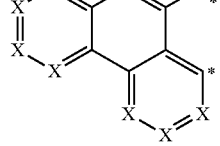

(L2-3)

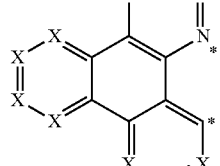

(L2-4)

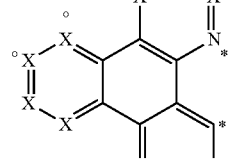

(L2-5)

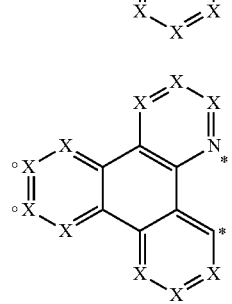

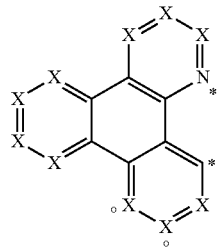
(L2-6)
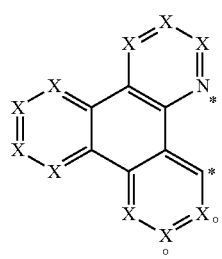
(L2-7)
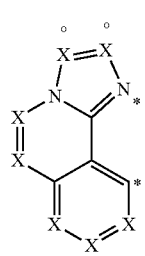
(L3-1)
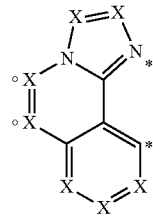
(L3-2)
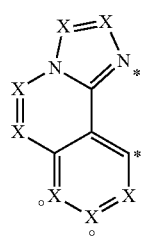
(L3-3)
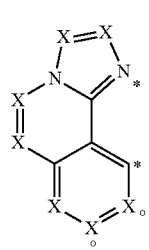
(L3-4)
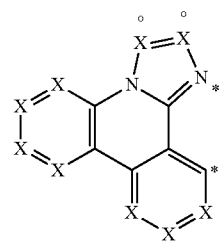
(L4-1)
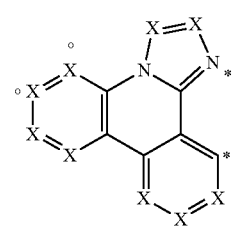
(L4-2)
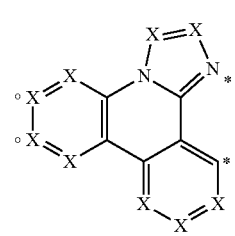
(L4-3)
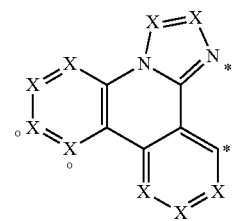
(L4-4)
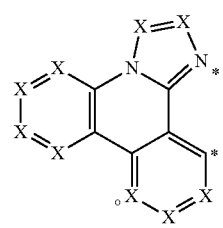
(L4-5)
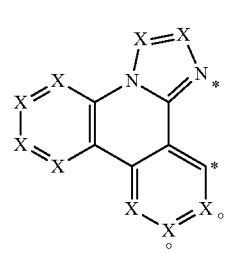
(L4-6)

(L5-1)

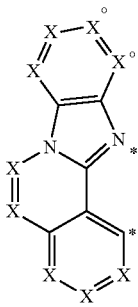

(L5-2)

(L5-3)

(L5-4)

(L5-5)

(L5-6)

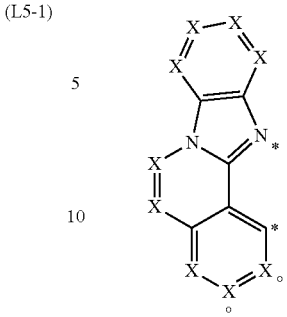

where the symbols used have the meanings given above.

Preferred embodiments of the group of the formula (3) are shown below.

The group of the formula (3) is a bicyclic structure. It is essential that it contains no acidic benzylic protons. Benzylic protons are taken to mean protons which are bonded to a carbon atom which is bonded directly to the aromatic or heteroaromatic ligand. The absence of acidic benzylic protons is achieved in the structure of the formula (3) through it being a bicyclic structure whose bridgehead is bonded directly to the aromatic group of CyC or CyD. Owing to the rigid spatial arrangement, the substituent $R^2$ which is bonded to the bridgehead if $A^1$ or $A^2$ stands for $CR^2$ and $R^2$ stands for H is significantly less acidic than benzylic protons in a non-bicyclic structure, since the corresponding anion of the bicyclic structure is not mesomerism-stabilised. Such a proton is thus a non-acidic proton in the sense of the present application.

In a preferred embodiment of the invention, $A^1$ and $A^2$ both stand, identically or differently, for $CR^2$, or $A^1$ and $A^2$ both stand for N. $A^1$ and $A^2$ particularly preferably stand, identically or differently, for $CR^2$. The bridgehead atoms are thus particularly preferably carbon.

In a preferred embodiment of the invention, the radical $R^2$ which is bonded to the bridgehead atom is selected, identically or differently on each occurrence, from the group consisting of H, D, F, a straight-chain alkyl group having 1 to 10 C atoms, which may be substituted by one or more radicals $R^1$, but is preferably unsubstituted, a branched or cyclic alkyl group having 3 to 10 C atoms, which may be substituted by one or more radicals $R^4$, but is preferably unsubstituted, or an aromatic or heteroaromatic ring system having 5 to 12 aromatic ring atoms, which may in each case be substituted by one or more radicals $R^4$. The radical $R^2$ which is bonded to the bridgehead atom is particularly preferably selected, identically or differently on each occurrence, from the group consisting of H, F, a straight-chain alkyl group having 1 to 4 C atoms, a branched alkyl group having 3 or 4 C atoms or a phenyl group, which may be substituted by an alkyl group having 1 to 4 C atoms, but is preferably unsubstituted. The radical $R^2$ is very particularly preferably selected on each occurrence, identically or differently, from the group consisting of H, methyl and tert-butyl.

In a further preferred embodiment, both groups $A^1$ and $A^2$ in formula (3) stand for $CR^2$ and the two radicals $R^2$ are selected identically.

In a further preferred embodiment of the invention, $A^3$ and $A^4$ stand, identically or differently on each occurrence, for an alkylene group having 2 or 3 carbon atoms, which may be substituted by one or more radicals $R^3$. $A^3$ and $A^4$ thus preferably contain no oxygen atoms in the alkylene group.

In a preferred embodiment of the invention, the radical $R^3$ which is bonded to $A^3$ or $A^4$ is selected, identically or differently on each occurrence, from the group consisting of H, D, F, a straight-chain alkyl group having 1 to 10 C atoms, which may be substituted by one or more radicals $R^4$, but is preferably unsubstituted, a branched or cyclic alkyl group having 3 to 10 C atoms, which may be substituted by one or more radicals $R^4$, but is preferably unsubstituted, or an aromatic or heteroaromatic ring system having 5 to 12 aromatic ring atoms, which may in each case be substituted by one or more radicals $R^4$; two radicals $R^3$ here may form a ring with one another and thus form a polycyclic, aliphatic ring system. Ring formation is also possible and preferred between a radical $R^3$ which is bonded to $A^3$ and a radical $R^3$ which is bonded to $A^4$. Ring formation between a radical $R^3$ which is bonded to $A^3$ and a radical $R^3$ which is bonded to $A^4$ preferably takes place by means of a single bond, oxygen, a methylene group, which may be substituted by one or two groups $R^4$, but is preferably unsubstituted, or an ethylene group, which may be substituted by one or more groups $R^4$, but is preferably unsubstituted. The radical $R^3$ is particularly preferably selected, identically or differently on each occurrence, from the group consisting of H, F, a straight-chain alkyl group having 1 to 4 C atoms or a branched alkyl group having 3 or 4 C atoms; two radicals $R^3$ here may form a ring with one another and thus form a polycyclic, aliphatic ring system.

Particularly preferably, $A^1$ and $A^2$ stand, identically or differently, for $CR^2$, and $A^3$ and $A^4$ stand, identically or differently on each occurrence, for an alkylene group having 2 or 3 carbon atoms, which may be substituted by one or more radicals $R^3$, where the preferred definitions given above preferably apply to $R^2$ and $R^3$.

In a preferred embodiment of the invention, $A^3$ and $A^4$ each stand for an ethylene group, which may be substituted by one or more radicals $R^3$. In a further preferred embodiment of the invention, $A^3$ stands for an ethylene group and $A^4$ for a propylene group, each of which may be substituted by one or more radicals $R^3$. In still a further embodiment of the invention, $A^3$ and $A^4$ each stand for a propylene group, which may be substituted by one or more radicals $R^3$. It is thus preferably a group of the following formula (4), (5) or (6):

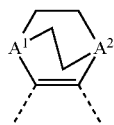

formula (4)

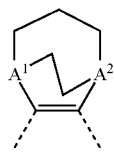

formula (5)

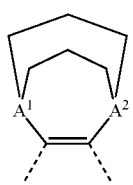

formula (6)

where $A^1$ and $A^2$ have the meanings given above, and the ethylene groups or propylene groups, which are shown unsubstituted for clarity, may be substituted by one or more radicals $R^3$, where $R^3$ has the meanings given above. In particular, two radicals $R^3$ which are bonded to the two different ethylene or propylene groups may also be linked to one another to form a ring system.

Preferred structures of the formulae (4), (5) and (6) are the structures of the following formulae (4a), (5a) and (6a):

formula (4a)

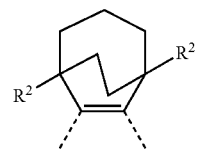

formula (5a)

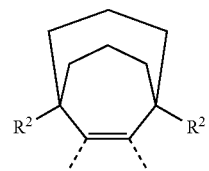

formula (6a)

where the ethylene groups or propylene groups may be substituted by one or more radicals $R^3$, where $R^3$ has the meanings given above. In particular, two radicals $R^3$ which are bonded to the two different ethylene or propylene groups may also be linked to one another to form a ring system.

Preferred structures of the formulae (4) and (6) in which two radicals $R^3$ are linked to one another to form a ring system are the structures of the following formulae (4b) and (6b):

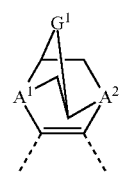

formula (4b)

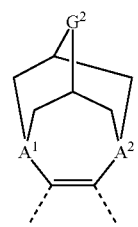

formula (6b)

where $A^1$ and $A^2$ have the meanings given above, the ethylene and propylene groups may be substituted by one or more radicals $R^3$, and $G^1$ stands for an ethylene group, which may be substituted by one or more groups $R^4$, but is preferably unsubstituted, and $G^2$ stands for a single bond, a methylene group or an ethylene group, each of which may be substituted by one or more groups $R^4$, but is preferably unsubstituted, or for an oxygen atom. $A^1$ and $A^2$ in the formulae (4b) and (6b) preferably stand, identically or differently, for $CR^2$.

Examples of suitable structures of the formula (4) are the following structures:

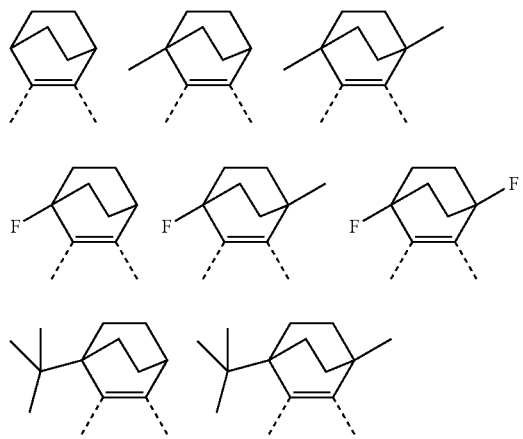

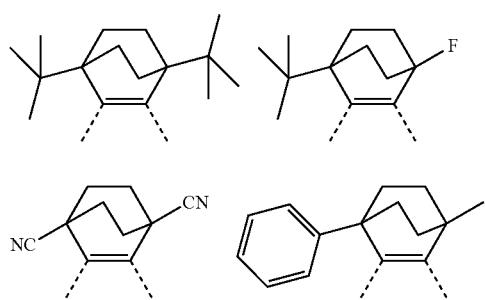

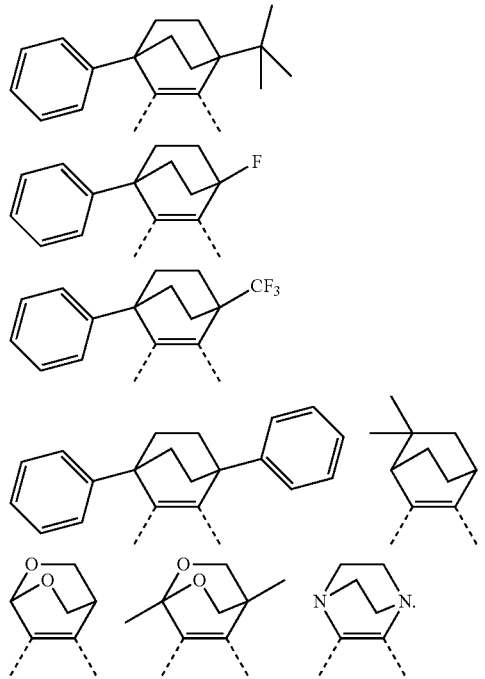

The following two structures are particularly preferred here:

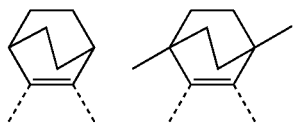

Examples of suitable structures of the formula (5) are the following structure,

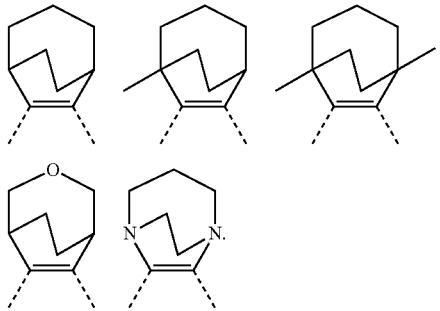

Examples of suitable structures of the formula (6) are the following structures:

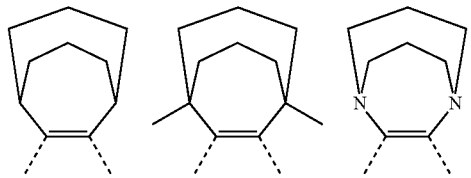

Examples of suitable structures of the formulae (4b) and (6b) are the following structures:

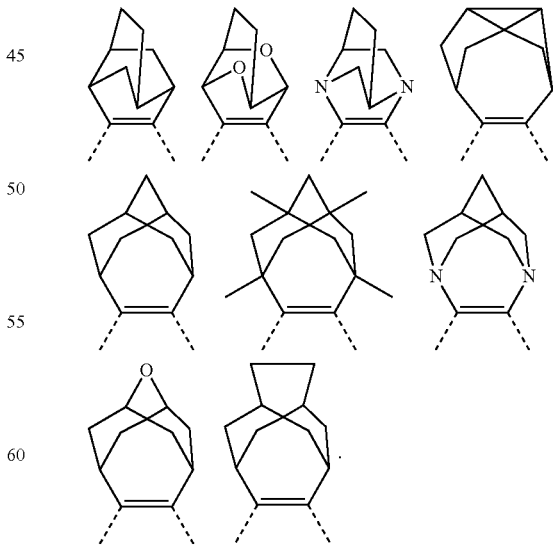

The three following structures are particularly preferred here:

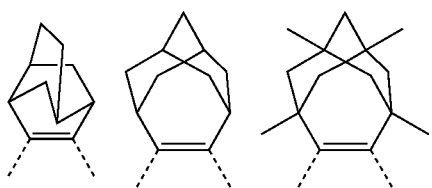

If radicals R which do not stand for a group of the formula (3) are bonded in the moiety of the formula (2), these radicals R are preferably selected on each occurrence, identically or differently, from the group consisting of H, D, F, Br, I, $N(R^1)_2$, CN, $Si(R^1)_3$, $B(OR^1)_2$, $C(=O)R^1$, a straight-chain alkyl group having 1 to 10 C atoms or an alkenyl group having 2 to 10 C atoms or a branched or cyclic alkyl group having 3 to 10 C atoms, each of which may be substituted by one or more radicals $R^1$, where one or more H atoms may be replaced by D or F, or an aromatic or heteroaromatic ring system having 5 to 30 aromatic ring atoms, which may in each case be substituted by one or more radicals $R^1$; two adjacent radical R or R with $R^1$ here may also form a mono- or polycyclic, aliphatic or aromatic ring system with one another. These radicals R are particularly preferably selected on each occurrence, identically or differently, from the group consisting of H, D, F, $N(R^1)_2$, a straight-chain alkyl group having 1 to 6 C atoms or a branched or cyclic alkyl group having 3 to 10 C atoms, where one or more H atoms may be replaced by D or F, or an aromatic or heteroaromatic ring system having 5 to 24 aromatic ring atoms, which may in each case be substituted by one or more radicals $R^1$; two adjacent radicals R or R with $R^1$ here may also form a mono- or polycyclic, aliphatic or aromatic ring system with one another. Furthermore, ring formation between CyC and CyD is also possible, as described above.

It is furthermore possible for the substituent R which is bonded in the ortho-position to the metal coordination to represent a coordinating group which is likewise coordinated or bonded to the metal M. Preferred coordinating groups R are aryl or heteroaryl groups, for example phenyl or pyridyl, aryl or alkyl cyanides, aryl or alkyl isocyanides, amines or amides, alcohols or alcoholates, thioalcohols or thioalcoholates, phosphines, phosphites, carbonyl functions, carboxylates, carbamides or aryl- or alkylacetylides. Examples of moieties ML of the formula (2) in which CyD stands for pyridine and CyC stands for benzene are the structures of the following formulae (7) to (18):

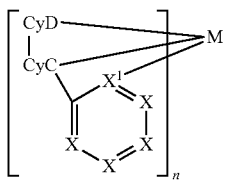

formula (7)

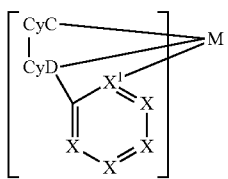

formula (8)

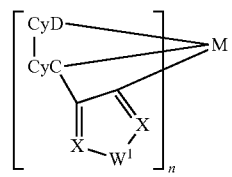

formula (9)

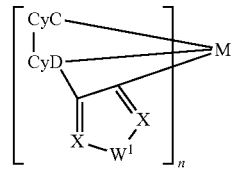

formula (10)

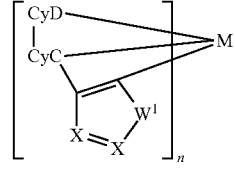

formula (11)

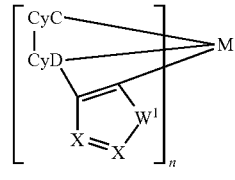

formula (12)

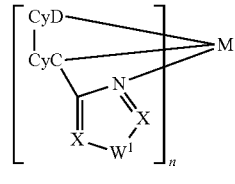

formula (13)

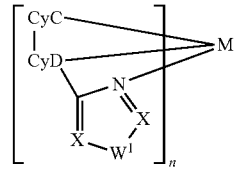

formula (14)

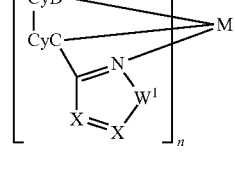

formula (15)

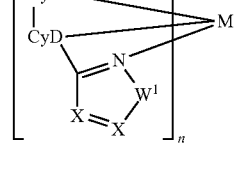

formula (16)

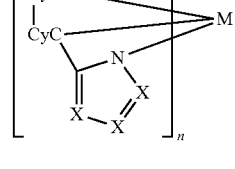

formula (17)

-continued formula (18)

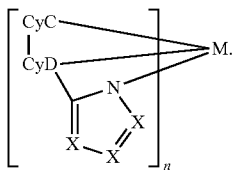

where the symbols and indices have the same meanings as described above, $X^1$ stands, identically or differently on each occurrence, for C or N and $W^1$ stands, identically or differently on each occurrence, for S, O or $NR^1$.

Formulae (7) to (18) show, merely by way of example, how the substituent R can additionally coordinate to the metal. Other groups R which coordinate to the metal, for example also carbenes, are also accessible entirely analogously without further inventive step.

As described above, a bridging unit which links this ligand L to one or more further ligands L or L' may also be present instead of one of the radicals R. In a preferred embodiment of the invention, a bridging unit is present instead of one of the radicals R, in particular instead of the radicals R which are in the ortho- or meta-position to the coordinating atom, so that the ligands have a tridentate or polydentate or polypodal character. It is also possible for two such bridging units to be present. This results in the formation of macrocyclic ligands or in the formation of cryptates.

Preferred structures containing polydentate ligands are the metal complexes of the following formulae (19) to (24), formula (19)

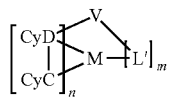

formula (20)

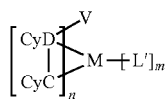

formula (21)

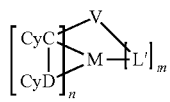

formula (22)

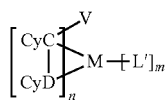

formula (23)

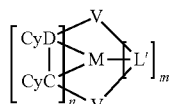

formula (24)

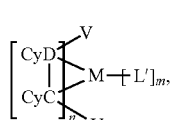

where the symbols and indices used have the above-mentioned meanings.

The ligands can likewise be bridged to one another via the cyclic group of the formula (3).

In the structures of the formulae (19) to (24), V preferably represents a single bond or a bridging unit containing 1 to 80 atoms from the third, fourth, fifth and/or sixth main group (IUPAC group 13, 14, 15 or 16) or a 3- to 6-membered homo- or heterocycle which covalently bonds the part-ligands L to one another or covalently bonds L to L'. The bridging unit V here may also have an asymmetrical structure, i.e. the linking of V to L and L' need not be identical. The bridging unit V can be neutral, singly, doubly or triply negatively charged or singly, doubly or triply positively charged. V is preferably neutral or singly negatively charged or singly positively charged, particularly preferably neutral. The charge of V is preferably selected so that overall a neutral complex forms. The preferences mentioned above for the moiety $ML_n$ apply to the ligands, and n is preferably at least 2.

The precise structure and chemical composition of the group V does not have a significant effect on the electronic properties of the complex since the job of this group is essentially to increase the chemical and thermal stability of the complexes by bridging L to one another or to L'.

If V is a trivalent group, i.e. bridges three ligands L to one another or two ligands L to L' or one ligand L to two ligands L', V is preferably selected, identically or differently on each occurrence, from the group consisting of B, $B(R^1)^-$, $B(C(R^1)_2)_3$, $(R^1)B(C(R^1)_2)_3^-$, $B(O)_3$, $(R^1)B(O)_3^-$, $B(C(R^1)_2C(R^1)_2)_3$, $(R^1)B(C(R^1)_2C(R^1)_2)_3^-$, $B(C(R^1)_2O)_3$, $(R^1)B(C(R^1)_2O)_3^-$, $B(OC(R^1)_2)_3$, $(R^1)B(OC(R^1)_2)_3^-$, $C(R^1)$, $CO^-$, $CN(R^1)_2$, $(R^1)C(C(R^1)_2)_3$, $(R^1)C(O)_3$, $(R^1)C(C(R^1)_2C(R^1)_2)_3$, $(R^1)C(C(R^1)_{20})_3$, $(R^1)C(OC(R^1)_2)_3$, $(R^1)C(Si(R^1)_2)_3$, $(R^1)C(Si(R^1)_2C(R^1)_2)_3$, $(R^1)C(C(R^1)_2Si(R^1)_2)_3$, $(R^1)C(Si(R^1)_2Si(R^1)_2)_3$, $Si(R^1)$, $(R^1)Si(C(R^1)_2)_3$, $(R^1)Si(O)_3$, $(R^1)Si(C(R^1)_2C(R^1)_2)_3$, $(R^1)Si(OC(R^1)_2)_3$, $(R^1)Si(C(R^1)_2O)_3$, $(R^1)Si(Si(R^1)_2)_3$, $(R^1)Si(Si(R^1)_2C(R^1)_2)_3$, $(R^1)Si(C(R^1)_2Si(R^1)_2)_3$, $(R^1)Si(Si(R^1)_2Si(R^1)_2)_3$, N, NO, $N(R^1)^+$, $N(C(R^1)_2)_3$, $(R^1)N(C(R^1)_2)_3^+$, $N(C=O)_3$, $N(C(R^1)_2C(R^1)_2)_3$, $(R^1)N(C(R^1)_2C(R^1)_2)^+$, P, $P(R^1)^+$, PO, PS, $P(O)_3$, $PO(O)_3$, $P(OC(R^1)_2)_3$, $PO(OC(R^1)_2)_3$, $P(C(R^1)_2)_3$, $P(R^1)(C(R^1)_2)_3^*$, $PO(C(R^1)_2)_3$, $P(C(R^1)_2C(R^1)_2)_3$, $P(R^1)$ $(C(R^1)_2C(R^1)_2)_3^+$, $PO(C(R^1)_2C(R^1)_2)_3$, $S^+$, $S(C(R^1)_2)_3^+$, $S(C(R^1)_2C(R^1)_2)_3^+$, or a unit of the formulae (25) to (29), formula (25)

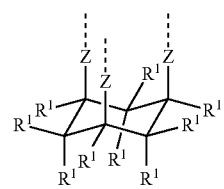

formula (26)

formula (27)

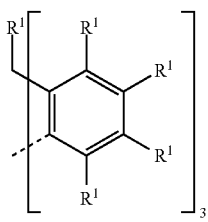

formula (28)

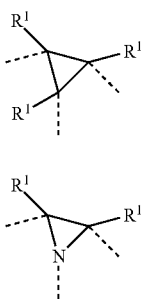

formula (29)

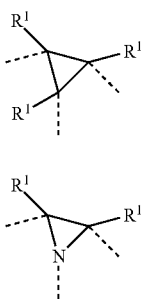

where the dashed bonds in each case indicate the bond to the part-ligands L or L', and Z is selected, identically or differently on each occurrence, from the group consisting of a single bond, O, S, S(=O), S(=O)$_2$, NR$^1$, PR$^1$, P(=O)R$^1$, C(R$^1$)$_2$, C(=O), C(=NR$^1$), C(=C(R$^1$)$_2$), Si(R$^1$)$_2$ or BR$^1$. The other symbols used have the meanings given above.

If V stands for a group CR$_2$, the two radicals R may also be linked to one another, and consequently structures such as, for example, 9,9-fluorene, are also suitable groups V.

If V is a divalent group, i.e. bridges two ligands L to one another or one ligand L to L', V is preferably selected, identically or differently on each occurrence, from the group consisting of aus BR$^1$, B(R$^1$)$_2^-$, C(R$^1$)$_2$, C(=O), Si(R$^1$)$_2$, NR$^1$, PR$^1$, P(R$^1$)$^2$, P(=O)(R$^1$), P(=S)(R$^1$), O, S, Se, or a unit of the formulae (30) to (39), formula (30)

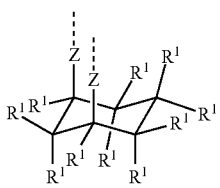

formula (31)

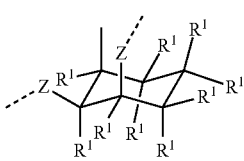

formula (32)

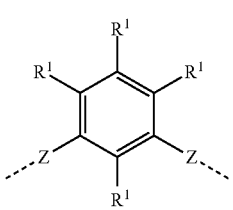

formula (33)

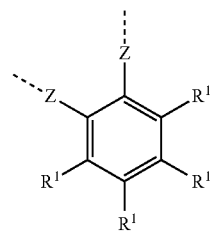

formula (34)

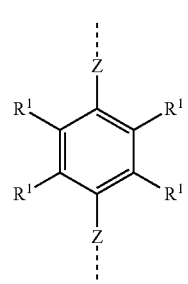

formula (35)

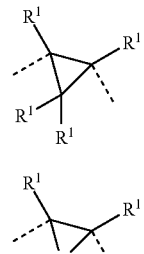

formula (36)

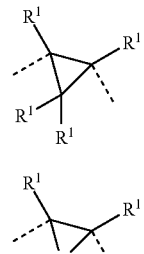

formula (37)

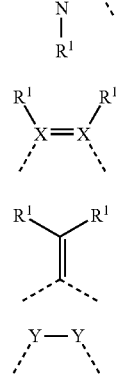

formula (38)

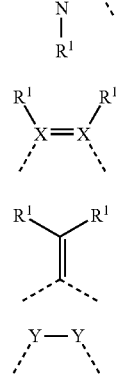

formula (39)

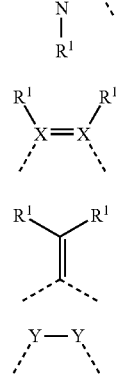

where the dashed bonds in each case indicate the bond to the part-ligands L or L', Y stands on each occurrence, identically or differently, for C(R$^1$)$_2$, N(R$^1$), O or S, and the other symbols used each have the meanings indicated above.

Preferred ligands L' as occur in formula (1) are described below. The ligand groups L' can also be selected correspondingly if they are bonded to L via a bridging unit V, as indicated in formulae (19), (21) and (23).

The ligands L' are preferably neutral, monoanionic, dianionic or trianionic ligands, particularly preferably neutral or monoanionic ligands. They can be monodentate, bidentate, tridentate or tetradentate and are preferably bidentate, i.e. preferably have two coordination sites. As described above, the ligands L' can also be bonded to L via a bridging group V.

Preferred neutral, monodentate ligands L' are selected from the group consisting of carbon monoxide, nitrogen monoxide, alkyl cyanides, such as, for example, acetonitrile, aryl cyanides, such as, for example, benzonitrile, alkyl isocyanides, such as, for example, methyl isonitrile, aryl isocyanides, such as, for example, benzoisonitrile, amines, such as, for example, tri-methylamine, triethylamine, morpholine, phosphines, in particular halo-phosphines, trialkylphosphines, triarylphosphines or alkylarylphosphines, such as, for example, trifluorophosphine, trimethylphosphine, tricyclohexylphosphine, tri-tert-butylphosphine, triphenylphosphine, tris(pentafluoro-phenyl)phosphine, dimethylphenylphosphine, methyldiphenylphosphine, bis(tert-butyl)phenylphosphine, phosphites, such as, for example, trimethyl phosphite, triethyl phosphite, arsines, such as, for example, trifluoroarsine, trimethylarsine, tricyclohexylarsine, tri-tert-butylarsine, triphenylarsine, tris(pentafluorophenyl)arsine, stibines, such as, for example, trifluoro-stibine, trimethylstibine, tricyclohexylstibine, tri-tert-butylstibine, triphenyl-stibine, tris(pentafluorophenyl) stibine, nitrogen-containing heterocycles, such as, for example, pyridine, pyridazine, pyrazine, pyrimidine, triazine, and carbenes, in particular Arduengo carbenes.

Preferred monoanionic, monodentate ligands L' are selected from hydride, deuteride, the halides $F^-$, $Cl^-$, $Br^-$ and $I^-$, alkylacetylides, such as, for example, methyl-C≡C⁻, tert-butyl-C≡C⁻, arylacetylides, such as, for example, phenyl-C≡C⁻, cyanide, cyanate, isocyanate, thiocyanate, isothiocyanate, aliphatic or aromatic alcoholates, such as, for example, methanolate, ethanolate, propanolate, isopropanolate, tert-butylate, phenolate, aliphatic or aromatic thioalcoholates, such as, for example, methanethiolate, ethane-thiolate, propanethiolate, isopropanethiolate, tert-thiobutylate, thiophenolate, amides, such as, for example, dimethylamide, diethylamide, diiso-propylamide, morpholide, carboxylates, such as, for example, acetate, trifluoroacetate, propionate, benzoate, aryl groups, such as, for example, phenyl, naphthyl, and anionic, nitrogen-containing heterocycles, such as pyrrolide, imidazolide, pyrazolide. The alkyl groups in these groups are preferably $C_1$-$C_{20}$-alkyl groups, particularly preferably $C_1$-$C_{10}$-alkyl groups, very particularly preferably $C_1$-$C_4$-alkyl groups. An aryl group is also taken to mean heteroaryl groups. These groups are as defined above.

Preferred di- or trianionic ligands are $O^{2-}$, $S^{2-}$, carbides, which result in coordination in the form R—C≡M, and nitrenes, which result in coordination in the form R—N=M, where R generally stands for a substituent, or $N^{3-}$.

Preferred neutral or mono- or dianionic, bidentate or polydentate ligands L' are selected from diamines, such as, for example, ethylenediamine, N,N,N',N'-tetramethylethylenediamine, propylenediamine, N,N,N',N'-tetra-methylpropylenediamine, cis- or trans-diaminocyclohexane, cis- or trans-N,N,N',N'-tetramethyldiaminocyclohexane, imines, such as, for example, 2-[1-(phenylimino)ethyl]pyridine, 2-[1-(2-methylphenylimino)ethyl]pyridine, 2-[1-(2,6-diisopropylphenylimino)ethyl]pyridine, 2-[1-(methylimino) ethyl]-pyridine, 2-[1-(ethylimino)ethyl]pyridine, 2-[1-(isopropylimino)ethyl]pyridine, 2-[1-(tert-butylimino)ethyl] pyridine, diimines, such as, for example, 1,2-bis-(methylimino)ethane, 1,2-bis(ethylimino)ethane, 1,2-bis (isopropylimino)-ethane, 1,2-bis(tert-butylimino)ethane, 2,3-bis(methylimino)butane, 2,3-bis-(ethylimino)butane, 2,3-bis(isopropylimino)butane, 2,3-bis(tert-butylimino)-butane, 1,2-bis(phenylimino)ethane, 1,2-bis(2-methylphenylimino)ethane, 1,2-bis(2,6-diisopropylphenylimino)ethane, 1,2-bis(2,6-di-tert-butylphenyl-imino)ethane, 2,3-bis (phenylimino)butane, 2,3-bis(2-methylphenylimino)-butane, 2,3-bis(2,6-diisopropylphenylimino)butane, 2,3-bis (2,6-di-tert-butyl-phenylimino)butane, heterocycles containing two nitrogen atoms, such as, for example, 2,2'-bipyridine, o-phenanthroline, diphosphines, such as, for example, bis(diphenylphosphino)methane, bis(diphenylphosphino)ethane, bis(diphenylphosphino)propane, bis (diphenylphosphino)butane, bis-(dimethylphosphino)methane, bis(dimethylphosphino)ethane, bis(dimethylphosphino)propane, bis(diethylphosphino)methane, bis (diethylphosphino)-ethane, bis(diethylphosphino)propane, bis(di-tert-butylphosphino)methane, bis(di-tert-butylphosphino)ethane, bis(tert-butylphosphino)propane, 1,3-diketonates derived from 1,3-diketones, such as, for example, acetyl-acetone, benzoylacetone, 1,5-diphenylacetylacetone, dibenzoylmethane, bis(1,1,1-trifluoroacetyl)methane, 3-ketonates derived from 3-ketoesters, such as, for example, ethyl acetoacetate, carboxylates derived from aminocarboxylic acids, such as, for example, pyridine-2-carboxylic acid, quinoline-2-carboxylic acid, glycine, N,N-dimethylglycine, alanine, N,N-dimethylaminoalanine, salicyliminates derived from salicylimines, such as, for example, methylsalicylimine, ethylsalicylimine, phenylsalicylimine, dialcoholates derived from dialcohols, such as, for example, ethylene glycol, 1,3-propylene glycol, and dithiolates derived from dithiols, such as, for example, 1,2-ethylenedithiol, 1,3-propylenedithiol, bis(pyrazolyl) borates, bis(imidazolyl) borates, 3-(2-pyridyl)diazoles or 3-(2-pyridyl)triazoles.

Preferred tridentate ligands are borates of nitrogen-containing heterocycles, such as, for example, tetrakis(1-imidazolyl) borate and tetrakis-(1-pyrazolyl) borate.

Preference is furthermore given to bidentate monoanionic, neutral or dianionic ligands L', in particular monoanionic ligands, which, with the metal, form a cyclometallated five- or six-membered ring with at least one metal-carbon bond, in particular a cyclometallated five-membered ring. These are, in particular, ligands as are generally used in the area of phosphorescent metal complexes for organic electroluminescent devices, i.e. ligands of the type phenylpyridine, naphthylpyridine, phenylquinoline, phenylisoquinoline, etc., each of which may be substituted by one or more radicals R. A multiplicity of ligands of this type is known to the person skilled in the art in the area of phosphorescent electroluminescent devices, and he will be able, without inventive step, to select further ligands of this type as ligand L' for compounds of the formula (1). The combination of two groups as depicted by the following formulae (40) to (64) is generally particularly suitable for this purpose, where one group is preferably bonded via a neutral nitrogen atom or a carbene carbon atom and the other group is preferably bonded via a negatively charged carbon atom or a negatively charged nitrogen atom. The ligand L' can then be formed from the groups of the formulae (40) to (64) through these groups bonding to one another in each case at the position denoted by #. The position at which the groups coordinate to the metal is denoted by *. These groups may also be bonded to the ligand L via one or two bridging units V.

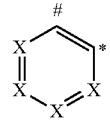

formula (40)

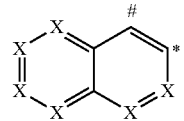

formula (41)

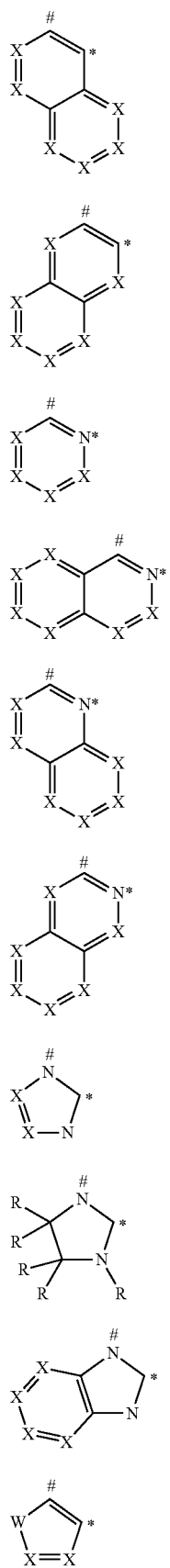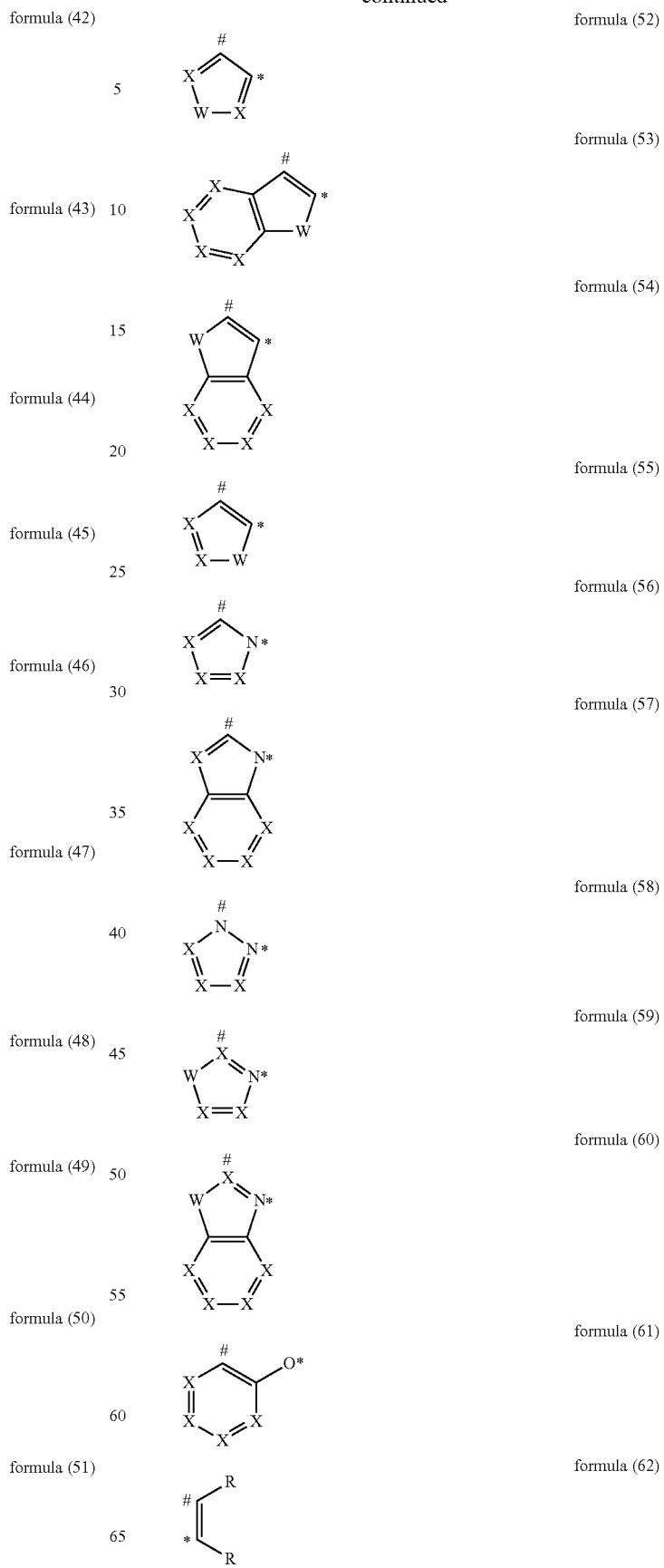

formula (63)

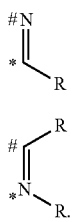

formula (64)

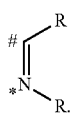

W here has the meaning given above and X stands on each occurrence, identically or differently, for CR or N, where the above-mentioned limitation, that at least two adjacent groups X stand for CR and the radicals R form a ring of the formula (3), does not apply here; and R has the same meaning as described above. Preferably, a maximum of three symbols X in each group stand for N, particularly preferably a maximum of two symbols X in each group stand for N, very particularly preferably a maximum of one symbol X in each group stands for N. Especially preferably, all symbols X stand for CR.

Likewise preferred ligands L are $\eta^5$-cyclopentadienyl, $\eta^5$-pentamethyl-cyclopentadienyl, $\eta^6$-benzene or $\eta^7$-cycloheptatrienyl, each of which may be substituted by one or more radicals R.

Likewise preferred ligands L' are 1,3,5-cis,cis-cyclohexane derivatives, in particular of the formula (65), 1,1,1-tri(methylene)methane derivatives, in particular of the formula (66), and 1,1,1-trisubstituted methanes, in particular of the formula (67) and (68), formula (65)

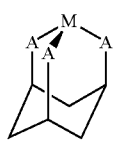

formula (66)

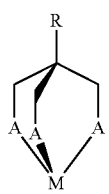

formula (67)

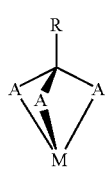

formula (68)

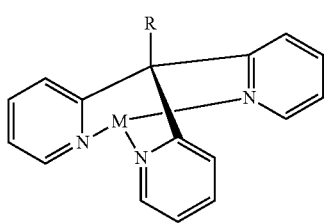

where the coordination to the metal M is shown in each of the formulae, R has the meaning given above, and A stands, identically or differently on each occurrence, for O⁻, S⁻, COO⁻, PR$_2$ or NR$_2$.

Preferred radicals R in the structures shown above are selected on each occurrence, identically or differently, from the group consisting of H, D, F, Br, N(R$^1$)$_2$, CN, B(OR$^1$)$_2$, C(=O)R$^1$, P(=O)(R$^1$)$_2$, a straight-chain alkyl group having 1 to 10 C atoms or a straight-chain alkenyl or alkynyl group having 2 to 10 C atoms or a branched or cyclic alkyl group having 3 to 10 C atoms, each of which may be substituted by one or more radicals R$^1$, where one or more H atoms may be replaced by D or F, or an aromatic or heteroaromatic ring system having 5 to 14 aromatic ring atoms, which may in each case be substituted by one or more radicals R$^1$; two or more adjacent radicals R here may also form a mono- or polycyclic, aliphatic, aromatic and/or benzo-fused ring system with one another. Particularly preferred radicals R are selected on each occurrence, identically or differently, from the group consisting of H, D, F, Br, CN, B(OR$^1$)$_2$, a straight-chain alkyl group having 1 to 5 C atoms, in particular methyl, or a branched or cyclic alkyl group having 3 to 5 C atoms, in particular isopropyl or tert-butyl, where one or more H atoms may be replaced by D or F, or an aromatic or heteroaromatic ring system having 5 to 12 aromatic ring atoms, which may in each case be substituted by one or more radicals R$^1$; two or more radicals R here may also form a mono- or polycyclic, aliphatic, aromatic and/or benzo-fused ring system with one another.

In a preferred embodiment of the invention, L' is coordinated to M via one or more aromatic or heteroaromatic groups, but is not coordinated via non-aromatic and non-heteroaromatic groups.

The complexes according to the invention can be facial or pseudofacial or they can be meridional or pseudomeridional.

The ligands L may also be chiral, depending on the structure. This is the case, for example, if the groups A$^3$ and A$^4$ in the structure of the formula (3) are different or if they contain substituents, for example alkyl, alkoxy, dialkylamino or aralkyl groups, which have one or more stereocentres. Since the basic structure of the complex may also be a chiral structure, the formation of diastereomers and a number of enantiomer pairs is possible. The complexes according to the invention then encompass both the mixtures of the various diastereomers or the corresponding racemates and also the individual isolated diastereomers or enantiomers.

The compounds can also be employed as chiral, enantiomerically pure complexes, which are able to emit circular-polarised light. This may have advantages, since it makes the polarisation filter on the device superfluous. In addition, complexes of this type are also suitable for use in safety labels, since, besides the emission, they also have the polarisation of the light as readily legible feature.

The preferred embodiments indicated above can be combined with one another as desired. In a particularly preferred embodiment of the invention, the preferred embodiments indicated above apply simultaneously.

The metal complexes according to the invention can in principle be prepared by various processes. However, the processes described below have proven particularly suitable.

The present invention therefore furthermore relates to a process for the preparation of the metal complex compounds of the formula (1) by reaction of the corresponding free ligands L and optionally L' with metal alkoxides of the formula (69), with metal ketoketonates of the formula (70), with metal halides of the formula (71) or with dimeric metal complexes of the formula (72) or with metal complexes of the formula (73), M(OR)$_n$          formula (69)

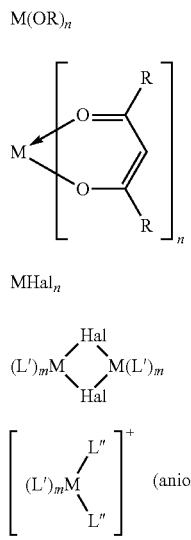

formula (70)

MHal$_n$          formula (71)

$$(L')_mM\begin{matrix}\diagup Hal \diagdown \\ \diagdown Hal \diagup\end{matrix}M(L')_m$$     formula (72)

$$\left[(L')_mM\begin{matrix}\diagup L'' \\ \diagdown L''\end{matrix}\right]^+ \text{(anion)}$$     formula (73)

where the symbols M, m, n and R have the meanings indicated above, Hal=F, Cl, Br or I, L" stands for an alcohol, in particular for an alcohol having 1 to 4 C atoms, or a nitrile, in particular acetonitrile or benzonitrile, and (anion) stands for a non-coordinating anion, such as, for example, triflate It is likewise possible to use metal compounds, in particular iridium compounds, which carry both alkoxide and/or halide and/or hydroxyl radicals as well as ketoketonate radicals. These compounds may also be charged. Corresponding iridium compounds which are particularly suitable as starting materials are disclosed in WO 2004/085449. [IrCl$_2$(acac)$_2$]$^-$, for exam-pie Na[IrCl$_2$(acac)$_2$], are particularly suitable. Metal complexes with acetyl-acetonate derivatives as ligand, for example Ir(acac)$_3$ or tris(2,2,6,6-tetra-methylheptane-3,5-dionato)iridium, and IrCl$_3$.xH$_2$O, where x usually stands for a number between 2 and 4.

Suitable platinum starting materials are, for example, PtCl$_2$, K$_2$[PtCl$_4$], PtCl$_2$(DMSO)$_2$, Pt(Me)$_2$(DMSO)$_2$ or PtCl$_2$(benzonitrile)$_2$.

The synthesis of the complexes is preferably carried out as described in WO 2002/060910, WO 2004/085449 and WO 2007/065523. Heteroleptic complexes can also be synthesised, for example, in accordance with WO 2005/042548. The synthesis here can also be activated, for example, thermally, photochemically and/or by microwave radiation. In order to activate the reaction, it is furthermore also possible to add a Lewis acid, for example a silver salt or AlCl$_3$.

The reactions can be carried out without addition of solvents or melting aids in a melt of the corresponding ligands to be o-metallated. If necessary, solvents or melting aids can be added. Suitable solvents are protic or aprotic solvents, such as aliphatic and/or aromatic alcohols (methanol, ethanol, isopropanol, t-butanol, etc.), oligo- and poly-alcohols (ethylene glycol, 1,2-propanediol, glycerol, etc.), alcohol ethers (ethoxyethanol, diethylene glycol, triethylene glycol, polyethylene glycol, etc.), ethers (di- and triethylene glycol dimethyl ether, diphenyl ether, etc.), aromatic, heteroaromatic and/or aliphatic hydrocarbons (toluene, xylene, mesitylene, chlorobenzene, pyridine, lutidine, quinoline, isoquinoline, tridecane, hexa-decane, etc.), amides (DMF, DMAC, etc.), lactams (NMP), sulfoxides (DMSO) or sulfones (dimethyl sulfone, sulfolane, etc.). Suitable melting aids are compounds which are in solid form at room temperature, but melt on warming of the reaction mixture and dissolve the reactants, so that a homogeneous melt forms. Particularly suitable are biphenyl, m-terphenyl, triphenylene, 1,2-, 1,3-, 1,4-bisphenoxybenzene, triphenylphosphine oxide, 18-crown-6, phenol, 1-naphthol, hydroquinone, etc.

These processes, optionally followed by purification, such as, for example, recrystallisation or sublimation, enable the compounds of the formula (1) according to the invention to be obtained in high purity, preferably greater than 99% (determined by means of $^1$H-NMR and/or HPLC).

The compounds according to the invention can also be rendered soluble by suitable substitution, for example by relatively long alkyl groups (about 4 to 20 C atoms), in particular branched alkyl groups, or optionally substituted aryl groups, for example, xylyl, mesityl or branched terphenyl or quaterphenyl groups. Compounds of this type are then soluble in common organic solvents, such as, for example, toluene or xylene, at room temperature in sufficient concentration to be able to process the complexes from solution. These soluble compounds are particularly suitable for processing from solution, for example by printing processes.

The compounds according to the invention can also be mixed with a polymer. It is likewise possible to incorporate these compounds covalently into a polymer. This is possible, in particular, with compounds which are substituted by reactive leaving groups, such as bromine, iodine, chlorine, boronic acid or boronic acid ester, or by reactive, polymerisable groups, such as olefins or oxetanes. These can be used as monomers for the production of corresponding oligomers, dendrimers or polymers. The oligomerisation or polymerisation here preferably takes place via the halogen functionality or the boronic acid functionality or via the polymerisable group. It is furthermore possible to crosslink the polymers via groups of this type. The compounds and polymers according to the invention can be employed as crosslinked or uncrosslinked layer.

The invention therefore furthermore relates to oligomers, polymers or dendrimers containing one or more of the above-mentioned compounds according to the invention, where one or more bonds are present from the compound according to the invention to the polymer, oligomer or dendrimer. Depending on the linking of the compound according to the invention, this therefore forms a side chain of the oligomer or polymer or is linked in the main chain. The polymers, oligomers or dendrimers may be conjugated, partially conjugated or non-conjugated. The oligomers or polymers may be linear, branched or dendritic. The same preferences as described above apply to the recurring units of the compounds according to the invention in oligomers, dendrimers and polymers.

For the preparation of the oligomers or polymers, the monomers according to the invention are homopolymerised or copolymerised with further monomers. Preference is given to copolymers, where the units of the formula (1) or the preferred embodiments described above are present in amounts of 0.01 to 99.9 mol %, preferably 5 to 90 mol %, particularly preferably 20 to 80 mol %. Suitable and preferred comonomers which form the polymer backbone are selected from fluorenes (for example in accordance with EP 842208 or WO 2000/022026), spirobifluorenes (for example in accordance with EP 707020, EP 894107 or WO 2006/061181), paraphenylenes (for example in accordance with WO 92/18552), carbazoles (for example in accordance with WO 2004/070772 or WO 2004/113468), thiophenes (for example in accordance with EP 1028136), dihydrophenanthrenes (for example in accordance with WO 2005/014689), cis- and trans-indeno-fluorenes (for example in accordance with WO 2004/041901 or WO 2004/113412), ketones (for example in accordance with WO 2005/040302), phenanthrenes (for example in accordance with WO 2005/104264 or WO 2007/017066) or also a plurality of these units. The polymers, oligomers and dendrimers may also contain further units, for example hole-transport units, in particular those based on triarylamines, and/or electron-transport units.

The present invention again furthermore relates to a formulation comprising a compound according to the invention or an oligomer, polymer or dendrimer according to the invention and at least one further compound. The further compound can be, for example, a solvent. However, the further compound can also be a further organic or inorganic compound which is likewise employed in the electronic device, for example a matrix material. This further compound may also be polymeric.

Formulations of the compounds according to the invention are necessary for processing of the compounds according to the invention from the liquid phase, for example by spin coating or by printing processes. These formulations can be, for example, solutions, dispersions or emulsions. It may be preferred to use mixtures of two or more solvents for this purpose. Suitable and preferred solvents are, for example, toluene, anisole, o-, m- or p-xylene, methyl benzoate, mesitylene, tetralin, veratrol, THF, methyl-THF, THP, chlorobenzene, dioxane, phenoxytoluene, in particular 3-phenoxytoluene, (−)-fenchone, 1,2,3,5-tetramethylbenzene, 1,2,4,5-tetramethylbenzene, 1-methylnaphthalene, 2-methylbenzothiazole, 2-phenoxyethanol, 2-pyrrolidinone, 3-methylanisole, 4-methylanisole, 3,4-dimethylanisole, 3,5-dimethylanisole, acetophenone, α-terpineol, benzothiazole, butyl benzoate, cumene, cyclohexanol, cyclohexanone, cyclohexylbenzene, decalin, dodecylbenzene, ethyl benzoate, indane, methyl benzoate, NMP, p-cymene, phenetole, 1,4-diisopropylbenzene, dibenzyl ether, diethylene glycol butyl methyl ether, triethylene glycol butyl methyl ether, diethylene glycol dibutyl ether, triethylene glycol dimethyl ether, diethylene glycol monobutyl ether, tripropylene glycol dimethyl ether, tetraethylene glycol dimethyl ether, 2-isopropylnaphthalene, pentylbenzene, hexylbenzene, heptylbenzene, octylbenzene, 1,1-bis(3,4-dimethylphenyl)ethane or mixtures of these solvents.

The complexes of the formula (1) described above or the preferred embodiments indicated above can be used as active component in the electronic device. An electronic device is taken to mean a device which comprises an anode, a cathode and at least one layer, where this layer comprises at least one organic or organometallic compound. The electronic device according to the invention thus comprises an anode, a cathode and at least one layer which comprises at least one compound of the formula (1) given above. Preferred electronic devices here are selected from the group consisting of organic electroluminescent devices (OLEDs, PLEDs), organic integrated circuits (O-ICs), organic field-effect transistors (O-FETs), organic thin-film transistors (O-TFTs), organic light-emitting transistors (O-LETs), organic solar cells (O-SCs), organic optical detectors, organic photoreceptors, organic field-quench devices (O-FQDs), light-emitting electrochemical cells (LECs) or organic laser diodes (O-lasers), comprising at least one compound of the formula (1) given above in at least one layer. Particular preference is given to organic electroluminescent devices. Active components are generally organic or inorganic materials which have been introduced between the anode and cathode, for example charge-injection, charge-transport or charge-blocking materials, but in particular emission materials and matrix materials. The compounds according to the invention exhibit particularly good properties as emission material in organic electroluminescent devices. Organic electroluminescent devices are therefore a preferred embodiment of the invention. Furthermore, the compounds according to the invention can be employed for the generation of singlet oxygen or in photocatalysis.

The organic electroluminescent device comprises a cathode, an anode and at least one emitting layer. Apart from these layers, it may also comprise further layers, for example in each case one or more hole-injection layers, hole-transport layers, hole-blocking layers, electron-transport layers, electron-injection layers, exciton-blocking layers, electron-blocking layers, charge-generation layers and/or organic or inorganic p/n junctions. It is possible here for one or more hole-transport layers to be p-doped, for example with metal oxides, such as $MoO_3$ or $WO_3$, or with (per)fluorinated electron-deficient aromatic compounds, and/or for one or more electron-transport layers to be n-doped. Interlayers which have, for example, an exciton-blocking function and/or control the charge balance in the electroluminescent device may likewise be introduced between two emitting layers. However, it should be pointed out that each of these layers does not necessarily have to be present.

The organic electroluminescent device here may comprise one emitting layer or a plurality of emitting layers. If a plurality of emission layers are present, these preferably have in total a plurality of emission maxima between 380 nm and 750 nm, resulting overall in white emission, i.e. various emitting compounds which are able to fluoresce or phosphoresce are used in the emitting layers. Particular preference is given to three-layer systems, where the three layers exhibit blue, green and orange or red emission (for the basic structure see, for example, WO 2005/011013), or systems which have more than three emitting layers. It may also be a hybrid system, where one or more layers fluoresce and one or more other layers phosphoresce.

In a preferred embodiment of the invention, the organic electroluminescent device comprises the compound of the formula (1) or the preferred embodiments indicated above as emitting compound in one or more emitting layers.

If the compound of the formula (1) is employed as emitting compound in an emitting layer, it is preferably employed in combination with one or more matrix materials. The mixture comprising the compound of the formula (1) and the matrix material comprises between 1 and 99% by vol., preferably between 2 and 90% by vol., particularly preferably between 3 and 40% by vol., especially between 5 and 15% by vol., of the compound of the formula (1), based on the mixture as a whole comprising emitter and matrix material. Correspondingly, the mixture comprises between 99.9 and 1% by vol., preferably between 99 and 10% by vol., particularly preferably between 97 and 60% by vol., in particular between 95 and 85% by vol., of the matrix material, based on the mixture as a whole comprising emitter and matrix material.

The matrix material employed can in general be all materials which are known for this purpose in accordance with the prior art. The triplet level of the matrix material is preferably higher than the triplet level of the emitter.

Suitable matrix materials for the compounds according to the invention are ketones, phosphine oxides, sulfoxides and sulfones, for example in accordance with WO 2004/013080, WO 2004/093207, WO 2006/005627 or WO 2010/006680, triarylamines, carbazole derivatives, for example CBP (N,N-biscarbazolylbiphenyl), m-CBP or the carbazole derivatives disclosed in WO 2005/039246, US 2005/0069729, JP 2004/288381, EP 1205527, WO 2008/086851 or US 2009/0134784, indolocarbazole derivatives, for example in accordance with WO 2007/063754 or WO 2008/056746, indenocarbazole derivatives, for example in accordance with WO 2010/136109 or WO 2011/000455, azacarbazoles, for example in accordance with EP 1617710, EP 1617711, EP 1731584, JP 2005/347160, bipolar matrix materials, for example in accordance with WO 2007/137725, silanes, for example in accordance with WO 2005/111172, azaboroles or boronic esters, for example in accordance with WO 2006/117052, diazasilole derivatives, for example in accordance with WO 2010/054729, diazaphosphole derivatives, for example in accordance with WO 2010/054730, triazine derivatives, for example in accordance with WO 2010/015306, WO 2007/063754 or WO 2008/056746, zinc complexes, for example in accordance with EP 652273 or WO 2009/062578, dibenzofuran derivatives, for example in accordance with WO 2009/148015, or bridged carbazole derivatives, for example in accordance with US 2009/0136779, WO 2010/050778, WO 2011/042107 or WO 2011/088877.

It may also be preferred to employ a plurality of different matrix materials as a mixture, in particular at least one electron-conducting matrix material and at least one hole-conducting matrix material. A preferred combination is, for example, the use of an aromatic ketone, a triazine derivative or a phosphine oxide derivative with a triarylamine derivative or a carbazole derivative as mixed matrix for the metal complex according to the invention. Preference is likewise given to the use of a mixture of a charge-transporting matrix material and an electrically inert matrix material which is not involved or not essentially involved in charge transport, as described, for example, in WO 2010/108579.

It is furthermore preferred to employ a mixture of two or more triplet emitters together with a matrix. The triplet emitter having the shorter-wave emission spectrum serves as co-matrix for the triplet-emitter having the longer-wave emission spectrum. Thus, for example, the complexes of the formula (1) according to the invention can be employed as co-matrix for triplet emitters emitting at longer wavelength, for example for green- or red-emitting triplet emitters.

The compounds according to the invention can also be employed in other functions in the electronic device, for example as hole-transport material in a hole-injection or -transport layer, as charge-generation material or as electron-blocking material. The complexes according to the invention can likewise be employed as matrix material for other phosphorescent metal complexes in an emitting layer.

The cathode preferably comprises metals having a low work function, metal alloys or multilayered structures comprising various metals, such as, for example, alkaline-earth metals, alkali metals, main-group metals or lanthanoids (for example Ca, Ba, Mg, Al, In, Mg, Yb, Sm, etc.). Also suitable are alloys comprising an alkali metal or alkaline-earth metal and silver, for example an alloy comprising magnesium and silver. In the case of multilayered structures, further metals which have a relatively high work function, such as, for example, Ag, may also be used in addition to the said metals, in which case combinations of the metals, such as, for example, Mg/Ag, Ca/Ag or Ba/Ag, are generally used. It may also be preferred to introduce a thin interlayer of a material having a high dielectric constant between a metallic cathode and the organic semiconductor. Suitable for this purpose are, for example, alkali metal or alkaline-earth metal fluorides, but also the corresponding oxides or carbonates (for example LiF, $Li_2O$, $BaF_2$, MgO, NaF, CsF, $Cs_2CO_3$, etc.). Organic alkali-metal complexes, for example Liq (lithium quinolinate), are likewise suitable for this purpose. The layer thickness of this layer is preferably between 0.5 and 5 nm.

The anode preferably comprises materials having a high work function. The anode preferably has a work function of greater than 4.5 eV vs. vacuum. Suitable for this purpose are on the one hand metals having a high redox potential, such as, for example, Ag, Pt or Au. On the other hand, metal/metal oxide electrodes (for example Al/Ni/NiOx, Al/PtOx) may also be preferred. For some applications, at least one of the electrodes must be transparent or partially transparent in order either to facilitate irradiation of the organic material (O-SCs) or the coupling-out of light (OLEDs/PLEDs, O-LASERs). Preferred anode materials here are conductive mixed metal oxides. Particular preference is given to indium tin oxide (ITO) or indium zinc oxide (IZO). Preference is furthermore given to conductive, doped organic materials, in particular conductive doped polymers, for example PEDOT, PANI or derivatives of these polymers. It is furthermore preferred for a p-doped hole-transport material to be applied to the anode as hole-injection layer, where suitable p-dopants are metal oxides, for example $MoO_3$ or $WO_3$, or (per)fluorinated electron-deficient aromatic compounds. Further suitable p-dopants are HAT-CN (hexacyanohexaazatriphenylene) or the compound NPD9 from Novaled. A layer of this type simplifies hole injection in materials having a low HOMO, i.e. a large value of the HOMO.

All materials as are used in accordance with the prior art for the layers can generally be used in the further layers, and the person skilled in the art will be able to combine each of these materials with the materials according to the invention in an electronic device without inventive step.

The device is correspondingly structured (depending on the application), provided with contacts and finally hermetically sealed, since the lifetime of such devices is drastically shortened in the presence of water and/or air.

Preference is furthermore given to an organic electroluminescent device, characterised in that one or more layers are applied by means of a sublimation process, in which the materials are vapour-deposited in vacuum sublimation units at an initial pressure of usually less than $10^{-5}$ mbar, preferably less than 100 mbar. It is also possible for the initial pressure to be even lower or even higher, for example less than $10^{-7}$ mbar.

Preference is likewise given to an organic electroluminescent device, characterised in that one or more layers are applied by means of the OVPD (organic vapour phase deposition) process or with the aid of carrier-gas sublimation, in which the materials are applied at a pressure of between $10^5$ mbar and 1 bar. A special case of this process is the OVJP (organic vapour jet printing) process, in which the materials are applied directly through a nozzle and thus structured (for example M. S. Arnold et al., *Appl. Phys. Lett.* 2008, 92, 053301).

Preference is furthermore given to an organic electroluminescent device, characterised in that one or more layers are produced from solution, such as, for example, by spin coating, or by means of any desired printing process, such as, for example, screen printing, flexographic printing, offset printing or nozzle printing, but particularly preferably LITI (light induced thermal imaging, thermal transfer printing) or ink-jet printing. Soluble compounds are necessary for this purpose, which are obtained, for example, through suitable substitution.

The organic electroluminescent device may also be produced as a hybrid system by applying one or more layers from solution and applying one or more other layers by vapour deposition. Thus, for example, it is possible to apply an emitting layer comprising a compound of the formula (1) and a matrix material from solution and to apply a hole-blocking layer and/or an electron-transport layer on top by vacuum vapour deposition.

These processes are generally known to the person skilled in the art and can be applied by him without problems to organic electroluminescent devices comprising compounds of the formula (1) or the preferred embodiments indicated above.

The electronic devices according to the invention, in particular organic electroluminescent devices, are distinguished over the prior art by one or more of the following surprising advantages:
1. Organic electroluminescent devices comprising compounds according to the invention as emitting materials have a very long lifetime.
2. Organic electroluminescent devices comprising compounds according to the invention as emitting materials have excellent efficiency. In particular, the efficiency is significantly higher compared with analogous compounds which do not contain a structural unit of the formula (3).
3. The metal complexes according to the invention have excellent solubility in a multiplicity of organic solvents, in particular in organic hydrocarbons. The solubility here is significantly improved compared with analogous compounds which do not contain a structural unit of the formula (3). This results in simplified purification during the synthesis of the complexes and in excellent suitability thereof for the production of OLEDs in solution-processed processes, for example printing processes.
4. The metal complexes according to the invention have very high oxidation stability in air and light, enabling them to be processed from solution, for example by printing processes, even in air.
5. Some of the metal complexes according to the invention have a very narrow emission spectrum, which results in high colour purity of the emission, as desired, in particular, for display applications.
6. The metal complexes according to the invention have reduced aggregation compared with analogous compounds which do not contain a structural unit of the formula (3). This is evident from a lower sublimation temperature compared with analogous complexes which do not contain a structural unit of the formula (3).

These advantages mentioned above are not accompanied by an impairment of the other electronic properties.

The invention is explained in greater detail by the following examples, without wishing to restrict it thereby. The person skilled in the art will be able to produce further electronic devices on the basis of the descriptions without inventive step and will thus be able to carry out the invention throughout the range claimed.

The FIGURE shows the photoluminescence spectrum of a tris(benzo[h]quinoline)iridium complex which contains a group of the formula (3), compared with the spectrum of the corresponding complex without the group of the formula (3). The spectra were measured in an approx. $10^{-5}$ molar solution in degassed toluene at room temperature. The narrower emission band having a full width at half maximum (FWHM) value of 68 nm compared with 81 nm in the case of the compound without a group of the formula (3) is clearly evident.

EXAMPLES

The following syntheses are carried out, unless indicated otherwise, in dried solvents under a protective-gas atmosphere. The metal complexes are additionally handled with exclusion of light or under yellow light. The solvents and reagents can be purchased, for example, from Sigma-ALDRICH or ABCR. The respective numbers in square brackets or the numbers indicated for individual compounds relate to the CAS numbers of the compounds known from the literature.

A: Synthesis of the Synthones S and SB

Example S1: 1,1,2,2,3,3-Hexamethylindane-d18, S1

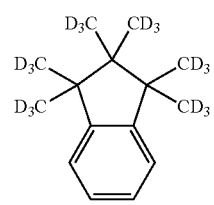 [SMILES: [2H]C([2H])([2H])C1(C([2H])([2H])[2H])c2ccccc2C(C([2H])([2H])[2H])(C([2H])([2H])[2H])C1(C([2H])([2H])[2H])C([2H])([2H])[2H]]

Preparation analogous to J. Baran, et al., J. Org. Chem. 1988, 53, 19, 4626.

18.7 ml (170 mmol) of titanium tetrachloride are added dropwise with vigorous stirring to a mixture, cooled to −78° C., of 160.7 g (1 mol) of 2-chloro-2-phenylpropane-d6 [53102-26-4], 230.8 g (2.4 mol) of 2,3-dimethylbut-2-ene-d12 [69165-86-2] and 2500 ml of anhydrous dichloromethane, and the mixture is stirred for a further 2 h. The cold reaction mixture is poured into 1500 ml of 3 N hydrochloric acid with vigorous stirring, stirred for a further 20 min., the organic phase is separated off, washed twice with 1000 ml of water each time, once with 500 ml of saturated sodium carbonate solution, once with 500 ml of saturated sodium chloride solution, dried over magnesium sulfate, the desiccant is filtered off, the filtrate is freed from dichloromethane in vacuo, and the residue is subjected to fractional distillation (core fraction 60-65° C., about 0.5 mbar). Yield: 163.1 g (740 mmol), 74%; purity: about 95% according to NMR.

The following compounds can be prepared analogously:

| Ex. | Starting materials | Product | Yield |
|---|---|---|---|
| S2 | 1716-38-7/563-79-1 | S2 | 68% |
| S3 | 934-53-2/563-79-1<br>Use of 4.4 mol<br>of 2,3-dimethylbut-2-ene | S3 | 49% |

Example S4: Pinacolyl 1,1,3,3-tetramethylindane-5-boronate, S4

Variant 1

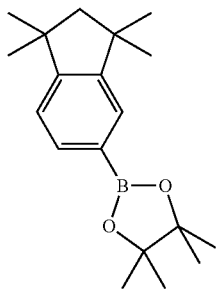

A) 5-Bromo-1,1,3,3-tetramethylindane [169695-24-3], S4-Br

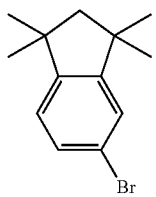

0.6 g of anhydrous iron(III) chloride and then, dropwise with exclusion of light, a mixture of 25.6 ml (500 mol) of bromine and 300 ml of dichloromethane are added to a solution, cooled to 0° C., of 87.2 g (500 mmol) of 1,1,3,3-tetramethylindane [4834-33-7] in 1000 ml of dichloromethane at such a rate that the temperature does not exceed +5° C. The reaction mixture is stirred at room temperature for a further 16 h, 300 ml of saturated sodium sulfite solution are then slowly added, the aqueous phase is separated off, the organic phase is washed three times with 1000 ml of water each time, dried over sodium sulfate, filtered through a short silica-gel column, and the solvent is then stripped off. Finally, the solid is recrystallised once from a little (about 100-150 ml) ethanol. Yield: 121.5 g (480 mmol), 96%; purity: about 95% according to $^1$H-NMR.

B) Pinacolyl 1,1,3,3-tetramethylindane-5-boronate, S4

A mixture of 25.3 g (100 mmol) of S4-Br, 25.4 g (120 mmol) of bis(pinacolato)diborane [73183-34-3], 29.5 g (300 mmol) of potassium acetate, anhydrous, 561 mg (2 mmol) of tricyclohexylphosphine and 249 mg (1 mmol) of palladium (II) acetate and 400 ml of dioxane is stirred at 80° C. for 16 h. After removal of the solvent in vacuo, the residue is taken up in 500 ml of dichloromethane, filtered through a Celite bed, the filtrate is evaporated in vacuo until crystallisation commences, and finally about 100 ml of methanol are also added dropwise in order to complete the crystallisation. Yield: 27.9 g (93 mmol), 93%; purity: about 95% according to $^1$H-NMR. Boronic acid esters formed as oil can also be reacted further without purification.

Variant 2

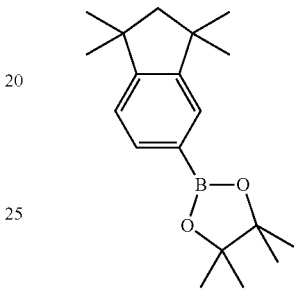

3.3 g (5 mmol) of bis[(1,2,5,6-t)-1,5-cyclooctadiene]di-μ-methoxydiiridium-(I) [12148-71-9], then 2.7 g (10 mmol) of 4,4'-di-tert-butyl-[2,2']bipyridinyl [72914-19-3] and then 5.1 g (10 mmol) of bis(pinacolato)diborane are added to 800 ml of n-heptane, and the mixture is stirred at room temperature for 15 min. 127.0 g (500 mmol) of bis(pinacolato) diborane and then 87.2 g (500 mmol) of 1,1,3,3-tetramethylindane [4834-33-7] are subsequently added, and the mixture is warmed at 80° C. for 12 h (TLC check, heptane: ethyl acetate 5:1). After cooling of the reaction mixture, 300 ml of ethyl acetate are added, the mixture is filtered through a silica-gel bed, and the filtrate is evaporated to dryness in vacuo. The crude product is recrystallised twice from acetone (about 800 ml). Yield: 136.6 g (455 mmol), 91%; purity: about 99% according to $^1$H-NMR.

The following compounds can be prepared analogously:

| Ex. | Starting material | Bromide | Product Boronic acid ester Variant | Yield |
|---|---|---|---|---|
| S5 | ![structure] 91324-94-6 | ![structure] S5-Br | ![structure] S51 | 80% |

-continued
| Ex. | Starting material | Bromide | Product Boronic acid ester Variant | Yield |
|---|---|---|---|---|
| S5 | 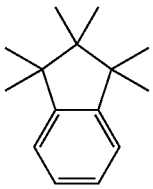<br>91324-94-6 | — | 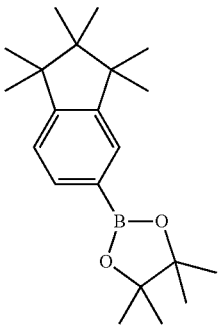<br>S51 | 95% |
| S6 | 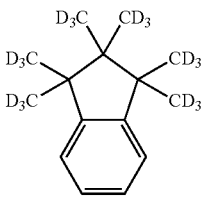<br>S1 | 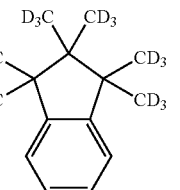<br>S6-Br | 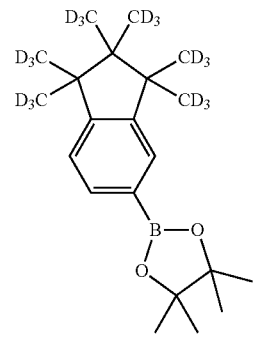 [SMILES: [2H]C([2H])([2H])C1(C([2H])([2H])[2H])c2ccc(B3OC(C)(C)C(C)(C)O3)cc2C(C([2H])([2H])[2H])(C([2H])([2H])[2H])C1(C([2H])([2H])[2H])C([2H])([2H])[2H]]<br>S61 | 78% |
| S7 | 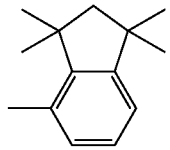<br>479070-73-0 | <br>S7-Br<br>Separation of regioisomers by distillation | 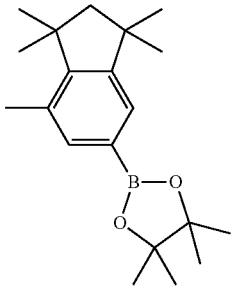<br>S71 | 60% |
| S8 | 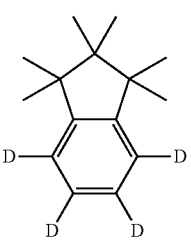 [SMILES: [2H]c1c([2H])c([2H])c2c(c1[2H])C(C)(C)C(C)(C)C2(C)C]<br>142076-41-3 | 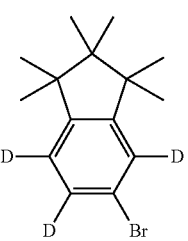<br>S8-Br | 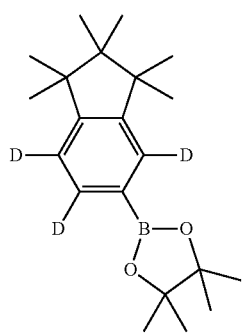 [SMILES: [2H]c1c([2H])c2c(c([2H])c1B1OC(C)(C)C(C)(C)O1)C(C)(C)C(C)(C)C2(C)C]<br>S81 | 81% |

-continued
| Ex. | Starting material | Bromide | Product Boronic acid ester Variant | Yield |
|---|---|---|---|---|
| S9 | 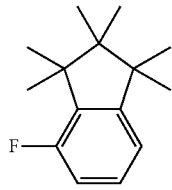 [SMILES: CC1(C)c2cccc(F)c2C(C)(C)C1(C)C]<br>S2 | 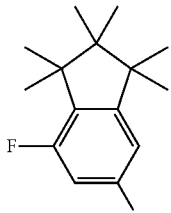<br>S9-Br<br>Separation of regioisomers by distillation | 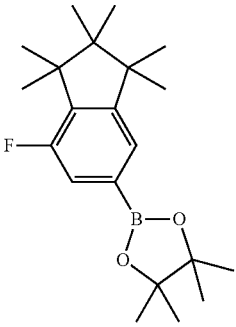 [SMILES: CC1(C)OB(c2cc(F)c3c(c2)C(C)(C)C(C)(C)C3(C)C)OC1(C)C]<br>S91 | 43% |
| S10 | 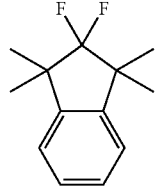<br>59508-28-0 | 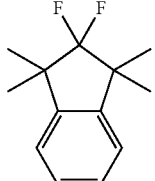<br>S10-Br | 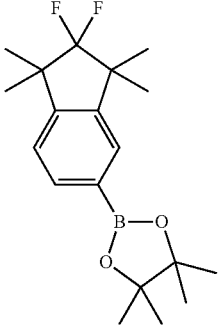<br>S101 | 78% |
| S11 | <br>4486-29-7 | <br>16499-72-2<br>S11-Br | 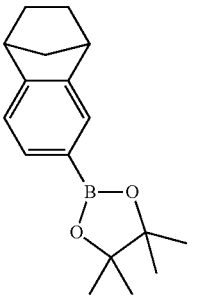<br>S111 | 80% |
| S12 | 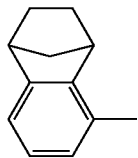<br>215725-16-9 | 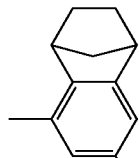<br>S12-Br<br>Separation of regioisomers by distillation | 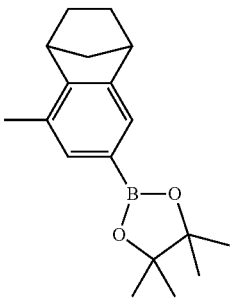<br>S121 | 68% |

-continued
| Ex. | Starting material | Bromide | Product Boronic acid ester Variant | Yield |
|---|---|---|---|---|
| S13 | 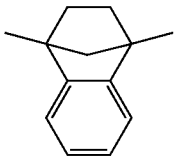<br>66684-45-5 | 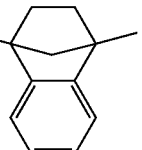<br>S13-Br | 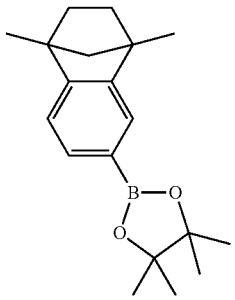<br>S131 | 77% |
| S13 | 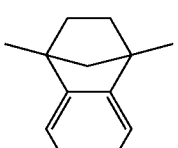<br>66684-45-5 | — | 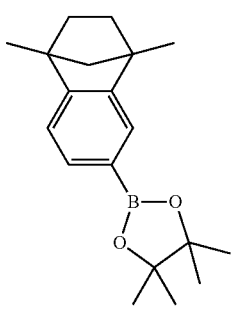<br>S132 | 93% |
| S14 | 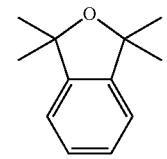<br>113710-83-1 | 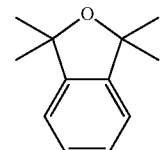<br>S14-Br | 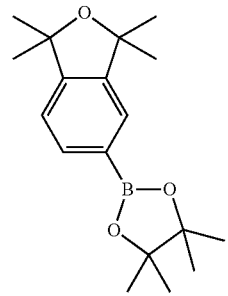<br>S141 | 79% |
| S14 | 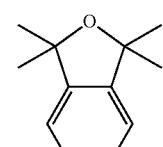<br>113710-83-1 | — | 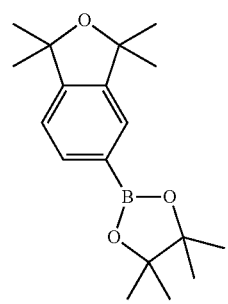<br>S-142 | 89% |

-continued
| Ex. | Starting material | Bromide | Product Boronic acid ester Variant | Yield |
|---|---|---|---|---|
| S15 | 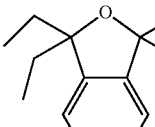<br>65089-09-0 | 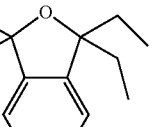<br>S15-Br | 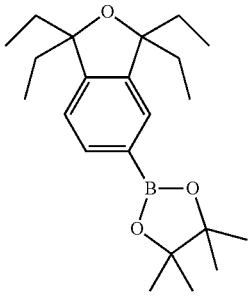 [SMILES: CCC1(CC)OC(CC)(CC)c2cc(B3OC(C)(C)C(C)(C)O3)ccc21]<br>S151 | 70% |
| S16 | 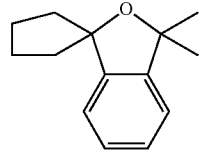<br>1020726-74-2 | 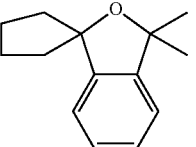<br>S16-Br<br>Separation of regioisomers by distillation | 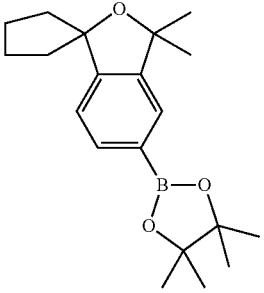 [SMILES: CC1(C)OC2(CCCC2)c2ccc(B3OC(C)(C)C(C)(C)O3)cc21]<br>S161 | 54% |
| S17 | 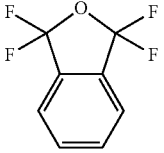<br>651-39-8 | 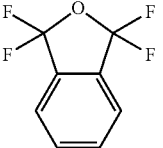<br>S17-Br | 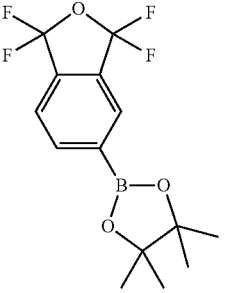 [SMILES: CC1(C)OB(c2ccc3c(c2)C(F)(F)OC3(F)F)OC1(C)C]<br>S171 | 81% |
| S18 | 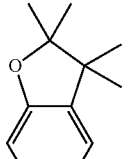<br>124797-68-8 | 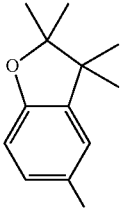<br>S18-Br<br>Separation of regioisomers by distillation | 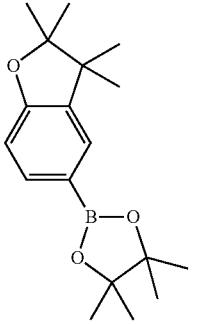 [SMILES: CC1(C)OB(c2ccc3c(c2)C(C)(C)C(C)(C)O3)OC1(C)C]<br>S181 | 56% |

-continued

| Ex. | Starting material | Bromide | Product Boronic acid ester Variant | Yield |
|---|---|---|---|---|
| S19 | — | 73790-19-9 S19-Br | S191 | 94% 1 Step |
| S20 | 35185-96-7 | S20-Br | S201 | 82% |
| S21 | 61200-08-6 | S21-Br | S211 | 79% |
| S22 | 3723-85-1 | S22-Br | S221 | 23% |

-continued
| Ex. | Starting material | Bromide | Product Boronic acid ester Variant | Yield |
|---|---|---|---|---|
| S23 | 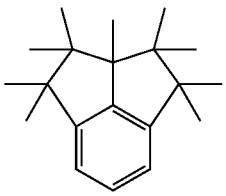<br>S3 | 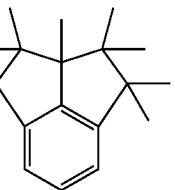<br>S22-Br | 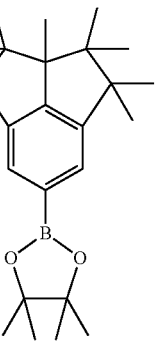<br>S231 | 77% |
| SB1 | <br>4175-52-4 | <br>SB1-Br | 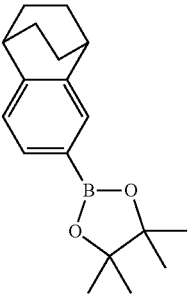 [SMILES: CC1(C)OB(c2ccc3c(c2)C2CCC3CC2)OC1(C)C]<br>SB11 | 80% |
| SB1 | 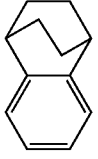<br>4175-52-4 | — | 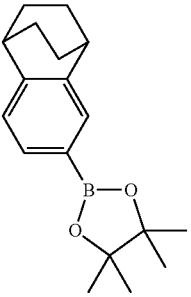 [SMILES: CC1(C)OB(c2ccc3c(c2)C2CCC3CC2)OC1(C)C]<br>SB12 | 93% |
| SB2 | 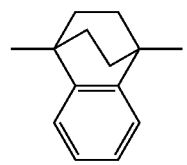<br>2716-23-6 | 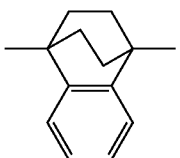<br>SB2-Br | 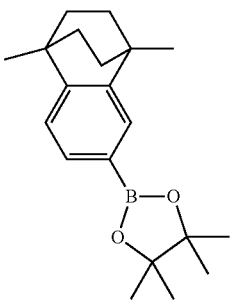<br>SB21 | 81% |

US 11,005,050 B2
-continued
| Ex. | Starting material | Bromide | Product Boronic acid ester Variant | Yield |
|---|---|---|---|---|
| SB2 | 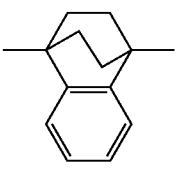<br>2716-23-6 | — | 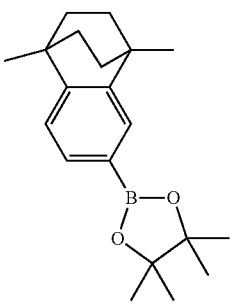<br>SB22 | 90% |
| SB3 | <br>35349-64-5 | — | 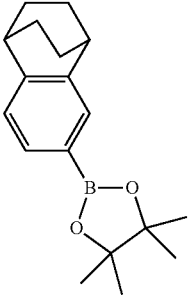 [SMILES: CC1(C)OB(c2ccc3c(c2)C2CCC3CC2)OC1(C)C]<br>SB32 | 89% |
| SB4 | 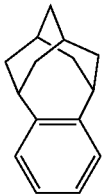 [SMILES: c1ccc2c(c1)C1CC3CC(C1)CC2C3]<br>60749-53-3 | <br>SB4-Br | 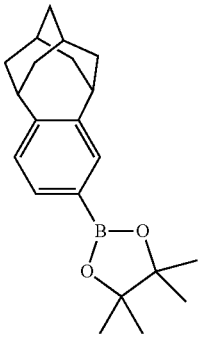 [SMILES: CC1(C)OB(c2ccc3c(c2)C2CC4CC(CC3C4)C2)OC1(C)C]<br>SB41 | 74% |
| SB4 | 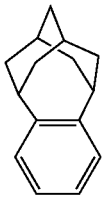 [SMILES: c1ccc2c(c1)C1CC3CC(C1)CC2C3]<br>60749-53-3 | — | 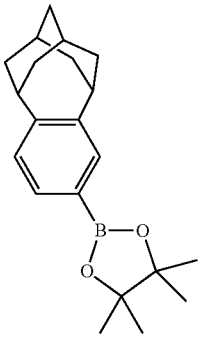 [SMILES: CC1(C)OB(c2ccc3c(c2)C2CC4CC(CC3C4)C2)OC1(C)C]<br>SB42 | 94% |

Example S24: 5,5,7,7-Tetramethyl-6,7-dihydro-5H-[2]pyridine, S24

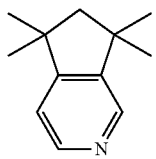

Procedure analogous to D. L. Boger et al., J. Org. Chem., 1981, 46, 10, 2180. A mixture of 14.0 g (100 mmol) of 2,2,4,4-tetramethylcyclopenta-none [4694-11-5], 9.0 ml (110 mmol) of pyrrolidine [123-75-1], 951 mg (5 mmol) of p-toluenesulfonic acid monohydrate [6192-52-5] and 500 ml of toluene is heated on a water separator until the separation of water is complete (typically about 16 h). The toluene is then removed in vacuo, and the oily residue is subjected to a bulb-tube distillation. The 17.4 g (90 mmol) of 1-(3,3,5,5-tetramethylcyclopent-1-enyl)pyrrolidine obtained as amber-coloured oil are taken up in 50 ml of chloroform and slowly added dropwise at room temperature to a solution of 10.5 g (130 mmol) of 1,2,4-triazine in 50 ml of chloroform. When the addition is complete, the orange solution is stirred at room temperature for a further 2 h, the temperature is then raised to 50° C., and the mixture is stirred for a further 45 h. After removal of the chloroform in vacuo, the residue is chromatographed on silica gel with diethyl ether:n-heptane (1:1, vv). Yield: 8.9 g (51 mmol), 51%; purity: about 97% according to $^1$H-NMR.

The following compounds are prepared analogously:

| Ex. | Starting materials | Product | Yield |
|---|---|---|---|
| S25 | 497-38-1 | 105275-30-7 S25 | 42% |
| S26 | 70897-07-3 | S26 | 37% |

Example S27: 5,6-Dibromo-1,1,2,2,3,3-hexamethylindane, S27

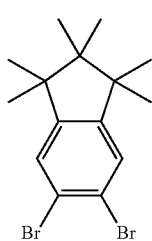

1.3 g of anhydrous iron(III) chloride and then, dropwise with exclusion of light, a mixture of 64.0 ml (1.25 mol) of bromine and 300 ml of dichloromethane are added to a solution of 101.2 g (500 mmol) of 1,1,2,2,3,3-hexamethyl-indane [91324-94-6] in 2000 ml of dichloromethane at such a rate that the temperature does not exceed 25° C. If necessary, the mixture is counter-cooled using a cold-water bath. The reaction mixture is stirred at room temperature for a further 16 h, 500 ml of saturated sodium sulfite solution are then slowly added, the aqueous phase is separated off, the organic phase is washed three times with 1000 ml of water each time, dried over sodium sulfate, filtered through a short silica-gel column, and the solvent is then stripped off. Finally, the solid is recrystallised once from a little (about 100 ml) ethanol. Yield: 135.8 g (377 mmol), 75%; purity: about 95% according to $^1$H-NMR.

The following compounds are prepared analogously:

| Ex. | Starting materials | Product | Yield |
|---|---|---|---|
| S28 | S1 | S28 | 78% |
| S29 | 59508-28-0 | S29 | 73% |
| S30 | 66684-45-5 | S30 | 76% |
| S31 | 113710-83-1 | S31 | 80% |

| Ex. | Starting materials | Product | Yield |
|---|---|---|---|
| S32 | 35185-96-7 | 749859-07-2 S32 | 77% |
| S33 | | S33 Chromatographic separation of the regioisomers | 19% |
| S34 | | S34 Chromatographic separation of the regioisomers | 23% |
| SB5 | 4175-52-4 | SB5 | 69% |
| SB6 | 2716-23-6 | SB6 | 72% |
| SB7 | 35349-64-5 | SB7 | 74% |
| SB8 | 60749-53-3 | SB8 | 78% |

Example S35:
5,6-Diamino-1,1,2,2,3,3-hexamethylindane, S35

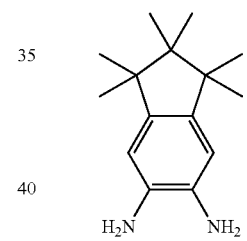

A: 5,6-Dinitro-1,1,2,2,3,3-tetramethylindane, S35a

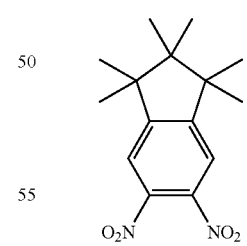

350 ml of 100% by weight nitric acid are slowly added dropwise to a vigorously stirred mixture, cooled to 0° C., of 101.2 g (500 mmol) of 1,1,2,2,3,3-hexamethylindane [91324-94-6] and 350 ml of 95% by weight sulfuric acid at such a rate that the temperature does not exceed +5° C. The reaction mixture is subsequently allowed to warm slowly to room temperature over 2-3 h and is then poured into a vigorously stirred mixture of 6 kg of ice and 2 kg of water. The pH is adjusted to 8-9 by addition of 40% by weight NaOH, the mixture is extracted three times with 1000 ml of ethyl acetate each time, the combined organic phases are washed twice with 1000 ml of water each time, dried over magnesium sulfate, the ethyl acetate is then removed virtually completely in vacuo until crystallisation commences, and the crystallisation is completed by addition of 500 ml of heptane. The beige crystals obtained in this way are filtered off with suction and dried in vacuo. Yield: 136.2 g (466 mmol), 93%; purity: about 94% according to $^1$H-NMR, remainder about 4% of 4,6-dinitro-1,1,3,3-tetramethylindane. About 3% of 4,5-dinitro-1,1,3,3-tetramethylindane, S35b, can be isolated from the mother liquor.

B: 5,6-Diamino-1,1,2,2,3,3-hexamethylindane, S35

136.2 g (466 mmol) of 5,6-dinitro-1,1,2,2,3,3-hexamethylindane, S35a, are hydrogenated at room temperature in 1200 ml of ethanol on 10 g of palladium/carbon at a hydrogen pressure of 3 bar for 24 h. The reaction mixture is filtered twice through a Celite bed, the brown solid obtained after removal of the ethanol is subjected to a bulb-tube distillation (T about 160° C., p about $10^{-4}$ mbar). Yield: 98.5 g (424 mmol), 91%; purity: about 95% according to $^1$H-NMR.

The following compounds are prepared analogously:

| Ex. | Starting materials | Product | Yield |
|---|---|---|---|
| S35b | 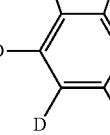 91324-94-6 | 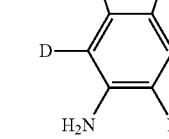 S35b | 2% |
| S36 | 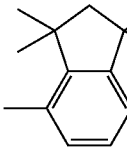 S1 | 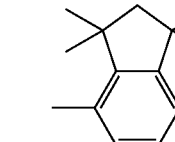 S36 | 80% |
| S37 |  4834-33-7 | 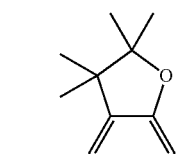 S37 | 84% |
| S38 | 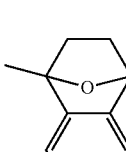 142076-41-3 | S38 | 76% |
| S39 | 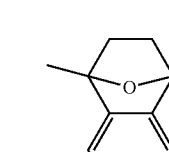 479070-73-0 | S39 | 68% |
| S40 |  124797-68-8 | S40 | 63% |
| S41 | 61200-08-6 | S41 | 77% |
| S42 |  215725-16-9 | S42 Chromatographic separation of the regioisomers | 16% |

-continued

| Ex. | Starting materials | Product | Yield |
|---|---|---|---|
| SB9 | 4175-52-4 | SB9 | 72% |
| SB10 | 2716-23-6 | SB10 | 70% |
| SB11 | 35349-64-5 | SB11 | 65% |
| SB12 | 60749-53-3 | SB12 | 74% |

Example S43: N-[2-(1,1,2,2,3,3-Hexamethylindan-5-yl)ethyl]benzamide, S43

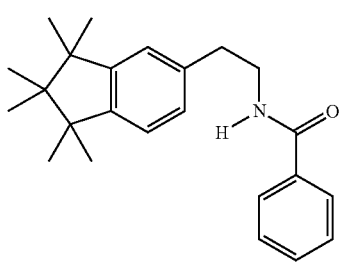 [SMILES: CC1(C)c2ccc(CCNC(=O)c3ccccc3)cc2C(C)(C)C1(C)C]

A: 1,1,2,2,3,3-Hexamethylindane-5-carboxaldehyde, S43a

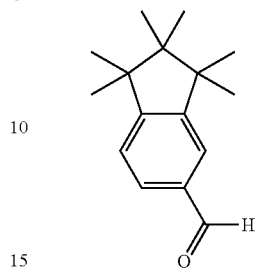

200 ml (500 mmol) of n-BuLi, 2.5 M in n-hexane, are added dropwise to a vigorously stirred solution, cooled to −78° C., of 140.6 g (500 mmol) of 5-bromo-1,1,2,2,3,3-hexamethylindane, S5-Br, in 1000 ml of THF at such a rate that the temperature does not exceed −55° C. When the addition is complete, the mixture is stirred for a further 30 min., and a mixture of 42.3 ml (550 mmol) of DMF and 50 ml of THF is then allowed to run in with vigorous stirring. The mixture is stirred at −78° C. for a further 1 h, then allowed to warm to room temperature and quenched by addition of 300 ml of saturated ammonium chloride solution. The organic phase is separated off, the THF is removed in vacuo, the residue is taken up in 500 ml of ethyl acetate, washed once with 300 ml of 5% hydrochloric acid, twice with 300 ml of water each time, once with 300 ml of saturated sodium chloride solution, the organic phase is dried over magnesium sulfate, and the solvent is then removed in vacuo. The residue is employed in step B without further purification. Yield: 107.1 g (465 mmol), 93%; purity: about 95% according to $^1$H-NMR.

The following compounds can be prepared analogously:

| Ex. | Starting material | Product | Yield |
|---|---|---|---|
| S44a | S8-Br | S44a | 91% |
| S45a | 16499-72-2 S11-Br | S45a | 89% |

-continued

| Ex. | Starting material | Product | Yield |
|---|---|---|---|
| S46a | 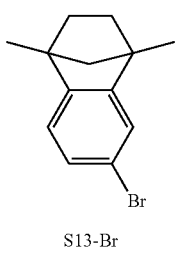 S13-Br | 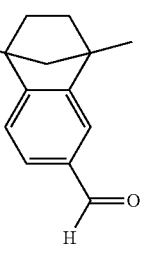 S46a | 95% |
| S47a | 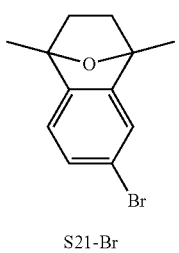 S21-Br | 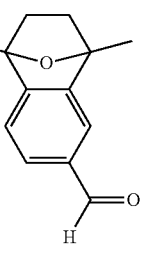 S47a | 90% |
| SB13a | 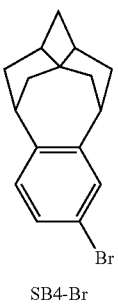 [SMILES: Brc1ccc2c(c1)C1CC3CC4CC2CC43C1] SB4-Br | 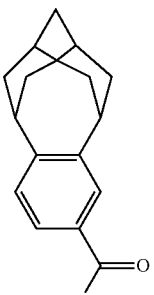 SB13a | 88% |

B: 2-(1,1,2,2,3,3-Hexamethyl-5-indanyl)ethylamine, S43b

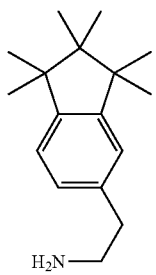

A mixture of 80.6 g (350 mmol) of 1,1,2,2,3,3-Hexamethylindane-5-carboxaldehyde, S43a, 400 ml of nitromethane and 4.6 g (70 mmol) of ammonium acetate, anhydrous, is heated under reflux for 2 h until the starting material has been consumed (TLC check). After cooling, the reaction mixture is poured into 1000 ml of water, extracted three times with 300 ml of dichloromethane each time, the combined organic phases are washed three times with saturated sodium hydrogencarbonate solution, three times with 300 ml of water each time and once with 300 ml of saturated sodium chloride solution, dried over magnesium sulfate, and the solvent is removed in vacuo. The dark oily residue is dissolved in 100 ml of THF and slowly added dropwise with ice-cooling to a solution of 38.0 g (1.0 mol) of lithium aluminium hydride in 1000 ml of THF (care: exothermic reaction!). When the addition is complete, the reaction mixture is allowed to warm to room temperature and is stirred at room temperature for a further 20 h. The reaction mixture is hydrolysed with ice-cooling by slow addition of 500 ml of saturated sodium sulfate solution. The salts are filtered off with suction, rinsed with 500 ml of THF, the THF is removed in vacuo, the residue is taken up in 1000 ml of dichloromethane, the solution is washed three times with 300 ml of water each time, once with 300 ml of saturated sodium chloride solution, dried over magnesium sulfate, and the solvent is then removed in vacuo. The purification is carried out by bulb-tube distillation (p about $10^{-4}$ mbar, T=200° C.). Yield: 67.0 g (273 mmol), 78%; purity: about 95% according to $^1$H-NMR.

The following compounds can be prepared analogously:

| Ex. | Starting material | Product | Yield |
|---|---|---|---|
| S44b | 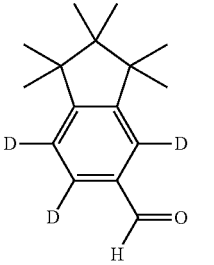 S44a | 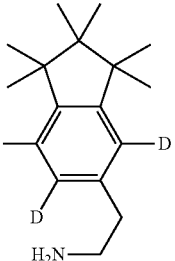 S44b | 74% |
| S45b | 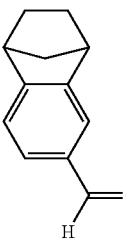 S45a | 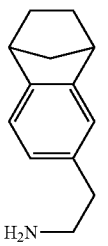 S45b | 77% |

| Ex. | Starting material | Product | Yield |
|---|---|---|---|
| S46b | S46a | S46b | 75% |
| S47b | S47a | S47b | 71% |

| Ex. | Starting material | Product | Yield |
|---|---|---|---|
| SB13b | SB13a | SB13b | 72% |

C: N-[2-(1,1,2,2,3,3-Hexamethylindan-5-yl)ethyl]benzamide, S43

A solution of 14.1 ml (100 mmol) of benzoyl chloride [98-88-4] in 100 ml of dichloromethane is added dropwise with vigorous stirring at 0*C to a mixture of 24.5 g (100 mmol) of 2-(1,1,2,2,3,3-hexamethyl-5-indanyl)ethylamine, S43b, 14.1 ml (100 mmol) of triethylamine and 150 ml of dichloromethane at such a rate that the temperature does not exceed 30° C. The mixture is subsequently stirred at room temperature for a further 1 h. The dichloromethane is removed in vacuo, 100 ml of methanol are added to the colourless solid, which is filtered off with suction, washed three times with 50 ml of methanol and dried in vacuo. Yield: 31.1 g (89 mmol), 89%; purity: about 98% according to $^1$H-NMR.

The following compounds can be prepared analogously:

| Ex. | Starting material | Carboxylic acid chloride | Product | Yield |
|---|---|---|---|---|
| S44 | S44b | 6613-441 | S44 | 74% |
| S45 | S45b | 1710-98-1 | S45 | 77% |

-continued

| Ex. | Starting material | Carboxylic acid chloride | Product | Yield |
|---|---|---|---|---|
| S46 | S46b | 14002-51-8 | S46 | 75% |
| S47 | S47b | 1005786-37-7 | S47 | 71% |
| S48 | S43b | 6613-441 | S48 | 86% |
| S49 | S43b | 765314-57-6 | S49 | 88% |

| Ex. | Starting material | Carboxylic acid chloride | Product | Yield |
|---|---|---|---|---|
| SB13 | 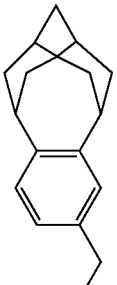 SB13b | 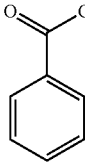 98-88-4 | 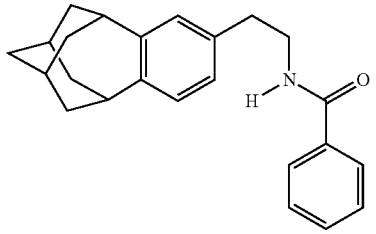 SB13 | 82% |

Example S50: 2,7-Di-tort-butyl-9,9'-(6-bromopyridin-2-yl)xanthene, S50

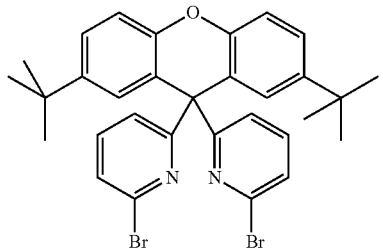 [SMILES: CC(C)(C)c1ccc2c(c1)C(c1cccc(Br)n1)(c1cccc(Br)n1)c1cc(C(C)(C)C)ccc1O2]

120 ml (300 mmol) of n-BuLi, 2.5 M in n-hexane, are added at room temperature to a solution of 84.7 g (300 mmol) of di(4-tert-butylphenyl) ether [24085-65-2] in 1500 ml of diethyl ether, and the mixture is then stirred under reflux for 60 h. After the reaction mixture has been cooled to −10° C., 82.1 g (240 mmol) of bis(6-bromopyridin-2-yl)methanone are added in portions, and the mixture is then stirred at −10° C. for a further 1.5 h. The reaction mixture is quenched by addition of 30 ml of ethanol, the solvent is removed completely in vacuo in a rotary evaporator, the residue is taken up in 1000 ml of glacial acetic acid, 150 ml of acetic anhydride and then, dropwise, 30 ml of conc. sulfuric acid are added with stirring, and the mixture is stirred at 60° C. for a further 3 h. The solvent is then removed in vacuo, the residue is taken up in 1000 ml of dichloromethane, and the mixture is rendered alkaline by addition of 10% by weight aqueous NaOH with ice-cooling. The organic phase is separated off, washed three times with 500 ml of water each time, dried over magnesium sulfate, the organic phase is evaporated to dryness, and the residue is taken up in 500 ml of methanol, homogenised at elevated temperature and then stirred for a further 12 h, during which the product crystallises. The solid obtained after filtration with suction is dissolved in 1000 ml of dichloromethane, the solution is filtered through a Celite bed, the filtrate is evaporated to dryness, the residue is recrystallised twice from toluene:methanol (1:1) and then dried in vacuo. Yield: 56.3 g (87 mmol), 36%; purity: about 95% according to $^1$H-NMR.

The following compound can be prepared analogously:

| Ex. | Starting material | Product | Yield |
|---|---|---|---|
| S51 | 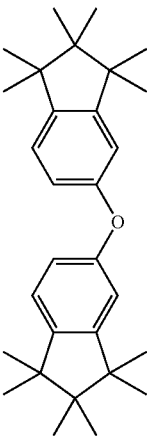 S52 | 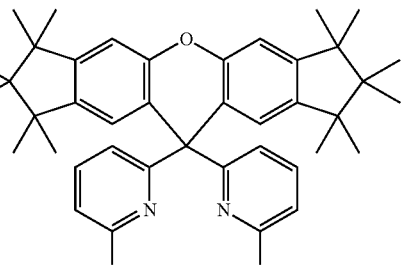 S51 | 28% |

Example S52:
Bis(1,1,2,2,3,3-hexamethylindan-5-yl) ether

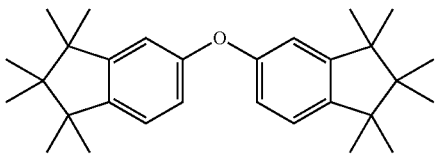

Procedure analogous to G. Chen et al., Tetrahedron Letters 2007, 48, 3, 47. A vigorously stirred mixture of 56.2 g (200 mmol) of 5-bromo-1,1,2,2,3,3-hexamethylindane, S5-Br, 212.2 g (800 mmol) of tripotassium phosphate trihydrate, 300 g of glass beads (diameter 3 mm), 449 mg (2 mmol) of palladium(II) acetate, 809 mg (4 mmol) of tri-tert-butylphosphine and 1000 ml of dioxane is heated under reflux for 20 h. After cooling, the salts are filtered off with suction, rinsed with 300 ml of dioxane, the filtrate is evaporated in vacuo, the residue is taken up in 500 ml of ethyl acetate, the solution is washed three times with 300 ml of water each time, once with 300 ml of saturated sodium chloride solution, dried over magnesium sulfate, and the ethyl acetate is then removed in vacuo. The residue is purified by bulb-tube distillation (p about $10^{-4}$ mbar, T about 180° C.). Yield: 32.6 g (78 mmol), 78%; purity: about 97% according to $^1$H-NMR.

Example B53: 7-Bromo-1,2,3,4-tetrahydro-1,4-methanonaphthalene-6-carbaldehyde, S53

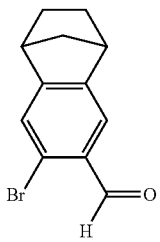

Procedure analogous to L. S. Chen et al., J. Organomet. Chem. 1980, 193, 283-292. 40 ml (100 mmol) of n-BuLi, 2.5 M in hexane, pre-cooled to −110° C., are added to a solution, cooled to −110° C., of 30.2 g (100 mmol) of 6,7-dibromo-1,2,3,4-tetrahydro-1,4-methanonaphthalene [42810-32-2] in a mixture of 1000 ml of THF and 1000 ml of diethyl ether at such a rate that the temperature does not exceed −105° C. The mixture is stirred for a further 30 min., a mixture, pre-cooled to −110° C., of 9.2 ml (120 mmol) of DMF and 100 ml of diethyl ether is then added dropwise, the mixture is then stirred for a further 2 h, allowed to warm to −10° C., 1000 ml of 2 N HCl are added, and the mixture is stirred at room temperature for a further 2 h. The organic phase is separated off, washed once with 500 ml of water, once with 500 ml of saturated sodium chloride solution, dried over magnesium sulfate, the solvent is removed in vacuo, and the residue is subjected to a bulb-tube distillation (T about 90° C., p about $10^{-4}$ mbar). Yield: 15.8 g (63 mmol), 63%; purity: about 95% according to $^1$H-NMR.

The following compounds can be prepared analogously:

| Ex. | Starting materials | Product | Yield |
|---|---|---|---|
| S54 | S27 | S54 | 68% |
| S55 | S30 | S55 | 66% |
| S56 | S31 | S56 | 60% |
| S57 | 749859-07-2 S32 | S57 | 54% |
| SB14 | SB5 | SB14 | 55% |

-continued

| Ex. | Starting materials | Product | Yield |
|---|---|---|---|
| SB15 | 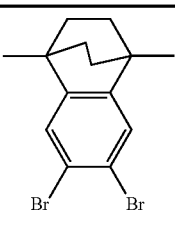 SB6 | 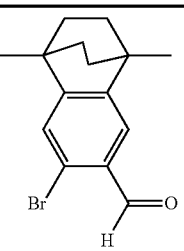 SB15 | 50% |
| SB16 | 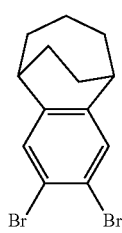 SB7 | 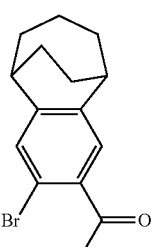 SB16 | 47% |
| SB17 | 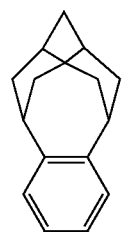 SB8 | 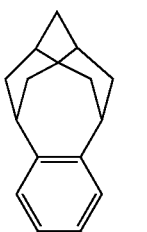 SB17 | 53% |

Example S58: 7-Phenylethynyl-1,2,3,4-tetrahydro-1,4-methanonaphthalene-6-carbaldehyde, S58

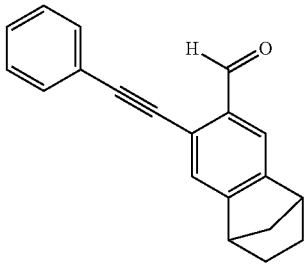 [SMILES: O=Cc1cc2c(cc1C#Cc1ccccc1)C1CCC2C1]

1.6 g (6 mmol) of triphenylphosphine, 674 mg (3 mmol) of palladium(II) acetate, 571 mg (30 mmol) of copper(I) iodide and 15.3 g (150 mmol) of phenylacetylene [536-74-3] are added consecutively to a solution of 25.1 g (100 mmol) of 7-bromo-1,2,3,4-tetrahydro-1,4-methanonaphthalene-6-carbaldehyde, S53, in a mixture of 200 ml of DMF and 100 ml of triethylamine, and the mixture is stirred at 65° C. for 4 h. After cooling, the precipitated triethylammonium hydrochloride is filtered off with suction, rinsed with 30 ml of DMF. The filtrate is freed from the solvents in vacuo. The oily residue is taken up in 300 ml of ethyl acetate, the solution is washed five times with 100 ml of water each time and once with 100 ml of saturated sodium chloride solution, and the organic phase is dried over magnesium sulfate. After removal of the ethyl acetate in vacuo, the oily residue is chromatographed on silica gel (n-heptane:ethyl acetate 99:1). Yield: 19.6 g (72 mmol), 72%; purity: about 97% according to $^1$H-NMR.

The following derivatives can be prepared analogously:

| Ex. | Bromo-arylaldehyde | Alkyne | Product | Yield |
|---|---|---|---|---|
| S59 | 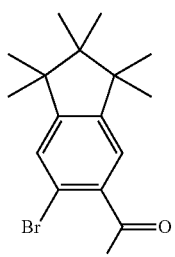 S54 | 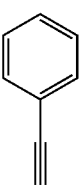 536-74-3 | 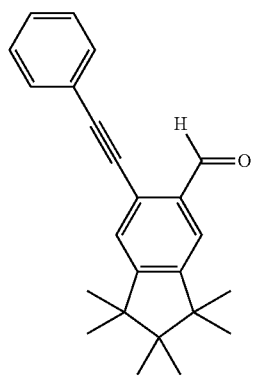 S59 | 69% |

-continued
| Ex. | Bromo-arylaldehyde | Alkyne | Product | Yield |
|---|---|---|---|---|
| S60 | 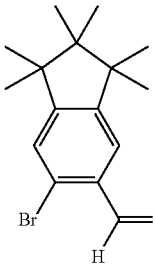 S54 | 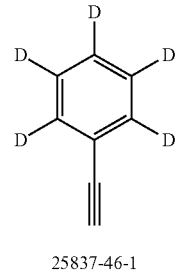 25837-46-1 | 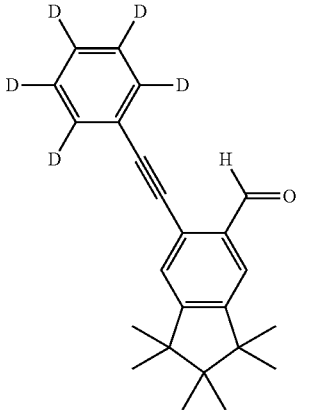 S60 | 69% |
| S61 | 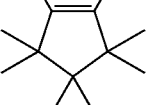 S54 | 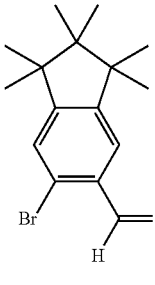 6366-06-9 | 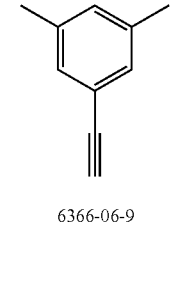 S61 | 70% |
| S62 | 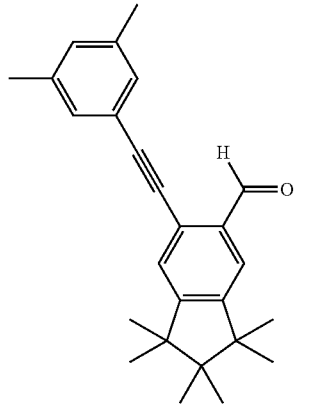 S54 | 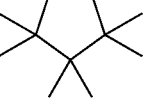 876726-86-2 | 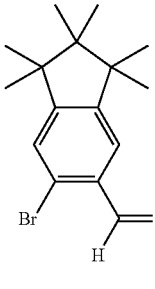 S62 | 66% |

-continued
| Ex. | Bromo-arylaldehyde | Alkyne | Product | Yield |
|---|---|---|---|---|
| S63 | 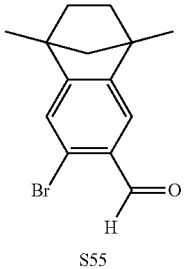 S55 | 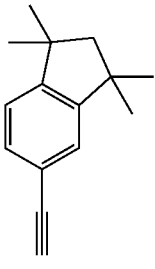 188889-51-2 | 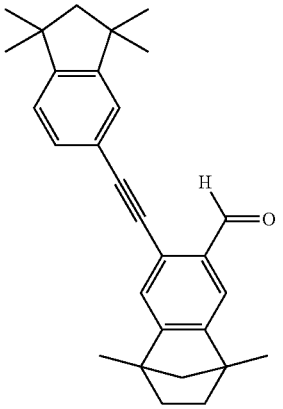 S63 | 67% |
| S64 | 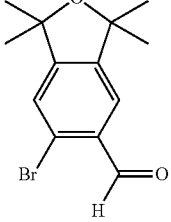 S56 | 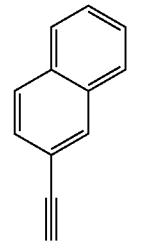 2949-26-0 | 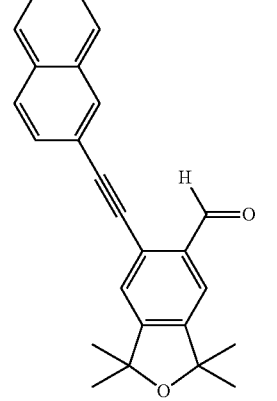 S64 | 70% |
| S65 | 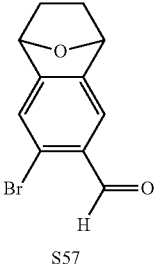 S57 | 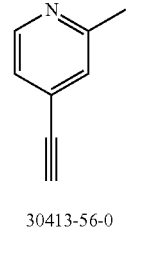 30413-56-0 | 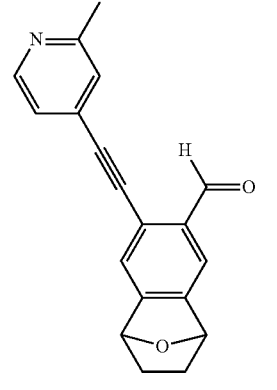 S65 | 56% |

-continued
| Ex. | Bromo-arylaldehyde | Alkyne | Product | Yield |
|---|---|---|---|---|
| SB18 | | | | 61% |
| SB19 | | | | 63% |
| SB20 | | | | 70% |
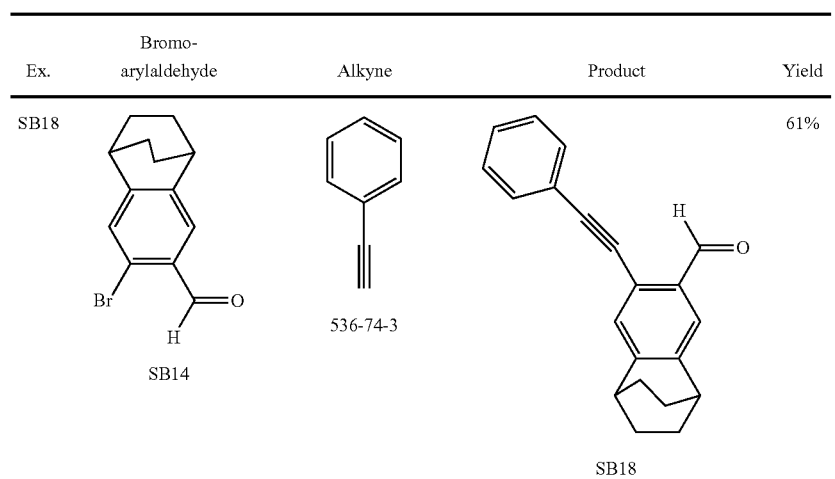
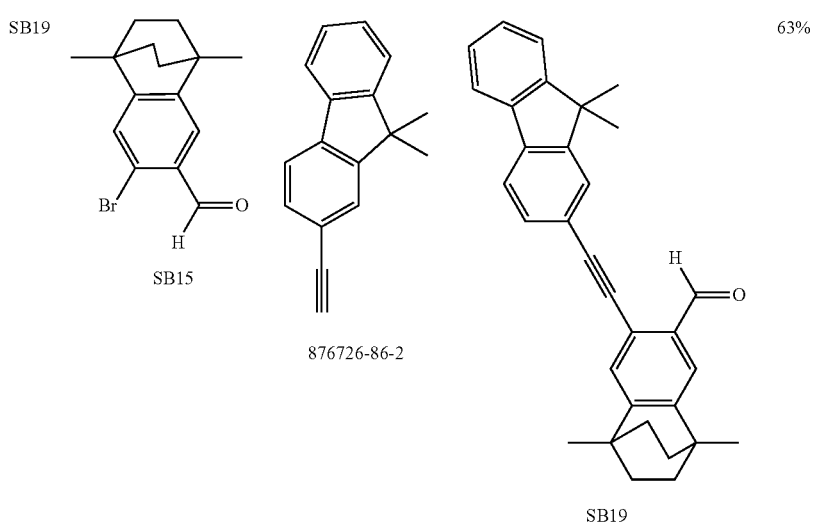
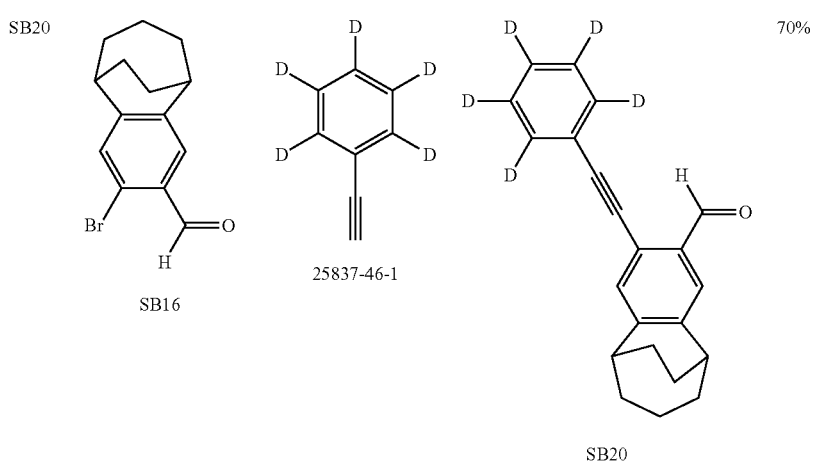

| Ex. | Bromo-arylaldehyde | Alkyne | Product | Yield |
|---|---|---|---|---|
| SB21 | 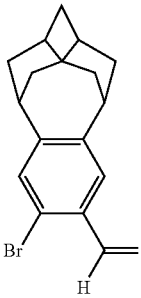 SB17 | 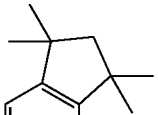 188889-51-2 | 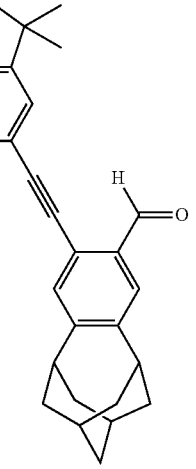 SB21 | 73% |

Example SB22: 5-[1-Hydroxymeth-(E)-ylidene]tricyclo-[4.3.1.1-$^{3,8}$]-undecan-4-one, SB22

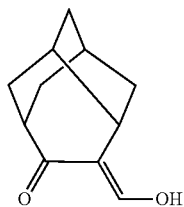 [SMILES: O=C1/C(=C/O)C2CC3CC1CC2C3]

A mixture of 16.4 g (100 mmol) of homoadamantanone [24669-56-5], 9.6 g (130 mmol) of ethyl formate [109-94-4] and 250 ml of methyl tert-butyl ether is added dropwise to a vigorously stirred suspension of 9.6 g (100 mmol) of sodium tert-butoxide in 300 ml of methyl tert-butyl ether (note: exothermic). When the addition is complete, the mixture is warmed at 60° C. for 16 h. After cooling, the beige-red solid which has precipitated out is filtered off with suction, washed once with a little methyl tert-butyl ether, resuspended in 300 ml of methyl tert-butyl ether and hydrolysed by addition of 200 ml of saturated ammonium chloride solution. The clear organic phase is separated off, washed three times with 100 ml of water each time, once with 100 ml of saturated sodium chloride solution, dried over magnesium sulfate, and the solvent is then removed in vacuo, leaving a yellow oil, which crystallises over time and can be employed in the next step without further purification. Yield: 15.6 g (81 mmol), 81%; purity: about 95% according to $^1$H NMR, where varying proportions of the (Z,E)-enol and aldehyde form are observed, depending on the compound, solvent, residual water content and pH, where the enol form usually strongly predominates.

The following compounds can be prepared analogously:

| Ex. | Ketone | Product | Yield |
|---|---|---|---|
| SB23 | 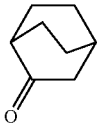 2716-23-6 | 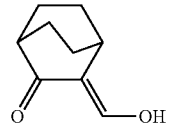 935-82-0 SB23 | 80% |
| SB24 | 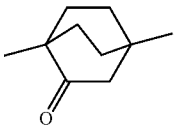 59117-09-8 | 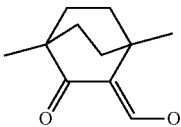 SB24 | 85% |
| SB25 |  1614-77-3 | 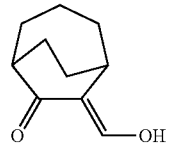 SB25 | 88% |
| SB26 | 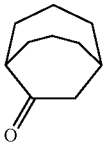 28054-91-3 | 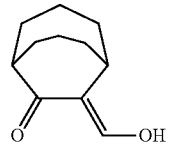 SB26 | 87% |

-continued

| Ex. | Ketone | Product | Yield |
|---|---|---|---|
| SB27 | 27567-85-7 | SB27 | 83% |
| SB28 | 14855-97-1 | SB28 | 85% |
| SB29 | 1746-95-8 | SB29 | 83% |
| SB30 | 13537-95-6 | SB30 | 86% |
| SB31 | 23067-63-2 | SB31 | 88% |

Example SB32

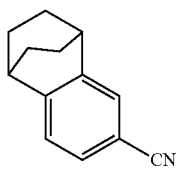 [SMILES: N#Cc1ccc2c(c1)C1CCC2CC1]

Procedure analogous to G. Zhang et al., Ad. Synth. & Catal., 2011, 353(2+3), 291. A mixture of 28.4 g (100 mmol) of SB1, 9.4 g (105 mmol) of copper(I) cyanide, 41.5 g (300 mmol) of potassium carbonate, 100 g of glass beads (diameter 3 mm), 400 ml of DMF and 3.6 ml of water is stirred at 80° C. for 10 h. After cooling, the DMF is substantially removed in vacuo, the residue is diluted with 500 ml of dichloromethane, the salts are filtered off through a Celite bed, the filtrate is washed three times with 200 ml of water and once with 100 ml of saturated sodium chloride solution and then dried over magnesium sulfate. The oily residue which remains after removal of the dichloromethane is distilled in a bulb tube. Yield: 11.5 g (63 mmol), 63%; purity: about 97% according to $^1$H NMR.

The following compounds can be prepared analogously:

| Ex. | Starting material | Product | Yield |
|---|---|---|---|
| S66 | S4 | S66 | 58% |
| S67 | S5 | S67 | 60% |
| S68 | S14 | S68 | 61% |
| SB33 | SB2 | SB33 | 65% |

105
-continued

| Ex. | Starting material | Product | Yield |
|---|---|---|---|
| SB34 | SB3 | SB34 | 56% |
| SB35 | SB4 | SB35 | 66% |

106

B: Synthesis of the Ligands L and LB

Example L1:
2-(1,1,3,3-Tetramethylindan-6-yl)pyridine, L1

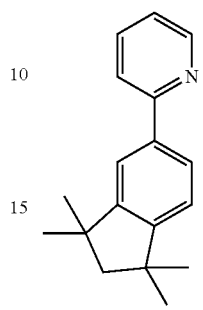

821 mg (2 mmol) of S-Phos and then 249 mg (1 mmol) of palladium(II) acetate are added to a mixture of 30.0 g (100 mmol) of pinacolyl 1,1,3,3-tetramethylindane-5-boronate, S4-B, 17.4 g (110 mmol) of 2-bromo-pyridine [109-04-6], 46.1 g (200 mmol) of tripotassium phosphate monohydrate, 300 ml of dioxane and 100 ml of water, and the mixture is heated under reflux for 16 h. After cooling, the aqueous phase is separated off, the organic phase is evaporated to dryness, the residue is taken up in 500 ml of ethyl acetate, the organic phase is washed three times with 200 ml of water each time, once with 200 ml of saturated sodium chloride solution, dried over magnesium sulfate, the desiccant is filtered off via a Celite bed, and the filtrate is re-evaporated to dryness. The oil obtained in this way is freed from low-boiling components and non-volatile secondary components by fractional bulb-tube distillation twice. Yield: 15.3 g (61 mmol), 61%; purity: about 99.5% according to $^1$H-NMR.

The following compounds are prepared analogously. Solids are freed from low-boiling components and non-volatile secondary components by recrystallisation and fractional sublimation (p about $10^{-4}$-$10^{-5}$ mbar, T about 160-240° C.). Oils are purified by chromatography, subjected to fractional bulb-tube distillation or dried in vacuo in order to remove low-boiling components.

| Ex. | Product Boronic acid ester | Bromide | Ligand | Yield |
|---|---|---|---|---|
| L2 | S5 | 54151-74-5 | | 66% |

-continued

| Ex. | Product Boronic acid ester | Bromide | Ligand | Yield |
|---|---|---|---|---|
| L3 | S5 | 1532-71-4 | | 67% |
| L4 | S6 | 24188-79-2 | | 64% |
| L5 | S7 | 612-62-4 | | 60% |
| L6 | S8 | 23952-31-0 | | 61% |

-continued
| Ex. | Product Boronic acid ester | Bromide | Ligand | Yield |
|---|---|---|---|---|
| L7 | 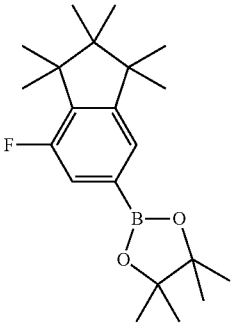<br>S9 | 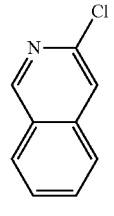<br>19493-45-9 | 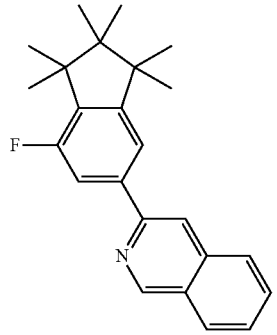 [SMILES: CC1(C)c2cc(-c3cc4ccccc4cn3)cc(F)c2C(C)(C)C1(C)C] | 63% |
| L8 | 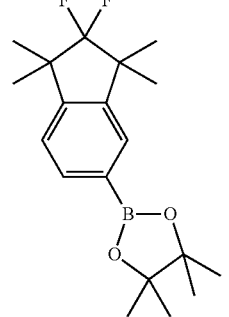<br>S10 | 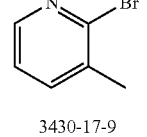<br>3430-17-9 | 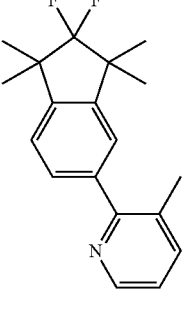 | 63% |
| L9 | 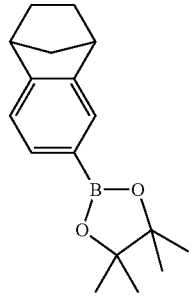<br>S11 | 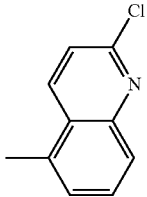<br>23952-31-0 | 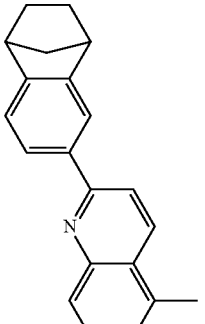 | 58% |
| L10 | 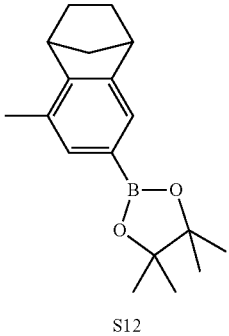<br>S12 | 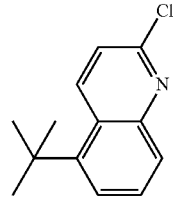<br>1251922-06-1 | 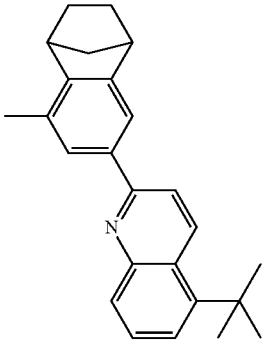 [SMILES: Cc1cc(-c2ccc3c(C(C)(C)C)cccc3n2)cc2c1C1CCC2C1] | 60% |

-continued

| Ex. | Product Boronic acid ester | Bromide | Ligand | Yield |
|---|---|---|---|---|
| L11 | S13 | 1251041-55-0 | | 54% |
| L12 | S-14 | 5451-74-5 | | 59% |
| L13 | S15 | 107351-82-6 | | 61% |
| L14 | S16 | 959238-69-8 | | 48% |

-continued

| Ex. | Product Boronic acid ester | Bromide | Ligand | Yield |
|---|---|---|---|---|
| L15 | S17 | 10386-27-3 | | 46% |
| L16 | S18 | 132118-28-6 | | 66% |
| L17 | S19 | 3430-17-9 | | 58% |
| L18 | S20 | 132118-28-6 | | 59% |

-continued

| Ex. | Product Boronic acid ester | Bromide | Ligand | Yield |
|---|---|---|---|---|
| L19 | S21 | 107351-82-6 | | 63% |
| L20 | S22 | 1142197-19-0 | | 65% |
| L21 | S23 | 23952-31-0 | | 60% |
| L22 | 98-80-6 | 106203-65-0 | | 64% |

-continued
| Ex. | Product Boronic acid ester | Bromide | Ligand | Yield |
|---|---|---|---|---|
| L23 | 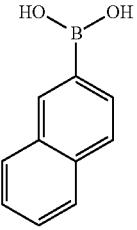<br>32316-92-0 | 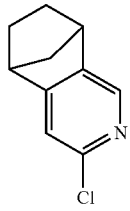<br>106203-65-0 | 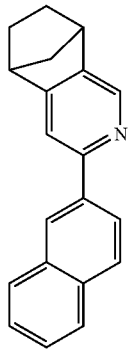 | 66% |
| L24 | 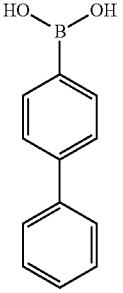<br>5122-94-1 | 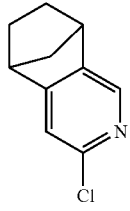<br>106203-65-0 | 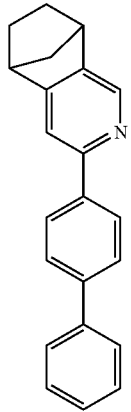 | 68% |
| L25 | 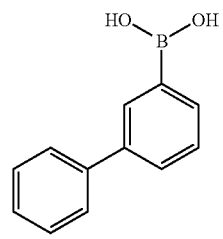<br>5122-95-2 | 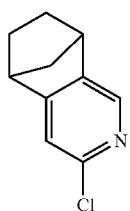<br>106203-65-0 | 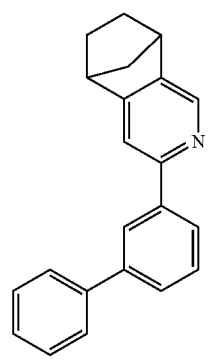 [SMILES: c1ccc(-c2cccc(-c3cc4c(cn3)C3CCC4C3)c2)cc1] | 63% |

US 11,005,050 B2
119                                                                                          120
-continued
| Ex. | Product Boronic acid ester | Bromide | Ligand | Yield |
|---|---|---|---|---|
| L26 | 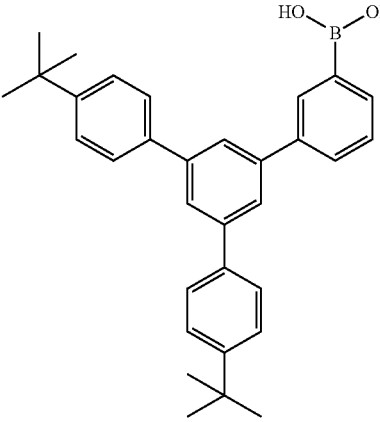<br>253280-21-6 | 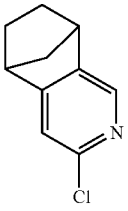<br>106203-65-0 | 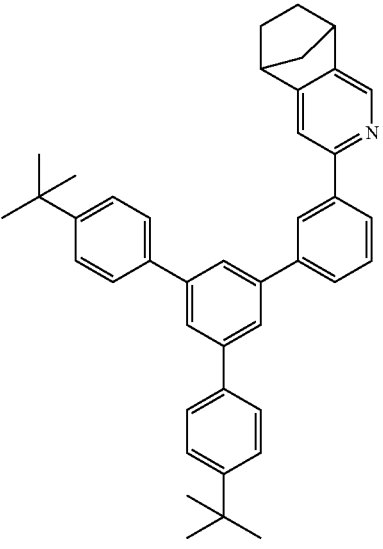 [SMILES: CC(C)(C)c1ccc(-c2cc(-c3ccc(C(C)(C)C)cc3)cc(-c3cccc(-c4cc5c(cn4)C4CCC5C4)c3)c2)cc1] | 45% |
| L27 | 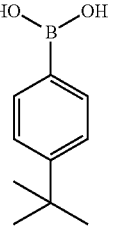<br>123324-71-0 | 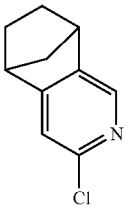<br>106203-65-0 | 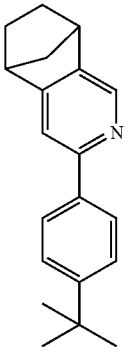 | 64% |
| L28 | 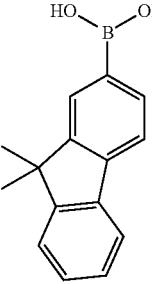<br>333432-28-3 | 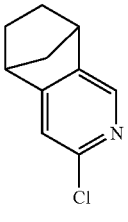<br>106203-65-0 | 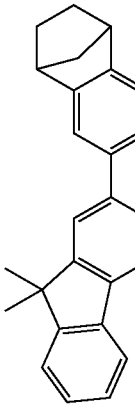 | 65% |

| Ex. | Product Boronic acid ester | Bromide | Ligand | Yield |
|---|---|---|---|---|
| L29 | 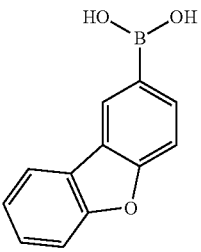<br>402936-15-6 | 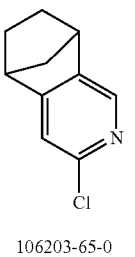<br>106203-65-0 | 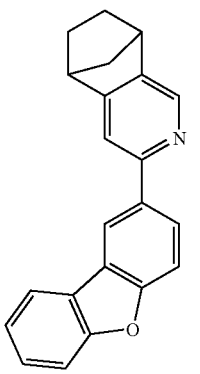 [SMILES: c1ccc2c(c1)oc1ccc(-c3cc4c(cn3)C3CCC4C3)cc12] | 66% |
| L30 | 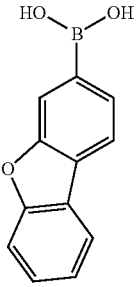<br>395087-89-5 | 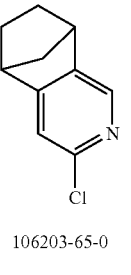<br>106203-65-0 | 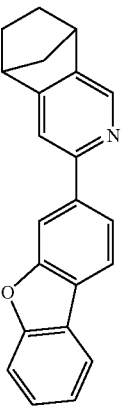 [SMILES: c1ccc2c(c1)oc1cc(-c3cc4c(cn3)C3CCC4C3)ccc12] | 67% |
| L31 | 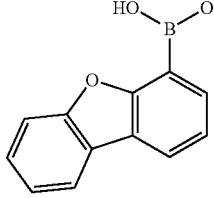<br>100124-06-9 | 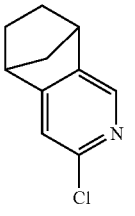<br>106203-65-0 | 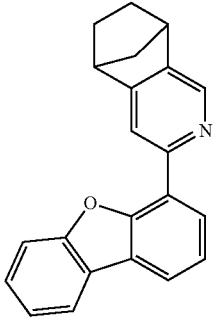 [SMILES: c1ccc2c(c1)oc1c(-c3cc4c(cn3)C3CCC4C3)cccc12] | 51% |
| L32 | 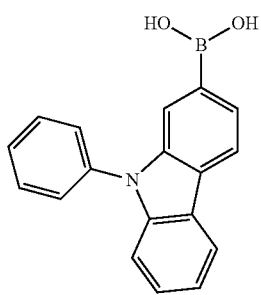<br>1001911-63-2 | 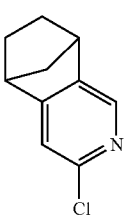<br>106203-65-0 | 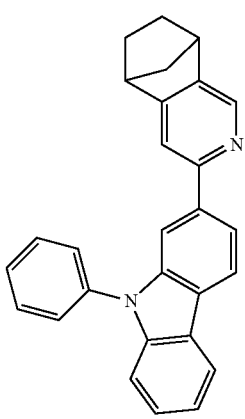 [SMILES: c1ccc(-n2c3ccccc3c3ccc(-c4cc5c(cn4)C4CCC5C4)cc32)cc1] | 64% |

-continued

| Ex. | Product Boronic acid ester | Bromide | Ligand | Yield |
|---|---|---|---|---|
| L33 | S5 | 106203-65-0 | | 63% |
| L34 | S8 | 106203-65-0 | | 61% |
| L35 | S11 | 106203-65-0 | Diastereomer mixture | 61% |
| L36 | S12 | 106203-65-0 | Diastereomer mixture | 62% |

-continued

| Ex. | Product Boronic acid ester | Bromide | Ligand | Yield |
|---|---|---|---|---|
| L37 | S18 | 106203-65-0 | | 49% |
| L38 | S21 | 106203-65-0 | Diastereomer mixture | 57% |
| L39 | 560132-24-3 | 132813-32-2 | | 60% |
| L40 | S13 | 132813-32-2 | Diastereomer mixture | 59% |

-continued

| Ex. | Product Boronic acid ester | Bromide | Ligand | Yield |
|---|---|---|---|---|
| L41 | S-14 | 132813-32-2 | | 53% |
| LB1 | SB1 | 109-04-6 | | 60% |
| LB2 | SB1 | 107351-82-6 | | 55% |
| LB3 | SB1 | 54151-74-5 | | 58% |

-continued

| Ex. | Product Boronic acid ester | Bromide | Ligand | Yield |
|---|---|---|---|---|
| LB4 | SB1 | 1532-71-4 | | 54% |
| LB5 | SB1 | 19439-45-9 | | 50% |
| LB6 | SB1 | 132118-28-6 | | 48% |
| LB7 | SB1 | 959238-69-8 | | 57% |

-continued
| Ex. | Product Boronic acid ester | Bromide | Ligand | Yield |
|---|---|---|---|---|
| LB8 | 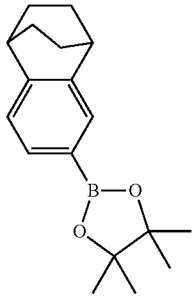<br>SB1 | 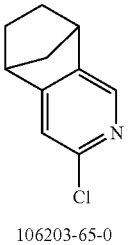<br>106203-65-0 | 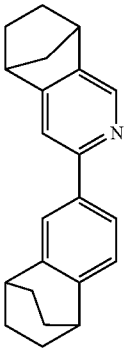 | 55% |
| LB9 | 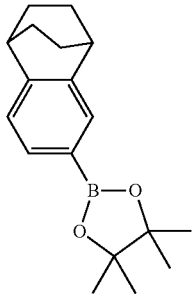<br>SB1<br>2.2 eq. of boronic acid | 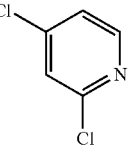<br>26452-80-2 | 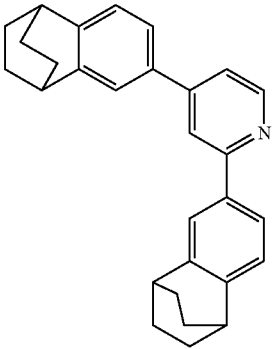 [SMILES: c1cc(-c2ccc3c(c2)C2CCC3CC2)cc(-c2ccc3c(c2)C2CCC3CC2)n1] | 48% |
| LB10 | 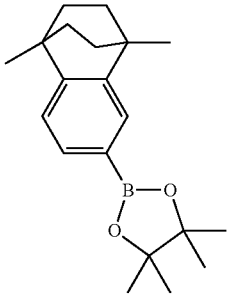<br>SB2 | 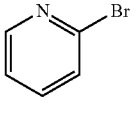<br>109-04-6 | 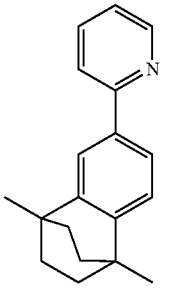 | 61% |
| LB11 | 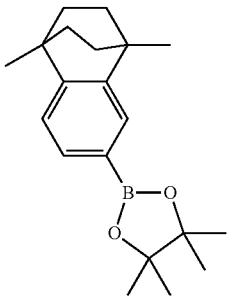<br>SB2 | 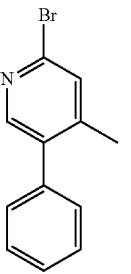<br>1438809-78-9 | 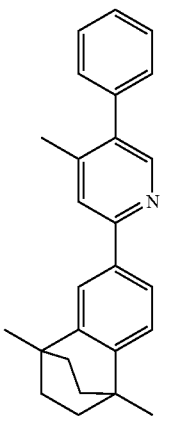 [SMILES: Cc1cc(-c2ccc3c(c2)C2(C)CCC3(C)CC2)ncc1-c1ccccc1] | 60% |

-continued

| Ex. | Product Boronic acid ester | Bromide | Ligand | Yield |
|---|---|---|---|---|
| LB12 | SB2 | CN-pyridine-Br, 139585-70-9 | | 57% |
| LB13 | SB2 | 3-chloroisoquinoline, 19493-45-9 | | 56% |
| LB14 | SB2 | 2-chloro-3,7-dimethylquinoline, 132118-28-6 | | 59% |
| LB15 | SB2 | 106203-65-0 | | 53% |

-continued
| Ex. | Product Boronic acid ester | Bromide | Ligand | Yield |
|---|---|---|---|---|
| LB16 | 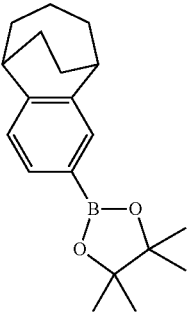 SB3 | 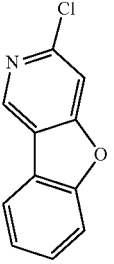 1251041-55-0 | 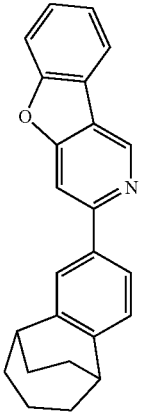 [SMILES: c1ccc2c(c1)oc1cc(-c3ccc4c(c3)C3CCCC4CC3)ncc12] | 54% |
| LB17 | 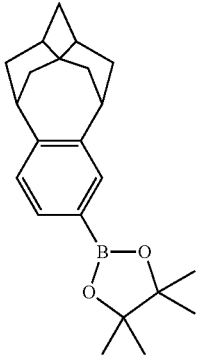 SB4 | 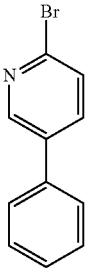 107351-82-6 | 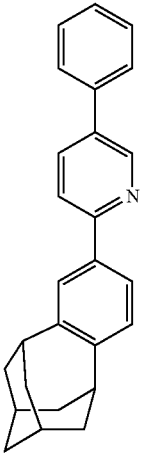 [SMILES: c1ccc(-c2ccc(-c3ccc4c(c3)C3CC5CC(CC4C5)C3)nc2)cc1] | 62% |
| LB18 | 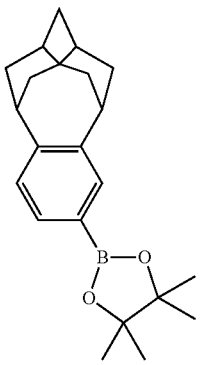 SB4 | 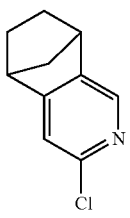 106203-65-0 | 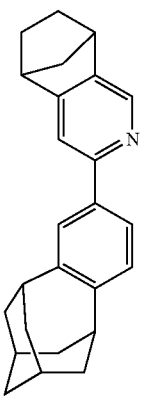 [SMILES: c1cc2c(cc1-c1cc3c(cn1)C1CCC3C1)C1CC3CC(CC2C3)C1] | 59% |

-continued

| Ex. | Product Boronic acid ester | Bromide | Ligand | Yield |
|---|---|---|---|---|
| LB19 | SB4 | 1532-71-4 | | 57% |
| LB20 | SB4 | 19493-45-9 | | 60% |
| LB21 | SB4 | 132118-28-6 | | 62% |

| Ex. | Product Boronic acid ester | Bromide | Ligand | Yield |
|---|---|---|---|---|
| LB22 | 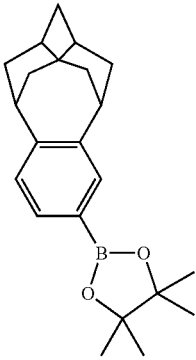<br>SB4<br>2.2 eq. of boronic acid | 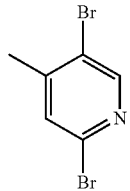<br>3430-26-0 | 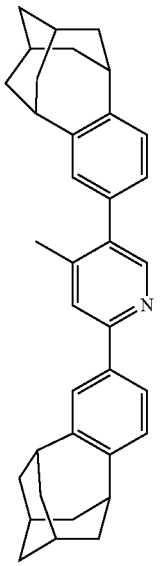 [SMILES: Cc1cc(-c2ccc3c(c2)C2CC4CC(CC3C4)C2)ncc1-c1ccc2c(c1)C1CC3CC(CC2C3)C1] | 47% |

Example 42: 5,5,7,7-Tetramethyl-3-phenyl-6,7-dihydro-5H-[2]pyridine, L42

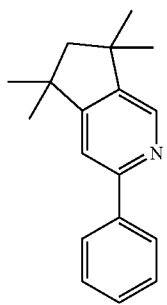 [SMILES: CC1(C)CC(C)(C)c2cc(-c3ccccc3)ncc21]

Procedure analogous to A. Mazzanti et al., Eur. J. Org. Chem., 2011, 6725.

40 ml (100 mmol) of n-butyllithium, 2.5 M in n-hexane, are added dropwise to a mixture, cooled to −78° C., of 10.5 ml (100 mmol) of bromobenzene and 500 ml of diethyl ether, and the mixture is stirred for a further 30 min. 17.5 g (100 mmol) of 5,5,7,7-tetramethyl-6,7-dihydro-5H-[2]pyridine, S24, are then added dropwise, the mixture is allowed to warm to room temperature, stirred for a further 12 h, quenched by addition of 100 ml of water, the organic phase is separated off, dried over magnesium sulfate. After removal of the solvent, the oily residue is chromatographed on silica gel with diethyl ether:n-heptane (3:7, v:v) and subsequently subjected to fractional bulb-tube distillation twice. Yield: 12.1 g (48 mmol), 48%; purity: about 99.5% according to $^1$H-NMR.

The following compounds can be prepared analogously. Solids are freed from low-boiling components and non-volatile secondary components by recrystallisation and fractional sublimation (p about $10^{-4}$-$10^{-5}$ mbar, T about 160-240° C.). Oils are purified by chromatography, subjected to fractional bulb-tube distillation or dried in vacuo in order to remove low-boiling components.

| Ex. | Pyridine | Bromide | Ligand | Yield |
|---|---|---|---|---|
| L43 | 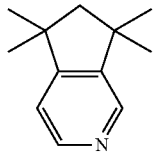<br>S24 | 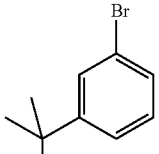<br>3972-64-3 | 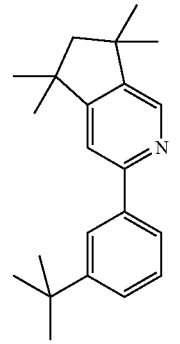 [SMILES: CC(C)(C)c1cccc(-c2cc3c(cn2)C(C)(C)CC3(C)C)c1] | 50% |

-continued
| Ex. | Pyridine | Bromide | Ligand | Yield |
|---|---|---|---|---|
| L44 | 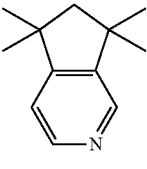<br>S24 | 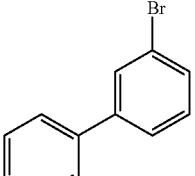<br>2113-57-7 | 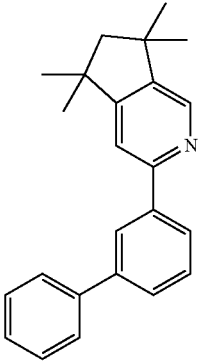 [SMILES: CC1(C)CC(C)(C)c2cc(-c3cccc(-c4ccccc4)c3)ncc21] | 48% |
| L45 | 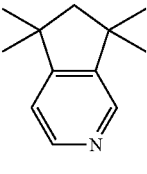<br>S24 | 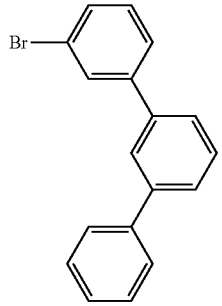 [SMILES: Brc1cccc(-c2cccc(-c3ccccc3)c2)c1]<br>98905-03-4 | 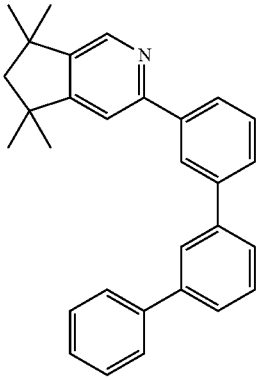 [SMILES: CC1(C)CC(C)(C)c2cc(-c3cccc(-c4cccc(-c5ccccc5)c4)c3)ncc21] | 46% |
| L46 | 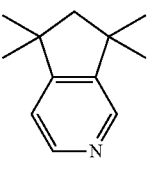<br>S24 | 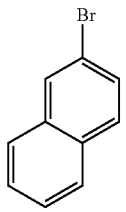 [SMILES: Brc1ccc2ccccc2c1]<br>580-13-2 | 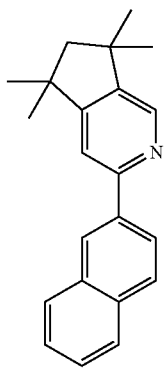 [SMILES: CC1(C)CC(C)(C)c2cc(-c3ccc4ccccc4c3)ncc21] | 50% |
| L47 | 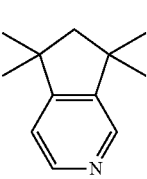<br>S24 | 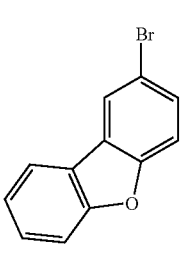 [SMILES: Brc1ccc2oc3ccccc3c2c1]<br>86-76-0 | 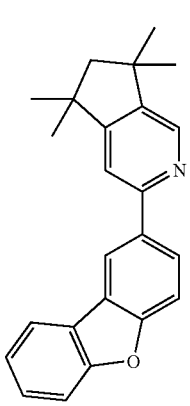 [SMILES: CC1(C)CC(C)(C)c2cc(-c3ccc4oc5ccccc5c4c3)ncc21] | 47% |

-continued
| Ex. | Pyridine | Bromide | Ligand | Yield |
|---|---|---|---|---|
| L48 | 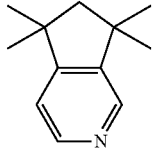<br>S24 | 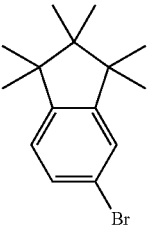<br>S5-Br | 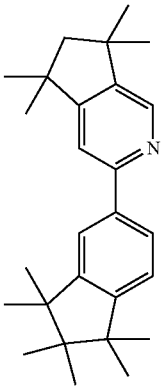 [SMILES: CC1(C)CC(C)(C)c2cc(-c3ccc4c(c3)C(C)(C)C(C)(C)C4(C)C)ncc21] | 51% |
| L49 | 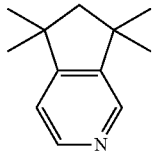<br>S24 | 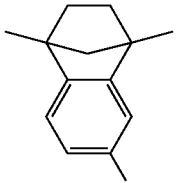<br>S13-Br | 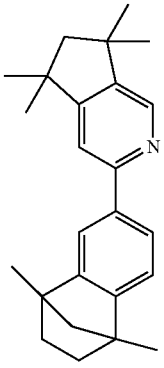 | 49% |
| L50 | 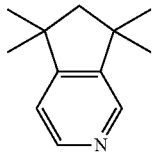<br>S24 | 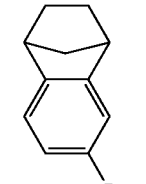<br>16499-72-2<br>S11-Br | 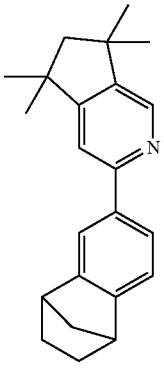 [SMILES: CC1(C)CC(C)(C)c2cc(-c3ccc4c(c3)C3CCC4C3)ncc21] | 45% |
| L51 | 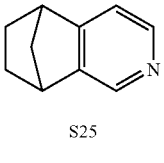<br>S25 | 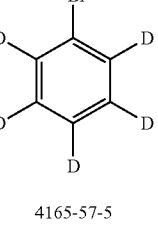<br>4165-57-5 | 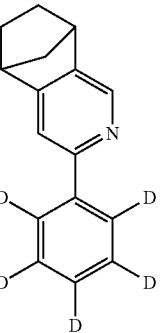 | 46% |

| Ex. | Pyridine | Bromide | Ligand | Yield |
|---|---|---|---|---|
| L52 | S26 | S5-Br | | 40% |

Example 53: 6,6,7,7,8,8-Hexamethyl-2-phenyl-7,8-dihydro-6H-cyclopenta[g]quinoxaline, L53

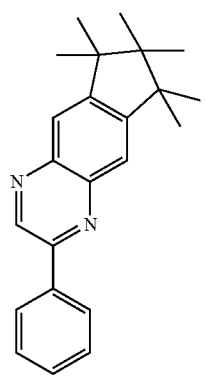 [SMILES: CC1(C)c2cc3ncc(-c4ccccc4)nc3cc2C(C)(C)C1(C)C]

Procedure analogous to S. V. More et al., Tetrahedron Lett. 2005, 46, 6345.

A mixture of 23.2 g (100 mmol) of 1,1,2,2,3,3-hexamethylindane-5,6-diamine, S35, 13.4 g (100 mmol) of oxo-phenylacetaldehyde [1074-12-0], 767 mg (3 mmol) of iodine and 75 ml of acetonitrile is stirred at room temperature for 16 h. The precipitated solid is filtered off with suction, washed once with 20 ml of acetonitrile, twice with 75 ml of n-heptane each time and then recrystallised twice from ethanol/ethyl acetate. Finally, the solid is freed from low-boiling components and non-volatile secondary components by fractional sublimation (p about $10^{-4}$-$10^{-5}$ mbar, T about 220° C.). Yield: 22.1 g (67 mmol), 67%; purity: about 99.5% according to $^1$H-NMR.

The following compounds are prepared analogously. Solids are freed from low-boiling components and non-volatile secondary components by recrystallisation and fractional sublimation (p about $10^{-4}$-$10^{-5}$ mbar, T about 160-240° C.). Oils are purified by chromatography, subjected to fractional bulb-tube distillation or dried in vacuo in order to remove low-boiling components.

| Ex. | Diamine | Diketone | Ligand | Yield |
|---|---|---|---|---|
| L54 | S35 | 579-07-7 | | 58% |

-continued

| Ex. | Diamine | Diketone | Ligand | Yield |
|---|---|---|---|---|
| L55 | S36 | 134-81-6 | | 69% |
| L56 | S38 | 579-07-7 | | 60% |
| L57 | S39 | 134-81-6 | | 70% |
| L58 | S37 | 3457-48-5 | | 48% |

US 11,005,050 B2
149
150
-continued
| Ex. | Diamine | Diketone | Ligand | Yield |
|---|---|---|---|---|
| L59 | 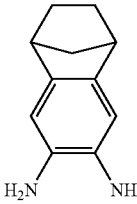<br>124639-03-8 | 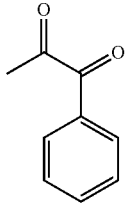<br>579-07-7 | 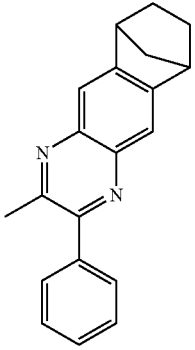 [SMILES: Cc1nc2cc3c(cc2nc1-c1ccccc1)C1CCC3C1] | 55% |
| L60 | 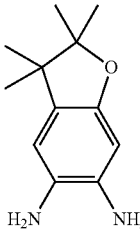<br>S40 | 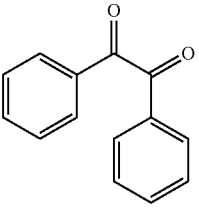 [SMILES: O=C(C(=O)c1ccccc1)c1ccccc1]<br>134-81-6 | 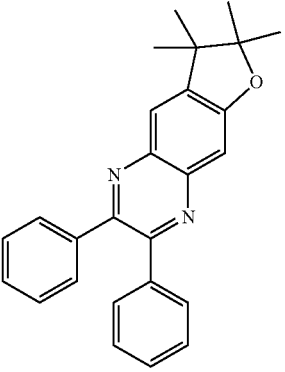 [SMILES: CC1(C)Oc2cc3nc(-c4ccccc4)c(-c4ccccc4)nc3cc2C1(C)C] | 68% |
| L61 | 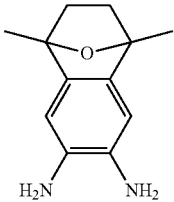<br>S41 | 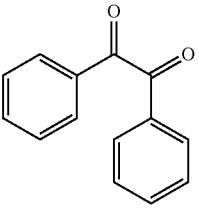 [SMILES: O=C(C(=O)c1ccccc1)c1ccccc1]<br>134-81-6 | 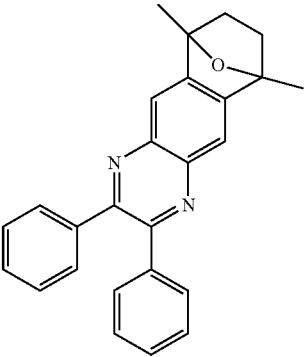 [SMILES: CC12CCC(C)(O1)c1cc3nc(-c4ccccc4)c(-c4ccccc4)nc3cc12] | 59% |
| L62 | 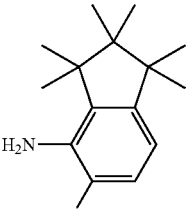<br>S35b | 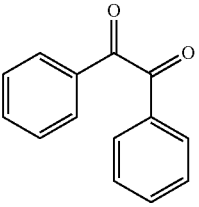 [SMILES: O=C(C(=O)c1ccccc1)c1ccccc1]<br>134-81-6 | 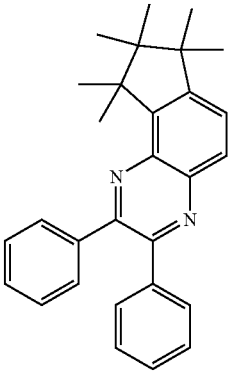 [SMILES: CC1(C)c2ccc3nc(-c4ccccc4)c(-c4ccccc4)nc3c2C(C)(C)C1(C)C] | 62% |

-continued
| Ex. | Diamine | Diketone | Ligand | Yield |
|---|---|---|---|---|
| L63 | 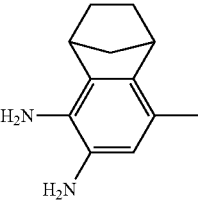 S42 | 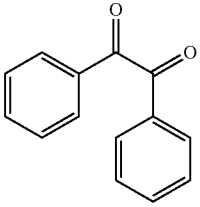 [SMILES: O=C(C(=O)c1ccccc1)c1ccccc1] 134-81-6 | 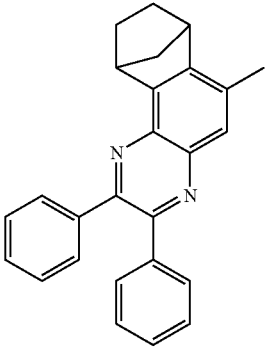 [SMILES: Cc1cc2nc(-c3ccccc3)c(-c3ccccc3)nc2c2c1C1CCC2C1] | 51% |
| LB23 | 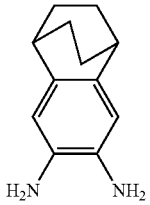 SB9 | 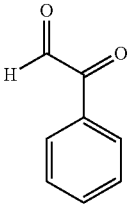 1074-12-0 | 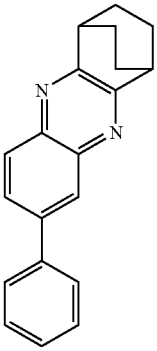 [SMILES: c1ccc(-c2ccc3nc4c(nc3c2)C2CCC4CC2)cc1] | 34% |
| LB24 | 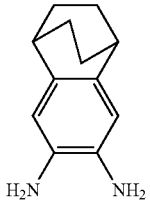 SB9 | 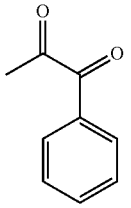 579-07-7 | 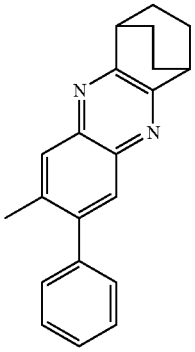 [SMILES: Cc1cc2nc3c(nc2cc1-c1ccccc1)C1CCC3CC1] | 44% |
| LB25 | 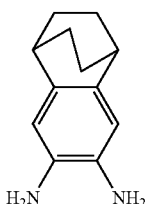 SB9 | 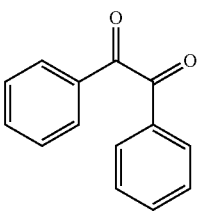 [SMILES: O=C(C(=O)c1ccccc1)c1ccccc1] 134-81-6 | 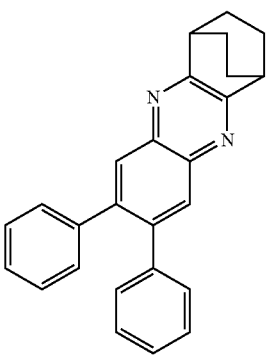 [SMILES: c1ccc(-c2cc3nc4c(nc3cc2-c2ccccc2)C2CCC4CC2)cc1] | 67% |

US 11,005,050 B2
153                                                                                    154
-continued
| Ex. | Diamine | Diketone | Ligand | Yield |
|---|---|---|---|---|
| LB26 | 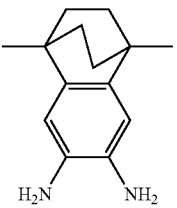 SB10 | 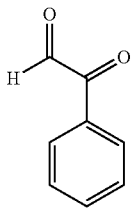 1074-12-0 | 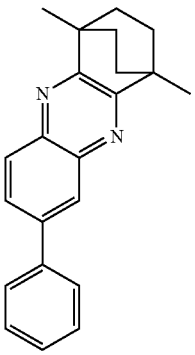 [SMILES: CC12CCC(C)(CC1)c1nc3cc(-c4ccccc4)ccc3nc12] | 38% |
| LB27 | 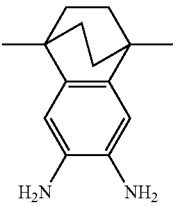 SB10 | 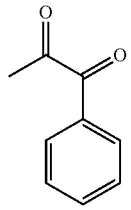 579-07-7 | 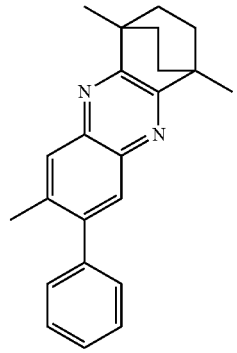 | 50% |
| LB28 | 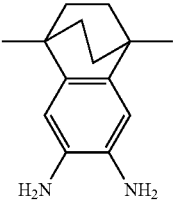 SB10 | 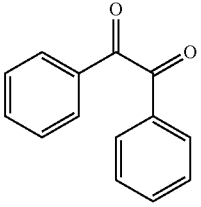 [SMILES: O=C(C(=O)c1ccccc1)c1ccccc1] 134-81-6 | 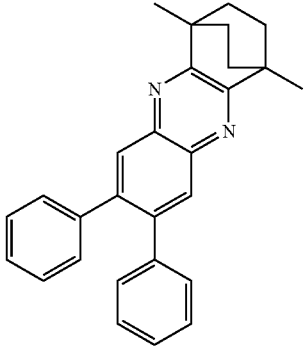 [SMILES: CC12CCC(C)(CC1)c1nc3cc(-c4ccccc4)c(-c4ccccc4)cc3nc12] | 71% |
| LB29 | 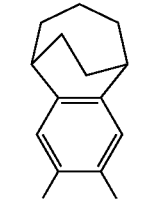 SB11 | 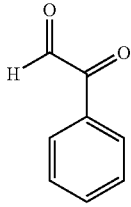 1074-12-0 | 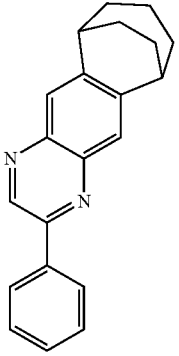 [SMILES: c1ccc(-c2cnc3cc4c(cc3n2)C2CCCC4CC2)cc1] | 35% |

-continued

| Ex. | Diamine | Diketone | Ligand | Yield |
|---|---|---|---|---|
| LB30 | SB12 | 1074-12-0 | | 38% |
| LB31 | SB12 | 579-07-7 | | 43% |
| LB32 | SB12 | 134-81-6 | | 59% |

Example 64: 5,5,6,6,7-Hexamethyl-1,2-diphenyl-1,5,6,7-tetrahydroindeno[5,6-d]imidazole, L64

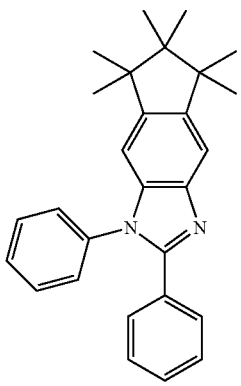 [SMILES: CC1(C)c2cc3nc(-c4ccccc4)n(-c4ccccc4)c3cc2C(C)(C)C1(C)C]

Procedure analogous to D. Zhao et al., Org. Lett., 2011, 13, 24, 6516. A mixture of 36.0 g (100 mmol) of 5,6-dibromo-1,1,2,2,3,3-hexamethylindane, 21.6 g (110 mmol) of N-phenylbenzamidine [1527-91-9], 97.8 g (300 mmol) of caesium carbonate, 100 g of molecular sieve 4 A, 1.2 g (2 mmol) of xantphos, 449 mg (2 mmol) of palladium(II) acetate and 600 ml of o-xylene is heated under reflux with vigorous stirring for 24 h. After cooling, the salts are filtered off with suction via a Celite bed, rinsed with 500 ml of o-xylene, the solvent is removed in vacuo, and the residue is recrystallised three times from cyclohexane/ethyl acetate. Finally, the solid is freed from low-boiling components and non-volatile secondary components by fractional sublimation (p about $10^{-4}$-$10^{-5}$ mbar, T about 230° C.). Yield: 28.0 g (71 mmol), 71%; purity: about 99.5% according to $^1$H-NMR.

The following compounds are prepared analogously. Solids are freed from low-boiling components and non-volatile secondary components by recrystallisation and fractional sublimation (p about $10^{-4}$-$10^{-5}$ mbar, T about 160-240° C.). Oils can be purified by chromatography, subjected to fractional bulb-tube distillation or dried in vacuo in order to remove low-boiling components.

| Ex. | 1,2-Dihalogen compound | Benzamidine | Ligand | Yield |
|---|---|---|---|---|
| L65 | 1311465-45-8 | 34028-17-6 | | 75% |
| L66 | S28 | 57327-73-8 | | 77% |

-continued
| Ex. | 1,2-Dihalogen compound | Benzamidine | Ligand | Yield |
|---|---|---|---|---|
| L67 | 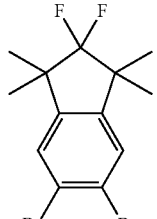<br>S29 | 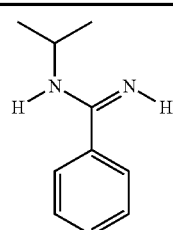<br>53510-31-9 | 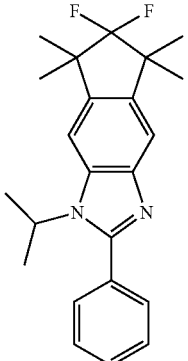 | 73% |
| L68 | 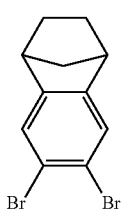 [SMILES: Brc1cc2c(cc1Br)C1CCC2C1]<br>42810-32-2 | 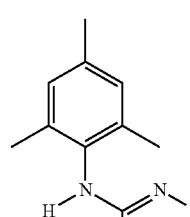<br>72340-27-3 | 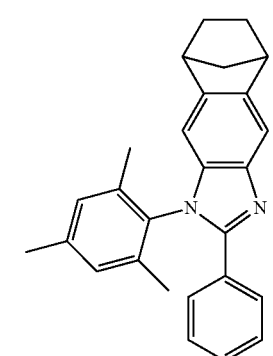 | 68% |
| L69 | 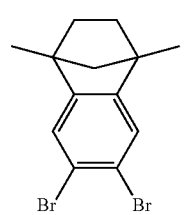<br>S30 | 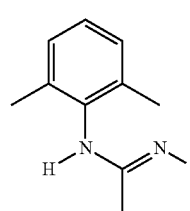<br>16239-27-3 | 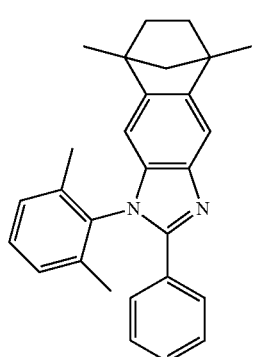 | 69% |
| L70 | 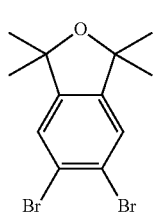<br>S31 | 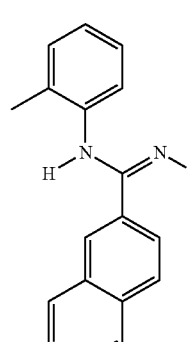<br>856062-57-2 | 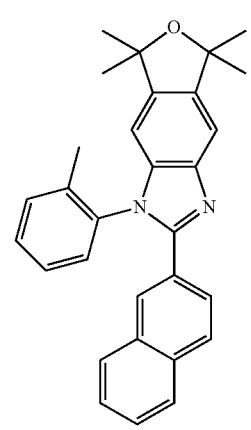 [SMILES: Cc1ccccc1-n1c(-c2ccc3ccccc3c2)nc2cc3c(cc21)C(C)(C)OC3(C)C] | 71% |

-continued

| Ex. | 1,2-Dihalogen compound | Benzamidine | Ligand | Yield |
|---|---|---|---|---|
| L71 | S32 | 64499-61-2 | | 64% |
| L72 | S33 | 787563-35-3 | | 36% |
| L73 | S34 | 16239-27-3 | | 44% |
| L74 | 75267-72-0 | 16239-27-3 | | 43% |

-continued
| Ex. | 1,2-Dihalogen compound | Benzamidine | Ligand | Yield |
|---|---|---|---|---|
| L75 | 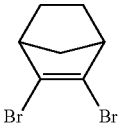<br>75267-72-0 | 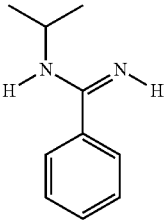<br>53510-31-9 | 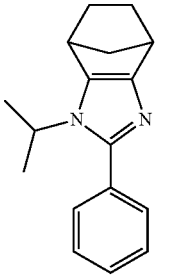 [SMILES: CC(C)n1c(-c2ccccc2)nc2c1C1CCC2C1] | 40% |
| L76 | 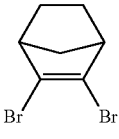<br>75267-72-0 | 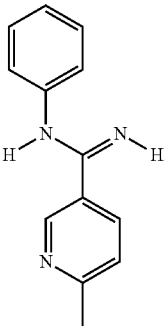 [SMILES: [H]/N=C(/Nc1ccccc1)c1ccc(C)nc1]<br>787563-35-3 | 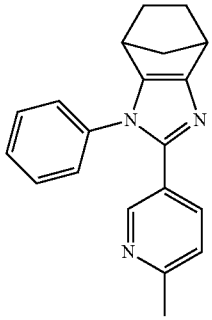 [SMILES: Cc1ccc(-c2nc3c(n2-c2ccccc2)C2CCC3C2)cn1] | 38% |
| L77 | 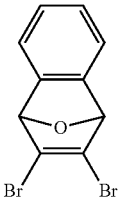<br>301829-08-3 | 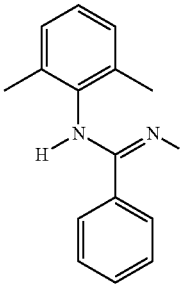<br>16239-27-3 | 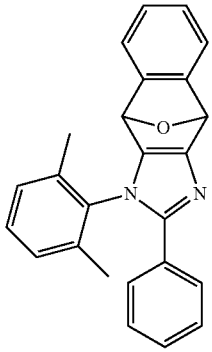 [SMILES: Cc1cccc(C)c1-n1c(-c2ccccc2)nc2c1C1OC2c2ccccc21] | 39% |
| LB33 | 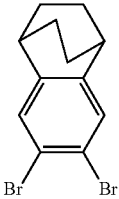 [SMILES: Brc1cc2c(cc1Br)C1CCC2CC1]<br>SB5 | 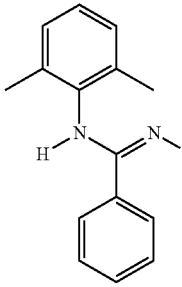<br>16239-27-3 | 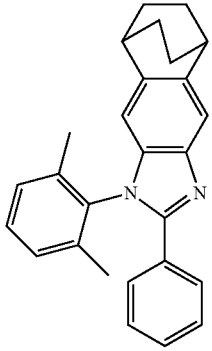 [SMILES: Cc1cccc(C)c1-n1c(-c2ccccc2)nc2cc3c(cc21)C1CCC3CC1] | 44% |

-continued
| Ex. | 1,2-Dihalogen compound | Benzamidine | Ligand | Yield |
|---|---|---|---|---|
| LB34 | 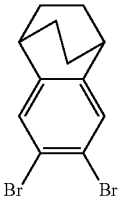 [SMILES: Brc1cc2c(cc1Br)C1CCC2CC1]<br>SB5 | 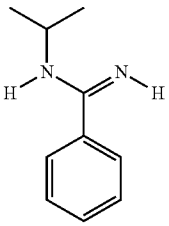<br>53510-31-9 | 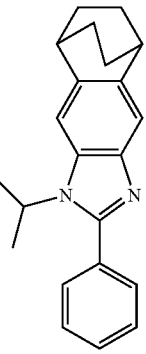 | 40% |
| LB35 | 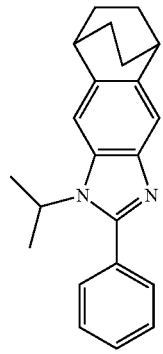 [SMILES: CC(C)n1c(-c2ccccc2)nc2cc3c(cc21)C1CCC3CC1]<br>SB5 | 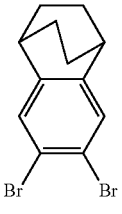<br>787563-35-3 | 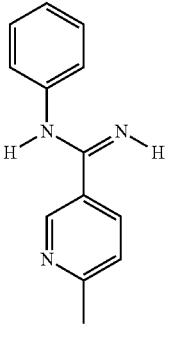 [SMILES: [H]/N=C(/Nc1ccccc1)c1ccc(C)nc1] | 45% |
| LB36 | 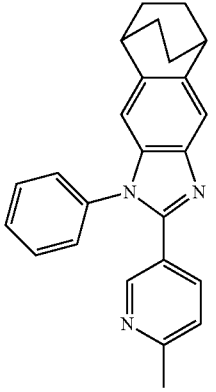 [SMILES: Cc1ccc(-c2nc3cc4c(cc3n2-c2ccccc2)C2CCC4CC2)cn1]<br>SB6 | 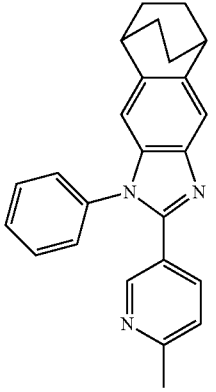 [SMILES: Cc1ccc(-c2nc3cc4c(cc3n2-c2ccccc2)C2CCC4CC2)cn1]<br>16239-27-3 | 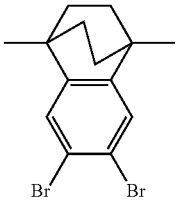 | 41% |
| LB37 | 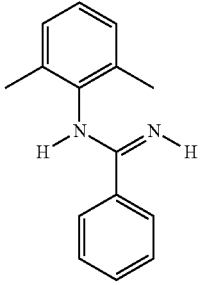 [SMILES: [H]/N=C(/Nc1c(C)cccc1C)c1ccccc1]<br>SB6 | 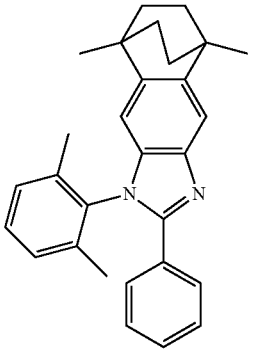 [SMILES: Cc1cccc(C)c1-n1c(-c2ccccc2)nc2cc3c(cc21)C1(C)CCC3(C)CC1]<br>53510-31-9 | 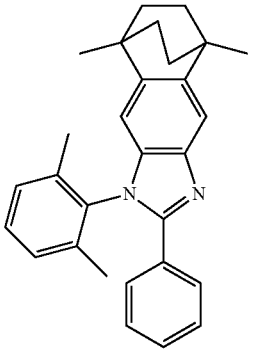 [SMILES: Cc1cccc(C)c1-n1c(-c2ccccc2)nc2cc3c(cc21)C1(C)CCC3(C)CC1] | 37% |

-continued
| Ex. | 1,2-Dihalogen compound | Benzamidine | Ligand | Yield |
|---|---|---|---|---|
| LB38 | 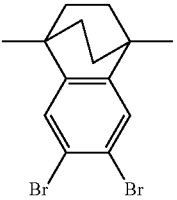 SB6 | 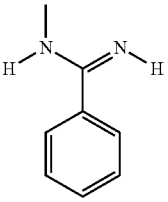 34028-17-6 | 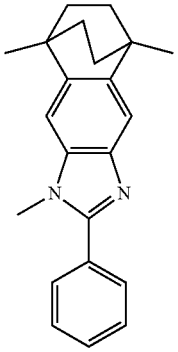 | 38% |
| LB39 | 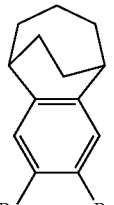 SB7 | 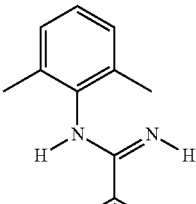 16239-27-3 | 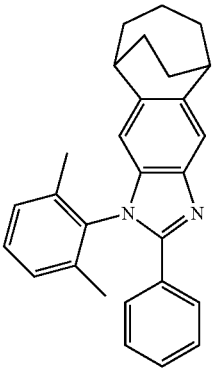 [SMILES: Cc1cccc(C)c1-n1c(-c2ccccc2)nc2cc3c(cc21)C1CCCC3CC1] | 34% |
| LB40 | 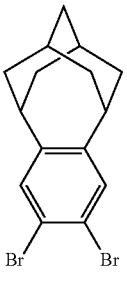 SB8 | 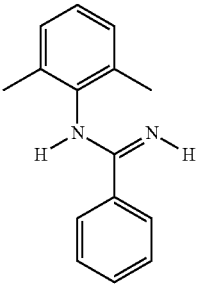 16239-27-3 | 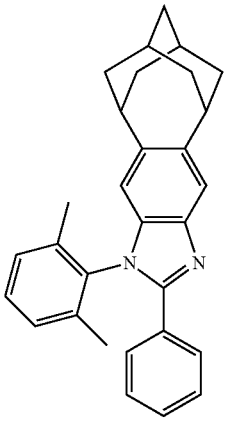 [SMILES: Cc1cccc(C)c1-n1c(-c2ccccc2)nc2cc3c(cc21)C1CC2CC(CC3C2)C1] | 46% |
| LB41 | 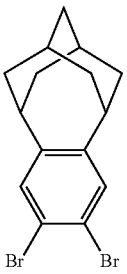 SB8 | 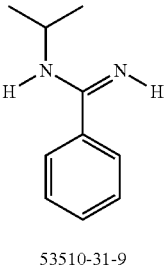 53510-31-9 | 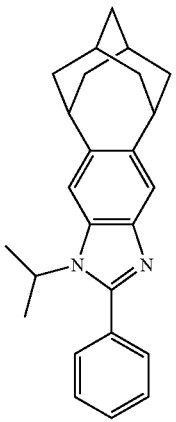 [SMILES: CC(C)n1c(-c2ccccc2)nc2cc3c(cc21)C1CC2CC(CC3C2)C1] | 43% |

| Ex. | 1,2-Dihalogen compound | Benzamidine | Ligand | Yield |
|---|---|---|---|---|
| LB42 |  SB8 | 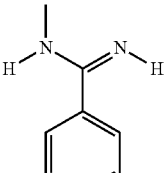 34028-17-6 | 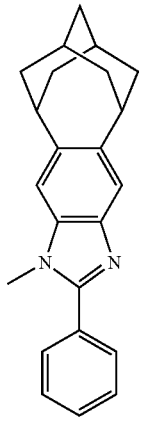 [SMILES: Cn1c(-c2ccccc2)nc2cc3c(cc21)C1CC2CC(CC3C2)C1] | 43% |

Example 78: 1,5,5,6,6,7,7-Heptamethyl-3-phenyl-1,5,6,7-tetrahydroindeno[5,6d]imidazolium iodide, L78

A) 5,5,6,6,7,7-Hexamethyl-1,5,6,7-tatrahydroindeno[5,6-d]imidazole

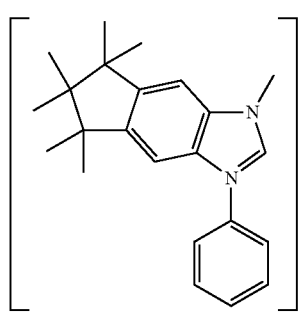

Procedure analogous to Z.-H. Zhang et al., J. Heterocycl. Chem. 2007, 44, 6, 1509. 1.3 g (5 mmol) of iodine are added to a vigorously stirred mixture of 116.2 g (500 mmol) of 1,1,2,2,3,3-hexamethylindane-5,6-diamine, S35, 90.9 ml (550 mmol) of triethoxymethane [122-51-0] and 400 ml of acetonitrile, and the mixture is stirred at room temperature for 5 h. The precipitated solid is filtered off with suction, washed once with a little acetonitrile, three times with 100 ml of n-heptane each time and dried in vacuo. Yield: 108.8 g (449 mmol), 90%; purity: about 97% according to $^1$H-NMR.

B) 5,5,6,6,7,7-Hexamethyl-1-phenyl-1,5,6,7-tetrahydroindeno[5,6-d]-imidazole

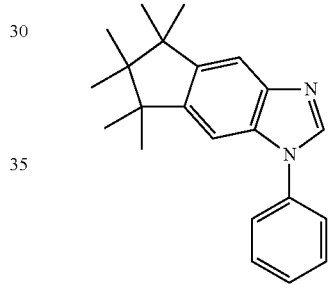

Procedure analogous to S. Zhang et al., Chem. Commun. 2008, 46, 6170. A mixture of 24.2 g (100 mmol) of 5,5,6,6,7,7-hexamethyl-1,5,6,7-tetrahydroindeno[5,6-d]imidazole, A), 12.6 ml (120 mmol) of bromobenzene [108-86-1], 27.6 g (200 mmol) of potassium carbonate, 952 mg (5 mmol) of copper(I) iodide, 1.0 g (10 mmol) of N,N-dimethylglycine, 200 g of glass beads (diameter 3 mm) and 300 ml of DMSO is heated at 120° C. with vigorous stirring for 36 h. After cooling, the salts are filtered off with suction, rinsed with 1000 ml of ethyl acetate, the combined organic phases are washed five times with 500 ml of water each time, once with 500 ml of saturated sodium chloride solution, dried over magnesium sulfate, the solvent is removed in vacuo, and the residue is recrystallised twice from cyclohexane. Yield: 28.3 g (89 mmol), 89%; purity: about 97% according to $^1$H-NMR.

C) 1,5,5,6,6,7,7-Heptamethyl-3-phenyl-1,5,6,7-tetrahydroindeno-[5,6-d]imidazolium iodide, L78

12.6 ml (200 mmol) of methyl iodide [74-88-4] are added with stirring to a suspension of 28.3 g (89 mmol) of 5,5,6,6,7,7-hexamethyl-1-phenyl-1,5,6,7-tetrahydroindeno

[5,6-d]imidazole, B), in 100 ml of THF, and the mixture is stirred at 45° C. for 24 h. After cooling, the precipitated solid is filtered off with suction, washed three times with 50 ml of ethanol each time and dried in vacuo. Yield: 23.5 g (51 mmol), 57%; purity: about 99% according to ¹H-NMR.

The following compounds are prepared analogously:

| Ex. | 1,2-Diamine | Brominated aromatic compound Alkyl halide | Ligand | Yield 3 steps |
|---|---|---|---|---|
| L79 | 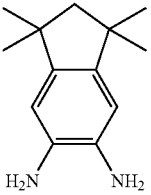 S37 |  623-00-7 MeI | 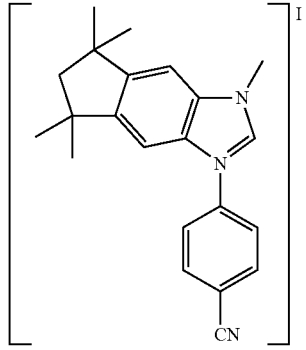 | 46% |
| L80 | 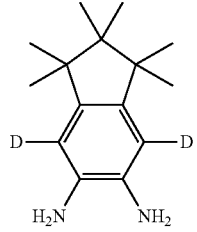 S38 | 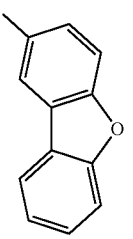 86-76-0 MeI | 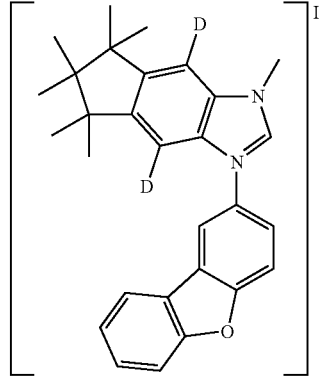 | 43% |
| L81 | 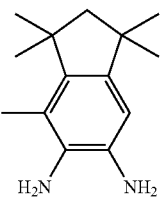 S39 | 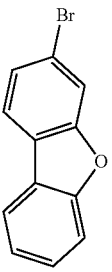 [SMILES: Brc1ccc2c(c1)oc1ccccc12] 26608-06-0 MeI | 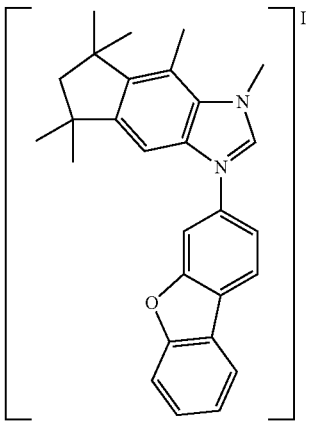 | 34% |

-continued

| Ex. | 1,2-Diamine | Brominated aromatic compound Alkyl halide | Ligand | Yield 3 steps |
|---|---|---|---|---|
| L82 | 124639-03-8 | 580-13-2 MeI | I | 41% |
| L83 | S40 | 3972-65-4 MeI | I (Chromatographic separation of the regioisomers) | 19% |
| L84 | S41 | 348-57-2 MeI | I | 37% |

| Ex. | 1,2-Diamine | Brominated aromatic compound Alkyl halide | Ligand | Yield 3 steps |
|---|---|---|---|---|
| L85 | 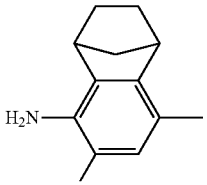<br>S42 | <br>28320-31-2<br>MeI | 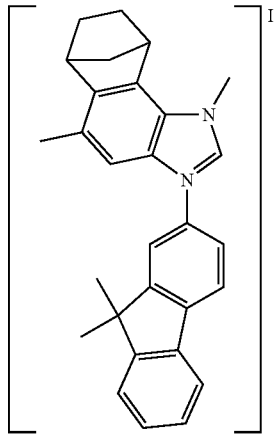 | 34% |
| L86 | 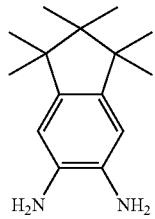<br>95-54-5<br>S35 | 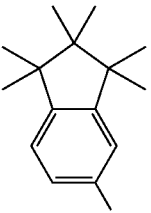<br>S5-Br<br>MeI | 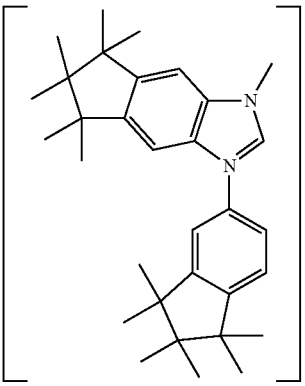 | 43% |
| L87 | 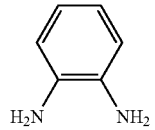<br>95-54-5 | 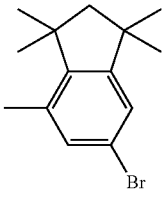<br>S7-Br<br>MeI | 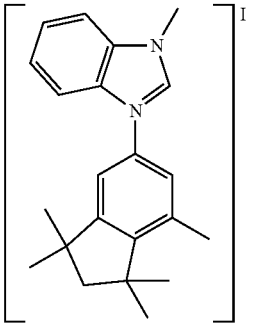 | 45% |
| L88 | 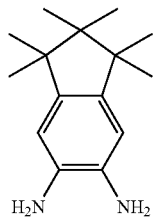<br>95-54-5<br>S35 | 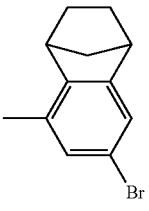<br>S12-Br<br>MeI | 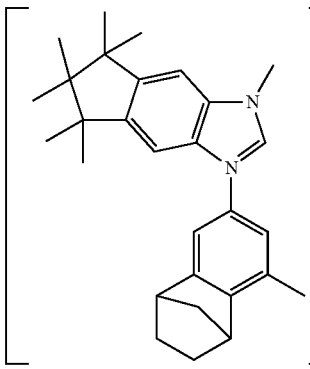 | 40% |

-continued

| Ex. | 1,2-Diamine | Brominated aromatic compound Alkyl halide | Ligand | Yield 3 steps |
|---|---|---|---|---|
| LB43 | SB9 | 623-00-7 MeI | | 39% |
| LB44 | SB9 | S5-Br MeI | | 37% |
| LB45 | SB10 | SB2-Br MeI | | 40% |
| LB46 | SB10 | S5-Br MeI | | 40% |

-continued

| Ex. | 1,2-Diamine | Brominated aromatic compound Alkyl halide | Ligand | Yield 3 steps |
|---|---|---|---|---|
| LB47 | SB11 | 3972-65-4<br>MeI | | 33% |
| LB48 | SB12 | 108-86-1<br>MeI | | 42% |
| LB49 | SB12 | SB2-Br<br>MeI | | 38% |
| LB50 | SB12 | S5-Br<br>MeI | | 39% |

-continued

| Ex. | 1,2-Diamine | Brominated aromatic compound Alkyl halide | Ligand | Yield 3 steps |
|---|---|---|---|---|
| LB51 | SB12 | SB4-Br | | 36% |

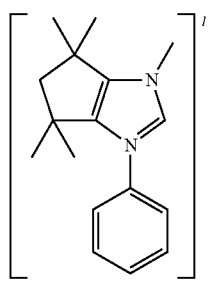

Example 89: 1,4,4,6,6-Pentamethyl-3-phenyl-1,4,5,6-tetrahydrocyclo-pentaimidazolium iodide, L89

A) 4,4,6,6-Tetramethyl-1,4,5,6-tetrahydrocyclopentaimidazole

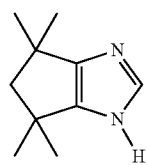

Preparation analogous to G. Bratulescu, Synthesis, 2009, 14, 2319. An intimate mixture of 1.54 g (10.0 mmol) of 3,3,5,5-tetramethylcyclopentane-1,2-dione [20633-06-1], 4.21 g (3.0 mmol) of urotropin, 7.7 g (10 mmol) of ammonium acetate and 0.3 ml of glacial acetic acid is heated in a temperature-controlled microwave until an internal temperature of about 120° C. has been reached, and is then held at this temperature for about 15 min. After cooling, the mass is added to 150 ml of water, the pH is adjusted to 8 using aqueous ammonia solution (10% by weight) with stirring, the precipitated solid is then filtered off with suction and washed with water. After drying, the product is recrystallised from ethanol/ethyl acetate. Yield: 1.17 g (7.1 mmol), 71%; purity: about 98% according to $^1$H-NMR.

B) 4,4,6,6-Tetramethyl-1-phenyl-1,4,5,6-tetrahydro-cyclopentaimidazole

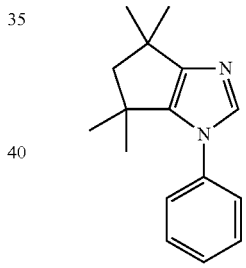

Preparation analogous to Example 78, B). Use of 1.64 g (10.0 mmol) of 4,4,6,6-tetramethyl-1,4,5,6-tetrahydrocyclopentaimidazole, A), the remaining starting materials and solvents are correspondingly adapted stoichiometrically. Yield: 1.53 g (6.3 mmol), 63%; purity: about 98% according to $^1$H-NMR.

C) 1,4,4,6,6-Pentamethyl-3-phenyl-1,4,5,6-tetrahydrocyclopenta-imidazolium iodide, L89

Preparation analogous to Example 78, C). Use of 2.4 g (10.0 mmol) of 4,4,6,6-tetramethyl-1-phenyl-1,4,5,6-tetrahydrocyclopentaimidazole, B), the remaining starting materials and solvents are correspondingly adapted stoichiometrically. Yield: 2.26 g (5.9 mmol), 59%; purity: about 99% according to $^1$H-NMR.

The following compounds are prepared analogously:

| Ex. | 1,2-Dione | Brominated aromatic compound Alkyl halide | Ligand | Yield 3 steps |
|---|---|---|---|---|
| L90 | 16980-19-1 | 28320-31-2 MeI | | 36% |
| L91 | 6236-71-1 | S5-Br MeI | | 40% |
| L92 | 62292-65-3 | 3972-65-4 MeI | | 33% |
| LB52 | 4216-89-1 | SB1-Br | | 30% |

-continued

| Ex. | 1,2-Dione | Brominated aromatic compound Alkyl halide | Ligand | Yield 3 steps |
|---|---|---|---|---|
| LB53 | 26775-76-8 | 108-86-1 MeI | | 31% |
| LB54 | 26775-76-8 | S5-Br MeI | | 34% |

Example 93: Ligands of the Benzo[4,5]Imidazo[2,1-c]Quinazoline Type

General Ligand Synthesis

From 2-amidoarylaldehydes and 1,2-diaminobenzenes

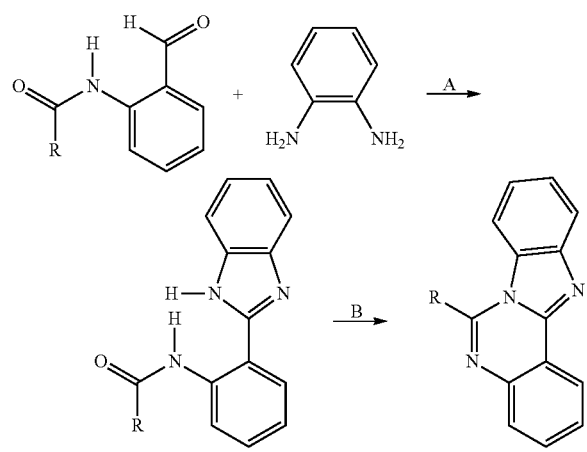

R = alkyl, aryl

Step A:

A solution of 100 mmol of the 2-amidoarylaldehyde and 110 mmol of the 1,2-diaminobenzene in 70 ml of ethanol is placed in a 500 ml round-bottomed flask with water separator and stirred at 50° C. for 30 min. 70 ml of nitrobenzene are then added, and the temperature is increased step-wise to gentle reflux of the nitrobenzene, with the ethanol and water formed being distilled off during the heating. After 4 h under gentle reflux, the mixture is allowed to cool to 50° C., 40 ml of methanol are added, the mixture is then allowed to cool fully with stirring, stirred at room temperature for a further 2 h, the crystals of 2-(2-amidophenyl)benzimidazole formed are then filtered off with suction, washed twice with 20 ml of methanol each time and dried in vacuo. If the 2-(2-amidophenyl)benzimidazole does not crystallise out, the solvent is removed in vacuo, and the residue is employed in step B.

Step B:

Variant A:

350 mmol of the corresponding carbonyl chloride and 50 mmol of the corresponding carboxylic acid are added to a vigorously stirred mixture (precision glass stirrer) of 100 mmol of the 2-(2-amidophenyl)benzimidazole and 150 ml of dioxane or diethylene glycol dimethyl ether, and the mixture is heated under reflux (typically 4-48 h) until the 2-(2- amidophenyl)benzimidazole has reacted. Corresponding carbonyl chlorides and carboxylic acids are those which form the respective amide radical. After cooling, the reaction mixture is introduced with vigorous stirring into a mixture of 1000 g of ice and 300 ml of aqueous conc. ammonia. If the product is produced in the form of a solid, this is filtered off with suction, washed with water and sucked dry. If the product is produced in the form of an oil, this is extracted with three portions of 300 ml each of ethyl acetate or dichloromethane. The organic phase is separated off, washed with 500 ml of water and evaporated in vacuo. The crude product is taken up in ethyl acetate or dichloromethane, filtered through a short column of aluminium oxide, basic, activity grade 1, or silica gel in order to remove brown impurities. After recrystallisation (methanol, ethanol, acetone, dioxane, DMF, etc.) of the benzo[4,5]-imidazo[2,1-c]quinazoline obtained in this way, the latter is freed from low-boiling components and non-volatile secondary components by bulb-tube distillation or fractional sublimation (p about $10^{-4}$-$10^{-5}$ mbar, T about 160-240° C.). Compounds containing aliphatic radicals having more than 6 C atoms, or those containing aralkyl groups having more than 9 C atoms, are typically purified by chromatography and then dried in vacuo in order to remove low-boiling components. Purity according to $^1$H-NMR typically >99.5%.

Variant B:

Analogous procedure to variant A, but 50 mmol of water are added instead of the carboxylic acid.

Variant C:

Analogous procedure to variant A, but no carboxylic acid is added.

Example L93

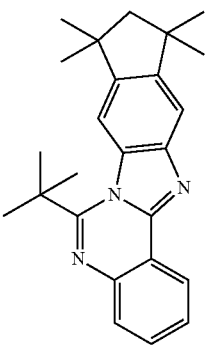 [SMILES: CC(C)(C)c1nc2ccccc2c2nc3cc4c(cc3n12)C(C)(C)CC4(C)C]

Step A:

Use of 20.5 g (100 mmol) of S69 and 22.5 g (110 mmol) of S16.

The 2,2-dimethyl-N-[2-(5,5,7,7-tetramethyl-1,5,6,6-tetrahydroindeno[5,6-d]-imidazol-2-yl)phenyl]propionamide crystallises out, yield 31.6 g (81 mmol) 81%; purity: 97% according to $^1$H-NMR.

Step B, Variant A:

Use of 31.6 g (81 mmol) of 2,2-dimethyl-N-[2-(5,5,7,7-tetramethyl-1,5,6,6-tetrahydroindeno[5,6-d]imidazol-2-yl)phenyl]propionamide (step A), 120 ml of dioxane, 33.8 g (280 mmol) of pivaloyl chloride [3282-30-2] and 4.1 g (40 mmol) of pivalic acid [75-98-9], reaction time 16 h, the crude product is produced in the form of a solid on neutralisation, recrystallisation from DMF/ethanol, fractional sublimation of the product twice at T about 170° C., p about $10^{-4}$ mbar. Yield: 19.3 g (52 mmol), 64%; purity: about 99.5% according to $^1$H-NMR.

The following compounds are prepared analogously:

| Ex. | 2-Amidoaryl-aldehyde | 1,2-Diamino-benzene | Ligand | Yield 2 steps |
|---|---|---|---|---|
| L94 | 6141-21-5 | S35 | | 55% |
| LB55 | 6141-21-5 | SB9 | | 51% |

| Ex. | 2-Amidoaryl-aldehyde | 1,2-Diamino-benzene | Ligand | Yield 2 steps |
|---|---|---|---|---|
| LB56 | 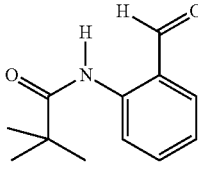<br>6141-21-5 | 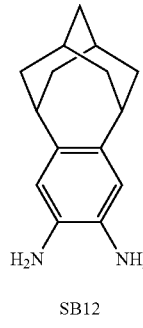<br>SB12 | 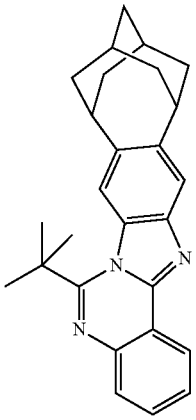 [SMILES: CC(C)(C)c1nc2ccccc2c2nc3cc4c(cc3n12)C1CC2CC(CC4C2)C1] | 50% |

Example L95: 1,1,2,2,3,3-Hexamethyl-5-phenyl-2,3-dihydro-1H-6-aza-cyclopenta[b]naphthalene, L95

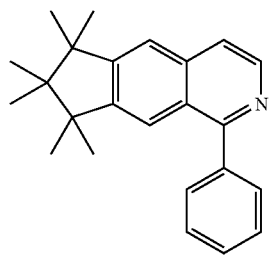 [SMILES: CC1(C)c2cc3ccnc(-c4ccccc4)c3cc2C(C)(C)C1(C)C]

17.0 g (120 mmol) of phosphorus pentoxide are added in portions with vigorous stirring at 90° C. to a solution of 34.8 g (100 mmol) of N-[2-(1,1,2,2,3,3-hexamethylindan-5-yl)ethyl]benzamide, S43, in 150 ml of o-xylene. 28.0 ml (300 mmol) of phosphoryl chloride are added dropwise to this reaction mixture, which is then stirred under reflux for a further 4 h. The reaction mixture cooled to 80° C. is poured onto 1000 g of ice with vigorous stirring and then rendered alkaline (pH about 12) by addition of solid NaOH. The mixture is extracted three times with 300 ml of toluene each time, the organic phase is washed three times with water, dried over magnesium sulfate, and the solvent is removed in vacuo. The oily residue is dissolved in 200 ml of o-dichlorobenzene, 86.9 g (1 mol) of manganese dioxide are added to the solution, and the mixture is subsequently boiled under reflux on a water separator for 16 h. After cooling, the manganese dioxide is filtered off via a Celite bed, the solid is washed with 500 ml of a mixture of dichloromethane and ethanol (10:1), and the combined filtrates are freed from the solvents in vacuo. The residue is recrystallised from cyclohexane/ethyl acetate and finally freed from low-boiling components and non-volatile secondary components by fractional sublimation (p about $10^{-4}$-$10^{-5}$ mbar, T about 230° C.). Yield: 20.1 g (61 mmol), 61%; purity: about 99.5% according to $^1$H-NMR.

The following compounds can be prepared analogously:

| Ex. | Starting material | Product | Yield |
|---|---|---|---|
| L96 | 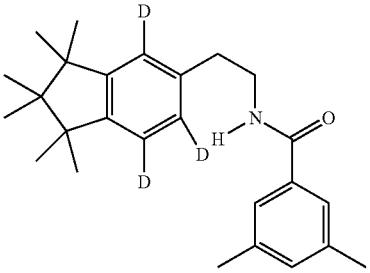<br>S44 | 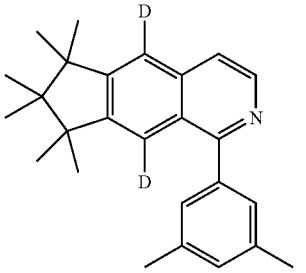 | 66% |

-continued
| Ex. | Starting material | Product | Yield |
|---|---|---|---|
| L97 | 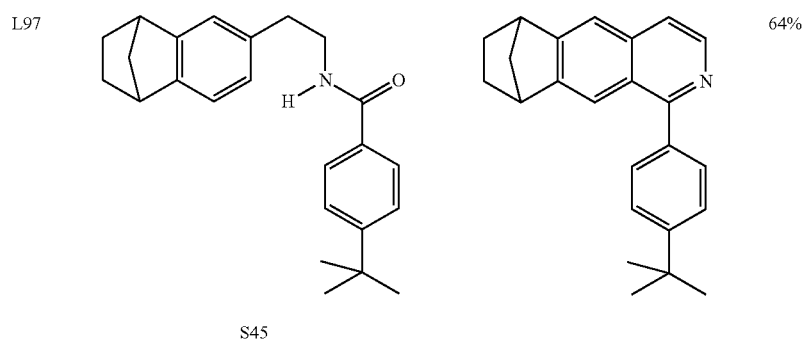 S45 | | 64% |
| L98 | 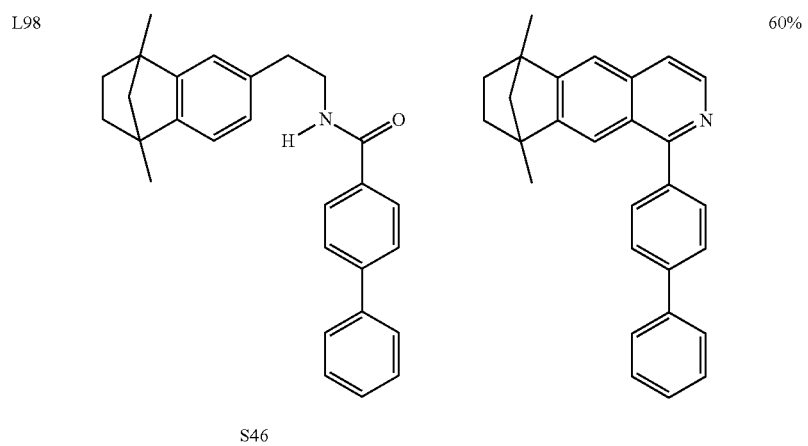 S46 | | 60% |
| L99 | 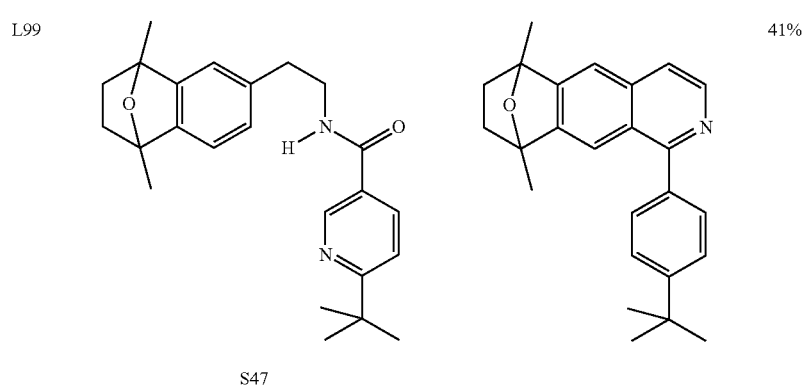 S47 | | 41% |
| L100 | 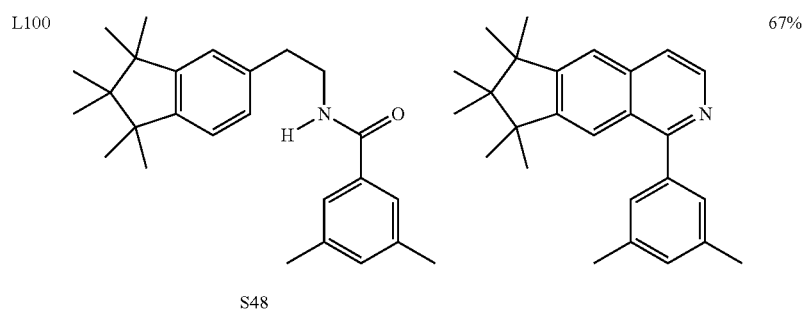 S48 | | 67% |

-continued

| Ex. | Starting material | Product | Yield |
|---|---|---|---|
| L101 | S49 | | 65% |
| LB57 | SB13 | | 63% |

Example L102: 7,8,9,10-Tetrahydro-7,10-methano-6-phenylphen-anthridine, L102

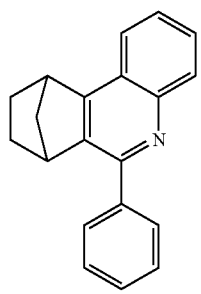 [SMILES: c1ccc(-c2nc3ccccc3c3c2C2CCC3C2)cc1]

14.2 g (100 mmol) of boron trifluoride etherate are added dropwise to a vigorously stirred mixture of 46.6 g (500 mmol) of aniline, 58.4 g (550 mmol) of benzaldehyde, 94.2 g (1 mol) of norbornene and 1300 ml of dichloromethane, and the mixture is then heated under reflux for 40 h. After cooling, the reaction mixture is washed twice with 400 ml of water each time, the organic phase is dried over magnesium sulfate, and the dichloromethane is then removed in vacuo. The residue is taken up in 1000 ml of o-dichlorobenzene, 435 g (5 mol) of manganese dioxide are added, and the mixture is heated under reflux on a water separator for 16 h. After cooling, 1000 ml of ethyl acetate are added, the manganese dioxide is filtered off with suction via a Celite bed, the manganese dioxide is rinsed with 1000 ml of ethyl acetate, and the combined filtrates are freed from the solvents in vacuo. The residue is recrystallised twice from cyclohexane and finally freed from low-boiling components and non-volatile secondary components by fractional sublimation (p about $10^{-4}$-$10^{-5}$ mbar, T about 230° C.). Yield: 76.0 g (280 mmol), 56%; purity: about 99.5% according to $^1$H-NMR.

The following compounds can be prepared analogously:
| Ex. | Starting material | Product | Yield |
|---|---|---|---|
| L103 |  498-66-8<br>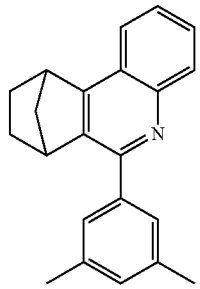 [SMILES: Cc1cc(C)cc(-c2nc3ccccc3c3c2C2CCC3C2)c1] 62-53-3<br>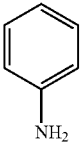 5779-95-3 | 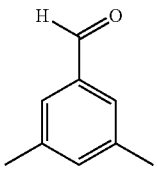 | 66% |
| L104 |  <br>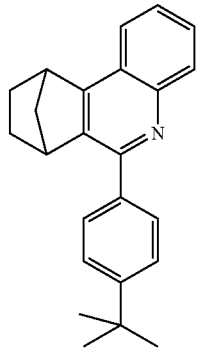 [SMILES: CC(C)(C)c1ccc(-c2nc3ccccc3c3c2C2CCC3C2)cc1] <br>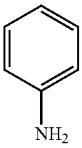 939-97-9 | 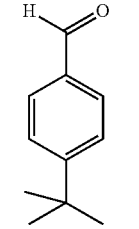 | 64 |
| L105 |  <br>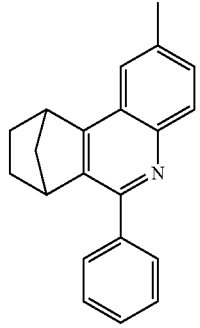 [SMILES: Cc1ccc2nc(-c3ccccc3)c3c(c2c1)C1CCC3C1] 106-49-0 |  | 56% |

| Ex. | Starting material | Product | Yield |
|---|---|---|---|
| | 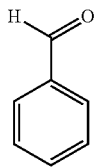 | | |
| L106 | 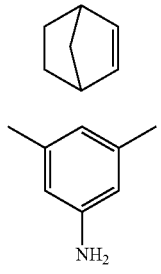 100-52-7 | | 58% |
| L107 | 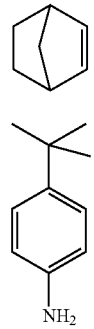 769-92-6 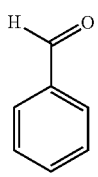 | | 61% |

| Ex. | Starting material | Product | Yield |
|---|---|---|---|
| L108 | <br>92-67-1 | 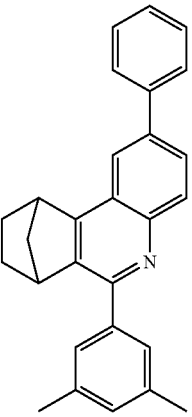 [SMILES: Cc1cc(C)cc(-c2nc3ccc(-c4ccccc4)cc3c3c2C2CCC3C2)c1] | 63% |
| L109 | <br>66-99-9 | 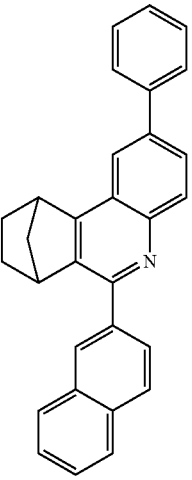 [SMILES: c1ccc(-c2ccc3nc(-c4ccc5ccccc5c4)c4c(c3c2)C2CCC4C2)cc1] | 58% |

| Ex. | Starting material | Product | Yield |
|---|---|---|---|
| L110 | 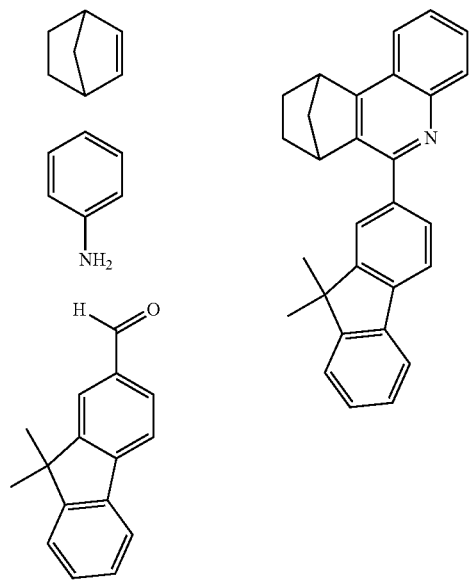 | | 55% |
| | 848300-71-8 | | |
| L111 | 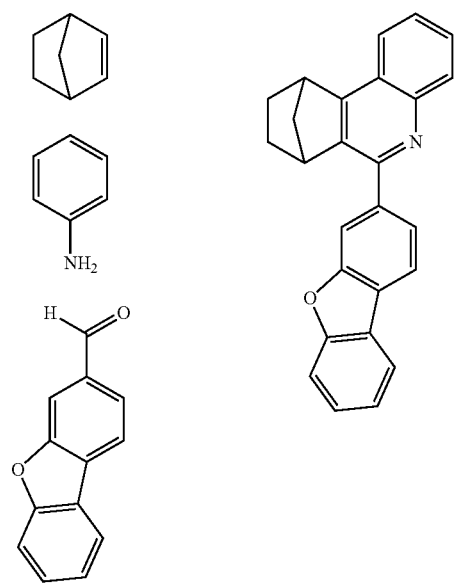 | | 60% |
| | 51818-91-8 | | |

| Ex. | Starting material | Product | Yield |
|---|---|---|---|
| L112 | 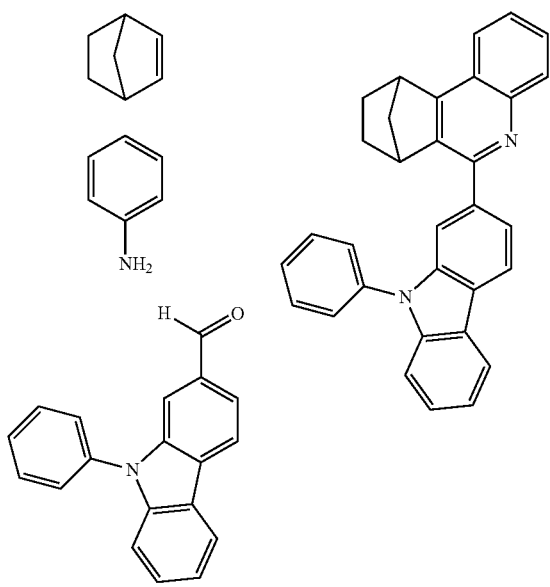 | | 34% |
| | 1353684-87-3 | | |
| L113 | 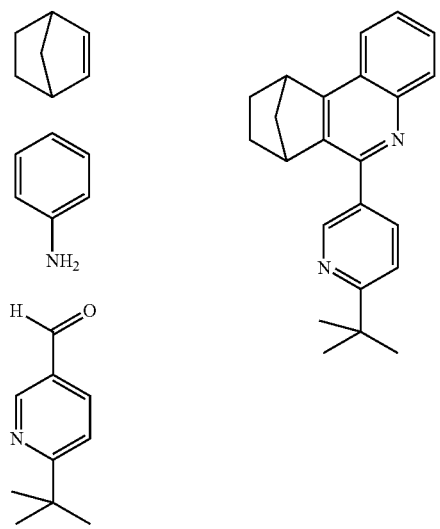 | | 69% |
| | 391900-69-9 | | |

-continued
| Ex. | Starting material | Product | Yield |
|---|---|---|---|
| L114 | 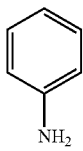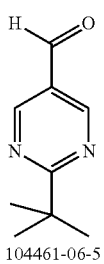104461-06-5 | 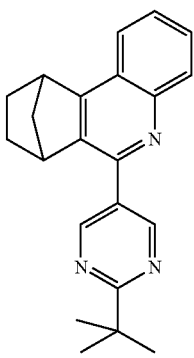 [SMILES: CC(C)(C)c1ncc(-c2nc3ccccc3c3c2C2CCC3C2)cn1] | 67% |
| L115 | 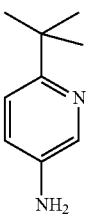39919-70-5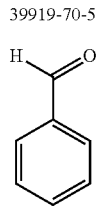 | 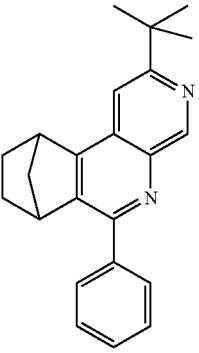 [SMILES: CC(C)(C)c1cc2c3c(c(-c4ccccc4)nc2cn1)C1CCC3C1]L115a<br><br>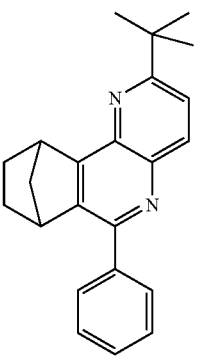 [SMILES: CC(C)(C)c1ccc2nc(-c3ccccc3)c3c(c2n1)C1CCC3C1]L115b<br>Chromatographic separation of the regioisomers | 23%<br><br><br>17% |

| Ex. | Starting material | Product | Yield |
|---|---|---|---|
| L116 |  59950-55-9 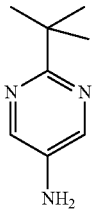 | 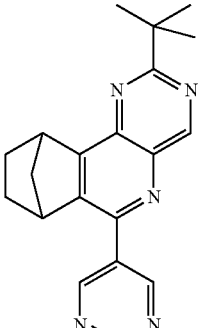 | 50% |
| L117 | 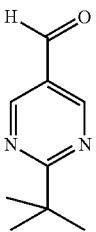 6541-60-2  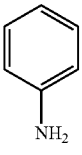 | 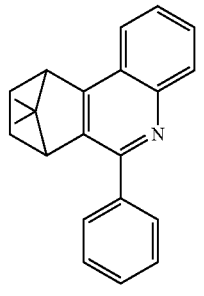 [SMILES: CC1(C)C2CCC1c1c2c(-c2ccccc2)nc2ccccc12] | 48% |
| L118 | 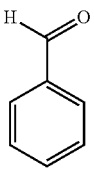 4453-90-1 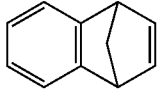 [SMILES: C1=CC2CC1c1ccccc12] | 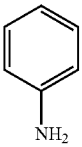 | 68% |

-continued
| Ex. | Starting material | Product | Yield |
|---|---|---|---|
| | 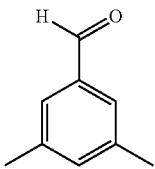 | | |
| L119 |  6705-50-6 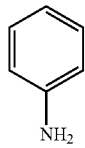 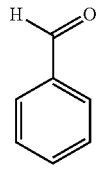 | 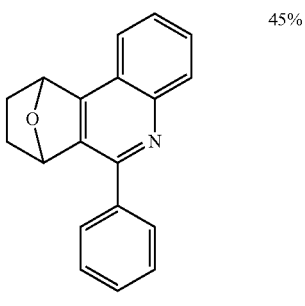 | 45% |
| L120 | 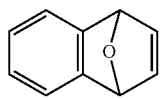 [SMILES: C1=CC2OC1c1ccccc12] 573-57-9 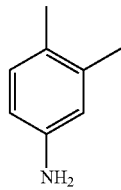 95-64-7 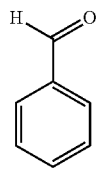 | 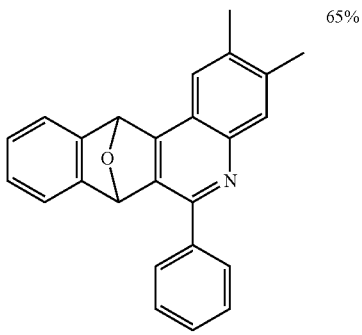 | 65% |

| Ex. | Starting material | Product | Yield |
|---|---|---|---|
| L121 | 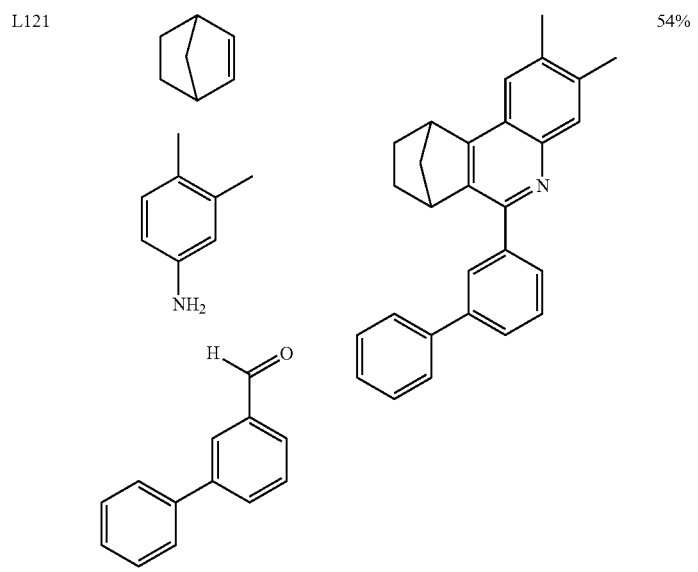
1204-60-0 | | 54% |
| L122 | 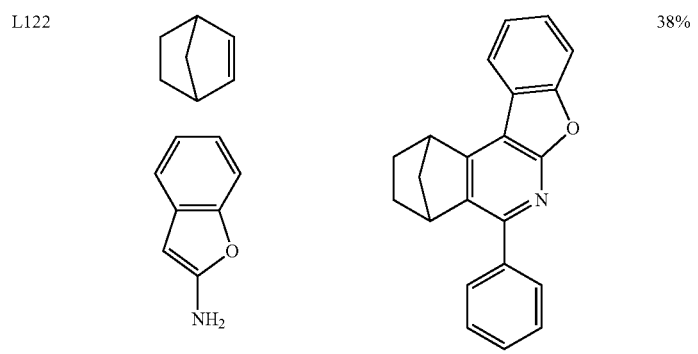
139266-08-3
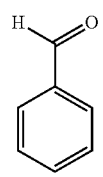 | | 38% |
| L123 | 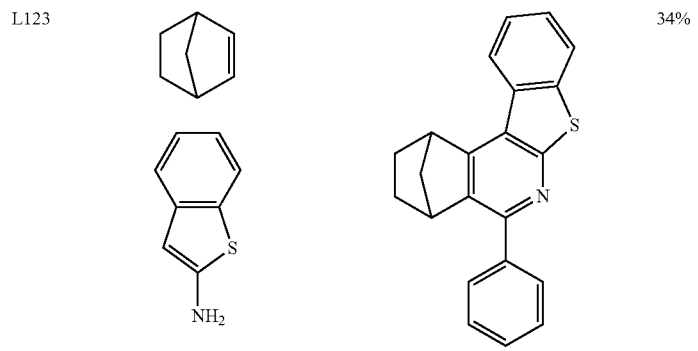
4521-30-6 | | 34% |

| Ex. | Starting material | Product | Yield |
|---|---|---|---|
| | 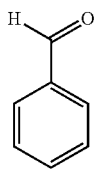 | | |
| L124 | <br>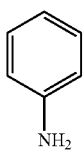<br>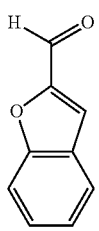<br>4265-16-1 | 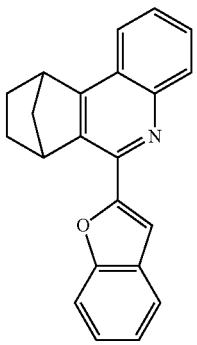 [SMILES: c1ccc2oc(-c3nc4ccccc4c4c3C3CCC4C3)cc2c1] | 36% |
| L125 | <br>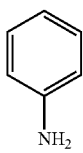<br>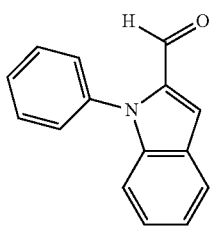 [SMILES: O=Cc1cc2ccccc2n1-c1ccccc1]<br>343238-30-2 | 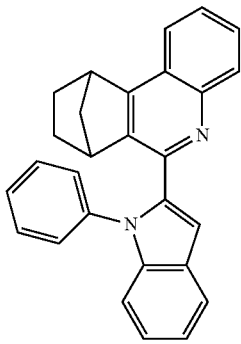 [SMILES: c1ccc(-n2c(-c3nc4ccccc4c4c3C3CCC4C3)cc3ccccc32)cc1] | 28% |

-continued

| Ex. | Starting material | Product | Yield |
|---|---|---|---|
| L126 | norbornene; benzofuran-2-amine; 1-phenyl-1H-indole-2-carbaldehyde | | 32% |
| L127 | 38667-10-6; 3,5-dimethylbenzaldehyde; aniline | | 25% |
| LB58 | 931-64-6; aniline | | 27% |

| Ex. | Starting material | Product | Yield |
|---|---|---|---|
| LB59 | (3,5-dimethylbenzaldehyde); (norbornene); (4-methylaniline) 106-49-0 | | 27% |
| LB60 | (benzaldehyde); (norbornene); (3,5-dimethylaniline) | | 25% |
| LB61 | (benzaldehyde) 100-52-7; (norbornene); (4-tert-butylaniline) 769-92-6 | | 29% |

219
220
-continued
| Ex. | Starting material | Product | Yield |
|---|---|---|---|
| LB62 | 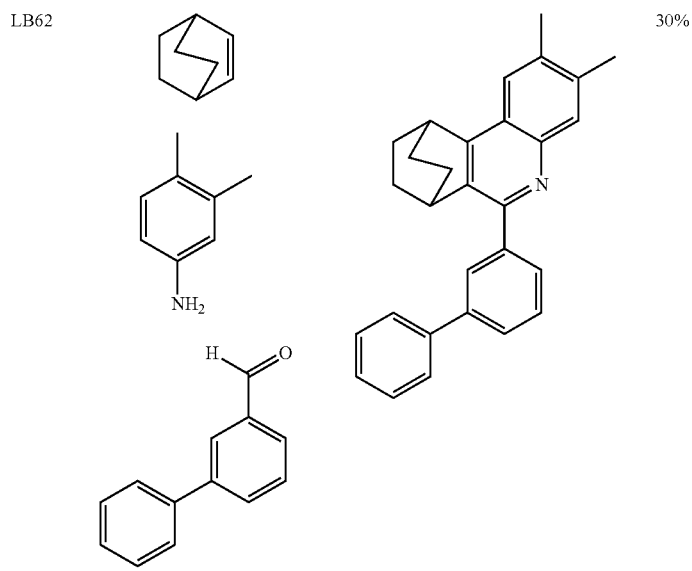 | | 30% |
| LB63 | 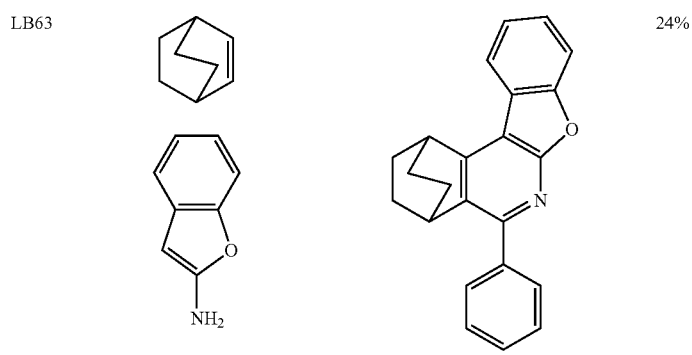 | | 24% |

US 11,005,050 B2
221
-continued
222
| Ex. | Starting material | Product | Yield |
|---|---|---|---|
| LB64 |  4265-16-1 | 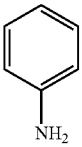 | 26% |
| LB65 | 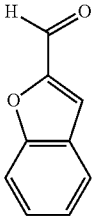 [SMILES: O=Cc1cc2ccccc2o1] 24669-57-6 | 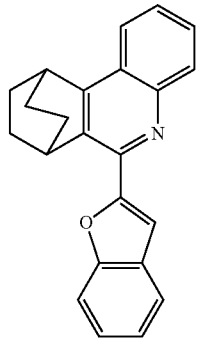 [SMILES: c1ccc2oc(-c3nc4ccccc4c4c3C3CCC4CC3)cc2c1] | 32% |

-continued
| Ex. | Starting material | Product | Yield |
|---|---|---|---|
| LB66 |  931-64-6 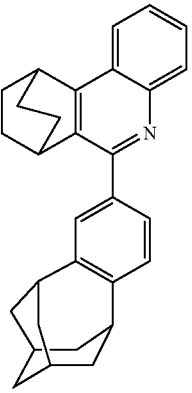 [SMILES: c1ccc2c3c(c(-c4ccc5c(c4)C4CC6CC(CC5C6)C4)nc2c1)C1CCC3CC1] SB13a | 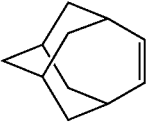 [SMILES: C1=CC2CC3CC1CC(C2)C3] | 29% |
| LB67 | 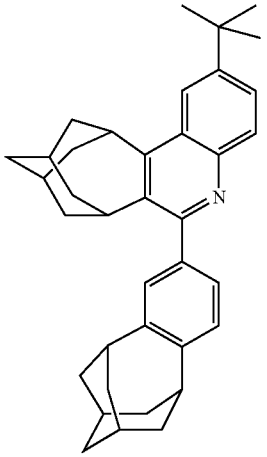 [SMILES: CC(C)(C)c1ccc2nc(-c3ccc4c(c3)C3CC5CC(CC4C5)C3)c3c(c2c1)C1CC2CC(CC3C2)C1] 24669-57-6 | | 31% |

Example L128: 5,8-Methano-5,6,7,8-tetrahydro-3-phenyl-2-azaanthra-cene, L128

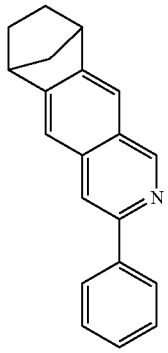 [SMILES: c1ccc(-c2cc3cc4c(cc3cn2)C2CCC4C2)cc1]

A mixture of 13.6 g (50 mmol) of 7-(3,3-dimethylbut-1-ynyl)-1,2,3,4-tetrahydro-1,4-methanonaphthalene-6-carbaldehyde, S58, and 500 ml of methanolic ammonia solution (2 M) is stirred at 140° C. for 5 h in an autoclave. After cooling, the methanol is removed in vacuo, the oily residue is chromatographed on silica gel (n-heptane:ethyl acetate 95:5) and finally freed from low-boiling components and non-volatile secondary components by fractional sublimation (p about $10^{-4}$-$10^{-5}$ mbar, T about 230° C.). Yield: 5.1 g (17 mmol), 34%; purity: about 99.5% according to $^1$H-NMR.

The following derivatives can be prepared analogously:

| Ex. | Starting material | Product | Yield |
|---|---|---|---|
| L129 | S59 | L129 | 37% |
| L130 | S60 | L130 | 29% |

-continued
| Ex. | Starting material | Product | Yield |
|---|---|---|---|
| L131 | | | 30% |
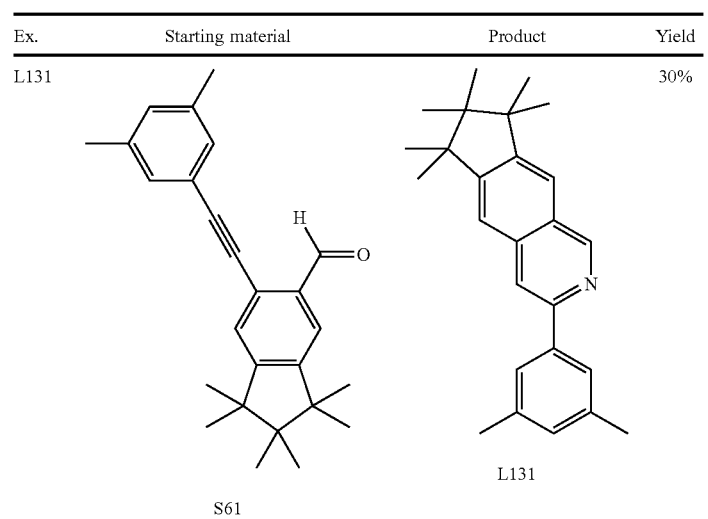
S61     L131
| L132 | | | 32% |
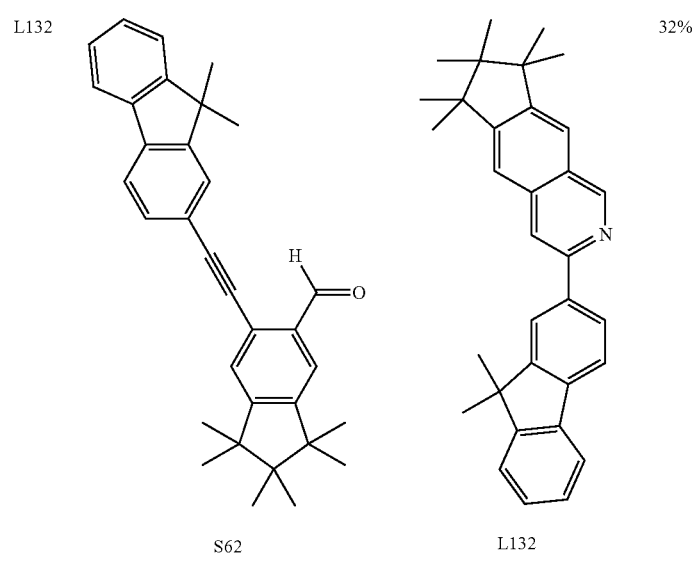
S62     L132
| L133 | | | 27% |
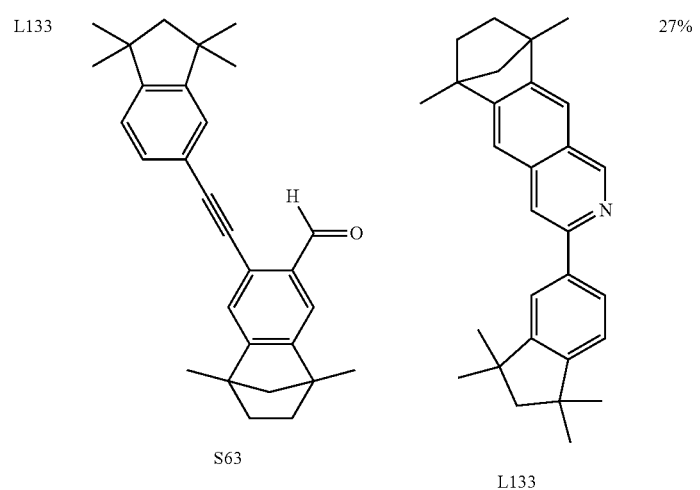
S63     L133

| Ex. | Starting material | Product | Yield |
|---|---|---|---|
| L134 | 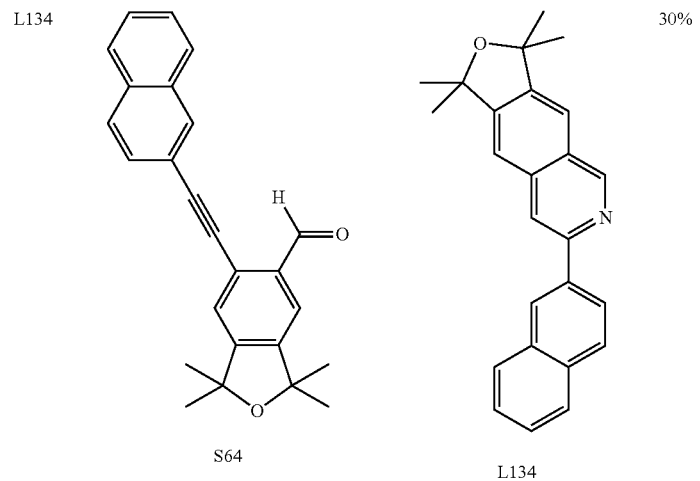 S64 | L134 | 30% |
| L135 | 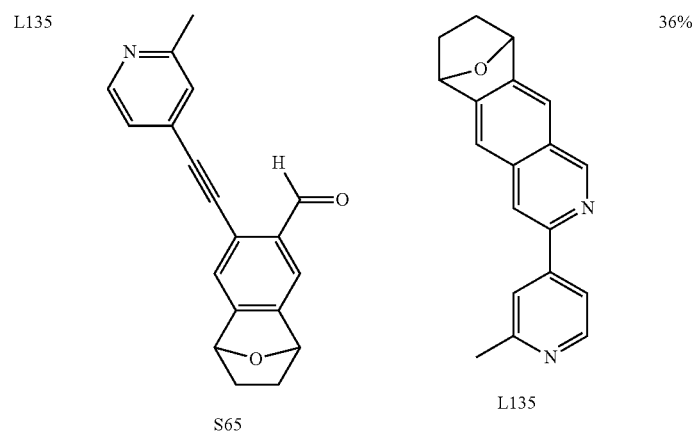 S65 | L135 | 36% |
| LB68 | 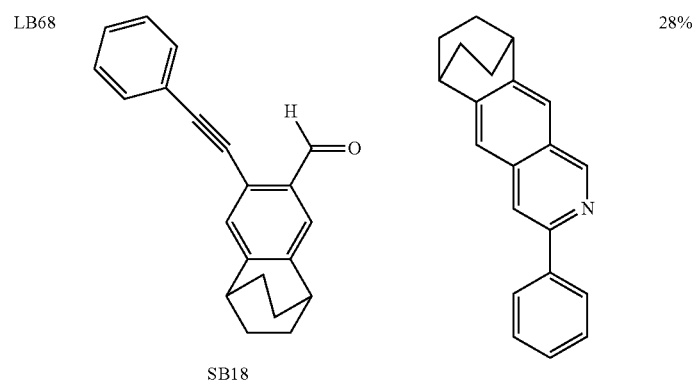 SB18 | | 28% |

| Ex. | Starting material | Product | Yield |
|---|---|---|---|
| LB69 | 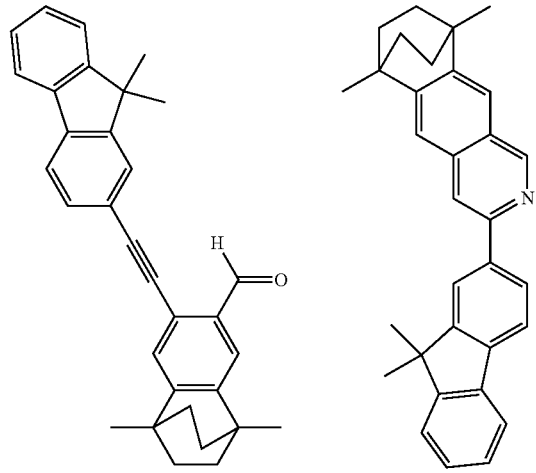<br>SB19 | | 26% |
| LB70 | 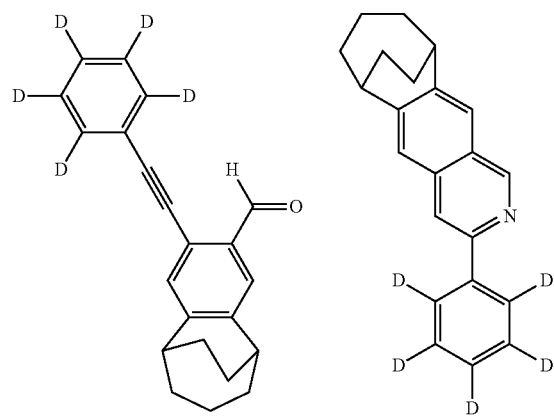<br>SB20 | | 27% |
| LB71 | 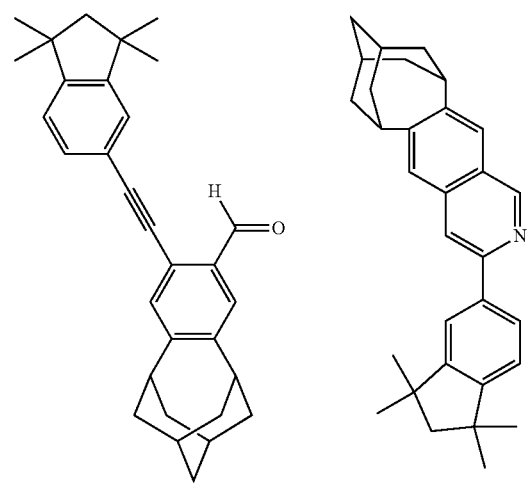<br>SB21 | | 29% |

Example L136: 1R,4S-Methano-1,2,3,4-tetrahydro-9-phenyl-10-aza-phenanthrene, L136

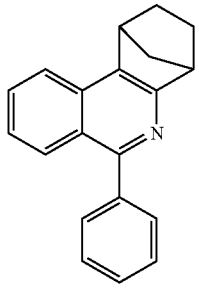 [SMILES: c1ccc(-c2nc3c(c4ccccc24)C2CCC3C2)cc1]

One drop of conc. sulfuric acid is added to a mixture of 26.1 g (100 mmol) of 2-bromophenylphenylmethanone [13047-06-8], 11.1 g (100 mmol) of (1R,2R,4S)-bicyclo[2.2.1]heptan-2-amine [7242-92-4] and 23.3 ml (105 mmol) of tetraethoxysilane [78-10-4], and the mixture is then heated at 160° C. in a water separator for 16 h, during which the ethanol distils off. After cooling, 500 ml of diethyl ether are added to the residue, the mixture is washed twice with 100 ml of saturated sodium hydrogencarbonate solution each time and twice with 300 ml of water each time and then dried over magnesium sulfate. After removal of the diethyl ether, 27.6 g (200 mmol) of potassium carbonate, 5 g of palladium/carbon (5% by weight), 2.6 g (10 mmol) of triphenylphosphine, 100 g of glass beads (diameter 3 mm) and 300 ml of mesitylene are added to the oily residue, and the mixture is again heated under reflux for 16 h. After cooling, the salts are filtered off with suction via a Celite bed, rinsed with 500 ml of toluene, and the combined filtrates are evaporated to dryness in vacuo. The residue is recrystallised three times from DMF/ethanol and finally freed from low-boiling components and non-volatile secondary components by fractional sublimation (p about $10^{-4}$-$10^{-5}$ mbar, T about 230° C.). Yield: 14.9 g (55 mmol), 55%; purity: about 99.5% according to $^1$H-NMR.

The following derivatives can be prepared analogously:

| Ex. | Starting material | Product | Yield |
|---|---|---|---|
| L137 | 80874-61-9 | L137 | 47% |
| L138 | 951889-08-0 | L138 | 45% |

| Ex. | Starting material | Product | Yield |
|---|---|---|---|
| LB72 | 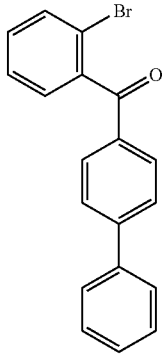 [SMILES: O=C(c1ccc(-c2ccccc2)cc1)c1ccccc1Br] 20643-57-6 instead of 7242-92-4<br>80874-61-9 | 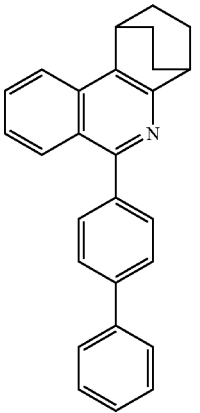 [SMILES: c1ccc(-c2ccc(-c3nc4c(c5ccccc35)C3CCC4CC3)cc2)cc1] | 37% |
| LB73 | 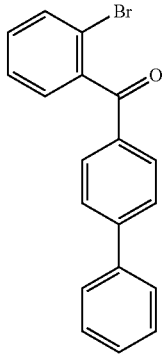 [SMILES: O=C(c1ccc(-c2ccccc2)cc1)c1ccccc1Br] 56419-24-0 instead of 7242-92-4<br>80874-61-9 | 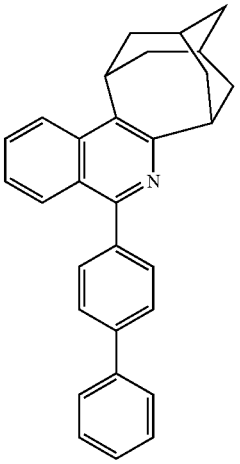 [SMILES: c1ccc(-c2ccc(-c3nc4c(c5ccccc35)C3CC5CC(CC4C5)C3)cc2)cc1] | 40% |

Example LB74

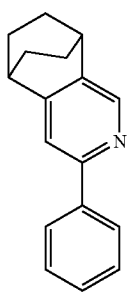 [SMILES: c1ccc(-c2cc3c(cn2)C2CCC3CC2)cc1]

Preparation analogous to M. Ohashi et al., J. Am. Chem. Soc, 2011, 133, 18018.

A mixture of 13.4 g (100 mmol) of 2,3-dimethylenebicyclo[2.2.2]octane [36439-79-9], 5.2 g (50 mmol) of benzonitrile [100-47-0], 1.4 g (5 mmol) of biscyclooctadienenickel(0) [1295-35-8], 5.6 g (20 mmol) of tricyclohexylphosphine [2622-14-2] and 200 ml of o-xylene is heated under gentle reflux for 30 h while a gentle stream of argon is passed in. After cooling, the mixture is filtered through a Celite bed, and the solvent is removed in vacuo. The residue is distilled twice in a bulb tube. Yield: 6.4 g (27 mmol), 54%; purity: about 98% according to $^1$H NMR.

The following compounds can be prepared analogously:
| Ex. | Olefin | Nitrile | Product | Yield |
|---|---|---|---|---|
| LB75 | 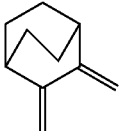<br>36439-79-9 | 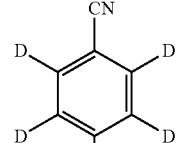<br>2102-15-0 | 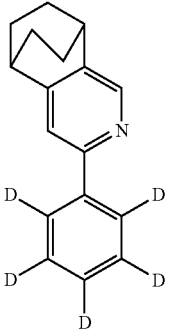 [SMILES: [2H]c1c([2H])c([2H])c(-c2cc3c(cn2)C2CCC3CC2)c([2H])c1[2H]] | 50% |
| LB76 | 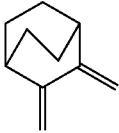<br>36439-79-9 | 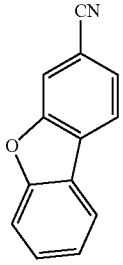 [SMILES: N#Cc1ccc2c(c1)oc1ccccc12]<br>29021-90-7 | 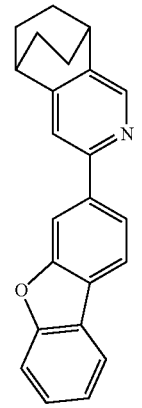 [SMILES: c1ccc2c(c1)oc1cc(-c3cc4c(cn3)C3CCC4CC3)ccc12] | 52% |
| LB77 | 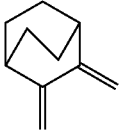<br>36439-79-9 | 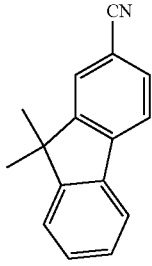 [SMILES: CC1(C)c2ccccc2-c2ccc(C#N)cc21]<br>890134-27-7 | 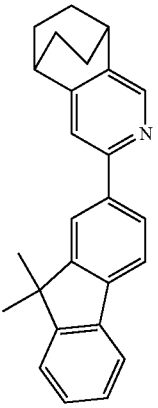 [SMILES: CC1(C)c2ccccc2-c2ccc(-c3cc4c(cn3)C3CCC4CC3)cc21] | 41% |
| LB78 | 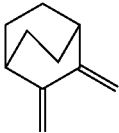<br>36439-79-9 | 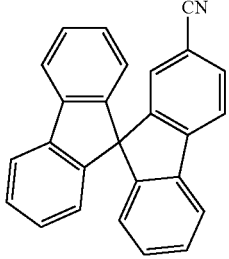 [SMILES: N#Cc1ccc2c(c1)C1(c3ccccc3-c3ccccc31)c1ccccc1-2]<br>782504-06-7 | 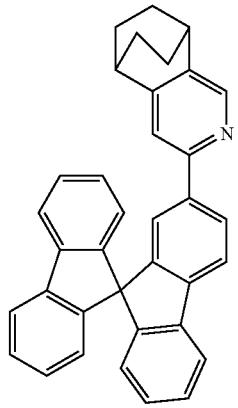 [SMILES: c1ccc2c(c1)-c1ccccc1C21c2ccccc2-c2ccc(-c3cc4c(cn3)C3CCC4CC3)cc21] | 48% |

-continued
| Ex. | Olefin | Nitrile | Product | Yield |
|---|---|---|---|---|
| LB79 | 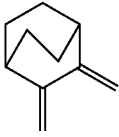<br>36439-79-9 | 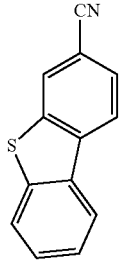 [SMILES: N#Cc1ccc2c(c1)sc1ccccc12]<br>1264712-13-1 | 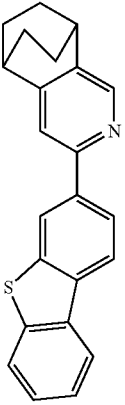 | 18% |
| LB80 | 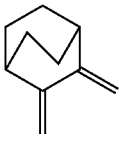<br>36439-79-9 | 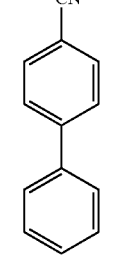<br>2920-38-9 | 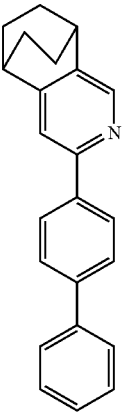 [SMILES: c1ccc(-c2ccc(-c3cc4c(cn3)C3CCC4CC3)cc2)cc1] | 54% |
| LB81 | 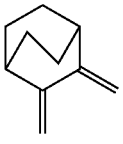<br>36439-79-9 | 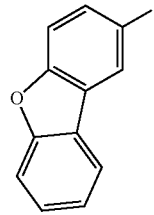<br>20927-96-2 | 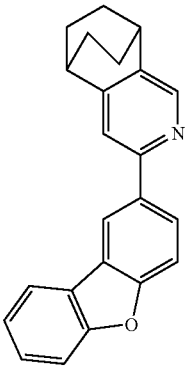 [SMILES: c1ccc2c(c1)oc1ccc(-c3cc4c(cn3)C3CCC4CC3)cc12] | 53% |

-continued

| Ex. | Olefin | Nitrile | Product | Yield |
|---|---|---|---|---|
| LB82 | 36439-79-9 | 540473-66-0 | | 45% |
| LB83 | 36439-79-9 | 1721-24-0 | | 49% |
| LB84 | 36439-79-9 | S66 | | 47% |
| LB85 | 36439-79-9 | S67 | | 46% |

-continued
| Ex. | Olefin | Nitrile | Product | Yield |
|---|---|---|---|---|
| LB86 | 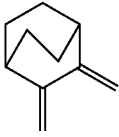 36439-79-9 | 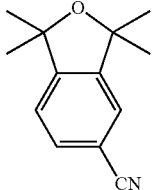 S68 | 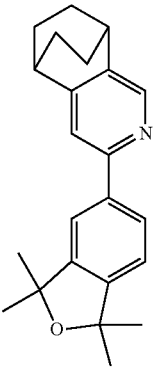 [SMILES: CC1(C)OC(C)(C)c2cc(-c3cc4c(cn3)C3CCC4CC3)ccc21] | 51% |
| LB87 | 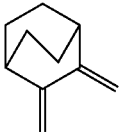 36439-79-9 |  SB32 | 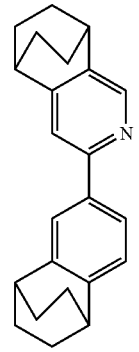 [SMILES: c1cc2c(cc1-c1cc3c(cn1)C1CCC3CC1)C1CCC2CC1] | 57% |
| LB88 | 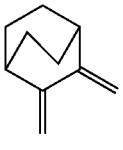 38439-79-9 | 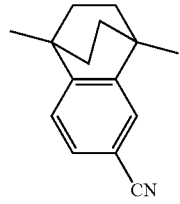 SB33 | 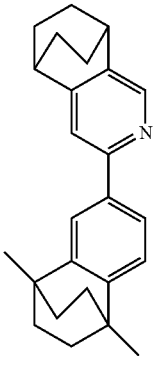 | 52% |
| LB89 | 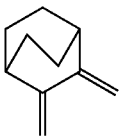 36439-79-9 | 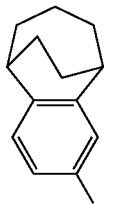 SB34 | 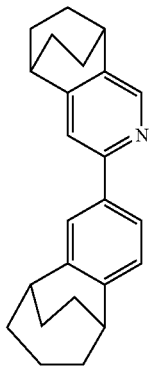 [SMILES: c1cc2c(cc1-c1cc3c(cn1)C1CCC3CC1)C1CCCC2CC1] | 43% |

-continued
| Ex. | Olefin | Nitrile | Product | Yield |
|---|---|---|---|---|
| LB90 | 95411-74-8 | 192699-47-1 | | 44% |
| LB91 | 95411-74-8 | S66 | | 47% |
| LB92 | 95411-74-8 | SB33 | | 48% |
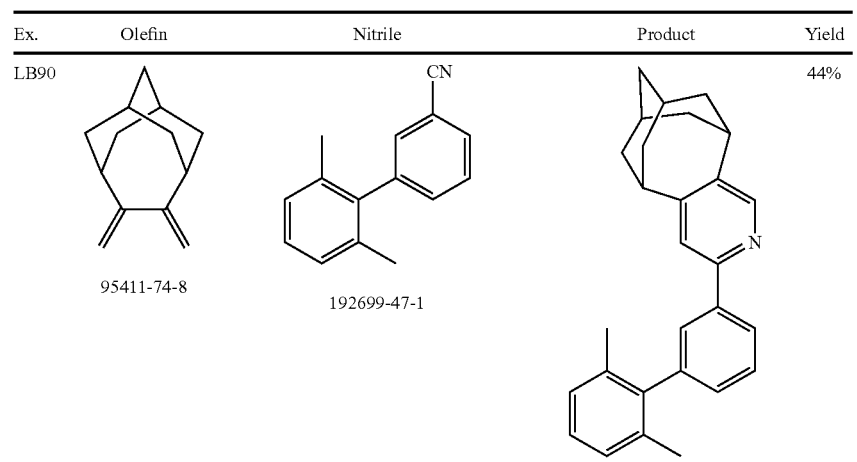
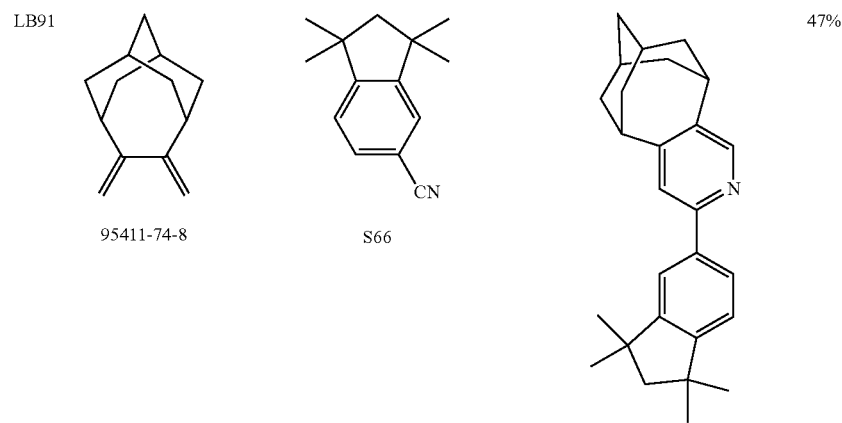
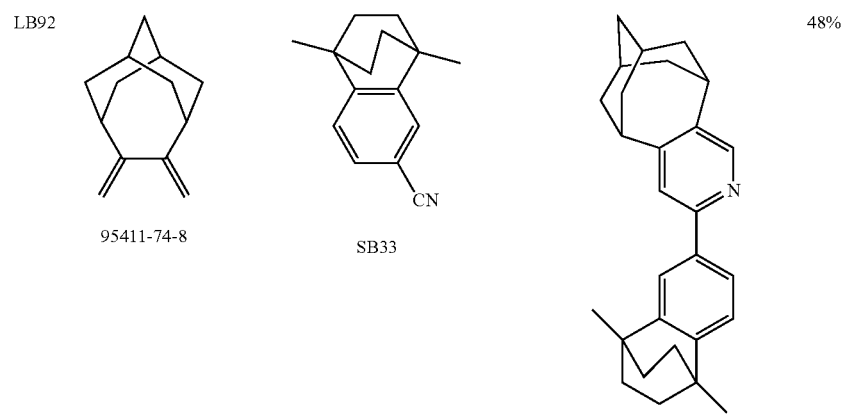

-continued

| Ex. | Olefin | Nitrile | Product | Yield |
|---|---|---|---|---|
| LB93 | 95411-74-8 | SB35 | | 50% |

Example LB94

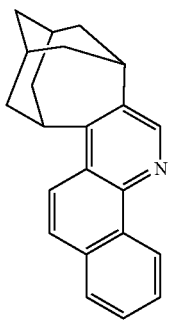 [SMILES: c1ccc2c(c1)ccc1c3c(cnc12)C1CC2CC(C1)CC3C2]

A mixture of 19.2 g (100 mmol) of 5-[1-hydroxymeth-[E]-ylidene-9-tricyclo-[4.3.1.1*3,8*]undecan-4-one, SB22, and 14.3 g (100 mmol) of 1-amino-naphthalene [134-32-7] is slowly heated to 160° C. on a water separator, during which the water formed during the reaction is slowly distilled off from the melt. After 10 h at 160° C., 100 ml of toluene are slowly added dropwise, and this is distilled off via the water separator in order to remove the residual water from the melt and the apparatus. About 300 g of polyphosphoric acid are added to the deep-brown melt obtained in this way in a countercurrent of argon, and the mixture is stirred at 160° C. for a further 16 h. After cooling to 120° C., 400 ml of water are added dropwise to the black, viscous melt (note: exothermic!), and stirring is continued until the melt has completely homogenised, during which a brown solid precipitates out. The suspension is transferred into a beaker containing 2 l of water, the mixture is stirred for a further 1 h, and the solid is filtered off with suction and washed once with 300 ml of water. After sucking dry, the solid is re-suspended in 1 l of 15% by weight ammonia solution, and the mixture is stirred for a further 1 h, and the solid is again filtered off with suction, washed with water until neutral and then sucked dry. The solid is dissolved in 500 ml of dichloromethane, the solution is washed with saturated sodium chloride solution, and the organic phase is dried over magnesium sulfate. After removal of the drying agent, the solution is evaporated, and the glass-like residue is passed through a column with dichloromethane, once on aluminium oxide, basic, activity grade 1, and twice on silica gel. The solid obtained in this way is recrystallised three times from DMF/EtOH and then subjected to fractional sublimation twice (p about $10^{-5}$ mbar, T 290° C.). Yield: 15.0 g (50 mmol), 50%; purity: about 99.9% according to $^1$H NMR.

The following compounds can be prepared analogously:

| Ex. | β-Hydroxy-methylene ketone | Amine | Product | Yield |
|---|---|---|---|---|
| LB95 | SB23 | 78832-53-8 | | 47% |

-continued

| Ex. | β-Hydroxy-methylene ketone | Amine | Product | Yield |
|---|---|---|---|---|
| LB96 | SB24 | 4523-45-9 | | 45% |
| LB97 | SB25 | 87833-80-5 | | 41% |
| LB98 | SB26 | 50358-40-2 | | 43% |
| LB99 | SB27 | 64485-52-5 | | 45% |

-continued
| Ex. | β-Hydroxy-methylene ketone | Amine | Product | Yield |
|---|---|---|---|---|
| LB100 | 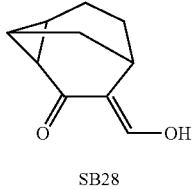<br>SB28 | 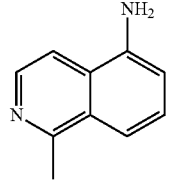<br>20335-61-9 | 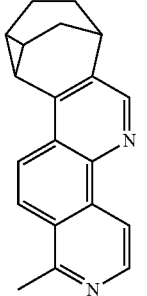 [SMILES: Cc1nccc2c1ccc1c3c(cnc12)C1CCC2C(C1)C32] | 19% |
| LB101 | 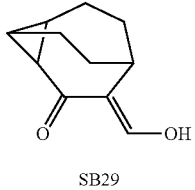<br>SB29 | 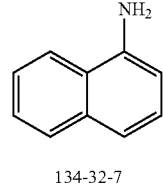<br>134-32-7 | 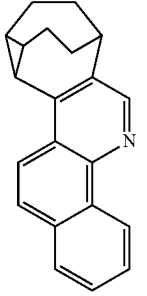 [SMILES: c1ccc2c(c1)ccc1c3c(cnc12)C1CCC2C(CC1)C32] | 22% |
| LB102 | 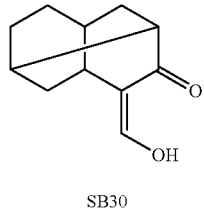<br>SB30 | 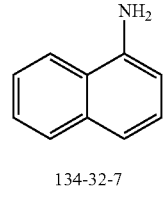<br>134-32-7 | 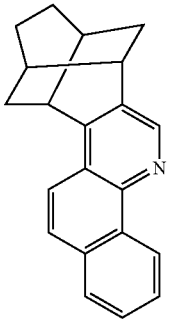 [SMILES: c1ccc2c(c1)ccc1c3c(cnc12)C1CC2CCC1CC32] | 46% |
| LB103 | 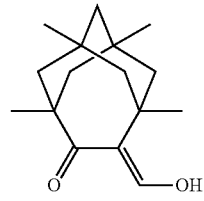<br>SB31 | 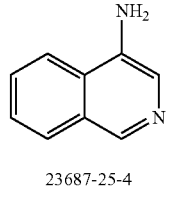<br>23687-25-4 | 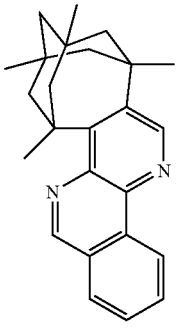 | 14% |

-continued

| Ex. | β-Hydroxy-methylene ketone | Amine | Product | Yield |
|---|---|---|---|---|
| LB104 | SB22 | 50358-40-2 | | 43% |
| LB105 | SB22 | 161431-57-8 | | 28% |
| LB106 | SB22 | 175229-87-5 | | 29% |

Example LB107: Tetradentate Uganda

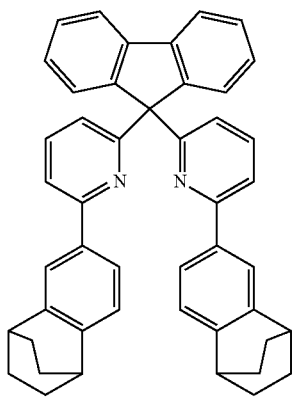 [SMILES: c1cc(-c2ccc3c(c2)C2CCC3CC2)nc(C2(c3cccc(-c4ccc5c(c4)C4CCC5CC4)n3)c3ccccc3-c3ccccc32)c1]

A mixture of 47.8 g (100 mmol) of 9,9-bis(6-bromopyrid-2-yl)fluorene [1323362-54-4], 65.4 g (230 mmol) of SB1, 42.4 g (400 mmol) of sodium carbonate, 1.2 g (1 mmol) of tetrakistriphenylphosphinopalladium(0), 300 ml of toluene, 200 ml of dioxane and 300 ml of water is heated under reflux for 30 h. After cooling, the organic phase is separated off, filtered through a Celite bed, with the Celite being rinsed with 300 ml of toluene, the combined filtrates are washed three times with 300 ml of water each time, dried over magnesium sulfate and then freed from toluene in vacuo. The residue is recrystallised three times from ethanol with addition of a little ethyl acetate and finally freed from low-boiling components and non-volatile secondary components by fractional sublimation (p about $10^{-5}$ mbar, T about 300° C.). Yield: 32.3 g (51 mmol), 51%; purity: about 99.5% according to $^1$H-NMR.

The following compounds can be prepared analogously:
| Ex. | Starting material | Starting material | Product | Yield |
|---|---|---|---|---|
| LB108 | 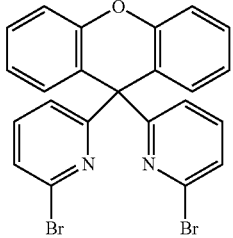 [SMILES: Brc1cccc(C2(c3cccc(Br)n3)c3ccccc3Oc3ccccc32)n1] 1421759-18-3 | 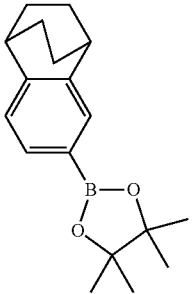 SB1 | 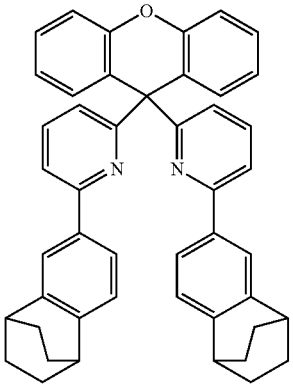 [SMILES: c1cc(-c2ccc3c(c2)C2CCC3CC2)nc(C2(c3cccc(-c4ccc5c(c4)C4CCC5CC4)n3)c3ccccc3Oc3ccccc32)c1] | 50% |
| LB109 | 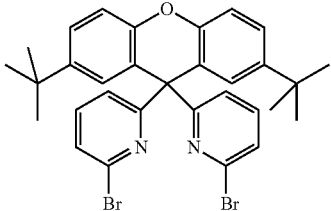 [SMILES: CC(C)(C)c1ccc2c(c1)C(c1cccc(Br)n1)(c1cccc(Br)n1)c1cc(C(C)(C)C)ccc1O2] S50 | 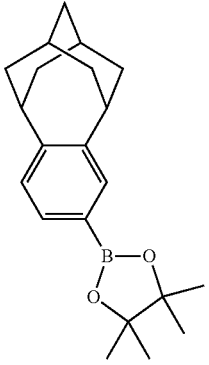 SB4 | 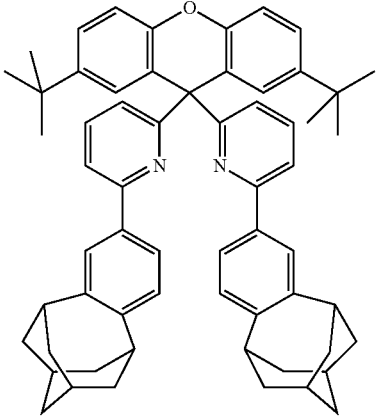 [SMILES: CC(C)(C)c1ccc2c(c1)C(c1cccc(-c3ccc4c(c3)C3CC5CC(CC4C5)C3)n1)(c1cccc(-c3ccc4c(c3)C3CC5CC(CC4C5)C3)n1)c1cc(C(C)(C)C)ccc1O2] | 55% |
| LB110 | 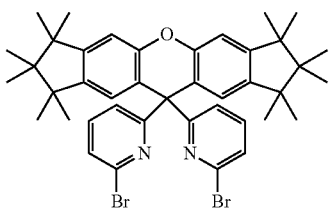 S51 | 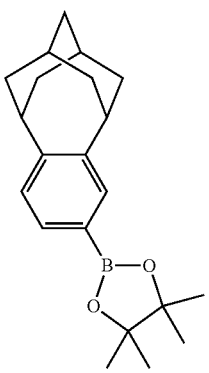 SB4 | 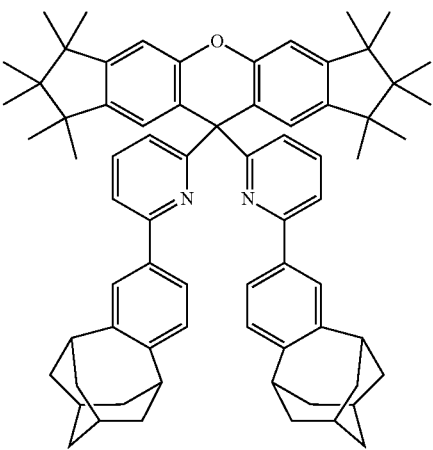 | 53% |

Example LB111: Tetradentate Ligands

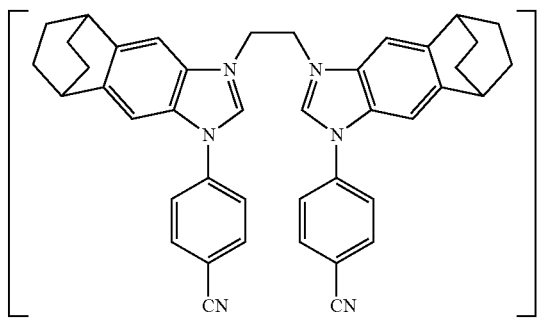

Procedure analogous to C. Cao et al., Synth. Commun. 2012, 42, 380.

A mixture of 15.0 g (50 mmol) of LB43 B), and 4.7 g (25 mmol) of 1,2-dibromoethane [106-93-4] is heated at 120° C. for 6 h in an autoclave. After cooling, the solid mass is taken up in 100 ml of tert-butyl methyl ether, homogenised with stirring, the white solid is filtered off, washed twice with 50 ml of tert-butyl methyl ether each time and dried in vacuo. Yield: 15.8 g (20 mmol), 80%; purity: about 98.0% according to $^1$H-NMR.

The following compounds can be prepared analogously:

| Ex. | Imidazole | Ligand | Yield |
|---|---|---|---|
| LB112 | LB43 B) | | 81% |
| LB113 | LB48 B) | | 80% |
| LB114 | LB53 B) | | 83% |

Example LB115: Hexadentate Ligands

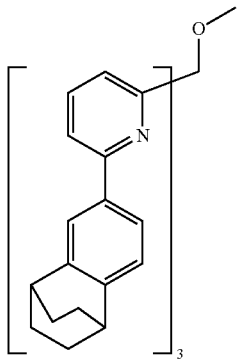

A mixture of 51.4 g (100 mmol) of tris(6-bromopyridin-2-yl)methoxy-methane [336158-91-9], 93.8 g (330 mmol) of SB1, 42.4 g (400 mmol) of sodium carbonate, 1.2 g (1 mmol) of tetrakistriphenylphosphinopalladium(0), 500 ml of toluene, 300 ml of dioxane and 500 ml of water is heated under reflux for 36 h. After cooling, the organic phase is separated off, filtered through a Celite bed, with the Celite being rinsed with 400 ml of toluene, the combined filtrates are washed three times with 300 ml of water each time, dried over magnesium sulfate and then freed from toluene in vacuo. The residue is recrystallised three times from isopropanol with addition of a little ethyl acetate and finally freed from low-boiling components and non-volatile secondary components by fractional sublimation (p about $10^{-5}$ mbar, T about 310° C.). Yield: 36.6 g (47 mmol), 47%; purity: about 99.5% according to $^1$H-NMR.

The following compounds can be prepared analogously:

| Ex. | Starting material | Starting material | Product | Yield |
|---|---|---|---|---|
| LB116 | 760177-68-2 | SB4 | | 50% |
| LB117 | 197776-47-9 | SB2 | | 45% |

Example LB118: Hexadentate Ligands

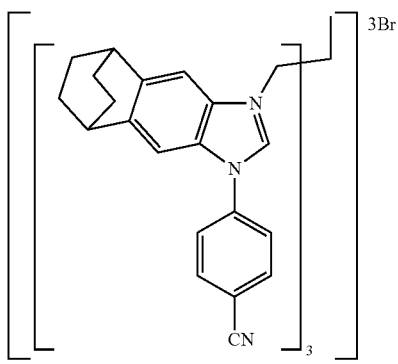

Procedure analogous to LB111, where the 1,2-dibromoethane is replaced by 5.2 g (16.7 mmol) of 1,1,1-tris(bromomethyl)ethane [60111-68-4]. Yield: 14.5 g (12 mmol), 72%; purity: about 99.0% according to $^1$H-NMR.

Compound LB119 can be prepared analogously:

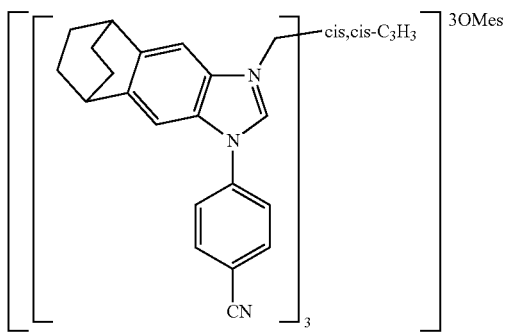

1,1,1-Tris(bromomethyl)ethane is replaced by 6.1 g (16.7 mmol) of cis,cis-1,2,3-cydopropanetrimethanol trimethanesulfonate [945230-85-3]. Yield: 16.5 g (13 mmol), 78%; purity: about 99.0% according to $^1$H-NMR.

C: Synthesis of the Metal Complexes

1) Homoleptic Tris-Facial Iridium Complexes of the Phenylpyridine, Phenylimidazole or Phenylbenzimidazole Type

Variant A: Trisacetylacetonatoiridium(III) as Iridium Starting Material

A mixture of 10 mmol of trisacetylacetonatoiridium(III) [15635-87-7] and 40-60 mmol (preferably 40 mmol) of the ligand L, optionally 1-10 g—typically in of an inert high-boiling additive as melting aid or solvent, e.g. hexa-decane, m-terphenyl, triphenylene, diphenyl ether, 3-phenoxytoluene, 1,2-, 1,3-, 1,4-bisphenoxybenzene, triphenylphosphine oxide, sulfolane, 18-crown-6, triethylene glycol, glycerol, polyethylene glycols, phenol, 1-naphthol, etc., and a glass-clad magnetic stirrer bar are melted into a thick-walled 50 ml glass ampoule in vacuo ($10^{-5}$ mbar). The ampoule is heated at the temperature indicated for the time indicated, during which the molten mixture is stirred with the aid of a magnetic stirrer. In order to prevent sublimation of the ligands onto relatively cold parts of the ampoule, the entire ampoule must have the temperature indicated. Alternatively, the synthesis can be carried out in a stirred autoclave with glass insert. After cooling (NOTE: the ampoules are usually under pressure!), the ampoule is opened, the sinter cake is stirred for 3 h with 100 g of glass beads (diameter 3 mm) in 100 ml of a suspension medium (the suspension medium is selected so that the ligand is readily soluble, but the metal complex has low solubility therein, typical suspension media are methanol, ethanol, dichloromethane, acetone, THF, ethyl acetate, toluene, etc.) and mechanically digested in the process. The fine suspension is decanted off from the glass beads, the solid is filtered off with suction, rinsed with 50 ml of the suspension medium and dried in vacuo. The dry solid is placed on a 3-5 cm deep aluminium oxide bed (aluminium oxide, basic, activity grade 1) in a continuous hot extractor and then extracted with an extractant (initially introduced amount about 500 ml, the extractant is selected so that the complex is readily soluble therein at elevated temperature and has low solubility therein when cold, particularly suitable extractants are hydrocarbons, such as toluene, xylenes, mesitylene, naphthalene, o-dichlorobenzene, halogenated aliphatic hydrocarbons are generally unsuitable since they may halogenate or decompose the complexes). When the extraction is complete, the extractant is evaporated to about 100 ml in vacuo. Metal complexes which have excessively good solubility in the extractant are brought to crystallisation by dropwise addition of 200 ml of methanol. The solid of the suspensions obtained in this way is filtered off with suction, washed once with about 50 ml of methanol and dried. After drying, the purity of the metal complex is determined by means of NMR and/or HPLC. If the purity is below 99.5%, the hot extraction step is repeated, omitting the aluminium oxide bed from the 2nd extraction. When a purity of 99.5-99.9% has been reached, the metal complex is heated or sublimed. The heating is carried out in a high vacuum (p about $10^{-5}$ mbar) in the temperature range from about 200-300° C., preferably for complexes having molecular weights greater than about 1300 g/mol. The sublimation is carried out in a high vacuum (p about $10^{-6}$ mbar) in the temperature range from about 230-400° C., with the sublimation preferably being carried out in the form of a fractional sublimation. Complexes which are readily soluble in organic solvents may alternatively also be chromatographed on silica gel.

Ifchiral ligands are employed, the derived fac-metal complexes are produced in the form of a diastereomer mixture. The enantiomers Λ,Δ in point group C3 generally have significantly lower solubility in the extractant than the enantiomers in point group C1, which are consequently enriched in the mother liquor. Separation of the C3 diastereomers from the C1 diastereomers is frequently possible by this method. In addition, the diastereomers can also be separated by chromatography. If ligands in point group C1 are employed in enantiomerically pure form, a diastereomer pair Λ,Δ in point group C3 is formed. The diastereomers can be separated by crystallisation or chromatography and thus obtained as enantiomerically pure compounds.

Variant B: Tris-(2,2,6,6-tatramethyl-3,5-heptanedionato)iridium(III) as iridium starting material Procedure analogous to variant A, using 10 mmol of tris(2,2,6,6-tetramethyl-3,5-heptanedionato)iridium [99581-86-9] instead of 10 mmol of tris-acetylacetonatoiridium(III) [15635-87-7]. The use of this starting material is advantageous since the purity of the crude products obtained is frequently better than in the case of variant A. In addition, the build-up of pressure in the ampoule is frequently not so pronounced.

Variant C: Sodium [Cis,Trans-Dichloro(Bisacetylacetonato)]Iridate(III) as Iridium Starting Material A mixture of 10 mmol of sodium [cis,trans-dichloro(bisacetylacetonato)]-iridate(III) [876296-21-8] and 60 mmol of the ligand in 50 ml of ethylene glycol, propylene glycol or diethylene glycol is heated under gentle reflux under a gentle stream of argon for the time indicated. After cooling to 60° C., the reaction mixture is diluted with a mixture of 50 ml of ethanol and 50 ml of 2 N hydrochloric acid with stirring and stirred for a further 1 h, the precipitated solid is filtered off with suction, washed three times with 30 ml of ethanol each time and then dried in vacuo. Purification by hot extraction or chromatography and fractional sublimation, as described under A.

| Ex. | Ligand L | Ir complex Diastereomer | Variant / Reaction medium / Melting aid / Reaction temp. / Reaction time / Suspension medium / Extractant | Yield |
|---|---|---|---|---|
| Ir(LB1)$_3$ | LB1 | | A / — / — / 270° C. / 24 h / EtOH / Ethyl acetate | 48% |
| Ir(LB1)$_3$ | LB1 | | C / Propylene glycol / — / RF / 100 h / — / o-Xylene | 40% |
| Ir(LB2)$_3$ | LB2 | | A / — / — / 270° C. / 24 h / EtOH / Ethyl acetate | 50% |

-continued

| Ex. | Ligand L | Ir complex Diastereomer | Variant Reaction medium Melting aid Reaction temp. Reaction time Suspension medium Extractant | Yield |
|---|---|---|---|---|
| Ir(LB3)₃ | LB3 | | as for Ir(LB2)₃ | 52% |
| Ir(LB4)₃ | LB4 | | as for Ir(LB2)₃ | 47% |
| Ir(LB5)₃ | LB5 | | as for Ir(LB2)₃ | 38% |
| Ir(LB6)₃ | LB6 | | A<br>—<br>Hydroquinone<br>280° C.<br>40 h<br>EtOH<br>Ethyl acetate | 13% |

-continued

| Ex. | Ligand L | Ir complex Diastereomer | Variant<br>Reaction medium<br>Melting aid<br>Reaction temp.<br>Reaction time<br>Suspension medium<br>Extractant | Yield |
|---|---|---|---|---|
| Ir(LB7)$_3$ | LB7 | | A<br>—<br>—<br>280° C.<br>30 h<br>EtOH<br>Ethyl acetate/<br>cyclohexane<br>1:1 | 33% |
| Ir(LB8)$_3$ | LB8 | Λ,Δ-C3 | as for Ir(LB2)$_3$ | 24% |
| Ir(LB9)$_3$ | LB9 | | A<br>—<br>—<br>270° C.<br>24 h<br>—<br>Chromatography<br>silica gel/toluene | 38% |
| Ir(LB10)$_3$ | LB10 | | as for Ir(LB2)$_3$ | 43% |

-continued
| Ex. | Ligand L | Ir complex Diastereomer | Variant Reaction medium Melting aid Reaction temp. Reaction time Suspension medium Extractant | Yield |
|---|---|---|---|---|
| Ir(LB11)₃ | LB11 | 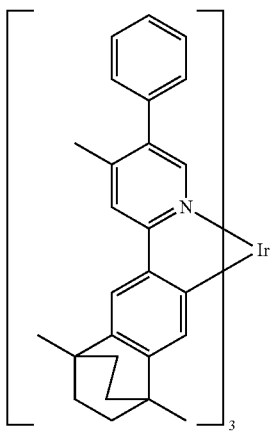 | as for Ir(LB2)₃ | 41% |
| Ir(LB12)₃ | LB12 | 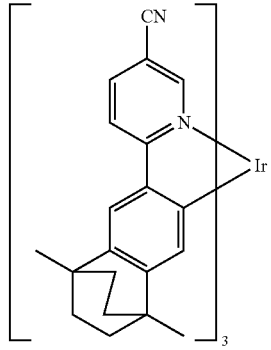 | as for Ir(LB2)₃ | 33% |
| Ir(LB13)₃ | LB13 | 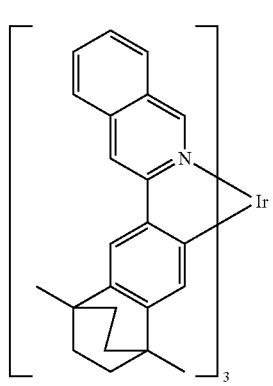 | as for Ir(LB2)₃ | 40% |

-continued

| Ex. | Ligand L | Ir complex Diastereomer | Variant<br>Reaction medium<br>Melting aid<br>Reaction temp.<br>Reaction time<br>Suspension medium<br>Extractant | Yield |
|---|---|---|---|---|
| Ir(LB14)₃ | LB14 | | B<br>—<br>Hydroquinone<br>280° C.<br>40 h<br>EtOH<br>Ethyl acetate | 10% |
| Ir(LB15)₃ | LB15 | Λ,Δ-C3 | as for Ir(LB2)₃ | 20% |
| Ir(LB16)₃ | LB16 | Λ,Δ-C3 | as for Ir(LB2)₃ | 16% |

| Ex. | Ligand L | Ir complex Diastereomer | Variant<br>Reaction medium<br>Melting aid<br>Reaction temp.<br>Reaction time<br>Suspension medium<br>Extractant | Yield |
|---|---|---|---|---|
| Ir(LB17)₃ | LB17 | (structure) | as for Ir(LB2)₃ | 36% |
| Ir(LB18)₃ | LB18 | (structure) Λ,Δ-C3 | B<br>—<br>—<br>280° C.<br>24 h<br>—<br>—<br>Chromatography silica gel<br>n-heptane:DCM 8:1 | 34% |
| Ir(LB19)₃ | LB19 | (structure) | as for Ir(LB2)₃ | 46% |

| Ex. | Ligand L | Ir complex Diastereomer | Variant Reaction medium Melting aid Reaction temp. Reaction time Suspension medium Extractant | Yield |
|---|---|---|---|---|
| Ir(LB20)$_3$ | LB20 | | as for Ir(LB2)$_3$ | 39% |
| Ir(LB21)$_3$ | LB21 | | as for Ir(LB14)$_3$ | 9% |
| Ir(LB22)$_3$ | LB22 | | B — 275° C. 20 h — Chromatography silica gel cyclohexane | 30% |

-continued

| Ex. | Ligand L | Ir complex Diastereomer | Variant Reaction medium Melting aid Reaction temp. Reaction time Suspension medium Extractant | Yield |
|---|---|---|---|---|
| Ir(LB33)₃ | LB33 | | A — — 280° C. 24 h EtOH Ethyl acetate | 45% |
| Ir(LB34)₃ | LB34 | | as for Ir(LB33)₃ | 40% |
| Ir(LB35)₃ | LB35 | | A — — 280° C. 45 h EtOH Toluene | 36% |

-continued

| Ex. | Ligand L | Ir complex Diastereomer | Variant Reaction medium Melting aid Reaction temp. Reaction time Suspension medium Extractant | Yield |
|---|---|---|---|---|
| Ir(LB36)$_3$ | LB36 | | as for Ir(LB33)$_3$ | 37% |
| Ir(LB37)$_3$ | LB37 | | as for Ir(LB33)$_3$ | 27% |
| Ir(LB38)$_3$ | LB38 | | as for Ir(LB33)$_3$ | 35% |

| Ex. | Ligand L | Ir complex Diastereomer | Variant Reaction medium Melting aid Reaction temp. Reaction time Suspension medium Extractant | Yield |
|---|---|---|---|---|
| Ir(LB39)₃ | LB39 | Λ,Δ-C3 | as for Ir(LB33)₃ | 17% |
| Ir(LB40)₃ | LB40 | | as for Ir(LB33)₃ | 39% |
| Ir(LB41)₃ | LB41 | | as for Ir(LB33)₃ | 32% |

-continued

| Ex. | Ligand L | Ir complex Diastereomer | Variant Reaction medium Melting aid Reaction temp. Reaction time Suspension medium Extractant | Yield |
|---|---|---|---|---|
| Ir(LB42)$_3$ | LB42 | | as for Ir(LB33)$_3$ | 35% |
| Ir(LB55)$_3$ | LB55 | | A — 290° C. 120 h Acetone Toluene | 40% |
| Ir(LB56)$_3$ | LB56 | | A — 290° C. 120 h Acetone Toluene | 38% |
| Ir(LB57)$_3$ | LB57 | | as for Ir(LB2)$_3$ | 44% |

-continued

| Ex. | Ligand L | Ir complex Diastereomer | Variant Reaction medium Melting aid Reaction temp. Reaction time Suspension medium Extractant | Yield |
|---|---|---|---|---|
| Ir(LB59)$_3$ | LB59 | | as for Ir(LB14)$_3$ | 7% |
| Ir(LB68)$_3$ | LB68 | | as for Ir(LB2)$_3$ | 42% |
| Ir(LB69)$_3$ | LB69 | | as for Ir(LB2)$_3$ | 40% |

-continued
| Ex. | Ligand L | Ir complex Diastereomer | Variant Reaction medium Melting aid Reaction temp. Reaction time Suspension medium Extractant | Yield |
|---|---|---|---|---|
| Ir(LB70)$_3$ | LB70 | 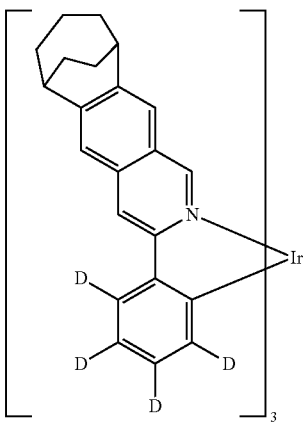<br>Diastereomer mixture | as for Ir(LB2)$_3$ | 29% |
| Ir(LB71)$_3$ | LB71 | 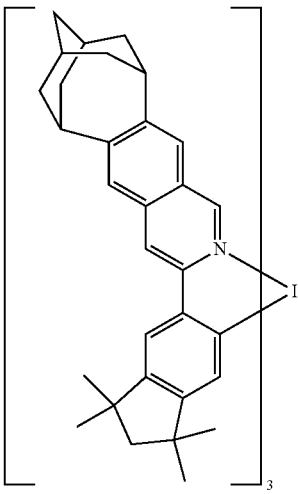 | A<br>—<br>270° C.<br>20 h<br>—<br>Chromatography silica gel cyclohexane | 42% |
| Ir(LB74)$_3$ | LB74 | 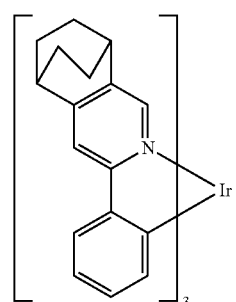 | as for Ir(LB2)$_3$ | 50% |

-continued

| Ex. | Ligand L | Ir complex Diastereomer | Variant Reaction medium Melting aid Reaction temp. Reaction time Suspension medium Extractant | Yield |
|---|---|---|---|---|
| Ir(LB75)$_3$ | LB75 | | as for Ir(LB2)$_3$ | 40% |
| Ir(LB76)$_3$ | LB76 | | as for Ir(LB2)$_3$ | 40% |
| Ir(LB77)$_3$ | LB77 | | as for Ir(LB2)$_3$ | 43% |

| Ex. | Ligand L | Ir complex Diastereomer | Variant Reaction medium Melting aid Reaction temp. Reaction time Suspension medium Extractant | Yield |
|---|---|---|---|---|
| Ir(LB78)₃ | LB78 | 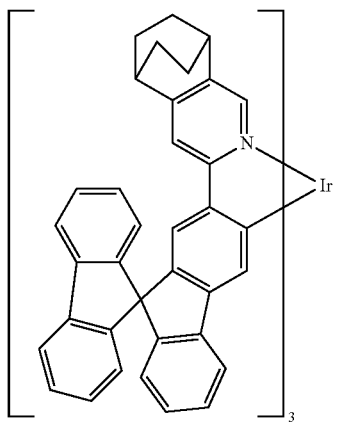 | as for Ir(LB2)₃ | 42% |
| Ir(LB79)₃ | LB79 | 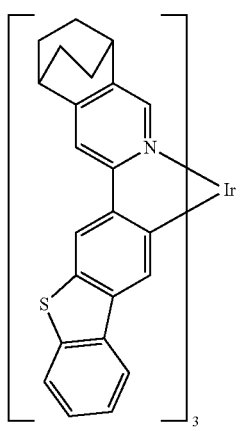 | as for Ir(LB2)₃ | 34% |
| Ir(LB80)₃ | LB80 | 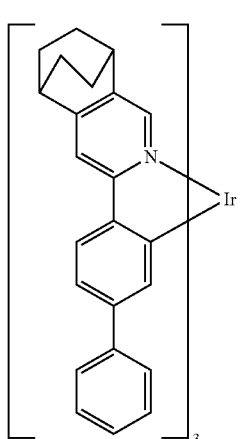 | as for Ir(LB2)₃ | 47% |

-continued

| Ex. | Ligand L | Ir complex Diastereomer | Variant<br>Reaction medium<br>Melting aid<br>Reaction temp.<br>Reaction time<br>Suspension medium<br>Extractant | Yield |
|---|---|---|---|---|
| Ir(LB81)₃ | LB81 | | as for Ir(LB2)₃ | 45% |
| Ir(LB83)₃ | LB83 | | A<br>—<br>—<br>285° C.<br>30 h<br>EtOH<br>o-Xylene | 31% |
| Ir(LB84)₃ | LB84 | | A<br>—<br>—<br>275° C.<br>22 h<br>EtOH<br>Cyclohexane | 50% |

-continued

| Ex. | Ligand L | Ir complex Diastereomer | Variant Reaction medium Melting aid Reaction temp. Reaction time Suspension medium Extractant | Yield |
|---|---|---|---|---|
| Ir(LB85)₃ | LB85 | | as for Ir(LB84)₃ | 47% |
| Ir(LB86)₃ | LB86 | | as for Ir(LB84)₃ | 52% |
| Ir(LB87)₃ | LB87 | | as for Ir(LB84)₃ | 46% |

-continued

| Ex. | Ligand L | Ir complex Diastereomer | Variant Reaction medium Melting aid Reaction temp. Reaction time Suspension medium Extractant | Yield |
|---|---|---|---|---|
| Ir(LB88)₃ | LB88 | | as for Ir(LB84)₃ | 47% |
| Ir(LB89)₃ | LB89 | Diastereomer mixture | as for Ir(LB84)₃ | 32% |
| Ir(LB90)₃ | LB90 | | as for Ir(LB2)₃ | 47% |

| Ex. | Ligand L | Ir complex Diastereomer | Variant Reaction medium Melting aid Reaction temp. Reaction time Suspension medium Extractant | Yield |
|---|---|---|---|---|
| Ir(LB91)$_3$ | LB91 | 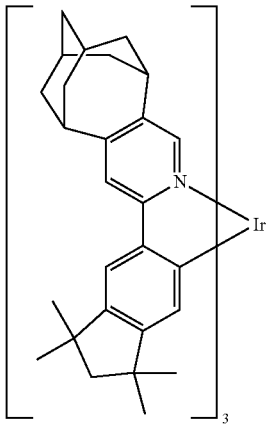 | as for Ir(LB84)$_3$ | 43% |
| Ir(LB92)$_3$ | LB92 | 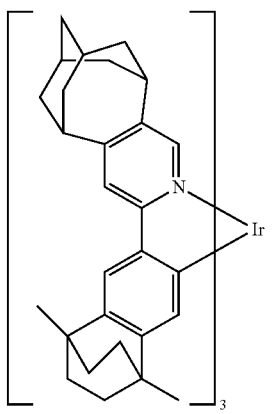 | as for Ir(LB84)$_3$ | 45% |
| Ir(LB93)$_3$ | LB93 | 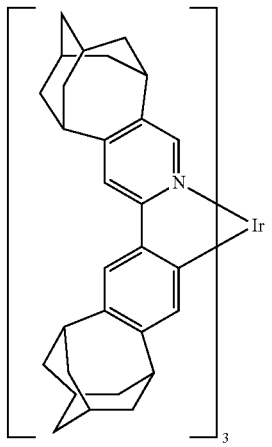 | as for Ir(LB84)$_3$ | 40% |

-continued

| Ex. | Ligand L | Ir complex Diastereomer | Variant Reaction medium Melting aid Reaction temp. Reaction time Suspension medium Extractant | Yield |
|---|---|---|---|---|
| Ir(LB94)₃ | LB94 | | A — Hydroquinone 270° C. 20 h MeOH Chromatography silica gel dichloromethane | 47% |
| Ir(LB95)₃ | LB95 | | A — Hydroquinone 280° C. 28 h MeOH Chromatography silica gel dichloromethane | 31% |
| Ir(LB96)₃ | LB96 | | as for Ir(LB94)₃ | 45% |
| Ir(LB97)₃ | LB97 | | as for Ir(LB94)₃ | 41% |

Diastereomer mixture

-continued

| Ex. | Ligand L | Ir complex Diastereomer | Variant Reaction medium Melting aid Reaction temp. Reaction time Suspension medium Extractant | Yield |
|---|---|---|---|---|
| Ir(LB98)$_3$ | LB98 | | A — Hydroquinone 290° C. 25 h MeOH Chromatography silica gel dichloromethane | 18% |
| Ir(LB99)$_3$ | LB99 | | as for Ir(LB98)$_3$ | 25% |
| Ir(LB100)$_3$ | LB100 | Diastereomer mixture | A — Hydroquinone 260° C. 25 h MeOH Chromatography silica gel dichloromethane | 13% |
| Ir(LB101)$_3$ | LB101 | | A — Hydroquinone 260° C. 25 h MeOH Chromatography silica gel dichloromethane | 18% |

-continued

| Ex. | Ligand L | Ir complex Diastereomer | Variant Reaction medium Melting aid Reaction temp. Reaction time Suspension medium Extractant | Yield |
|---|---|---|---|---|
| Ir(LB102)₃ | LB102 | | as for Ir(LB94)₃ | 45% |
| Ir(LB103)₃ | LB103 | | as for Ir(LB94)₃ | 48% |
| Ir(LB104)₃ | LB104 | | as for Ir(LB98)₃ | 26% |
| Ir(LB105)₃ | LB105 | | as for Ir(LB98)₃ | 18% |

| Ex. | Ligand L | Ir complex Diastereomer | Variant Reaction medium Melting aid Reaction temp. Reaction time Suspension medium Extractant | Yield |
|---|---|---|---|---|
| Ir(LB106)₃ | LB106 | 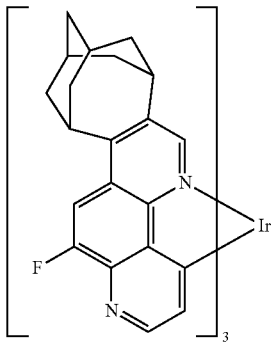 | as for Ir(LB98)₃ | 23% |

2) Homoleptic Iridium Complexes of the Arduengo Carbene Type

Preparation analogous to K. Tsuchiya, et al., Eur. J. Inorg. Chem., 2010, 926.

A mixture of 10 mmol of the ligand, 3 mmol of iridium (III) chloride hydrate, 10 mmol of silver carbonate, 10 mmol of sodium carbonate in 75 ml of 2-ethoxyethanol is warmed under reflux for 24 h. After cooling, 300 ml of water are added, the precipitated solid is filtered off with suction, washed once with 30 ml of water and three times with 15 ml of ethanol each time and dried in vacuo. The fac/mer isomer mixture obtained in this way is chromatographed on silica gel. The isomers are subsequently subjected to fractional sublimation or freed from the solvent in a high vacuum (fac-Ir(LB49)₃, fac-Ir(LB50)₃, fac-Ir(LB51)₃).

| Ex. | Ligand L | Ir complex Diastereomer | Yield |
|---|---|---|---|
| fac-Ir(LB43)₃ mer-Ir(LB43)₃ | LB43 | 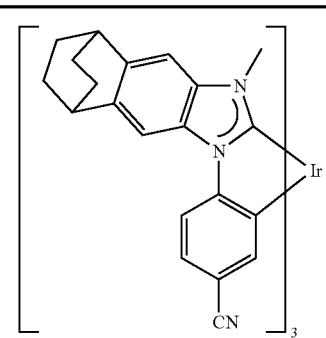 | 39% 11% |
| fac-Ir(LB44)₃ mer-Ir(LB44)₃ | LB44 | 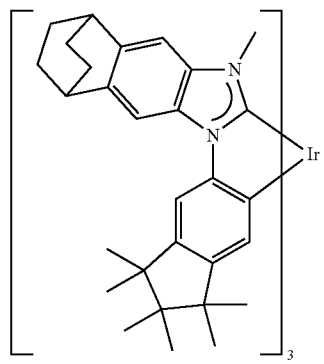 | 36% 10% |
| fac-Ir(LB45)₃ mer-Ir(LB45)₃ | LB45 | 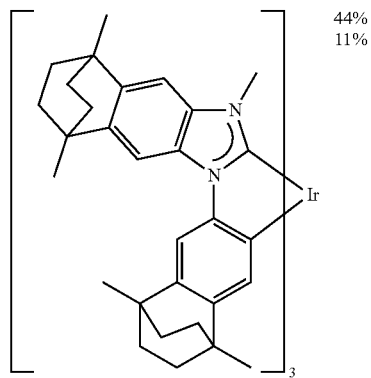 | 44% 11% |

-continued

| Ex. | Ligand L | Ir complex Diastereomer | Yield |
|---|---|---|---|
| fac-Ir(LB46)₃ mer-Ir(LB46)₃ | LB46 | | 41% 5% |
| fac-Ir(LB47)₃ | LB47 | | 33% | fac-Λ,Δ-C3

| Ex. | Ligand L | Ir complex Diastereomer | Yield |
|---|---|---|---|
| fac-Ir(LB48)₃ | LB48 | | 36% |
| fac-Ir(LB49)₃ | LB49 | | 42% |

-continued

| Ex. | Ligand L | Ir complex Diastereomer | Yield |
|---|---|---|---|
| fac-Ir(LB50)₃ | LB50 | | 39% |
| fac-Ir(LB51)₃ | LB51 | | 38% |
| fac-Ir(LB52)₃ | LB52 | | 30% |
| fac-Ir(LB53)₃ | LB53 | | 28% |

| Ex. | Ligand L | Ir complex Diastereomer | Yield |
|---|---|---|---|
| fac-Ir(LB54)₃ | LB54 | [structure] | 33% |

3) Iridium Complexes of the [Ir(L)₂C]2 Type

Variant A

A mixture of 22 mmol of the ligand, 10 mmol of iridium(III) chloride hydrate, 75 ml of 2-ethoxyethanol and 25 ml of water is heated under reflux for 16-24 h with vigorous stirring. If the ligand does not dissolve or does not dissolve completely in the solvent mixture under reflux, 1,4-dioxane is added until a solution has formed. After cooling, the precipitated solid is filtered off with suction, washed twice with ethanol/water (1:1, w) and then dried in vacuo. The chloro dimer of the formula [Ir(L)₂Cl]₂ obtained in this way is reacted further without purification.

Variant B

A mixture of 10 mmol of sodium bisacetylacetonatodichloroiridate(III) [770720-50-8], 24 mmol of ligand L and a glass-clad magnetic stirrer bar are melted into a thick-walled 50 ml glass ampoule in vacuo ($10^{-5}$ mbar). The ampoule is heated at the temperature indicated for the time indicated, during which the molten mixture is stirred with the aid of a magnetic stirrer. After cooling—NOTE: the ampoules are usually under pressure!—the ampoule is opened, the sinter cake is stirred for 3 h with 100 g of glass beads (diameter 3 mm) in 100 ml of the suspension medium indicated (the suspension medium is selected so that the ligand is readily soluble, but the chloro dimer of the formula [Ir(L)₂Cl]₂ has low solubility therein, typical suspension media are dichloromethane, acetone, ethyl acetate, toluene, etc.) and mechanically digested at the same time. The fine suspension is decanted off from the glass beads, the solid [Ir(L)₂Cl]₂ which still contains about 2 eq. of NaCl, referred to below as the crude chloro dimer) is filtered off with suction and dried in vacuo. The crude chloro dimer of the formula [Ir(L)₂Cl]₂ obtained in this way is reacted further without purification.

| Ex. | Ligand L | Ir complex Variant Temp./time Diastereomer | Yield |
|---|---|---|---|
| [Ir(L1)₂Cl]₂ | L1 | [structure] A | 76% |
| [Ir(L2)₂Cl]₂ | L2 | Ir[(L2)Cl]₂ A | 81% |
| [Ir(L5)₂Cl]₂ | L5 | [structure] A | 61% |

-continued
| Ex. | Ligand L | Ir complex Variant Temp./time Diastereomer | Yield |
|---|---|---|---|
| [Ir(L6)₂Cl]₂ | L6 | Ir[(L6)Cl]₂<br>A | 74% |
| [Ir(L10)₂Cl]₂ | L10 | 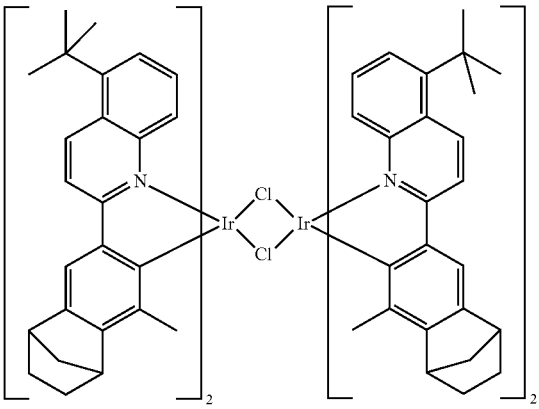<br>A<br>Diastereomer mixture | 63% |
| [Ir(L11)₂Cl]₂ | L11 | 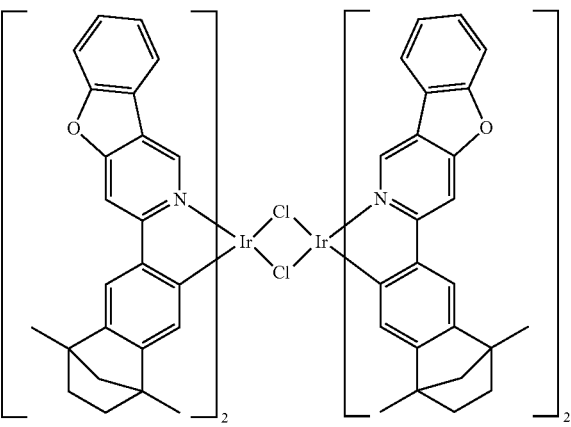<br>A<br>Diastereomer mixture | 69% |
| [Ir(L12)₂Cl]₂ | L12 | Ir[(L12)Cl]₂<br>B | 75% |
| [Ir(L14)₂Cl]₂ | L14 | 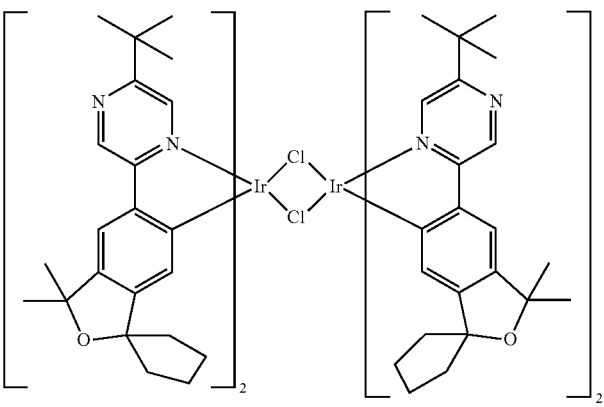 | |
| [Ir(L21)₂Cl]₂ | L21 | Ir[(L21)Cl]₂<br>A<br>Diastereomer mixture | 53% |

-continued
| Ex. | Ligand L | Ir complex Variant Temp./time Diastereomer | Yield |
|---|---|---|---|
| [Ir(L25)₂Cl]₂ | L25 | 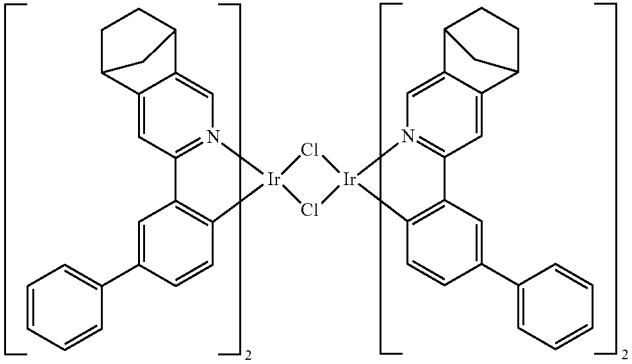<br>A<br>Diastereomer mixture | 73% |
| [Ir(L42)₂Cl]₂ | L42 | 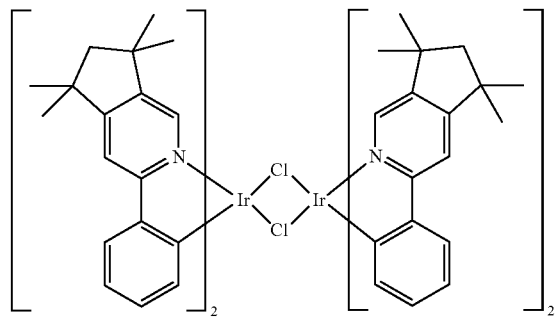<br>A | 84% |
| [Ir(L47)₂Cl]₂ | L47 | 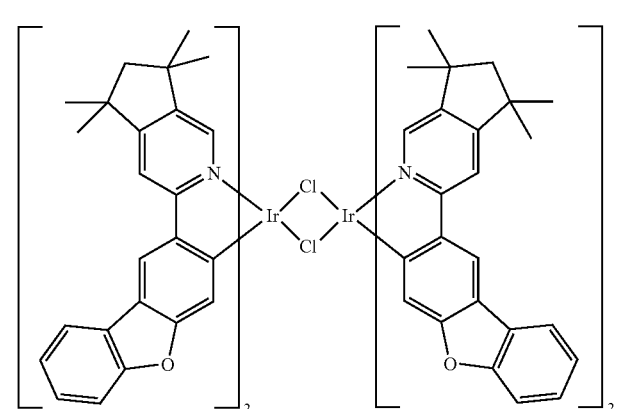<br>A | 80% |

-continued

| Ex. | Ligand L | Ir complex Variant Temp./time Diastereomer | Yield |
|---|---|---|---|
| [Ir(L48)₂Cl]₂ | L48 | B 200° C./80 h | 78% |
| [Ir(L53)₂Cl]₂ | L53 | A | 46% |
| [Ir(L55)₂Cl]₂ | L55 | Ir[(L55)Cl]₂ A | 44% |
| [Ir(L59)₂Cl]₂ | L59 | [Ir(L59)₂Cl]₂ A Diastereomer mixture | 57% |
| [Ir(L60)₂Cl]₂ | L60 | [Ir(L60)₂Cl]₂ A | 63% |
| [Ir(L62)₂Cl]₂ | L62 | [Ir(L62)₂Cl]₂ B 240° C./48 h | 65% |
| [Ir(L64)₂Cl]₂ | L64 | B 250° C./80 h | 88% |

-continued

| Ex. | Ligand L | Ir complex Variant Temp./time Diastereomer | Yield |
|---|---|---|---|
| [Ir(L72)₂Cl]₂ | L72 | B 270° C./80 h | 78% |
| [Ir(L74)₂Cl]₂ | L74 | B 250° C./80 h | 66% |
| [Ir(L95)₂Cl]₂ | L95 | B 240° C./60 h | 88% |
| [Ir(L96)₂Cl]₂ | L96 | [Ir(L96)₂Cl]₂ as for [Ir(L95)₂Cl]₂ | 86% |
| [Ir(L100)₂Cl]₂ | L100 | [Ir(L100)₂Cl]₂ as for [Ir(L95)₂Cl]₂ | 87% |

| Ex. | Ligand L | Ir complex Variant Temp./time Diastereomer | Yield |
|---|---|---|---|
| [Ir(L102)₂Cl]₂ | L102 | 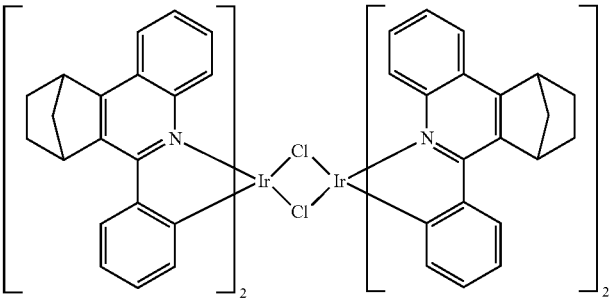<br>B<br>250° C./60 h<br>Diastereomer mixture | 92% |
| [Ir(L103)₂Cl]₂ | L103 | [Ir(L103)₂Cl]₂<br>as for [Ir(L102)₂Cl]₂ | 90% |
| [Ir(L104)₂Cl]₂ | L104 | [Ir(L104)₂Cl]₂<br>as for [Ir(L102)₂Cl]₂ | 90% |
| [Ir(L105)₂Cl]₂ | L105 | [Ir(L105)₂Cl]₂<br>as for [Ir(L102)₂Cl]₂ | 83% |
| [Ir(L106)₂Cl]₂ | L106 | [Ir(L106)₂Cl]₂<br>as for [Ir(L102)₂Cl]₂ | 91% |
| [Ir(L107)₂Cl]₂ | L107 | [Ir(L107)₂Cl]₂<br>as for [Ir(L102)₂Cl]₂ | 90% |
| [Ir(L108)₂Cl]₂ | L108 | [Ir(L108)₂Cl]₂<br>as for [Ir(L102)₂Cl]₂ | 87% |
| [Ir(L109)₂Cl]₂ | L109 | [Ir(L109)₂Cl]₂<br>as for [Ir(L102)₂Cl]₂ | 90% |
| [Ir(L110)₂Cl]₂ | L110 | [Ir(L110)₂Cl]₂<br>as for [Ir(L102)₂Cl]₂ | 92% |
| [Ir(L111)₂Cl]₂ | L111 | [Ir(L111)₂Cl]₂<br>as for [Ir(L102)₂Cl]₂ | 89% |
| [Ir(L112)₂Cl]₂ | L112 | [Ir(L112)₂Cl]₂<br>as for [Ir(L102)₂Cl]₂ | 84% |
| [Ir(L113)₂Cl]₂ | L113 | [Ir(L113)₂Cl]₂<br>B<br>250° C. /60 h<br>Diastereomer mixture | 78% |
| [Ir(L114)₂Cl]₂ | L114 | [Ir(L114)₂Cl]₂<br>B<br>280° C. /60 h<br>Diastereomer mixture | 64% |
| [Ir(L115a)₂Cl]₂ | L115a | [Ir(L115a)₂Cl]₂<br>as for [Ir(L102)₂Cl]₂ | 89% |
| [Ir(L115b)₂Cl]₂ | L115b | [Ir(L115b)₂Cl]₂<br>as for [Ir(L102)₂Cl]₂ | 91% |
| [Ir(L116)₂Cl]₂ | L116 | [Ir(L116)₂Cl]₂<br>as for [Ir(L114)₂Cl]₂ | 87% |
| [Ir(L117)₂Cl]₂ | L117 | [Ir(L117)₂Cl]₂<br>as for [Ir(L102)₂Cl]₂ | 88% |
| [Ir(L118)₂Cl]₂ | L118 | [Ir(L118)₂Cl]₂<br>as for [Ir(L102)₂Cl]₂ | 88% |
| [Ir(L119)₂Cl]₂ | L119 | [Ir(L119)₂Cl]₂<br>as for [Ir(L102)₂Cl]₂ | 90% |
| [Ir(L120)₂Cl]₂ | L120 | [Ir(L120)₂Cl]₂<br>as for [Ir(L102)₂Cl]₂ | 89% |
| [Ir(L121)₂Cl]₂ | L121 | [Ir(L121)₂Cl]₂<br>as for [Ir(L102)₂Cl]₂ | 89% |
| [Ir(L122)₂Cl]₂ | L122 | [Ir(L122)₂Cl]₂<br>as for [Ir(L102)₂Cl]₂ | 87% |
| [Ir(L123)₂Cl]₂ | L123 | [Ir(L123)₂Cl]₂<br>as for [Ir(L102)₂Cl]₂ | 93% |
| [Ir(L124)₂Cl]₂ | L124 | [Ir(L124)₂Cl]₂<br>B<br>250° C. /30 h<br>Diastereomer mixture | 78% |
| [Ir(L125)₂Cl]₂ | L125 | [Ir(L125)₂Cl]₂<br>as for [Ir(L124)₂Cl]₂ | 80% |
| [Ir(L126)₂Cl]₂ | L126 | [Ir(L126)₂Cl]₂<br>as for [Ir(L124)₂Cl]₂ | 67% |

-continued
| Ex. | Ligand L | Ir complex Variant Temp./time Diastereomer | Yield |
|---|---|---|---|
| [Ir(L127)₂Cl]₂ | L127 | [Ir(L127)₂Cl]₂<br>B<br>260° C./28 h | 69% |
| [Ir(L129)₂Cl]₂ | L129 | 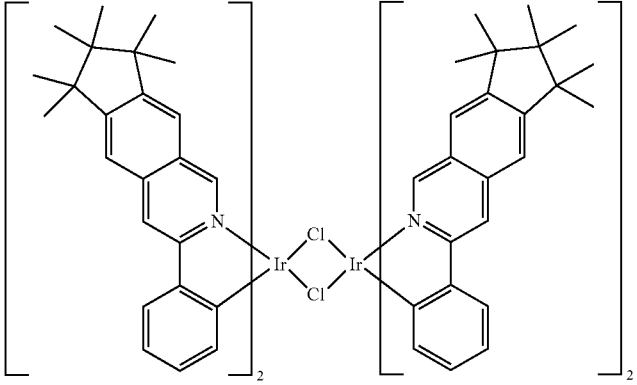<br>B<br>260° C./30 h | 91% |
| [Ir(L136)₂Cl]₂ | L136 | 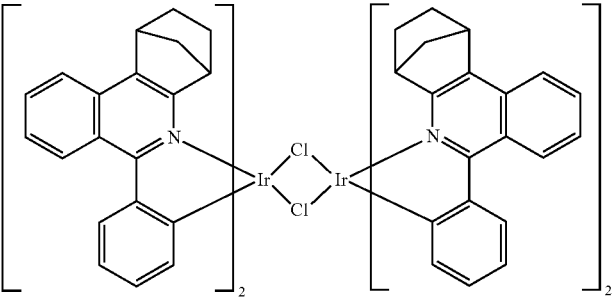<br>B<br>280° C./40 h<br>Diastereomer mixture | 85%<br><br><br>85% |
| [Ir(L137)₂Cl]₂ | L137 | [Ir(L137)₂Cl]₂<br>as for [Ir(L136)₂Cl]₂ | 86% |
| [Ir(L138)₂Cl]₂ | L138 | [Ir(L138)₂Cl]₂<br>as for [Ir(L136)₂Cl]₂ | 84% |
| [Ir(LB1)₂Cl]₂ | LB1 | 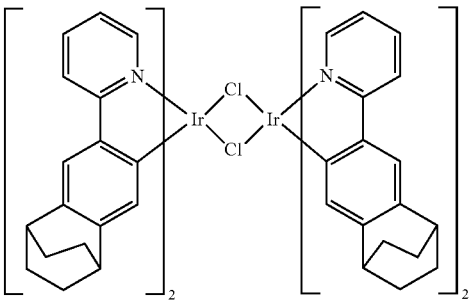<br>A | 76% |

| Ex. | Ligand L | Ir complex Variant Temp./time Diastereomer | Yield |
|---|---|---|---|
| [Ir(LB2)₂Cl]₂ | LB2 | B<br>240° C./20 h | 76% |
| [Ir(LB3)₂Cl]₂ | LB3 | [Ir(LB3)₂Cl]₂<br>as for [Ir(LB1)₂Cl]₂ | 75% |
| [Ir(LB4)₂Cl]₂ | LB4 | [Ir(LB4)₂Cl]₂<br>as for [Ir(LB1)₂Cl]₂ | 80% |
| [Ir(LB5)₂Cl]₂ | LB5 | [Ir(LB5)₂Cl]₂<br>as for [Ir(LB1)₂Cl]₂ | 79% |
| [Ir(LB6)₂Cl]₂ | LB6 | [Ir(LB6)₂Cl]₂<br>as for [Ir(LB2)₂Cl]₂ | 73% |
| [Ir(LB7)₂Cl]₂ | LB7 | [Ir(LB7)₂Cl]₂<br>as for [Ir(LB2)₂Cl]₂ | 74% |
| [Ir(LB8)₂Cl]₂ | LB8 | [Ir(LB8)₂Cl]₂<br>as for [Ir(LB2)₂Cl]₂ | 77% |
| [Ir(LB9)₂Cl]₂ | LB9 | [Ir(LB9)₂Cl]₂<br>as for [Ir(LB2)₂Cl]₂ | 81% |
| [Ir(LB10)₂Cl]₂ | LB10 | [Ir(LB10)₂Cl]₂<br>as for [Ir(LB1)₂Cl]₂ | 76% |
| [Ir(LB11)₂Cl]₂ | LB11 | [Ir(LB11)₂Cl]₂<br>as for [Ir(LB2)₂Cl]₂ | 84% |
| [Ir(LB12)₂Cl]₂ | LB12 | [Ir(LB12)₂Cl]₂<br>as for [Ir(LB2)₂Cl]₂ | 84% |
| [Ir(LB13)₂Cl]₂ | LB13 | [Ir(LB13)₂Cl]₂<br>as for [Ir(LB2)₂Cl]₂ | 80% |
| [Ir(LB14)₂Cl]₂ | LB14 | [Ir(LB14)₂Cl]₂<br>as for [Ir(LB2)₂Cl]₂ | 79% |
| [Ir(LB15)₂Cl]₂ | LB15 | [Ir(LB15)₂Cl]₂<br>as for [Ir(LB2)₂Cl]₂ | 83% |
| [Ir(LB16)₂Cl]₂ | LB16 | [Ir(LB16)₂Cl]₂<br>as for [Ir(LB2)₂Cl]₂ | 82% |
| [Ir(LB17)₂Cl]₂ | LB17 | [Ir(LB17)₂Cl]₂<br>as for [Ir(LB2)₂Cl]₂ | 80% |
| [Ir(LB18)₂Cl]₂ | LB18 | [Ir(LB18)₂Cl]₂<br>as for [Ir(LB2)₂Cl]₂ | 86% |
| [Ir(LB19)₂Cl]₂ | LB19 | [Ir(LB19)₂Cl]₂<br>as for [Ir(LB2)₂Cl]₂ | 80% |
| [Ir(LB20)₂Cl]₂ | LB20 | [Ir(LB20)₂Cl]₂<br>as for [Ir(LB2)₂Cl]₂ | 81% |
| [Ir(LB21)₂Cl]₂ | LB21 | [Ir(LB21)₂Cl]₂<br>as for [Ir(LB2)₂Cl]₂ | 73% |

| Ex. | Ligand L | Ir complex Variant Temp./time Diastereomer | Yield |
|---|---|---|---|
| [Ir(LB22)₂Cl]₂ | LB22 | as for [Ir(LB2)₂Cl]₂ | 86% |
| [Ir(LB23)₂Cl]₂ | LB23 | A | 53% |
| [Ir(LB24)₂Cl]₂ | LB24 | B<br>250° C./20 h | 60% |
| [Ir(LB25)₂Cl]₂ | LB25 | [Ir(LB25)₂Cl]₂<br>as for [Ir(LB24)₂Cl]₂ | 60% |
| [Ir(LB26)₂Cl]₂ | LB26 | [Ir(LB26)₂Cl]₂<br>as for [Ir(LB24)₂Cl]₂ | 52% |

-continued

| Ex. | Ligand L | Ir complex Variant Temp./time Diastereomer | Yield |
|---|---|---|---|
| [Ir(LB27)₂Cl]₂ | LB27 | [Ir(LB27)₂Cl]₂ as for [Ir(LB24)₂Cl]₂ | 64% |
| [Ir(LB28)₂Cl]₂ | LB28 | [Ir(LB28)₂Cl]₂ as for [Ir(LB24)₂Cl]₂ | 67% |
| [Ir(LB29)₂Cl]₂ | LB29 | [Ir(LB29)₂Cl]₂ as for [Ir(LB23)₂Cl]₂ | 53% |
| [Ir(LB30)₂Cl]₂ | LB30 | [Ir(LB30)₂Cl]₂ as for [Ir(LB24)₂Cl]₂ | 52% |
| [Ir(LB31)₂Cl]₂ | LB31 | [Ir(LB31)₂Cl]₂ as for [Ir(LB24)₂Cl]₂ | 59% |
| [Ir(LB32)₂Cl]₂ | LB32 | [Ir(LB32)₂Cl]₂ as for [Ir(LB24)₂Cl]₂ | 66% |
| [Ir(LB33)₂Cl]₂ | LB33 | B 270° C./60 h | 75% |
| [Ir(LB34)₂Cl]₂ | LB34 | [Ir(LB34)₂Cl]₂ as for [Ir(LB33)₂Cl]₂ | 57% |
| [Ir(LB35)₂Cl]₂ | LB35 | [Ir(LB35)₂Cl]₂ B 285° C./80 h | 48% |
| [Ir(LB36)₂Cl]₂ | LB36 | [Ir(LB36)₂Cl]₂ as for [Ir(LB33)₂Cl]₂ | 77% |
| [Ir(LB37)₂Cl]₂ | LB37 | [Ir(LB37)₂Cl]₂ as for [Ir(LB33)₂Cl]₂ | 60% |
| [Ir(LB38)₂Cl]₂ | LB38 | [Ir(LB38)₂Cl]₂ as for [Ir(LB33)₂Cl]₂ | 64% |
| [Ir(LB39)₂Cl]₂ | LB39 | [Ir(LB39)₂Cl]₂ as for [Ir(LB33)₂Cl]₂ | 78% |
| [Ir(LB40)₂Cl]₂ | LB40 | [Ir(LB40)₂Cl]₂ as for [Ir(LB33)₂Cl]₂ | 76% |
| [Ir(LB41)₂Cl]₂ | LB41 | [Ir(LB41)₂Cl]₂ as for [Ir(LB33)₂Cl]₂ | 51% |
| [Ir(LB42)₂Cl]₂ | LB42 | [Ir(LB42)₂Cl]₂ as for [Ir(LB33)₂Cl]₂ | 65% |
| [Ir(LB58)₂Cl]₂ | LB58 | B 250° C./50 h | 81% |
| [Ir(LB59)₂Cl]₂ | LB59 | [Ir(LB59)₂Cl]₂ as for [Ir(LB58)₂Cl]₂ | 92% |
| [Ir(LB60)₂Cl]₂ | LB60 | [Ir(LB60)₂Cl]₂ as for [Ir(LB58)₂Cl]₂ | 90% |

| Ex. | Ligand L | Ir complex Variant Temp./time Diastereomer | Yield |
|---|---|---|---|
| [Ir(LB61)$_2$Cl]$_2$ | LB61 | [Ir(LB61)$_2$Cl]$_2$ as for [Ir(LB58)$_2$Cl]$_2$ | 89% |
| [Ir(LB62)$_2$Cl]$_2$ | LB62 | [Ir(LB62)$_2$Cl]$_2$ as for [Ir(LB58)$_2$Cl]$_2$ | 89% |
| [Ir(LB63)$_2$Cl]$_2$ | LB63 | [Ir(LB63)$_2$Cl]$_2$ as for [Ir(LB58)$_2$Cl]$_2$ | 82% |
| [Ir(LB64)$_2$Cl]$_2$ | LB64 | [Ir(LB64)$_2$Cl]$_2$ as for [Ir(LB58)$_2$Cl]$_2$ | 67% |
| [Ir(LB65)$_2$Cl]$_2$ | LB65 | [Ir(LB65)$_2$Cl]$_2$ as for [Ir(LB58)$_2$Cl]$_2$ | 88% |
| [Ir(LB66)$_2$Cl]$_2$ | LB66 | [Ir(LB66)$_2$Cl]$_2$ as for [Ir(LB58)$_2$Cl]$_2$ | 90% |
| [Ir(LB67)$_2$Cl]$_2$ | LB67 | [Ir(LB67)$_2$Cl]$_2$ as for [Ir(LB58)$_2$Cl]$_2$ | 91% |
| [Ir(LB68)$_2$Cl]$_2$ | LB68 | 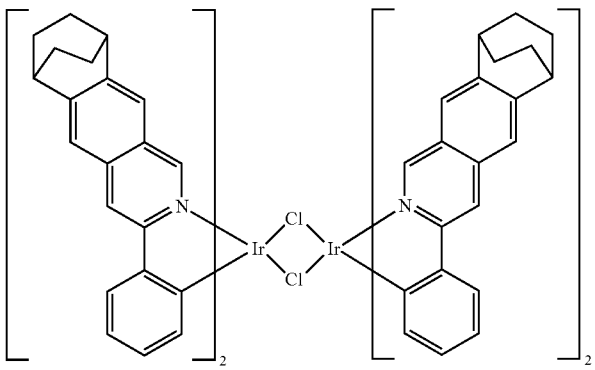<br>B<br>260° C./30 h | 88% |
| [Ir(LB69)$_2$Cl]$_2$ | LB69 | [Ir(LB69)$_2$Cl]$_2$ as for [Ir(LB69)$_2$Cl]$_2$ | 85% |
| [Ir(LB70)$_2$Cl]$_2$ | LB70 | [Ir(LB70)$_2$Cl]$_2$ as for [Ir(LB69)$_2$Cl]$_2$ | 67% |
| [Ir(LB71)$_2$Cl]$_2$ | LB71 | [Ir(LB71)$_2$Cl]$_2$ as for [Ir(LB69)$_2$Cl]$_2$ | 87% |
| [Ir(LB72)$_2$Cl]$_2$ | LB72 | 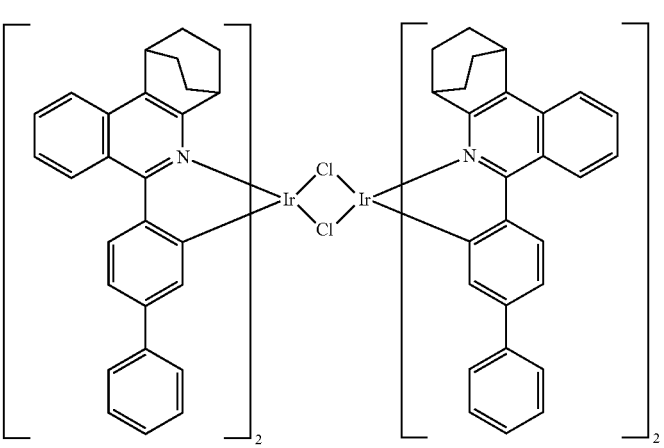<br>B<br>280° C./40 h | 56% |
| [Ir(LB73)$_2$Cl]$_2$ | LB73 | [Ir(LB73)$_2$Cl]$_2$ as for [Ir(LB72)$_2$Cl]$_2$ | 59% |

| Ex. | Ligand L | Ir complex Variant Temp./time Diastereomer | Yield |
|---|---|---|---|
| [Ir(LB74)₂Cl]₂ | LB74 | 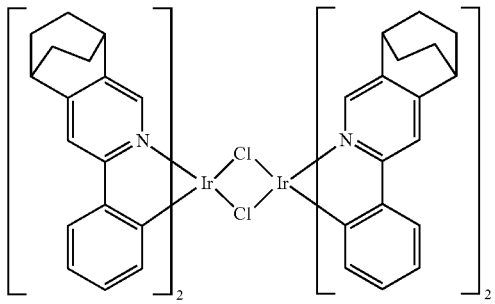<br>A | 86% |
| [Ir(LB75)₂Cl]₂ | LB75 | [Ir(LB75)₂Cl]₂<br>B<br>260° C./25 h | 90% |
| [Ir(LB76)₂Cl]₂ | LB76 | [Ir(LB76)₂Cl]₂<br>as for [Ir(LB75)₂Cl]₂ | 89% |
| [Ir(LB77)₂Cl]₂ | LB77 | [Ir(LB77)₂Cl]₂<br>as for [Ir(LB75)₂Cl]₂ | 90% |
| [Ir(LB78)₂Cl]₂ | LB78 | [Ir(LB78)₂Cl]₂<br>as for [Ir(LB75)₂Cl]₂ | 83% |
| [Ir(LB79)₂Cl]₂ | LB79 | [Ir(LB79)₂Cl]₂<br>as for [Ir(LB75)₂Cl]₂ | 87% |
| [Ir(LB80)₂Cl]₂ | LB80 | [Ir(LB80)₂Cl]₂<br>as for [Ir(LB75)₂Cl]₂ | 86% |
| [Ir(LB81)₂Cl]₂ | LB81 | [Ir(LB81)₂Cl]₂<br>as for [Ir(LB75)₂Cl]₂ | 90% |
| [Ir(LB82)₂Cl]₂ | LB82 | [Ir(LB82)₂Cl]₂<br>as for [Ir(LB75)₂Cl]₂ | 61% |
| [Ir(LB83)₂Cl]₂ | LB83 | [Ir(LB83)₂Cl]₂<br>as for [Ir(LB75)₂Cl]₂ | 86% |
| [Ir(LB84)₂Cl]₂ | LB84 | [Ir(LB84)₂Cl]₂<br>as for [Ir(LB75)₂Cl]₂ | 85% |
| [Ir(LB85)₂Cl]₂ | LB85 | [Ir(LB85)₂Cl]₂<br>as for [Ir(LB75)₂Cl]₂ | 88% |
| [Ir(LB86)₂Cl]₂ | LB86 | [Ir(LB86)₂Cl]₂<br>as for [Ir(LB75)₂Cl]₂ | 86% |
| [Ir(LB87)₂Cl]₂ | LB87 | [Ir(LB87)₂Cl]₂<br>as for [Ir(LB75)₂Cl]₂ | 91% |
| [Ir(LB88)₂Cl]₂ | LB88 | [Ir(LB88)₂Cl]₂<br>as for [Ir(LB75)₂Cl]₂ | 90% |
| [Ir(LB90)₂Cl]₂ | LB90 | [Ir(LB90)₂Cl]₂<br>as for [Ir(LB75)₂Cl]₂ | 90% |
| [Ir(LB91)₂Cl]₂ | LB91 | [Ir(LB91)₂Cl]₂<br>as for [Ir(LB75)₂Cl]₂ | 85% |
| [Ir(LB92)₂Cl]₂ | LB92 | [Ir(LB92)₂Cl]₂<br>as for [Ir(LB75)₂Cl]₂ | 83% |
| [Ir(LB93)₂Cl]₂ | LB93 | [Ir(LB93)₂Cl]₂<br>as for [Ir(LB75)₂Cl]₂ | 86% |
| [Ir(LB94)₂Cl]₂ | LB94 | 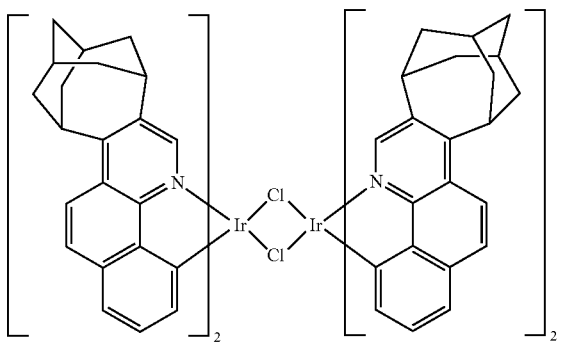<br>B<br>280° C./25 h | 66% |

-continued

| Ex. | Ligand L | Ir complex Variant Temp./time Diastereomer | Yield |
|---|---|---|---|
| [Ir(LB95)$_2$Cl]$_2$ | LB95 | [Ir(LB95)$_2$Cl]$_2$ | 36% |
| [Ir(LB102)$_2$Cl]$_2$ | LB96 | [Ir(LB102)$_2$Cl]$_2$ | 70% |
| [Ir(LB103)$_2$Cl]$_2$ | LB103 | [Ir(LB103)$_2$Cl]$_2$ | 68% |
| [Ir(LB104)$_2$Cl]$_2$ | LB104 | [Ir(LB104)$_2$Cl]$_2$ | 30% |

4) Iridium Complexes of the [Ir(L)$_2$(HOMe)$_2$]OTf Type 5 ml of methanol and then 10 mmol of silver(I) trifluoromethanesulfonate [2923-28-6] are added to a suspension of 5 mmol of the chloro dimer [Ir(L)$_2$Cl]$_2$ in 150 ml of dichloromethane, and the mixture is stirred at room temperature for 18 h. The precipitated silver(1) chloride is filtered off with suction via a Celite bed, the filtrate is evaporated to dryness, the yellow residue is taken up in 30 ml of toluene or cyclohexane, the solid is filtered off, washed with n-heptane and dried in vacuo. The product of the formula [Ir(L)$_2$(HOMe)$_2$]OTf obtained in this way is reacted further without purification.

| Ex. | [Ir(L)$_2$Cl]$_2$ | [Ir(L)$_2$(HOMe)$_2$]OTf | Yield |
|---|---|---|---|
| [Ir(L1)$_2$(HOMe)$_2$]OTf | Ir[(L1)Cl]$_2$ | (structure) | 81% |
| [Ir(L2)$_2$(HOMe)$_2$]OTf | [Ir(L2)$_2$Cl]$_2$ | [Ir(L2)$_2$(HOMe)$_2$]OTf | 79% |
| [Ir(L5)$_2$(HOMe)$_2$]OTf | [Ir(L5)$_2$Cl]$_2$ | [Ir(L5)$_2$(HOMe)$_2$]OTf | 77% |
| [Ir(L6)$_2$(HOMe)$_2$]OTf | [Ir(L6)$_2$Cl]$_2$ | [Ir(L6)$_2$(HOMe)$_2$]OTf | 77% |
| [Ir(L10)$_2$(HOMe)$_2$]OTf | [Ir(L10)$_2$Cl]$_2$ | [Ir(L10)$_2$(HOMe)$_2$]OTf | 80% |
| [Ir(L11)$_2$(HOMe)$_2$]OTf | [Ir(L11)$_2$Cl]$_2$ | [Ir(L11)$_2$(HOMe)$_2$]OTf | 76% |
| [Ir(L12)$_2$(HOMe)$_2$]OTf | [Ir(L12)$_2$Cl]$_2$ | [Ir(L12)$_2$(HOMe)$_2$]OTf | 64% |
| [Ir(L14)$_2$(HOMe)$_2$]OTf | [Ir(L14)$_2$Cl]$_2$ | [Ir(L14)$_2$(HOMe)$_2$]OTf | 82% |
| [Ir(L21)$_2$(HOMe)$_2$]OTf | [Ir(L21)$_2$Cl]$_2$ | [Ir(L21)$_2$(HOMe)$_2$]OTf | 79% |
| [Ir(L25)$_2$(HOMe)$_2$]OTf | [Ir(L25)$_2$Cl]$_2$ | [Ir(L25)$_2$(HOMe)$_2$]OTf | 80% |
| [Ir(L42)$_2$(HOMe)$_2$]OTf | [Ir(L42)$_2$Cl]$_2$ | [Ir(L42)$_2$(HOMe)$_2$]OTf | 75% |
| [Ir(L47)$_2$(HOMe)$_2$]OTf | [Ir(L47)$_2$Cl]$_2$ | [Ir(L47)$_2$(HOMe)$_2$]OTf | 86% |
| [Ir(L48)$_2$(HOMe)$_2$]OTf | [Ir(L48)$_2$Cl]$_2$ | [Ir(L48)$_2$(HOMe)$_2$]OTf | 78% |
| [Ir(L53)$_2$(HOMe)$_2$]OTf | [Ir(L53)$_2$Cl]$_2$ | [Ir(L53)$_2$(HOMe)$_2$]OTf | 81% |
| [Ir(L55)$_2$(HOMe)$_2$]OTf | [Ir(L55)$_2$Cl]$_2$ | [Ir(L55)$_2$(HOMe)$_2$]OTf | 82% |
| [Ir(L59)$_2$(HOMe)$_2$]OTf | [Ir(L59)$_2$Cl]$_2$ | [Ir(L59)$_2$(HOMe)$_2$]OTf | 80% |
| [Ir(L60)$_2$(HOMe)$_2$]OTf | [Ir(L60)$_2$Cl]$_2$ | [Ir(L60)$_2$(HOMe)$_2$]OTf | 78% |
| [Ir(L62)$_2$(HOMe)$_2$]OTf | [Ir(L62)$_2$Cl]$_2$ | [Ir(L62)$_2$(HOMe)$_2$]OTf | 77% |
| [Ir(L64)$_2$(HOMe)$_2$]OTf | [Ir(L64)$_2$Cl]$_2$ | [Ir(L64)$_2$(HOMe)$_2$]OTf | 76% |
| [Ir(L72)$_2$(HOMe)$_2$]OTf | [Ir(L72)$_2$Cl]$_2$ | [Ir(L72)$_2$(HOMe)$_2$]OTf | 79% |
| [Ir(L74)$_2$(HOMe)$_2$]OTf | [Ir(L74)$_2$Cl]$_2$ | [Ir(L74)$_2$(HOMe)$_2$]OTf | 83% |
| [Ir(L95)$_2$(HOMe)$_2$]OTf | [Ir(L95)$_2$Cl]$_2$ | [Ir(L95)$_2$(HOMe)$_2$]OTf | 83% |
| [Ir(L96)$_2$(HOMe)$_2$]OTf | [Ir(L96)$_2$Cl]$_2$ | [Ir(L96)$_2$(HOMe)$_2$]OTf | 77% |
| [Ir(L100)$_2$(HOMe)$_2$]OTf | [Ir(L100)$_2$Cl]$_2$ | [Ir(L100)$_2$(HOMe)$_2$]OTf | 74% |
| [Ir(L102)$_2$(HOMe)$_2$]OTf | [Ir(L102)$_2$Cl]$_2$ | [Ir(L102)$_2$(HOMe)$_2$]OTf | 76% |
| [Ir(L129)$_2$(HOMe)$_2$]OTf | [Ir(L129)$_2$Cl]$_2$ | [Ir(L129)$_2$(HOMe)$_2$]OTf | 86% |
| [Ir(LB1)$_2$(HOMe)$_2$]OTf | Ir[(LB1)Cl]$_2$ | (structure) | 82% |

-continued

| Ex. | [Ir(L)₂Cl]₂ | [Ir(L)₂(HOMe)₂]OTf | Yield |
|---|---|---|---|
| [Ir(LB2)₂(HOMe)₂]OTf | Ir[(LB2)₂Cl]₂ | [Ir(LB2)₂(HOMe)₂]OTf | |
| [Ir(LB3)₂(HOMe)₂]OTf | Ir[(LB3)₂Cl]₂ | [Ir(LB3)₂(HOMe)₂]OTf | 74% |
| [Ir(LB4)₂(HOMe)₂]OTf | Ir[(LB4)₂Cl]₂ | [Ir(LB4)₂(HOMe)₂]OTf | 82% |
| [Ir(LB5)₂(HOMe)₂]OTf | Ir[(LB5)₂Cl]₂ | [Ir(LB5)₂(HOMe)₂]OTf | 78% |
| [Ir(LB6)₂(HOMe)₂]OTf | Ir[(LB6)₂Cl]₂ | [Ir(LB6)₂(HOMe)₂]OTf | 77% |
| [Ir(LB8)₂(HOMe)₂]OTf | Ir[(LB8)₂Cl]₂ | [Ir(LB8)₂(HOMe)₂]OTf | 82% |
| [Ir(LB9)₂(HOMe)₂]OTf | Ir[(LB9)₂Cl]₂ | [Ir(LB9)₂(HOMe)₂]OTf | 79% |
| [Ir(LB11)₂(HOMe)₂]OTf | Ir[(LB11)₂Cl]₂ | [Ir(LB11)₂(HOMe)₂]OTf | 77% |
| [Ir(LB14)₂(HOMe)₂]OTf | Ir[(LB14)₂Cl]₂ | [Ir(LB14)₂(HOMe)₂]OTf | 74% |
| [Ir(LB17)₂(HOMe)₂]OTf | Ir[(LB17)₂Cl]₂ | [Ir(LB17)₂(HOMe)₂]OTf | 78% |
| [Ir(LB21)₂(HOMe)₂]OTf | Ir[(LB21)₂Cl]₂ | [Ir(LB21)₂(HOMe)₂]OTf | 79% |
| [Ir(LB22)₂(HOMe)₂]OTf | Ir[(LB22₂)Cl]₂ | [Ir(LB22)₂(HOMe)₂]OTf | 76% |
| [Ir(LB33)₂(HOMe)₂]OTf | Ir[(LB33)₂Cl]₂ | [Ir(LB33)₂(HOMe)₂]OTf | 78% |
| [Ir(LB42)₂(HOMe)₂]OTf | Ir[(LB42)₂Cl]₂ | [Ir(LB42)₂(HOMe)₂]OTf | 75% |
| [Ir(LB57)₂(HOMe)₂]OTf | Ir[(LB57)₂Cl]₂ | [Ir(LB57)₂(HOMe)₂]OTf | 82% |
| [Ir(LB58)₂(HOMe)₂]OTf | Ir[(LB58)₂Cl]₂ | [Ir(LB58)₂(HOMe)₂]OTf | 82% |
| [Ir(LB60)₂(HOMe)₂]OTf | Ir[(LB60)₂Cl]₂ | [Ir(LB60)₂(HOMe)₂]OTf | 75% |
| [Ir(LB67)₂(HOMe)₂]OTf | Ir[(LB67)₂Cl]₂ | [Ir(LB67)₂(HOMe)₂]OTf | 78% |
| [Ir(LB68)₂(HOMe)₂]OTf | Ir[(LB68)₂Cl]₂ | [Ir(LB68)₂(HOMe)₂]OTf | 76% |
| [Ir(LB74)₂(HOMe)₂]OTf | Ir[(LB74)₂Cl]₂ | [Ir(LB74)₂(HOMe)₂]OTf | 77% |
| [Ir(LB76)₂(HOMe)₂]OTf | Ir[(LB76)₂Cl]₂ | [Ir(LB76)₂(HOMe)₂]OTf | 79% |
| [Ir(LB81)₂(HOMe)₂]OTf | Ir[(LB81)₂Cl]₂ | [Ir(LB81)₂(HOMe)₂]OTf | 81% |
| [Ir(LB85)₂(HOMe)₂]OTf | Ir[(LB85)₂Cl]₂ | [Ir(LB85)₂(HOMe)₂]OTf | 79% |
| [Ir(LB91)₂(HOMe)₂]OTf | Ir[(LB91)₂Cl]₂ | [Ir(LB91)₂(HOMe)₂]OTf | 78% |
| [Ir(LB93)₂(HOMe)₂]OTf | Ir[(LB93)₂Cl]₂ | [Ir(LB93)₂(HOMe)₂]OTf | 81% |
| [Ir(LB94)₂(HOMe)₂]OTf | Ir[(LB94)₂Cl]₂ | [Ir(LB94)₂(HOMe)₂]OTf | 74% |

5) Heteroleptic tris-facial Iridium complexes of the phenylpyridine, phenylimidazole or phenylbenzimidazole type A mixture of 10 mmol of the ligand L, 10 mmol of bis(methanol)bis[2-(2-pyridinyl-κN)phenyl-κC]iridium(III) trifluoromethanesulfonate [1215692-14-0] or bis(methanol)bis[2-(6-methyl-2-pyridinyl-κN)phenyl-κC]iridium(III) trifluoromethanesulfonate [1215692-29-7] or iridium complexes of the [Ir(L)₂(HOMe)₂]OTf type according to the invention, 11 mmol of 2,6-dimethylpyridine and 150 ml of ethanol is heated under reflux for 40 h. After cooling, the precipitated solid is filtered off with suction, washed three times with 30 ml of ethanol each time and dried in vacuo. The crude product obtained in this way is chromatographed on silica gel (solvent or mixtures thereof, for example DCM, THF, toluene, n-heptane, cyclohexane) and subjected to fractional sublimation as described under 1) variant A.

| | [Ir(L)₂(HOMe)₂]OTf | | |
|---|---|---|---|
| | Ligand | Ir complex | |
| Ex. | L | Diastereomer | Yield |
| Ir500 | 1215692-14-0<br>LB1 | (structure) | 41% |

-continued

| Ex. | [Ir(L)₂(HOMe)₂]OTf Ligand L | Ir complex Diastereomer | Yield |
|---|---|---|---|
| Ir501 | 1215692-14-0 LB2 | | 46% |
| Ir502 | 1215692-14-0 LB3 | | 45% |
| Ir503 | 1215692-29-7 LB6 | | 24% |

-continued

| Ex. | [Ir(L)₂(HOMe)₂]OTf Ligand L | Ir complex Diastereomer | Yield |
|---|---|---|---|
| Ir504 | 1215692-14-0 LB9 | | 44% |
| Ir505 | 1215692-14-0 LB17 | | 51% |
| Ir506 | 1215692-14-0 LB22 | | 54% |

-continued
| Ex. | [Ir(L)₂(HOMe)₂]OTf Ligand L | Ir complex Diastereomer | Yield |
|---|---|---|---|
| Ir507 | 1215692-14-0 L23 | 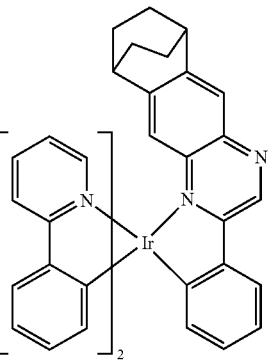 | 28% |
| IR508 | 1215692-14-0 LB40 | 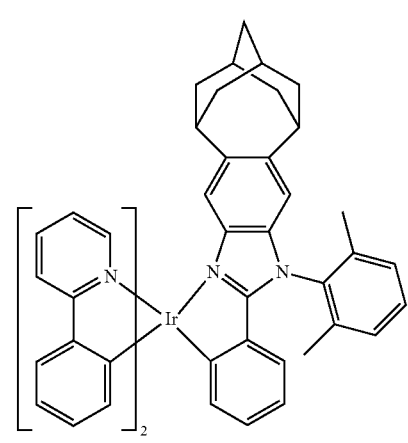 | 46% |
| Ir509 | 1215692-14-0 LB57 | 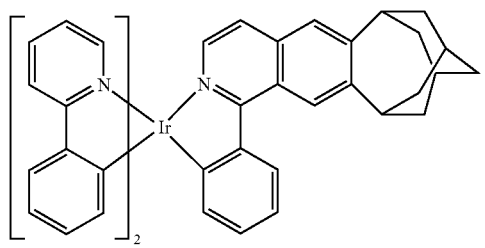 | 40% |
| Ir510 | 1215692-14-0 LB60 | 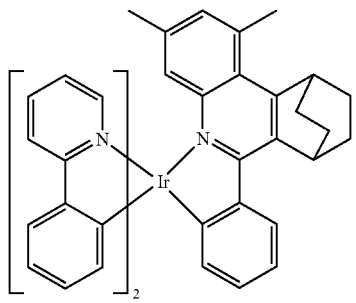 | 28% |

-continued
| Ex. | [Ir(L)₂(HOMe)₂]OTf Ligand L | Ir complex Diastereomer | Yield |
|---|---|---|---|
| Ir511 | 1215692-29-7 LB71 | 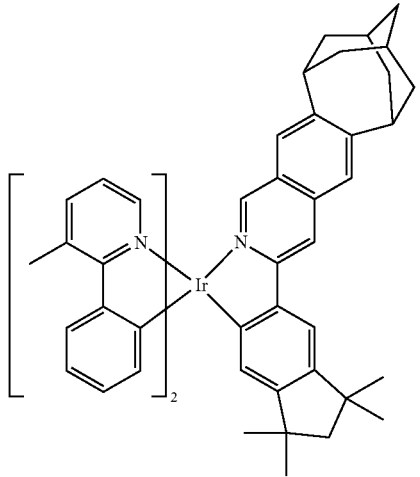 | 47% |
| Ir512 | 1215692-29-7 LB74 | 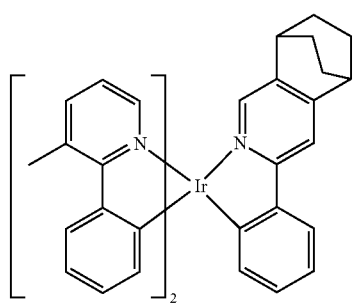 | 49% |
| Ir513 | 1215692-14-0 LB77 | 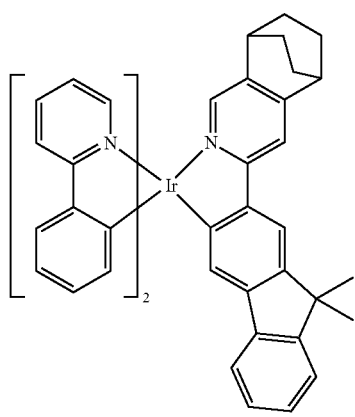 | 47% |

-continued

| Ex. | [Ir(L)₂(HOMe)₂]OTf Ligand L | Ir complex Diastereomer | Yield |
|---|---|---|---|
| Ir514 | 1215692-14-0 LB78 | | 50% |
| Ir515 | 1215692-14-0 LB85 | | 44% |
| Ir516 | 1215692-14-0 LB87 | | 46% |
| Ir517 | 1215692-14-0 LB96 | | 21% |

-continued

| Ex. | [Ir(L)₂(HOMe)₂]OTf Ligand L | Ir complex Diastereomer | Yield |
|---|---|---|---|
| Ir518 | [Ir(LB1)₂(HOMe)₂]OTf 1008-89-56 | | 40% |
| Ir519 | [Ir(LB2)₂(HOMe)₂]OTf 1008-89-56 | | 41% |
| Ir520 | [Ir(LB3)₂(HOMe)₂]OTf 1008-89-56 | | 42% |
| Ir521 | [Ir(LB6)₂(HOMe)₂]OTf 1008-89-56 | | 20% |

-continued

| Ex. | [Ir(L)₂(HOMe)₂]OTf Ligand L | Ir complex Diastereomer | Yield |
|---|---|---|---|
| Ir522 | [Ir(LB9)₂(HOMe)₂]OTf 1008-89-56 | | 43% |
| Ir523 | [Ir(LB11)₂(HOMe)₂]OTf 1008-89-56 | | 46% |
| Ir524 | [Ir(LB33)₂(HOMe)₂]OTf 1008-89-56 | | 33% |

-continued

| Ex. | [Ir(L)₂(HOMe)₂]OTf Ligand L | Ir complex Diastereomer | Yield |
|---|---|---|---|
| Ir525 | [Ir(LB67)₂(HOMe)₂]OTf 1008-89-56 | | 21% |
| Ir526 | [Ir(LB81)₂(HOMe)₂]OTf 1008-89-56 | | 52% |
| Ir527 | [Ir(L1)₂HOMe)]₂]OTf LB3 | | 44% |

-continued

| Ex. | [Ir(L)₂(HOMe)₂]OTf Ligand L | Ir complex Diastereomer | Yield |
|---|---|---|---|
| Ir528 | [Ir(L2)₂HOMe)]₂]OTf LB10 | | 45% |
| Ir529 | [Ir(L12)₂HOMe)]₂]OTf LB36 | | 31% |
| Ir530 | [Ir(L1)₂HOMe)]₂]OTf LB87 | | 48% |

-continued

| Ex. | [Ir(L)₂(HOMe)₂]OTf Ligand L | Ir complex Diastereomer | Yield |
|---|---|---|---|
| Ir531 | [Ir(L2)₂HOMe)]₂]OTf LB79 | | 45% |
| Ir532 | [Ir(LB1)₂(HOMe)₂]OTf LB17 | | 49% |
| Ir533 | [Ir(LB1)₂(HOMe)₂]OTf LB74 | | 53% |

-continued

| Ex. | [Ir(L)₂(HOMe)₂]OTf Ligand L | Ir complex Diastereomer | Yield |
|---|---|---|---|
| Ir534 | [Ir(LB1)₂(HOMe)₂]OTf LB93 | 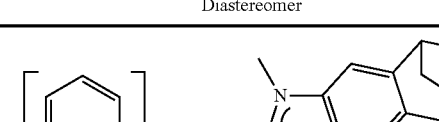 | 46% |
| Ir535 | [Ir(LB33)₂(HOMe)₂]OTf LB35 | | 19% |

6) Heteroleptic Tris-Facial Iridium Complexes Containing Ligands of the Arduengo Carbene Type Preparation analogous to A. G. Tennyson et al., Inorg. Chem., 2009, 48, 6924.

A mixture of 22 mmol of the ligand, 10 mmol of iridium chloro dimer [Ir(L)₂Cl]₂, 10 mmol of silver(I) oxide and 300 ml of 1,2-dichloroethane is stirred at 90° C. for 30 h. After cooling, the precipitated solid is filtered off with suction via a Celite bed, washed once with 30 ml of 1,2-dichloroethane, and the filtrate is evaporated to dryness in vacuo. The crude product obtained in this way is chromatographed on silica gel (solvent or mixtures thereof, for example dichloromethane, THF, toluene, n-heptane, cyclohexane) and subjected to fractional sublimation as described under 1) variant A.

| Ex. | [Ir(L)₂Cl]₂ Ligand L | Ir complex Diastereomer | Yield |
|---|---|---|---|
| Ir536 | [Ir(PPy)₂Cl]₂ 603109-48-48 LB43 | 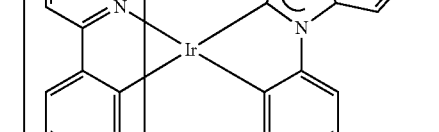 | 50% |

-continued

| Ex. | [Ir(L)₂Cl]₂ Ligand L | Ir complex Diastereomer | Yield |
|---|---|---|---|
| Ir537 | [Ir(L64)₂Cl]₂ LB45 | | 42% |

7) Iridium Complexes of the Ir(L)₂L' Type Containing Non-o-Metallated Ligands L'

A mixture of 25 mmol of the ligand L', 10 mmol of iridium chloro dimer [Ir(L)₂Cl]₂, 30 mmol of sodium hydrogencarbonate, 100 ml of 2-ethoxyethanol and 30 ml of water is stirred at 90° C. for 16 h. After cooling, the precipitated solid is filtered off with suction, washed three times with 30 ml of ethanol each time and dried in vacuo. The crude product obtained in this way is chromatographed on silica gel (solvent or mixtures thereof, for example dichloromethane, THF, toluene, n-heptane, cyclohexane) or recrystallised, and subjected to fractional sublimation as described under 1) variant A.

| Ex. | [Ir(L)₂Cl]₂ Ligand L' | Ir complex Diastereomer | Yield |
|---|---|---|---|
| Ir538 | [Ir(LB1)₂Cl]₂ 123-54-6 | | 76% |
| Ir539 | [Ir(LB22)₂Cl]₂ 123-54-6 | | 72% |
| Ir540 | [Ir(LB23)₂Cl]₂ 123-54-6 | | 48% |

363 -continued

| Ex. | [Ir(L)₂Cl]₂ Ligand L' | Ir complex Diastereomer | Yield |
|---|---|---|---|
| Ir541 | [Ir(LB58)₂Cl]₂ 123-54-6 | | 40% |
| Ir542 | [Ir(LB59)₂Cl]₂ 123-54-6 | Ir542 as for [Ir(LB58)₂Cl]₂ | 38% |
| Ir543 | [Ir(LB60)₂Cl]₂ 123-54-6 | Ir543 as for [Ir(LB58)₂Cl]₂ | 33% |
| Ir544 | [Ir(LB61)₂Cl]₂ 123-54-6 | Ir544 as for [Ir(LB58)₂Cl]₂ | 35% |
| Ir545 | [Ir(LB62)₂Cl]₂ 123-54-6 | Ir545 as for [Ir(LB58)₂Cl]₂ | 31% |
| Ir546 | [Ir(LB63)₂Cl]₂ 123-54-6 | Ir546 as for [Ir(LB58)₂Cl]₂ | 33% |
| Ir547 | [Ir(LB64)₂Cl]₂ 123-54-6 | Ir547 as for [Ir(LB58)₂Cl]₂ | 30% |
| Ir548 | [Ir(LB65)₂Cl]₂ 123-54-6 | Ir548 as for [Ir(LB58)₂Cl]₂ | 36% |
| Ir549 | [Ir(LB66)₂Cl]₂ 123-54-6 | Ir549 as for [Ir(LB58)₂Cl]₂ | 35% |
| Ir550 | [Ir(LB67)₂Cl]₂ 123-54-6 | Ir550 as for [Ir(LB58)₂Cl]₂ | 35% |
| Ir551 | [Ir(LB68)₂Cl]₂ 123-54-6 | | 70% |
| Ir552 | [Ir(LB72)₂Cl]₂ 1118-71-4 | | 28% |
| Ir553 | [Ir(LB94)₂Cl]₂ 1118-71-4 | | 55% |

8) Platinum Complexes of the PtLL' Type Containing Non-o-Metallated Ligands L'

Preparation analogous to J. Brooks et al., Inorg. Chem. 2002, 41, 3055. A mixture of 20 mmol of the ligand L, 10 mmol of K₂PtCl₄, 75 ml of 2-ethoxyethanol and 25 ml of water is heated under reflux for 16 h. After cooling and addition of 100 ml of water, the precipitated solid is filtered off with suction, washed once with 30 ml of water and dried in vacuo. The platinum chloro dimer of the formula [PtLCl]₂ obtained in this way is suspended in 100 ml of 2-ethoxyethanol, 30 mmol of the ligands L' and 50 mmol of sodium carbonate are added, the reaction mixture is stirred at 100° C. for 16 h and then evaporated to dryness in vacuo. The crude product obtained in this way is chromatographed on silica gel (solvent or mixtures thereof, for example dichloromethane, THF, toluene, n-heptane, cyclohexane) or recrystallised, and subjected to fractional sublimation as described under 1) variant A.

| Ex. | Ligand L Ligand L' | Pt complex | Yield |
|---|---|---|---|
| Pt001 | LB1 123-54-6 | | 31% |
| Pt002 | LB5 1118-71-4 | | 34% |

| Ex. | Ligand L Ligand L' | Pt complex | Yield |
|---|---|---|---|
| Pt003 | LB93 123-54-6 | 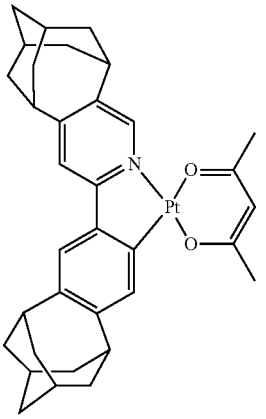 | 43% |
| Pt004 | LB41 1118-71-4 | 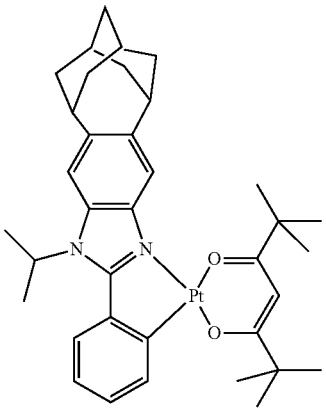 | 40% |

9) Platinum Complexes of Tetradentate Ligands

A mixture of 10 mmol of the ligand L, 10 mmol of $K_2PtCl_4$, 400 mmol of lithium acetate, anhydrous, and 200 ml of glacial acetic acid is heated under reflux for 60 h. After cooling and addition of 200 ml of water, the mixture is extracted twice with 250 ml of toluene each time, dried over magnesium sulfate, filtered through a Celite bed, the Celite is rinsed with 200 ml of toluene, and the toluene is then removed in vacuo. The solid obtained in this way is purified as described under 1) variant A by hot extraction and then subjected to fractional sublimation.

| Ex. | Ligand L | Pt complex | Extractant | Yield |
|---|---|---|---|---|
| Pt(LB107) | LB107 | 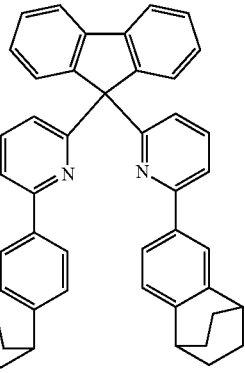 | Toluene | 41% |
| Pt(LB108) | LB108 | Pt(LB108) | Toluene | 35% |
| Pt(LB109) | LB109 | Pt(LB109) | Ethyl acetate Cyclohexane 2:8, vv | 37% |
| Pt(LB110) | LB110 | Pt(LB110) | Cyclohexane | 38% |

10) Platinum Complexes of Tetradentate Ligands of the Arduengo Carbene Type

A mixture of 10 mmol of the ligand, 10 mmol of silver(I) oxide and 200 ml of dioxane is stirred at room temperature for 16 h, 100 ml of butanone, 20 mmol of sodium carbonate and 10 mmol of cyclooctadienylplatinum dichloride are then added, and the mixture is heated under reflux for 16 h. After removal of the solvent, the solid is extracted by stirring with 500 ml of hot toluene, the suspension is filtered through a Celite bed, and the filtrate is evaporated to dryness. The solid obtained in this way is chromatographed on silica gel with DCM and then subjected to fractional sublimation as described under 1) variant A.

| Ex. | Ligand | Pt complex | Yield |
|---|---|---|---|
| Pt(LB111) | LB111 | 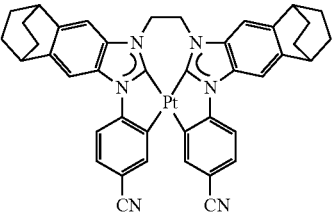 | 28% |
| Pt(LB112) | LB112 | Pt(LB112) | 25% |
| Pt(LB113) | LB113 | Pt(LB113) | 26% |
| Pt(LB114) | LB114 | Pt(LB114) | 30% |

11) Iridium Complexes of Hexadentate Ligands

A mixture of 10 mmol of the ligand L, 10 mmol of sodium bisacetylacetonatodichloroiridate(II) [770720-50-8] and 200 ml of triethylene glycol dimethyl ether is heated at 210° C. on a water separator for 48 h (the acetyl-acetone and thermal cleavage products of the solvent distil off). After cooling and addition of 200 ml of water, the precipitated solid is filtered off with suction and dried in vacuo. The solid is extracted by stirring with 500 ml of hot THF, the suspension is filtered through a Celite bed while still hot, the Celite is rinsed with 200 ml of THF, and the combined filtrates are evaporated to dryness. The solid obtained in this way is purified as described under 1) variant A by hot extraction with toluene and then subjected to fractional sublimation.

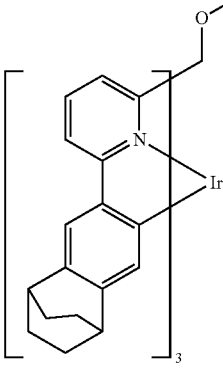

| Ex. | Ligand | Ir complex | Yield |
|---|---|---|---|
| Ir(LB115) | LB115 | | 23% |
| Ir(LB116) | LB116 | Ir(LB116) | 25% |
| Ir(LB117) | LB117 | Ir(LB117) | 30% |

12) Iridium Complexes of Hexadentate Ligands of the Arduengo Carbene Type

Preparation analogous to K. Tsuchiya et al., Eur. J. Inorg. Chem. 2010, 926.

A mixture of 3 mmol of the ligand, 3 mmol of iridium(III) chloride hydrate, 10 mmol of silver carbonate and 10 mmol of sodium carbonate in 75 ml of 2-ethoxyethanol is warmed under reflux for 48 h. After cooling, 300 ml of water are added, the precipitated solid is filtered off with suction, washed once with 30 ml of water and three times with 15 ml of ethanol each time and dried in vacuo. The crude product obtained in this way is chromatographed on silica gel (DCM) and then subjected to fractional sublimation as described under 1) variant A.

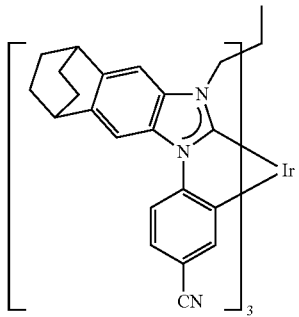

| Ex. | Ligand | Ir complex | Yield |
|---|---|---|---|
| Ir(LB118) | L118 | | 20% |
| Ir(LB119) | L119 | L119 | 18% |

Example: Comparison of the Photoluminescence Spectra

The FIGURE shows the photoluminescence spectrum of the complex Ir(LB94)$_3$, i.e. a tris(benzo[h]quinoline)iridium complex which contains a group of the formula (3), compared with the spectrum of the corresponding complex without the group of the formula (3). The spectra were measured in an approx. $10^{-5}$ molar solution in degassed toluene at room temperature. The narrower emission band with a full width at half maximum FWHM of 68 nm compared with 81 nm in the case of the compound without a group of the formula (3) is clearly evident. The complex according to the invention furthermore has higher photoluminescence quantum efficiency.

Example: Production of OLEDs

1) Vacuum-Processed Devices

OLEDs according to the invention and OLEDs in accordance with the prior art are produced by a general process in accordance with WO 2004/058911, which is adapted to the circumstances described here (layer-thickness variation, materials used).

The results for various OLEDs are presented in the following examples. Glass plates with structured ITO (50 nm, indium tin oxide) form the substrates to which the OLEDs are applied. The OLEDs have in principle the following layer structure: substrate 1 hole-transport layer 1 (HTL1) consisting of HTM doped with 3% of NDP-9 (commercially available from Novaled), 20 nm/hole-transport layer 2 (HTL2)/optional electron-blocking layer (EBL)/ emission layer (EML)/optional hole-blocking layer (HBL)/ electron-transport layer (ETL)/optional electron-injection layer (EIL) and finally a cathode. The cathode is formed by an aluminium layer with a thickness of 100 nm Firstly, vacuum-processed OLEDs are described. For this purpose, all materials are applied by thermal vapour deposition in a vacuum chamber. The emission layer here always consists of at least one matrix material (host material) and an emitting dopant (emitter), which is admixed with the matrix material or matrix materials in a certain proportion by volume by co-evaporation. An expression such as M3:M2: Ir(L1)$_3$ (55%:35%:10%) here means that material M3 is present in the layer in a proportion by volume of 55%, M2 is present in the layer in a proportion of 35% and Ir(L1)$_3$ is present in the layer in a proportion of 10%. Analogously, the electron-transport layer may also consist of a mixture of two materials. The precise structure of the OLEDs is shown in Table 1. The materials used for the production of the OLEDs are shown in Table 3.

The OLEDs are characterised by standard methods. For this purpose, the electroluminescence spectra, the current efficiency (measured in cd/A) and the voltage (measured at 1000 cd/m$^2$ in V) are determined from current/voltage/ luminance characteristic lines (IUL characteristic lines). For selected experiments, the lifetime is determined. The lifetime is defined as the time after which the luminous density has dropped to a certain proportion from a certain initial luminous density. The expression LT50 means that the lifetime given is the time at which the luminous density has dropped to 50% of the initial luminous density, i.e. from, for example, 1000 cd/m$^2$ to 500 cd/m$^2$. Depending on the emission colour, different initial luminances were selected. The values for the lifetime can be converted to a FIGURE for other initial luminous densities with the aid of conversion formulae known to the person skilled in the art. The lifetime for an initial luminous density of 1000 cd/m$^2$ is a usual FIGURE here.

Use of Compounds According to the Invention as Emitter Materials in Phosphorescent OLEDs The compounds according to the invention can be employed, inter alia, as phosphorescent emitter materials in the emission layer in OLEDs. The iridium compounds shown in Table 3 are used as comparison in accordance with the prior art. The results for the OLEDs are summarised in Table 2.

TABLE 1

Structure of the OLEDs

| Ex. | HTL2 Thickness | EBL Thickness | EML Thickness | HBL Thickness | ETL Thickness |
|---|---|---|---|---|---|
| Red OLEDs | | | | | |
| D-IrR1 | HTM 280 nm | — | M7:M8:Ir-R1 (65%:30%:5%) 35 nm | — | ETM1:ETM2 (50%:50%) 40 nm |
| D-Ir(LB4)$_3$ | HTM 280 nm | — | M7:M8:Ir(LB4)$_3$ (65%:30%:5%) 35 nm | — | ETM1:ETM2 (50%:50%) 40 nm |
| Yellow OLEDs | | | | | |
| D-Ir-Y2 | HTM 250 nm | — | M7:M8:Ir-Y2 (62%:30%:8%) 25 nm | — | ETM1:ETM2 (50%:50%) 45 nm |
| D-Ir(LB3)$_3$ | HTM 250 nm | — | M7:M8:Ir(LB3)$_3$ (82%:30%:8%) 25 nm | — | ETM1:ETM2 (50%:50%) 45 nm |
| Green OLEDs | | | | | |
| D-Ir-G1 | HTM 230 nm | — | M7:M8:Ir-G1 (65%:30%:5%) 25 nm | HBM2 10 nm | ETM1:ETM2 (50%:50%) 35 nm |
| D-Ir(LB1)$_3$ | HTM 230 nm | — | M7:M8:Ir(LB1)$_3$ (65%:30%:5%) 25 nm | HBM2 10 nm | ETM1:ETM2 (50%:50%) 35 nm |
| Blue OLEDs | | | | | |
| D-Ir-B1 | HTM 190 nm | EBM 10 nm | M1:M4:Ir-B1 (60%:35%:5%) 25 nm | HBM1 10 nm | ETM1:ETM2 (50%:50%) 15 nm |
| D-Ir(LB55)$_3$ | HTM 190 nm | EBM 10 nm | M1:M4:Ir(LB55)$_3$ (60%:35%:5%) 25 nm | HBM1 10 nm | ETM1:ETM2 (50%:50%) 15 nm |

TABLE 2

Results of the vacuum-processed OLEDs

| Ex. | EQE (%) 1000 cd/m$^2$ | Voltage (V) 1000 cd/m$^2$ | CIE x/y 1000 cd/m$^2$ | LT80 (h) 1000 cd/m$^2$ |
|---|---|---|---|---|
| Red OLEDs | | | | |
| D-IrR1 | 13.3 | 2.9 | 0.67/0.33 | 14000 |
| D-Ir(LB4)$_3$ | 16.0 | 3.0 | 0.69/0.30 | 19000 |
| Yellow OLEDs | | | | |
| D-Ir-Y2 | 22.3 | 3.0 | 0.44/0.55 | 32000 |
| D-Ir(LB3)$_3$ | 24.0 | 3.2 | 0.48/0.51 | 36000 |
| Green OLEDs | | | | |
| D-Ir-G1 | 18.0 | 3.4 | 0.32/0.64 | 8000 |
| D-Ir(LB1)$_3$ | 23.5 | 3.4 | 0.33/0.64 | 17000 |

| Ex. | EQE (%) 1000 cd/m$^2$ | Voltage (V) 1000 cd/m$^2$ | CIE x/y 1000 cd/m$^2$ | LT50 (h) 1000 cd/m$^2$ |
|---|---|---|---|---|
| Blue OLEDs | | | | |
| D-Ir-B1 | 16.3 | 4.8 | 0.18/0.37 | 1000 |
| D-Ir(LB55)$_3$ | 22.8 | 3.9 | 0.15/0.32 | 1200 |

TABLE 3
Structural formulae of the materials used
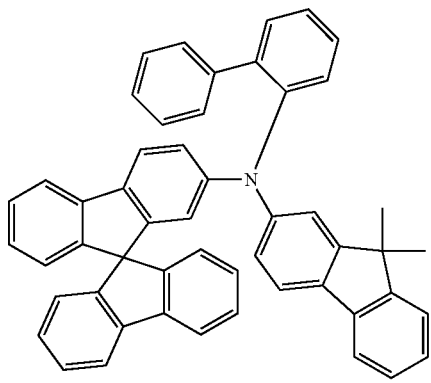
HTM
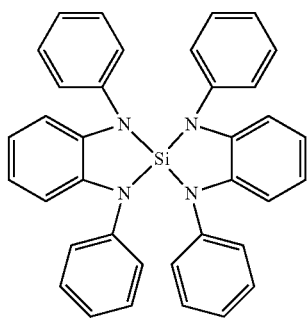
EBM = M10
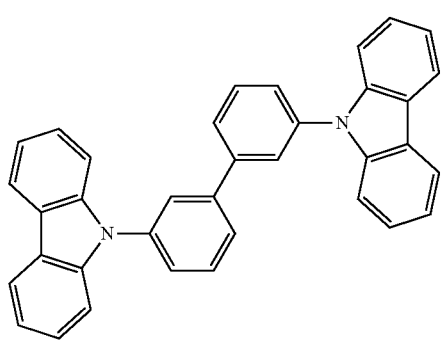
M1
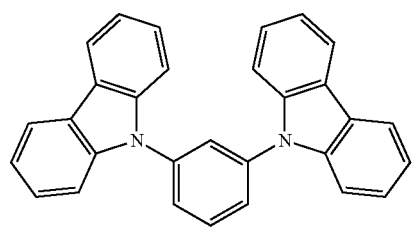
M2
TABLE 3-continued
Structural formulae of the materials used
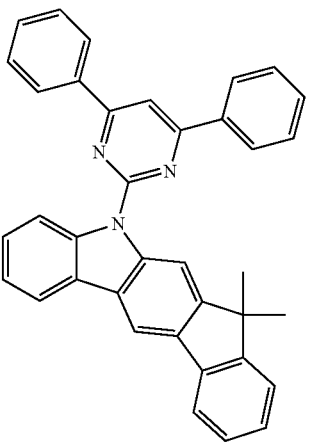
M3 = HBM2
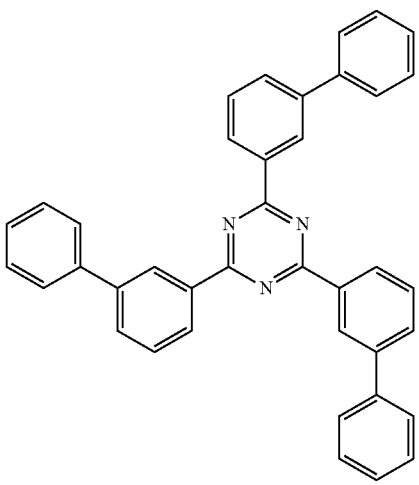
M4 = HBM1
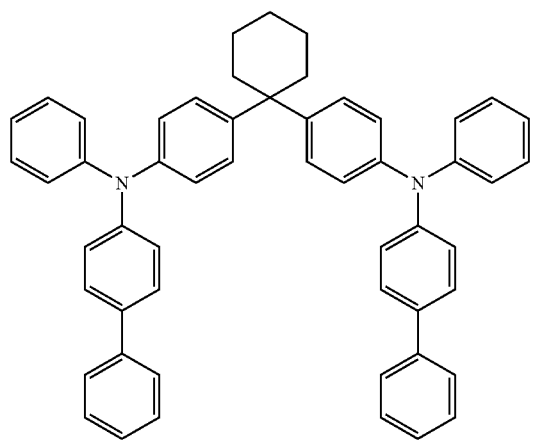
M5

TABLE 3-continued
Structural formulae of the materials used
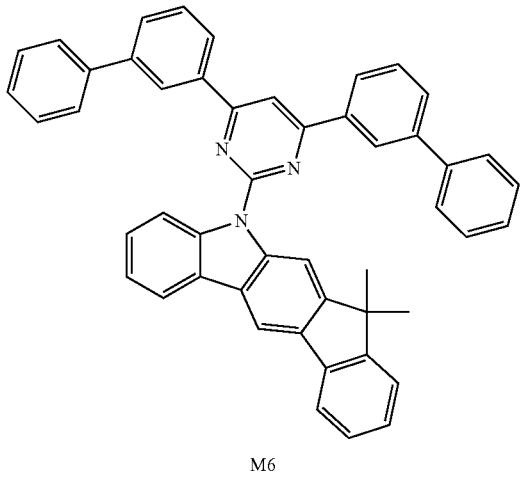 [SMILES: CC1(C)c2ccccc2-c2cc3c4ccccc4n(-c4nc(-c5cccc(-c6ccccc6)c5)cc(-c5cccc(-c6ccccc6)c5)n4)c3cc21 ; "M6"]
M6
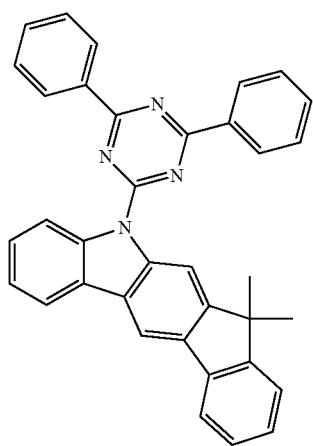
M7
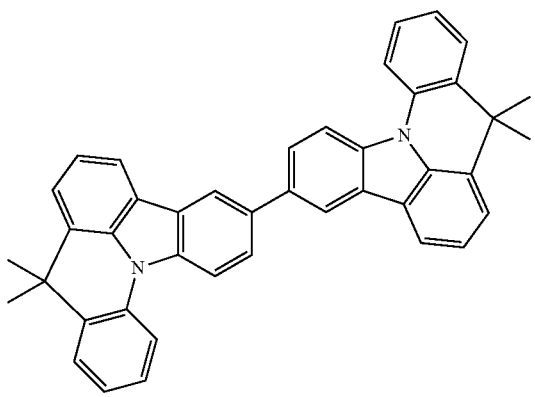
M8
TABLE 3-continued
Structural formulae of the materials used
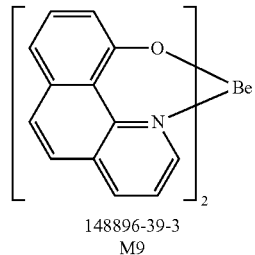
148896-39-3
M9
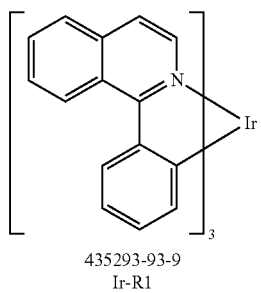
435293-93-9
Ir-R1
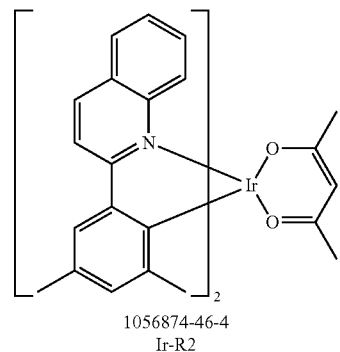
1056874-46-4
Ir-R2
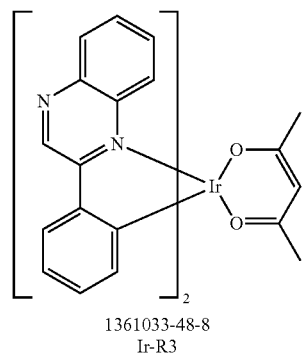
1361033-48-8
Ir-R3

TABLE 3-continued
Structural formulae of the materials used
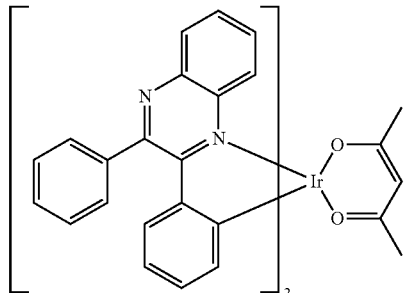
848127-98-0
Ir-R4
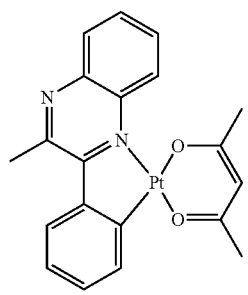
890307-63-8
Pt-R1
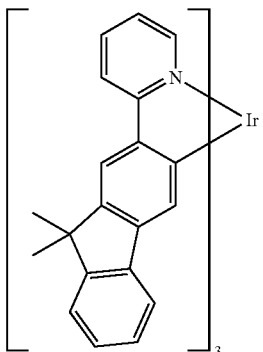
458532-65-5
Ir-Y1
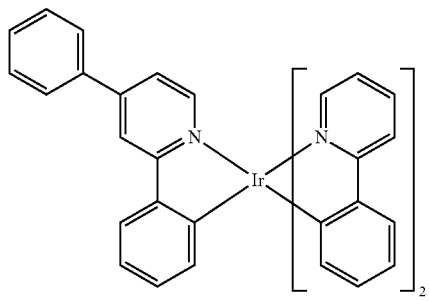
1215281-24-5
Ir-Y2
TABLE 3-continued
Structural formulae of the materials used
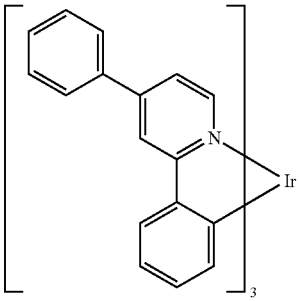
459133-57-4
Ir-Y3
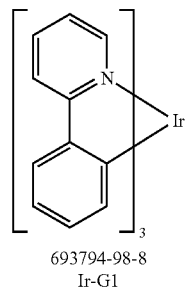
693794-98-8
Ir-G1
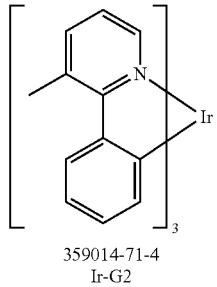
359014-71-4
Ir-G2
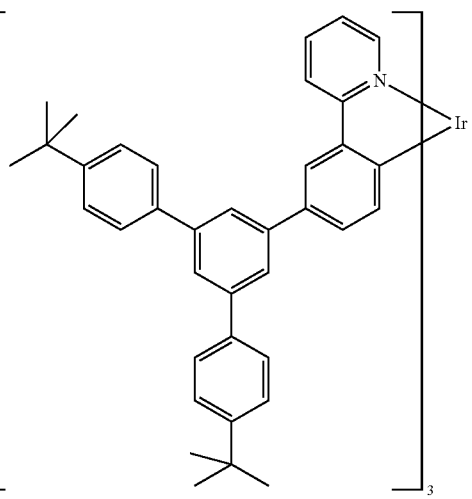
856219-87-9
Ir-G3

TABLE 3-continued

Structural formulae of the materials used

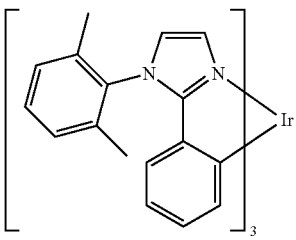

1013022-35-9
Ir-B1

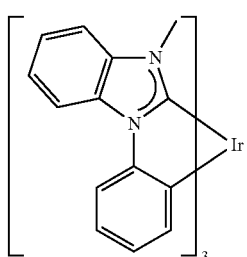

869486-05-5
Ir-B2

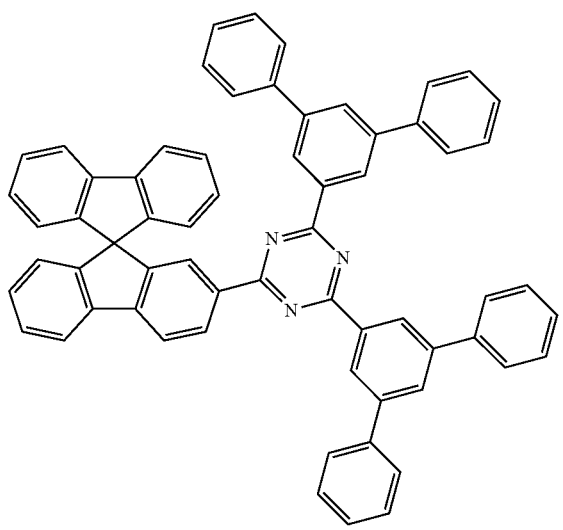

ETM-1

TABLE 3-continued

Structural formulae of the materials used

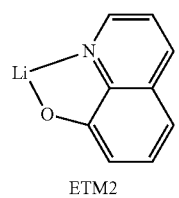

ETM2

Example LB120

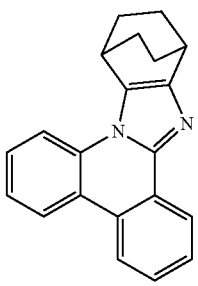 [SMILES: c1ccc2c(c1)c1ccccc1n1c3c(nc21)C1CCC3CC1]

A mixture of 19.4 g (100 mmol) of 6-aminophenanthridine [832-68-8], 47.6 g (300 mmol) of 3-chlorobicyclo[2.2.2]octan-2-one [23804-48-0], 25.2 g (300 mmol) of sodium hydrogencarbonate, 300 ml of ethylene glycol and 30 ml of water is stirred at 130° C. for 24 h. A further 47.6 g (300 mmol) of 3-chlorobicyclo[2.2.2]octan-2-one [23804-48-0] and 25.2 g (300 mmol) of sodium hydrogencarbonate are then added, and the mixture is stirred at 130° C. for a further 24 h. After cooling, the reaction mixture is diluted with 1000 ml of water, extracted three times with 300 ml of ethyl acetate each time, the combined organic phases are washed with 500 ml of water and 500 ml of saturated sodium chloride solution, and the organic phase is evaporated in vacuo. The residue is chromatographed on silica gel (EA: DCM 9:1), then recrystallised twice from DMF/ethanol and subjected to fractional sublimation twice (T about 200° C., p about $10^{-4}$ mbar). Yield: 6.3 g (21 mmol), 21%; purity: about 99.0% according to $^1$H-NMR.

The following derivatives can be prepared analogously:

| Ex. | 6-Amino-phenanthridine | 2-Haloketone | Product | Yield |
|---|---|---|---|---|
| LB121 | 832-68-8 | 26775-75-7 | | 20% |

-continued
| Ex. | 6-Amino-phenanthridine | 2-Haloketone | Product | Yield |
|---|---|---|---|---|
| LB122 | 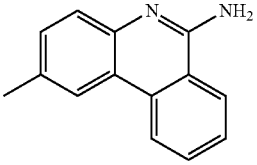<br>855829-20-8 | 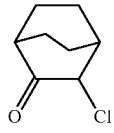 | 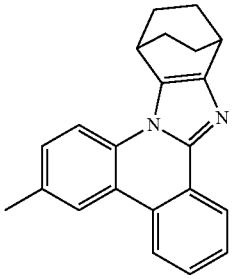 [SMILES: Cc1ccc2c(c1)c1ccccc1c1nc3c(n21)C1CCC3CC1] | 24% |
| LB123 | 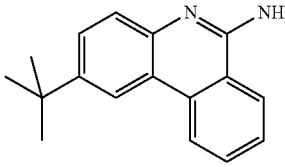<br>946147-22-4 |  | 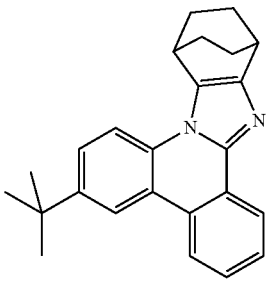 [SMILES: CC(C)(C)c1ccc2c(c1)c1ccccc1c1nc3c(n21)C1CCC3CC1] | 23% |
| LB124 | 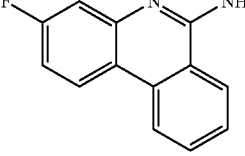<br>714243-31-9 | 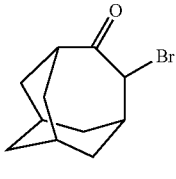 [SMILES: O=C1C2CC3CC(C2)CC(C3)C1Br] | 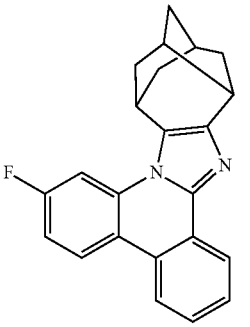 [SMILES: Fc1ccc2c3ccccc3c3nc4c(n3c2c1)C1CC2CC(C1)C4C2] | 25% |
| LB125 | 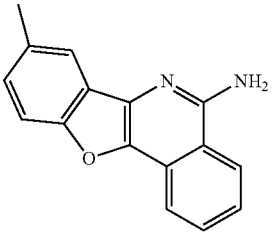<br>1293961-03-1 | 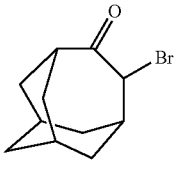 [SMILES: O=C1C2CC3CC(C2)CC(C3)C1Br] | 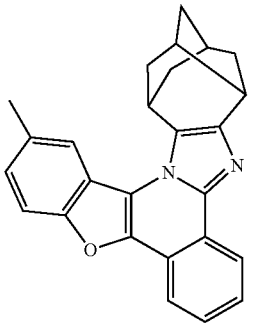 [SMILES: Cc1ccc2oc3c4ccccc4c4nc5c(n4c3c2c1)C1CC2CC(C1)C5C2] | 26% |
| LB126 | 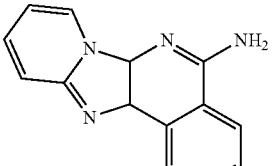<br>94718-73-7 | 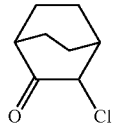 | 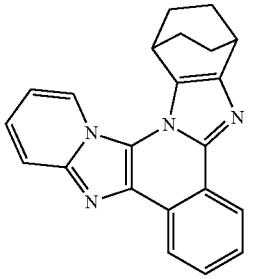 [SMILES: c1ccc2c(c1)c1nc3ccccn3c1n1c3c(nc21)C1CCC3CC1] | 22% |

Example LB127

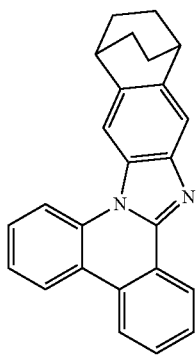 [SMILES: c1ccc2c(c1)c1ccccc1n1c3cc4c(cc3nc21)C1CCC4CC1]

A vigorously stirred mixture of 19.4 g (100 mmol) of 6-aminophenanthridine [832-68-8], 41.1 g (130 mmol) of SB5, 18.0 g (130 mmol) of potassium carbonate, 100 g of glass beads (diameter 3 mm), 2.1 g (8 mmol) of triphenylphosphine and 498 mg (2 mmol) of palladium(II) acetate in 300 ml of o-xylene is heated under reflux for 18 h. After cooling to 80° C., the salts and glass beads are filtered off through a Celite bed with suction, the latter is rinsed with 500 ml of hot o-xylene, and the filtrate is evaporated to dryness in vacuo. The residue is chromatographed on silica gel (EA:DCM 9:1), then recrystallised twice from DMF/ethanol and subjected to fractional sublimation twice (T about 230° C., p about $10^{-4}$ mbar). Yield: 11.9 g (34 mmol), 34%; purity: about 99.0% according to $^1$H-NMR.

The following derivatives can be prepared analogously:

| Ex. | Phenanthridine | 1,2-Dihalo-benzene | Product | Yield |
|---|---|---|---|---|
| LB128 | 832-68-8 | SB8 | | 33% |
| LB129 | 946147-22-4 | SB5 | | 28% |

| Ex. | Phenanthridine | 1,2-Dihalo-benzene | Product | Yield |
|---|---|---|---|---|
| LB130 | 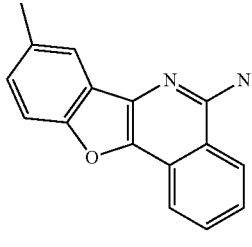 1293961-03-1 | 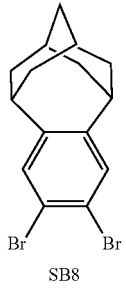 SB8 | 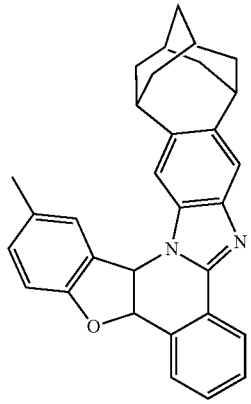 [SMILES: Cc1ccc2c(c1)C1C(O2)c2ccccc2-c2nc3cc(C4CCCCC4)c(C4CCCCC4)cc3n21] | 23% |

Example LB1: 2-Tricyclo[6.2.2.0*2,7*]dodeca-279,3,5-trien-4-yl-pyridine, LB1

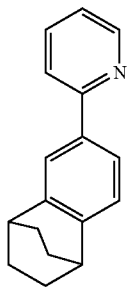

A mixture of 13.4 g (100 mmol) of 2,3-dimethylenebicyclo[2.2.2]octane [36439-79-9], 12.4 g (120 mmol) of 2-ethynylpyridine [1945-84-2] and 50 ml of chlorobenzene is stirred at 120° C. for 16 h. 26.1 g (300 mmol) of activated manganese(II) oxide are then added, and the mixture is stirred at 120° C. for a further 3 h. After cooling, the mixture is extended with 200 ml of ethyl acetate and filtered through a Celite bed, and the solvent and excess 2-ethynylpyridine are removed in vacuo. The oily residue is distilled twice in a bulb tube (p about $10^{-4}$ mbar, T about 190° C.). Yield: 17.2 g (73 mmol), 73%; purity: about 99.0% according to $^1$H NMR.

The following compounds can be prepared analogously:

| Ex. | Starting material | Starting material | Product | Yield |
|---|---|---|---|---|
| LB131 | 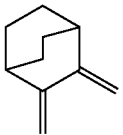 | 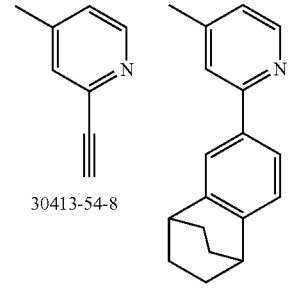 30413-54-8 | 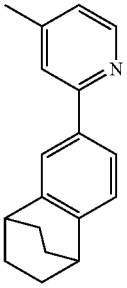 | 64% |
| LB4 | 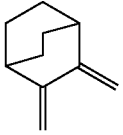 | 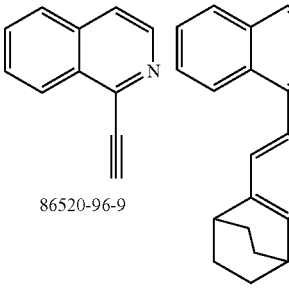 86520-96-9 | 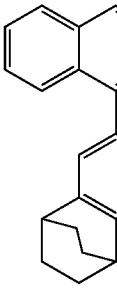 | 68% |

-continued
| Ex. | Starting material | Starting material | Product | Yield |
|---|---|---|---|---|
| LB132 | 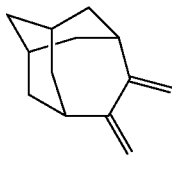<br>95411-74-8 | 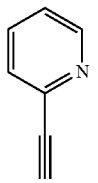<br>1945-84-2 | 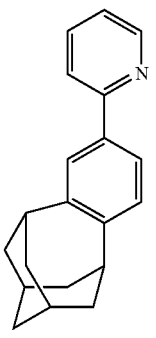 [SMILES: c1ccc(-c2ccc3c(c2)C2CC4CC(CC3C4)C2)nc1] | 72% |
| LB133 | 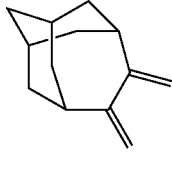<br>95411-74-8 | 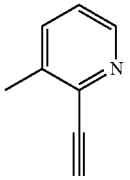<br>30413-59-3 | 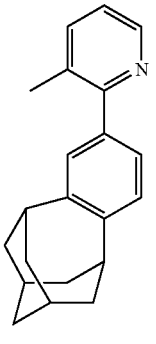 | 69% |
| LB134 | 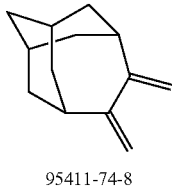<br>95411-74-8 | 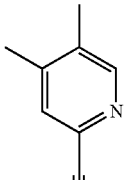<br>512197-95-4 | 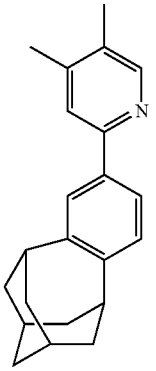 [SMILES: Cc1cnc(-c2ccc3c(c2)C2CC4CC(CC3C4)C2)cc1C] | 61% |
| LB135 | 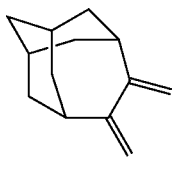<br>95411-74-8 | 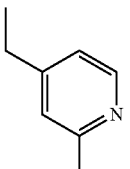<br>512197-93-2 | 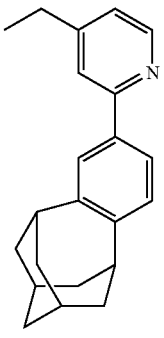 [SMILES: CCc1ccnc(-c2ccc3c(c2)C2CC4CC(CC3C4)C2)c1] | 63% |

| Ex. | Starting material | Starting material | Product | Yield |
|---|---|---|---|---|
| LB136 | 95411-74-8 | 1401685-43-5 | | 68% |
| LB19 | 95411-74-8 | 86520-96-9 | | 70% |

C: Synthesis of the Metal Complexes

1) Homoleptic Tris-Facial Iridium Complexes of the Phenylpyridine, Phenylimidazole or Phenylbenzimidazole Type As described in the above-mentioned chapter, the following metal complexes can be prepared:

| Ex. | Ligand L | Ir complex | Variant<br>Reaction medium<br>Melting aid<br>Reaction temp.<br>Reaction time<br>Suspension medium<br>Extractant | Yield |
|---|---|---|---|---|
| Ir(LB120)$_3$ | LB120 | | A<br>—<br>1 ml of hexadecane<br>290° C.<br>120 h<br>Acetone<br>Toluene | 42% |

| Ex. | Ligand L | Ir complex | Variant<br>Reaction medium<br>Melting aid<br>Reaction temp.<br>Reaction time<br>Suspension medium<br>Extractant | Yield |
|---|---|---|---|---|
| Ir(LB121)$_3$ | LB121 | Ir(LB121)$_3$ | as for Ir(LB120)$_3$ | 40% |
| Ir(LB122)$_3$ | LB122 | Ir(LB122)$_3$ | as for Ir(LB120)$_3$ | 37% |
| Ir(LB123)$_3$ | LB123 | Ir(LB123)$_3$ | as for Ir(LB120)$_3$ | 39% |
| Ir(LB124)$_3$ | LB124 | Ir(LB124)$_3$ | as for Ir(LB120)$_3$ | 28% |
| Ir(LB125)$_3$ | LB125 | Ir(LB125)$_3$ | as for Ir(LB120)$_3$ | 35% |
| Ir(LB126)$_3$ | LB126 | Ir(LB126)$_3$ | as for Ir(LB120)$_3$ | 23% |
| Ir(LB127)$_3$ | LB127 | Ir(LB127)$_3$ | as for Ir(LB120)$_3$ | 38% |
| Ir(LB128)$_3$ | LB128 | Ir(LB128)$_3$ | as for Ir(LB120)$_3$ | 35% |
| Ir(LB129)$_3$ | LB129 | Ir(LB129)$_3$ | as for Ir(LB120)$_3$ | 40% |
| Ir(LB130)$_3$ | LB130 | Ir(LB130)$_3$ | as for Ir(LB120)$_3$ | 29% |
| Ir(LB131)$_3$ | LB131 | 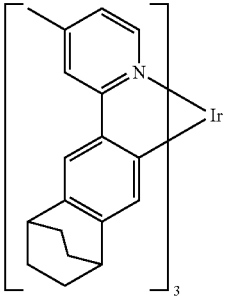 | A<br>—<br>270° C.<br>24 h<br>EtOH<br>Acetonitrile | 46% |
| Ir(LB132)$_3$ | LB132 | Ir(LB132)$_3$ | as for Ir(LB131)$_3$ | 48% |
| Ir(LB133)$_3$ | LB133 | Ir(LB133)$_3$ | as for Ir(LB131)$_3$ | 37% |
| Ir(LB134)$_3$ | LB134 | Ir(LB134)$_3$ | as for Ir(LB131)$_3$ | 45% |
| Ir(LB135)$_3$ | LB135 | Ir(LB135)$_3$ | as for Ir(LB131)$_3$ | 39% |
| Ir(LB136)$_3$ | LB136 | Ir(LB136)$_3$ | as for Ir(LB131)$_3$ | 34% |

Derivatisation of the Metal Complexes

1) Halogenation of the Fac-Iridium Complexes

A ×10.5 mmol of N-halosuccinimide (halogen: Cl, Br, I) are added to a solution or suspension of 10 mmol of a complex carrying A×C—H groups (where A=1, 2 or 3) in the para-position to the iridium in 500 ml of dichloromethane at 30° C. with exclusion of light and air, and the mixture is stirred for 20 h. Complexes which have low solubility in DCM can also be reacted in other solvents (TCE, THF, DMF, etc.) and at elevated temperature. The solvent is subsequently substantially removed in vacuo. The residue is boiled with 100 ml of methanol, the solid is filtered off with suction, washed three times with 30 ml of methanol and then dried in vacuo, giving the fac-iridium complexes which are brominated in the para-position to the iridium Synthesis of Ir(B74-Br)$_3$

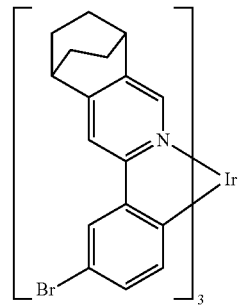

5.6 g (31.5 mmol) of N-bromosuccinimide are added in one portion to a suspension, stirred at 30° C., of 8.9 g (10 mmol) of Ir(LB74)$_3$ in 500 ml of DCM, and the mixture is then stirred for a further 20 h. After removal of about 450 ml of the DCM in vacuo, 100 ml of methanol are added to the yellow suspension, the solid is filtered off with suction, washed three times with about 30 ml of methanol and then dried in vacuo. Yield: 10.5 g (9.3 mmol), 953%; purity: >99.0% according to NMR.

The following compounds can be prepared analogously:

| Ex. | Complex | Brominated complex | Yield |
|---|---|---|---|
| Ir(LB80-Br)$_3$ | Ir(LB80)$_3$ | Ir(LB80-Br)$_3$ | 91% |
| Ir(LB94-Br)$_3$ | Ir(LB94)$_3$ | Ir(LB94-Br)$_3$ | 95% |
| Ir(LB95-Br)$_3$ | Ir(LB95)$_3$ | Ir(LB95-Br)$_3$ | 92% |

| Ex. | Complex | Brominated complex | Yield |
|---|---|---|---|
| Ir(LB102-Br)₃ | Ir(LB102)₃ | Ir(LB102-Br)₃ | 93% |
| Ir(LB33-Br)₃ | Ir(LB33)₃ | Ir(LB33-Br)₃ | 92% |
| Ir(LB55-Br)₃ | Ir(LB55)₃ | Ir(LB55-Br)₃ | 94% |
| Ir(LB57-Br)₃ | Ir(LB57)₃ | Ir(LB57-Br)₃ | 92% |

-continued
| Ex. | Complex | Brominated complex | Yield |
|---|---|---|---|
| Ir(LB68-Br)₃ | 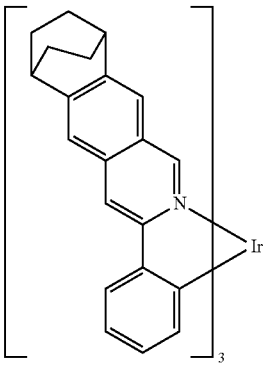 Ir(LB68)₃ | 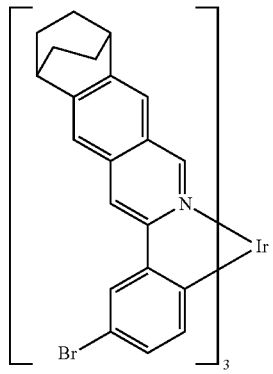 Ir(LB68-Br)₃ | 94% |
| fac-Ir(LB48-Br)₃ | 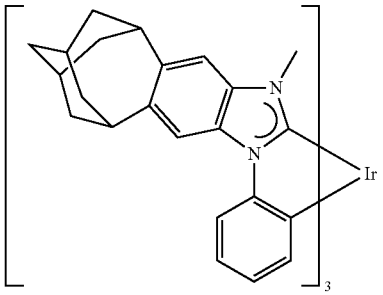 fac-Ir(LB48)₃ | 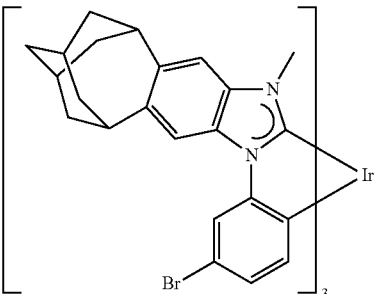 fac-Ir(LB48-Br)₃ | 86% |
| Ir500-Br₂ | 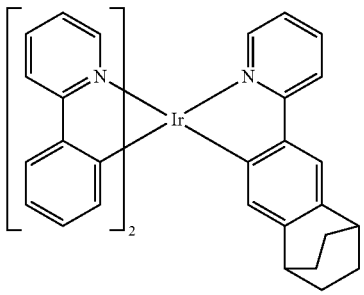 Ir500 | 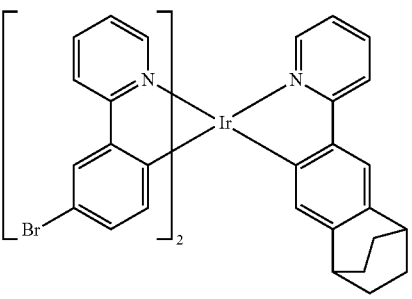 Ir500-Br₂ | 87% |
| Ir502-Br₂ | 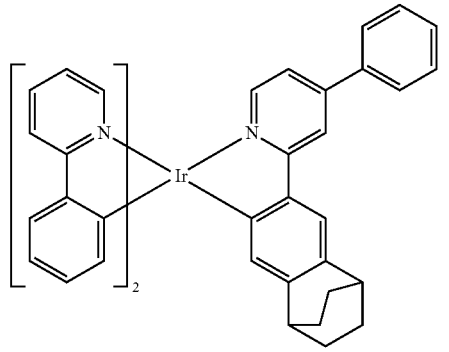 Ir502 | 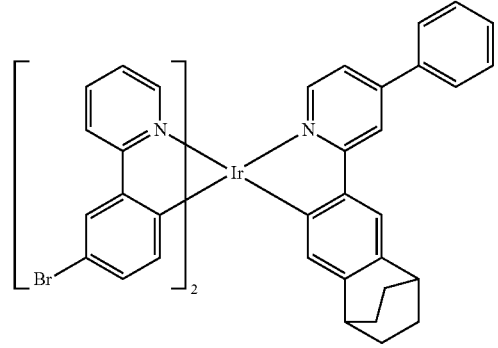 Ir502-Br₂ | 90% |

-continued

| Ex. | Complex | Brominated complex | Yield |
|---|---|---|---|
| Ir516-Br₂ | Ir516 | Ir516-Br₂ | 89% |
| Ir518-Br | Ir518 | Ir518-Br | 89% |
| Ir520-Br | Ir520 | Ir520-Br | 91% |
| Ir523-Br | Ir523 | Ir523-Br | 90% |

| Ex. | Complex | Brominated complex | Yield |
|---|---|---|---|
| Ir533-Br | 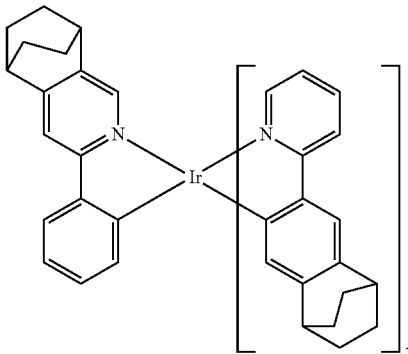<br>Ir533 | 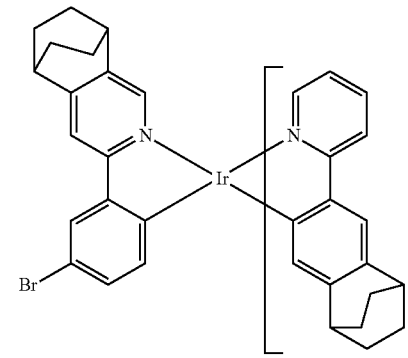<br>Ir533-Br | 93% |

2) Suzuki Coupling to the Brominated Fac-Iridium Complexes

Variant A, Two-Phase Reaction Mixture 0.6 mmol of tri-o-tolylphosphine and then 0.1 mmol of palladium(II) acetate are added to a suspension of 10 mmol of a brominated complex, 12-20 mmol of the boronic acid or boronic acid ester per Br function and 40-80 mmol of tripotassium phosphate in a mixture of 300 ml of toluene, 100 ml of dioxane and 300 ml of water, and the mixture is heated under reflux for 16 h. After cooling, 500 ml of water and 200 ml of toluene are added, the aqueous phase is separated off, the organic phase is washed three times with 200 ml of water, once with 200 ml of saturated sodium chloride solution and dried over magnesium sulfate. The solid material is filtered off through a Celite bed and rinsed with toluene, the toluene is removed virtually completely in vacuo, 300 ml of methanol are added, the precipitated crude product is filtered off with suction, washed three times with 50 ml of methanol each time and dried in vacuo. The crude product is passed through a silica-gel column twice. The metal complex is finally heated or sublimed. The heating is carried out in a high vacuum (p about $10^{-6}$ mbar) in the temperature range from about 200-300° C. The sublimation is carried out in a high vacuum (p about $10^{-6}$ mbar) in the temperature range from about 300-400'C, with the sublimation preferably being carried out in the form of a fractional sublimation.

Variant B, One-Phase Reaction Mixture 0.6 mmol of tri-o-tolylphosphine and then 0.1 mmol of palladium(II) acetate are added to a suspension of 10 mmol of a brominated complex, 12-20 mmol of the boronic acid or boronic acid ester per Br function and 60-100 mmol of the base (potassium fluoride, tripotassium phosphate (anhydrous or monohydrate or trihydrate), potassium carbonate, caesium carbonate, etc.) and 100 g of glass beads (diameter 3 mm) in 100 ml-500 ml of an aprotic solvent (THF, dioxane, xylene, mesitylene, dimethylacetamide, NMP, DMSO, etc.), and the mixture is heated under reflux for 1-24 h. Alternatively, other phosphines, such as tri-tert-butylphosphine, SPhos, XPhos, RuPhos, XanthPhos, etc., can be employed, where the preferred phosphine: palladium ratio in the case of these phosphines is 2:1 to 1.2:1. The solvent is removed in vacuo, the product is taken up in a suitable solvent (toluene, dichloromethane, ethyl acetate, etc.) and purified as described under Variant A.

Synthesis of Ir600$_3$

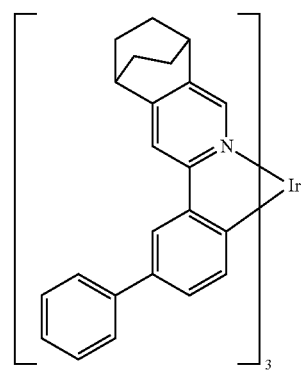

Variant A

Use of 11.3 g (10.0 mmol) of Ir(LB74-Br)$_3$ and 4.9 g (40.0 mmol) of phenyl-boronic acid [98-80-6], 17.7 (60 mmol) of tripotassium phosphate (anhydrous), 183 mg (0.6 mmol) of tri-o-tolylphosphine [6163-58-2], 23 mg (0.1 mmol) of palladium(II) acetate, 300 ml of toluene, 100 ml of dioxane and 300 ml of water, 100° C., 12 h. Chromatographic separation on silica gel with toluene/ethyl acetate (90:10, w) twice. Yield: 6.3 g (5.6 mmol), 56%; purity: about 99.9% according to HPLC.

The following compounds can be prepared analogously:

| Ex. | Complex Boronic acid Variant | Product | Yield |
|---|---|---|---|
| Ir601 | Ir(LB80-Br)₃ 1233200-59-3 A Chromatographic separation using toluene | | 60% |
| Ir602 | Ir(LB94-Br)₃ 84110-40-7 B SPhos:Pd(ac)₂/2:1 K₃PO₄ * 3H₂O Toluene Chromatographic separation using toluene | | 58% |
| Ir603 | Ir(LB95-Br)₃ 333432-28-3 A Chromatographic separation using toluene | | 49% |

| Ex. | Complex Boronic acid Variant | Product | Yield |
|---|---|---|---|
| Ir604 | Ir(LB102-Br)₃ 5122-95-2 A Chromatographic separation using toluene | 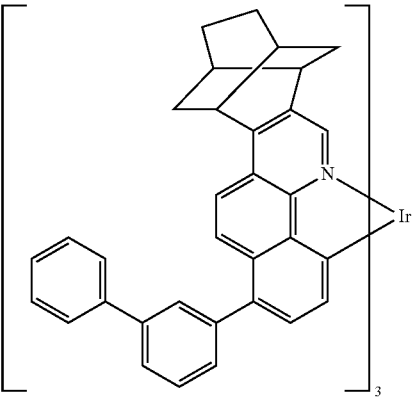 | 66% |
| Ir605 | Ir(LB33-Br)₃ 84110-40-7 B SPhos:Pd(ac)₂/2:1 K₃PO₄ * 3H₂O Toluene Chromatographic separation using toluene | 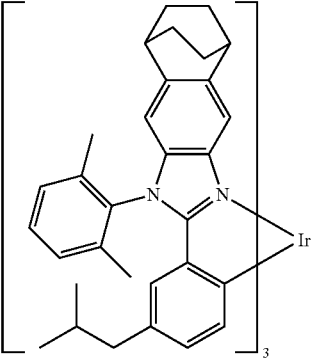 | 60% |
| Ir606 | Ir(LB55-Br)₃ 1233200-59-3 A Chromatographic separation using toluene | 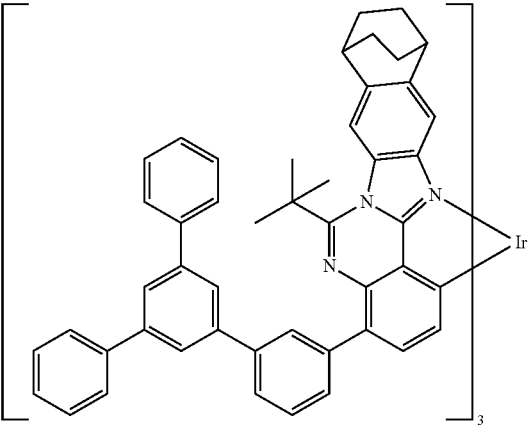 | 62% |

-continued

| Ex. | Complex Boronic acid Variant | Product | Yield |
|---|---|---|---|
| Ir607 | Ir(LB57-Br)₃ 1233200-59-3 A Chromatographic separation using toluene | | 57% |
| Ir608 | Ir(LB68-Br)₃ 4441-56-9 B SPhos:Pd(ac)₂/2:1 K₃PO₄ * 3H₂O Toluene Chromatographic separation using toluene | | 52% |
| Ir609 | Ir502-Br₂ 100379-00-8 B SPhos:Pd(ac)₂/2:1 Cs₂CO₃/dioxane Chromatographic separation using toluene/DCM (95:5 vv) | | 36% |

| Ex. | Complex Boronic acid Variant | Product | Yield |
|---|---|---|---|
| Ir610 | Ir516-Br$_2$ 1251825-65-6 A Chromatographic separation using n-heptane/EA (90:10) | 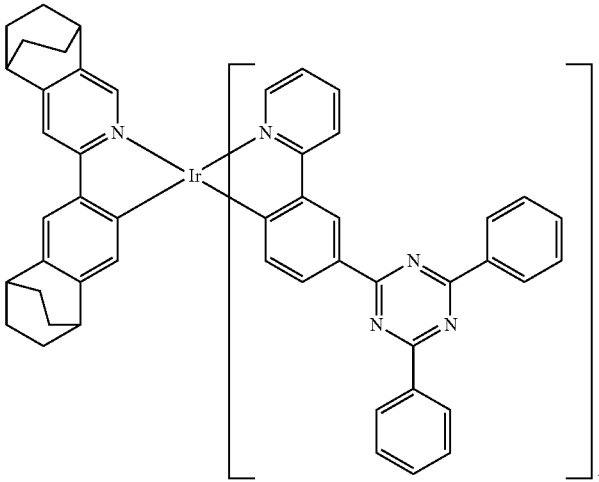 | 56% |
| Ir611 | Ir533-Br 654664-63-8 A Chromatographic separation using n-heptane/EA (90:10) | 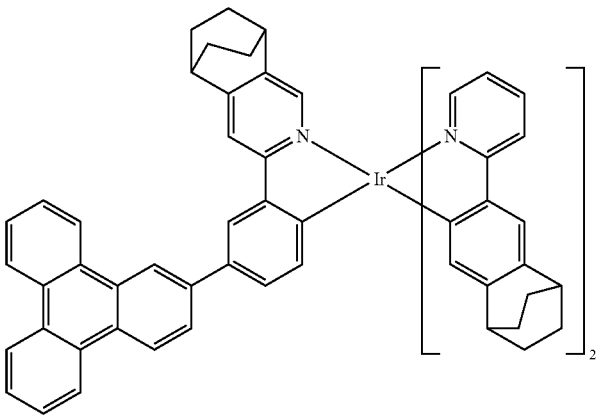 | 60% |

3) Buchwald Coupling on the Iridium Complexes 0.4 mmol of tri-tert-butylphosphine and then 0.3 mmol of palladium(II) acetate are added to a mixture of 10 mmol of the brominated complex, 12-20 mmol of the diarylamine or carbazole p[er bromine function, 1.1 molar amount of sodium tert-butoxide per amine employed or 80 mmol of tripotassium phosphate (anhydrous) in the case of carbazoles, 100 g of glass beads (diameter 3 mm) and 300-500 ml of toluene or o-xylene in the case of carbazoles, and the mixture is heated under reflux for 16-30 h with vigorous stirring. After cooling, 500 ml of water are added, the aqueous phase is separated off, and the organic phase is washed twice with 200 ml of water and once with 200 ml of saturated sodium chloride solution and dried over magnesium sulfate. The solid material is filtered off through a Celite bed and rinsed with toluene or o-xylene, the solvent is removed virtually completely in vacuo, 300 ml of ethanol are added, the precipitated crude product is filtered off with suction, washed three times with 50 ml of EtOH each time and dried in vacuo. The crude product is purified by chromatography on silica gel twice. The metal complex is finally heated or sublimed. The heating is carried out in a high vacuum (p about $10^{-6}$ mbar) in the temperature range from about 200-300° C. The sublimation is carried out in a high vacuum (p about $10^{-6}$ mbar) in the temperature range from about 300-400° C., with the sublimation preferably being carried out in the form of a fractional sublimation.

Synthesis of Ir700

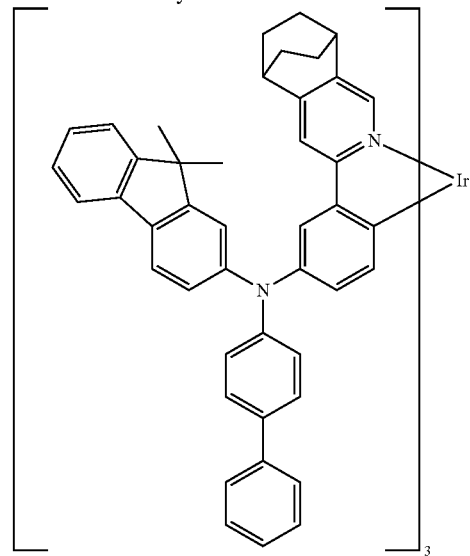

Use of 11.3 g (10 mmol) of Ir(LB74-Br)₃ and 14.5 g (40 mmol) of N-[1,1'-biphenyl]-4-yl-9,9-dimethyl-9H-fluoren-2-amine [897671-69-1]. Heating. Yield: 7.1 g (3.6 mmol), 36%; purity: about 99.8% according to HPLC.

The following compounds can be prepared analogously:

| Ex. | Product Starting material Amine or carbazole | Yield |
|---|---|---|
| Ir701 | Ir518-Br [1257220-47-5] | 46% |
| Ir702 | Ir520-Br [1257220-47-5] | 40% |

| Ex. | Product<br>Starting material<br>Amine or carbazole | Yield |
|---|---|---|
| Ir703 | 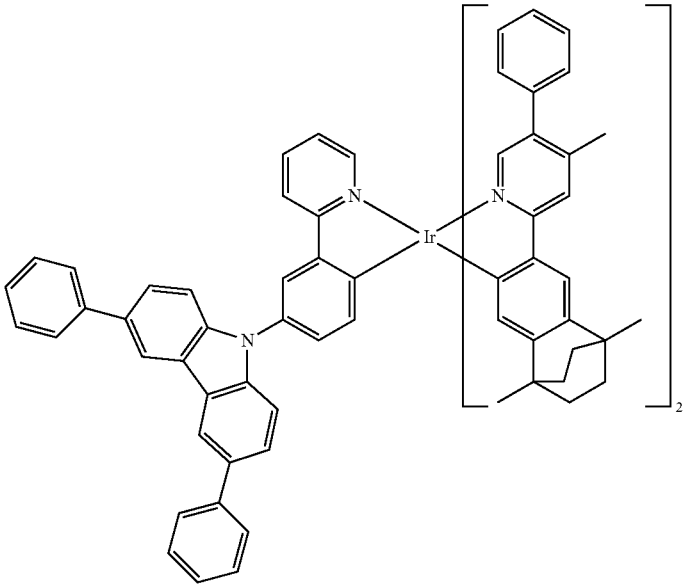<br>Ir523-Br<br>[56525-79-2] | 44% |
| Ir704 | 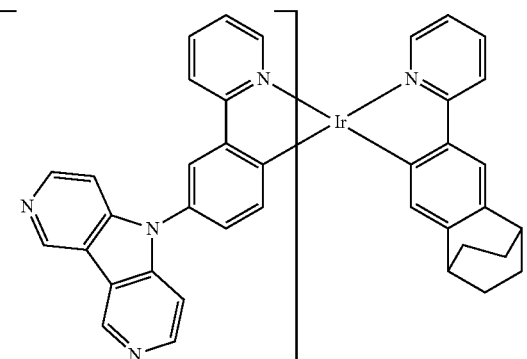<br>Ir500-Br₂<br>[244-78-0] | 40% |

4) Cyanation of the Iridium Complexes

A mixture of 10 mmol of the brominated complex, 13 mmol of copper(I) cyanide per bromine function and 300 ml of NMP is stirred at 200° C. for 20 h. After cooling, the solvent is removed in vacuo, the residue is taken up in 500 ml of dichloromethane, the copper salts are filtered off via Celite, the dichloromethane is evaporated virtually to dryness in vacuo, 100 ml of ethanol are added, the precipitated solid is filtered off with suction, washed twice with 50 ml of ethanol each time and dried in vacuo. Chromatography or hot extraction and fractional sublimation of the crude product as described in C: Synthesis of the metal complexes, 1) Homoleptic tris-facial iridium complexes of the phenylpyridine, phenylimidazole or phenylbenzimidazole type: variant A.

Synthesis of Ir800

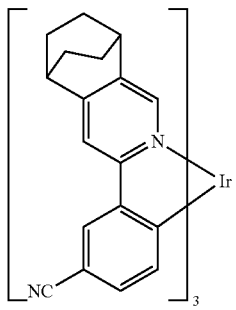

Use of 11.3 g (10 mmol) of Ir(LB74-Br)$_3$ and 3.5 g (39 mmol) of copper(I) cyanide. Sublimation. Yield: 4.7 g (4.8 mmol), 48%; purity: about 99.8% according to HPLC.

The following compounds can be prepared analogously:

| Ex. | Product Starting material | Yield |
|---|---|---|
| Ir801 | 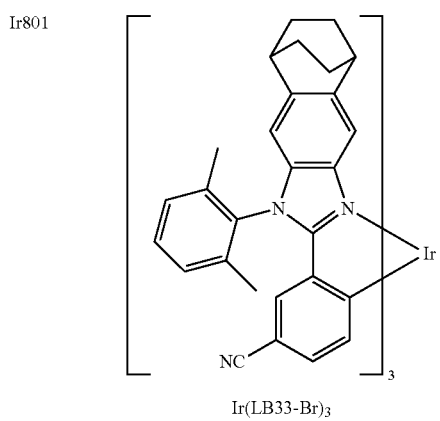<br>Ir(LB33-Br)$_3$ | 37% |
| Ir802 | 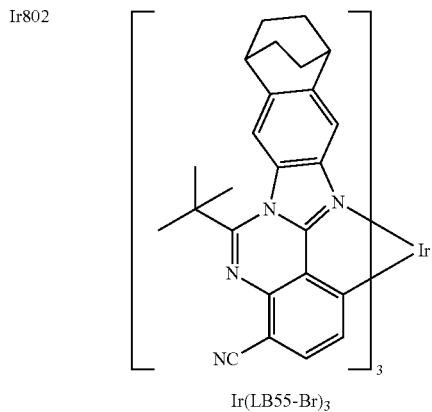<br>Ir(LB55-Br)$_3$ | 42% |
| Ir803 | 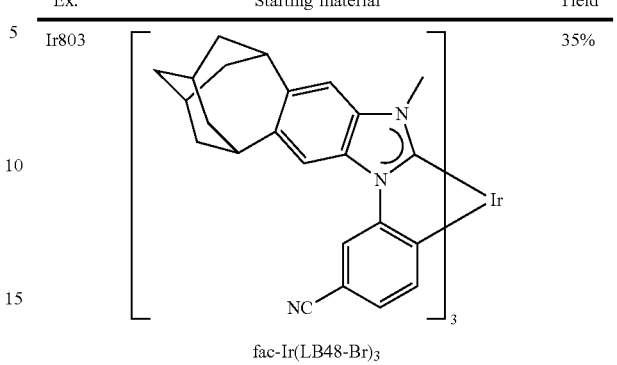<br>fac-Ir(LB48-Br)$_3$ | 35% |
| Ir804 | 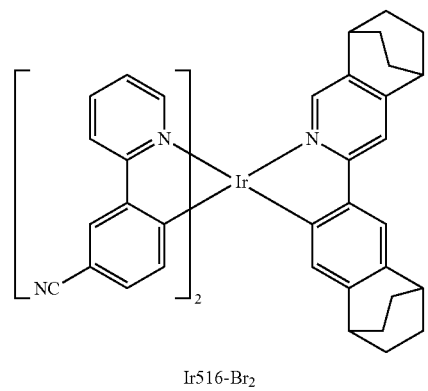<br>Ir516-Br$_2$ | 47% |
| Ir805 | 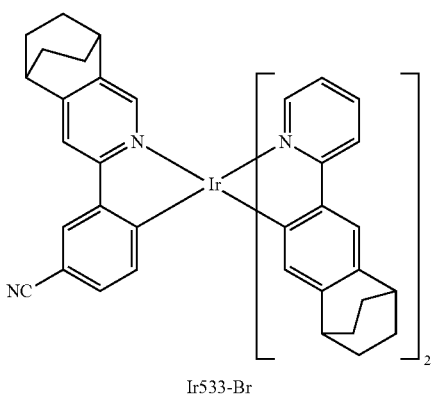<br>Ir533-Br | 65% |

5) Borylation of the Iridium Complexes

A mixture of 10 mmol of the brominated complex, 12 mmol of bis(pinacolato)diborane [73183-34-3] per bromine function, 30 mmol of potassium acetate, anhydrous, per bromine function, 0.2 mmol of tricyclohexylphosphine, 0.1 mmol of palladium(II) acetate and 300 ml of solvent (dioxane, DMSO, NMP, etc.) is stirred at 80-160° C. for 4-16 h. After removal of the solvent in vacuo, the residue is taken up in 300 ml of dichloromethane, THF or ethyl acetate, filtered through a Celite bed, the filtrate is evaporated in vacuo until crystallisation commences, and finally about 100 ml of methanol are added dropwise in order to complete the crystallisation. The compounds can be recrystallised from dichloromethane, ethyl acetate or THF with addition of methanol or alternatively from cyclohexane.

Synthesis of Ir900
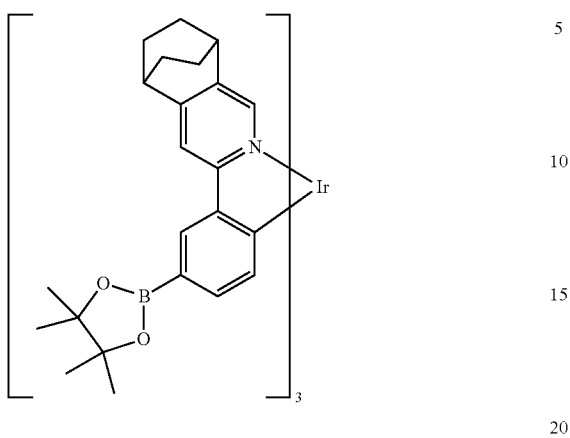
Use of 11.3 g (10 mmol) of Ir(LB74-Br) and 9.1 g (36 mmol) of bis(pinacolato)diborane [73183-34-3], DMSO, 120° C., 6 h, taking-up and Celite filtration in THF, recrystallisation from THF:methanol. Yield: 7.5 g (5.7 mmol), 57%; purity: about 99.8% according to HPLC.
The following compounds can be prepared analogously:
| Ex. | Starting material | Product | Yield |
|---|---|---|---|
| Ir901 | Ir(LB94-Br)₃ | Ir901 | 61% |
| Ir902 | Ir500-Br₂ | Ir902 | 64% |

-continued

| Ex. | Starting material | Product | Yield |
|---|---|---|---|
| Ir903 | Ir502-Br₂ | Ir903 | 60% |
| Ir904 | Ir516-Br₂ | Ir904 | 67% |
| Ir905 | Ir518-Br | Ir905 | 71% |
| Ir906 | Ir520-Br | Ir906 | 69% |

| Ex. | Starting material | Product | Yield |
|---|---|---|---|
| Ir907 | 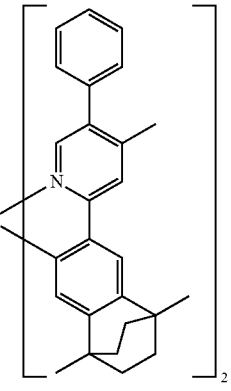<br>Ir523-Br | 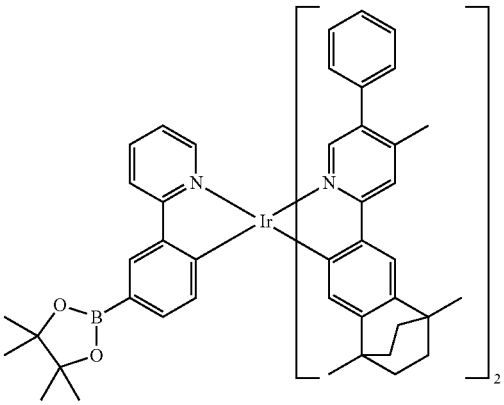<br>Ir907 | 66% |
| Ir908 | 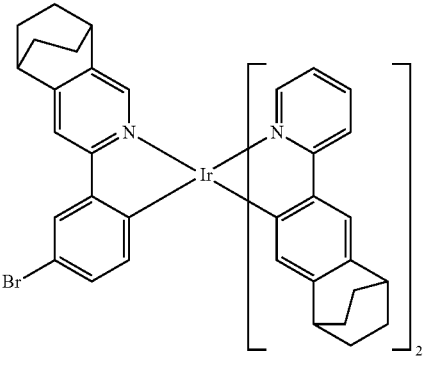<br>Ir533-Br | 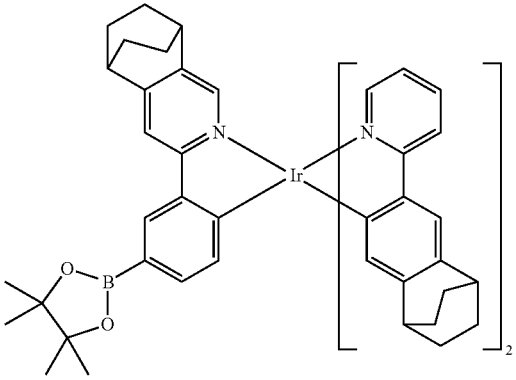<br>Ir908 | 73% |

6) Suzuki Coupling to the Borylated Fac-Iridium Complexes

Variant A, Two-Phase Reaction Mixture 0.6 mmol of tri-o-tolylphosphine and then 0.1 mmol of palladium(II) acetate are added to a suspension of 10 mmol of a borylated complex, 12-20 mmol of aryl bromide per $(RO)_2B$ function and 80 mmol of tripotassium phosphate in a mixture of 300 ml of toluene, 100 ml of dioxane and 300 ml of water, and the mixture is heated under reflux for 16 h. After cooling, 500 ml of water and 200 ml of toluene are added, the aqueous phase is separated off, and the organic phase is washed three times with 200 ml of water, once with 200 ml of saturated sodium chloride solution and dried over magnesium sulfate. The mixture is filtered through a Celite bed, the latter is rinsed with toluene, the toluene is removed virtually completely in vacuo, 300 ml of methanol are added, and the crude product which has precipitated out is filtered off with suction, washed three times with 50 ml of methanol each time and dried in vacuo. The crude product is passed through a silica-gel column twice. The metal complex is finally heated or sublimed. The heating is carried out in a high vacuum (p about $10^{-6}$ mbar) in the temperature range from about 200-300° C. The sublimation is carried out in a high vacuum (p about $10^{-6}$ mbar) in the temperature range from about 300-400° C., where the sublimation is preferably carried out in the form of a fractional sublimation.

Variant B, Single-Phase Reaction Mixture 0.6 mmol of tri-o-tolylphosphine and then 0.1 mmol of palladium(II) acetate are added to a suspension of 10 mmol of a borylated complex, 12-20 mmol of aryl bromide per $(RO)_2B$ function and 60-100 mmol of the base (potassium fluoride, tripotassium phosphate (anhydrous, monohydrate or trihydrate), potassium carbonate, caesium carbonate, etc.) and 100 g of glass beads (diameter 3 mm) in 100 ml-500 ml of an aprotic solvent (THF, dioxane, xylene, mesitylene, dimethylacetamide, NMP, DMSO, etc.), and the mixture is heated under reflux for 1-24 h. Alternatively, other phosphines, such as tri-tert-butylphosphine, SPhos, XPhos, RuPhos, XanthPhos, etc., can be employed, where in the case of these phosphines the preferred phosphine: palladium ratio is 2:1 to 1.2:1. The solvent is removed in vacuo, and the product is taken up in a suitable solvent (toluene, dichloromethane, ethyl acetate, etc.) and purified as described under variant A.

Synthesis of Ir600s

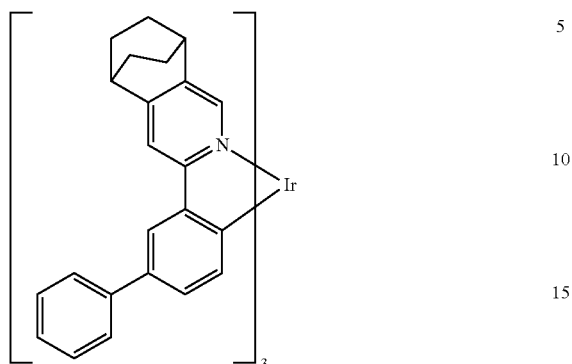

Variant A

Use of 12.7 g (10.0 mmol) of Ir900 and 4.2 ml (40.0 mmol) of bromobenzene [108-86-1], 17.7 g (60 mmol) of tripotassium phosphate (anhydrous), 183 mg (0.6 mmol) of tri-o-tolylphosphine [6163-58-2], 23 mg (0.1 mmol) of palladium(II) acetate, 300 ml of toluene, 100 ml of dioxane and 300 ml of water, 100° C., 12 h. Chromatographic separation on silica gel using toluene/ethyl acetate (90:10, w) twice. Yield: 6.6 g (5.9 mmol), 59%; purity: about 99.9% according to HPLC.

The following compounds can be prepared analogously:

| Ex. | Complex Boronic acid Variant | Product | Yield |
|---|---|---|---|
| Ir612 | Ir906 26608-06-0 A Chromatographic separation using toluene | Ir612 | 62% |

-continued

| Ex. | Complex Boronic acid Variant | Product | Yield |
|---|---|---|---|
| Ir613 | Ir907 1153-85-1 A Chromatographic separation using toluene | Ir613 | 65% |
| Ir614 | Ir908 1369587-63-2 A Chromatographic separation using toluene | Ir914 | 59% |

Polymers Containing the Metal Complexes:

General Polymerisation Procedure for the Bromides or Boronic Acid Derivatives as Polymerisable Group, Suzuki Polymerisation Variant A—Two-Phase Reaction Mixture The monomers (bromides and boronic acids or boronic acid esters, purity according to HPLC>99.8%) in the composition indicated in the table are dissolved or suspended in a mixture of 2 parts by volume of toluene: 6 parts by volume of dioxane: 1 part by volume of water in a total concentration of about 100 mmol/1.2 mol equivalents of tripotassium phosphate per Br functionality employed are then added, the mixture is stirred for a further 5 min., 0.03 to 0.003 mol equivalent of tri-ortho-tolylphosphine and then 0.005 to 0.0005 mol equivalent of palladium(II) acetate (phosphine to Pd ratio preferably 6:1) per Br functionality employed are then added, and the mixture is heated under reflux for 2-3 h with very vigorous stirring. If the viscosity of the mixture increases excessively, it can be diluted with a mixture of 2 parts by volume of toluene: 3 parts by volume of dioxane. After a total reaction time of 4-6 h, 0.05 mol equivalent per Br functionality employed of a monobromoaromatic compound are added for end capping, and then, 30 min. later, 0.05 mol equivalent per Br functionality employed of a monoboronic acid or a monoboronic acid ester is added, and the mixture is boiled for a further 1 h. After cooling, the mixture is diluted with 300 ml of toluene. The aqueous phase is separated off, the organic phase is washed twice with 300 ml of water each time, dried over magnesium sulfate, filtered through a Celite bed in order to remove palladium and then evaporated to dryness. The crude polymer is dissolved in THF (concentration about 10-30 g/l), and the solution is allowed to run slowly, with very vigorous stirring, into twice the volume of methanol. The polymer is filtered off with suction and washed three times with methanol. The reprecipitation process is repeated five times, the polymer is then dried to constant weight at 30-50° C. in vacuo.

Variant B—One-Phase Reaction Mixture

The monomers (bromides and boronic acids or boronic acid esters, purity according to HPLC>99.8%) in the composition indicated in the table are dissolved or suspended in a solvent (THF, dioxane, xylene, mesitylene, dimethylacetamide, NMP, DMSO, etc.) in a total concentration of about 100 mmol/1.3 mol equivalents of base (potassium fluoride, tripotassium phosphate (anhydrous, monohydrate or trihydrate), potassium carbonate, caesium carbonate, etc., in each case anhydrous) per Br functionality are then added, and the weight equivalent of glass beads (diameter 3 mm) is added, the mixture is stirred for a further 5 min., 0.03 to 0.003 mol equivalent of tri-ortho-tolylphosphine and then 0.005 to 0.0005 mol equivalent of palladium(II) acetate (phosphine to Pd ratio preferably 6:1) per Br functionality are then added, and the mixture is then heated under reflux for 2-3 h with very vigorous stirring. Alternatively, other phosphines, such as tri-tert-butylphosphine, SPhos, XPhos, RuPhos, XanthPhos, etc., can be employed, where the preferred phosphine: palladium ratio in the case of these phosphines is 2:1 to 1.3:1. After a total reaction time of 4-12 h, 0.05 mol equivalent of a monobromoaromatic compound and then, 30 min. later, 0.05 mol equivalent of a monoboronic acid or a monoboronic acid ester is added for end capping, and the mixture is boiled for a further 1 h. The solvent is substantially removed in vacuo, the residue is taken up in toluene, and the polymer is purified as described under variant A.

Monomers M/End Cappers E:

M1

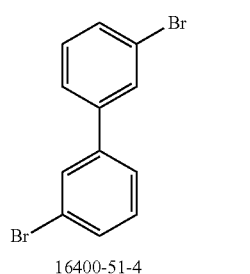

16400-51-4

M2

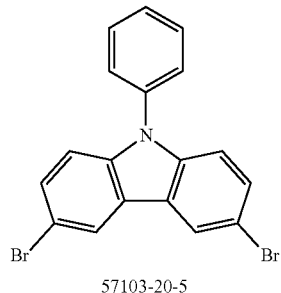

57103-20-5

M3

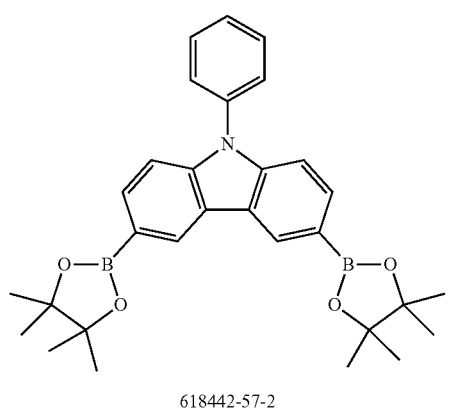

618442-57-2

M4

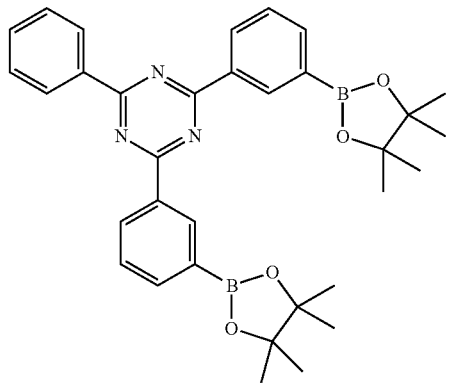

1238751-26-5

E1

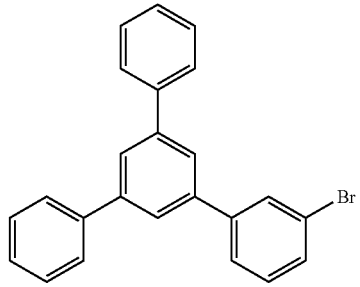

1233200-57-1

E2

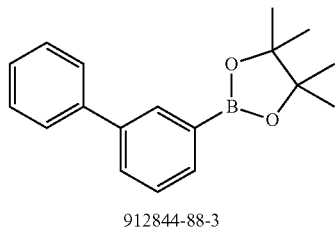

912844-88-3

Polymers:

Composition of the Polymers, mol %

| Polymer | M1 [%] | M2 [%] | M3 [%] | M4 [%] | Ir complex/[%] |
|---|---|---|---|---|---|
| P1 | — | 30 | — | 45 | Ir(LB74-Br)$_3$/10 |
| P2 | 10 | 10 | — | 35 | Ir(LB94-Br)$_3$/10 |
| P3 | — | 30 | — | 40 | Ir500-Br$_2$/10 |
| P4 | — | 30 | — | 40 | Ir502-Br$_2$/10 |
| P5 | 20 | 30 | 10 | 20 | Ir904/20 |

Molecular Weights and Yield of the Polymers According to the Invention:

| Polymer | Mn [gmol$^{-1}$] | Polydispersity | Yield |
|---|---|---|---|
| P1 | 190,000 | 4.5 | 62% |
| P2 | 218,000 | 5.0 | 59% |
| P3 | 270,000 | 2.3 | 60% |
| P4 | 245,000 | 2.2 | 55% |
| P5 | 260,000 | 2.5 | 57% |

Solubility of the Complexes in Organic Solvents:

The complexes according to the invention have the solubility shown in the table, in the solvents indicated at 25° C. Comparison with the complexes without the bicyclic group according to the invention shows that the solubility of the complexes according to the invention is significantly greater (factor about 10-100).

| Ex. | Solvent | Comparative complex Solubility | Complex Solubility [g/ml] |
|---|---|---|---|
| Sol1 | Toluene | 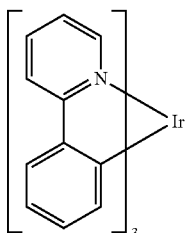<br>94928-86-6<br><<1 mg/ml | 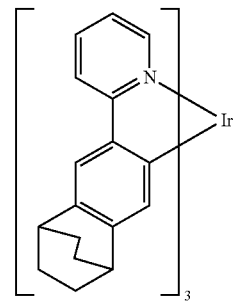<br>Ir(LB1)$_3$<br>>20 mg/ml |
| Sol2 | o-Xylene | 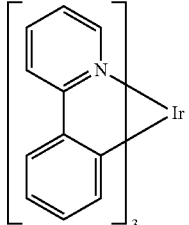<br>94928-86-6<br><<1 mg/ml | 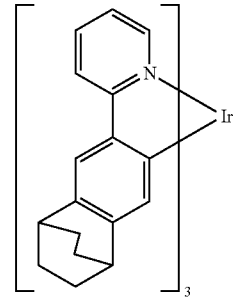<br>Ir(LB1)$_3$<br>>30 mg/ml |
| Sol3 | 3-Phenoxy-toluene | 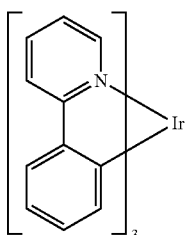<br>94928-86-6<br><5 mg/ml | 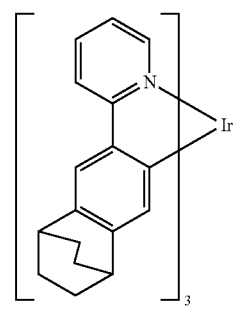<br>Ir(LB1)$_3$<br>>50 mg/ml |

-continued
| Ex. | Solvent | Comparative complex Solubility | Complex Solubility [g/ml] |
|---|---|---|---|
| Sol4 | Toluene | 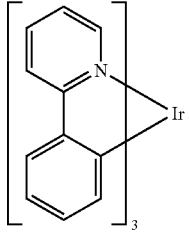<br>94928-86-6<br><<1 mg/ml | 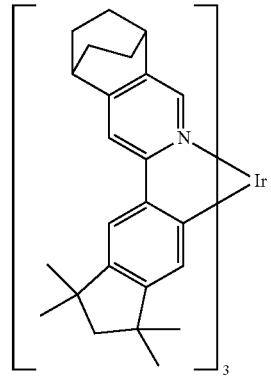<br>Ir(LB84)$_{3S}$<br>>70 mg/ml |
| Sol5 | Toluene | 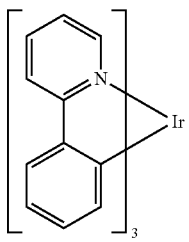<br>94928-86-6<br><<1 mg/ml | 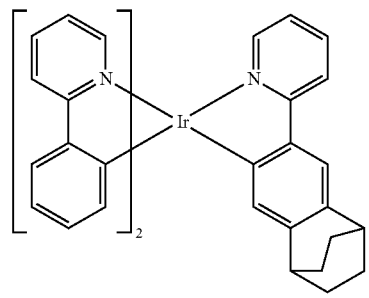<br>Ir500 |
| Sol6 | Toluene | 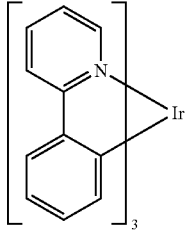<br>94928-86-6<br><<1 mg/ml | 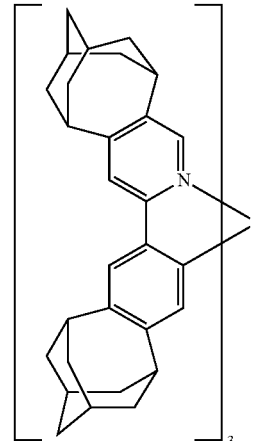<br>Ir(LB93)$_3$<br>>>100 mg/ml |

| Ex. | Solvent | Comparative complex Solubility | Complex Solubility [g/ml] |
|---|---|---|---|
| Sol7 | o-Xylene | 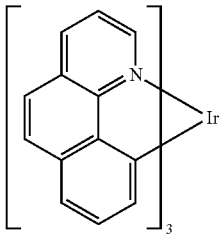<br>337526-98-4<br><<1 mg/ml | 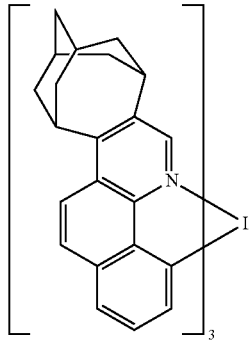<br>Ir(LB94)₃<br>>50 mg/ml |
| Sol8 | Toluene | 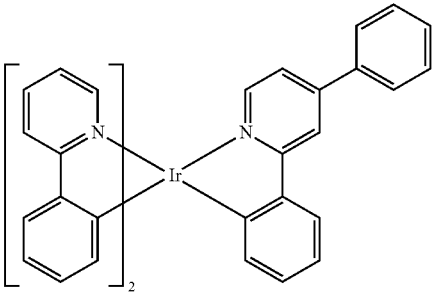<br>1215281-24-5<br><20 mg/ml | 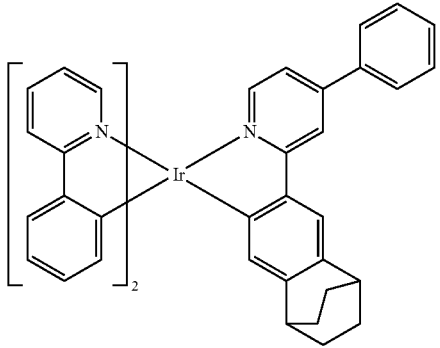<br>Ir502<br>>100 mg/ml |
| Sol9 | Toluene | 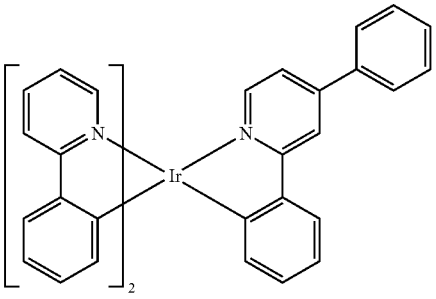<br>1215281-24-5<br><20 mg/ml | 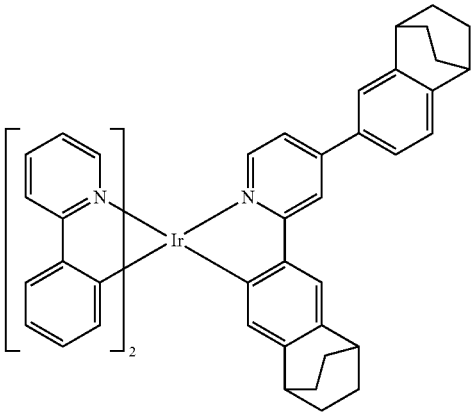<br>Ir504<br>>>200 mg/ml |

-continued

| Ex. | Solvent | Comparative complex Solubility | Complex Solubility [g/ml] |
|---|---|---|---|
| Sol10 | Toluene | 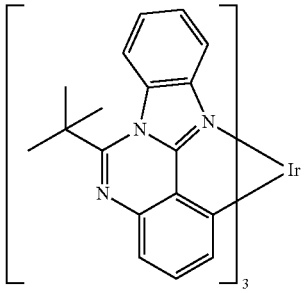<br>1356928-20-5<br><<1 mg/ml | 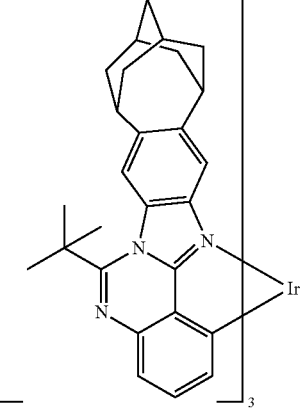<br>Ir(LB56)$_3$<br>>10 mg/ml |

Sublimation of the Complexes:

The complexes according to the invention have the sublimation temperature and rate shown in the table at a base pressure of about $10^{-5}$ mbar. Comparison with complexes without the bicyclic group according to the invention shows that the sublimation temperature of the complexes according to the invention is lower and the sublimation rate is significantly greater. In addition, the complexes according to the invention are stable under the sublimation conditions.

| Ex. | Comparative complex | Complex |
|---|---|---|
| Sub1 | 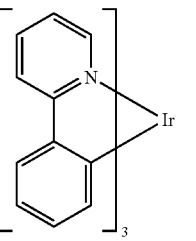<br>94928-86-6<br>T, subl.: 330-340° C.<br>Rate: approx. 5 g/h | 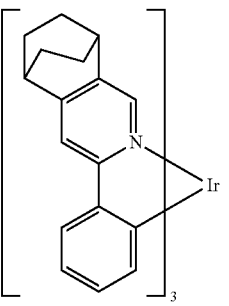<br>Ir(LB1)$_3$<br>T, subl.: 310° C.<br>Rate: approx. 8 g/h |

-continued

| Ex. | Comparative complex | Complex |
|---|---|---|
| Sub2 | 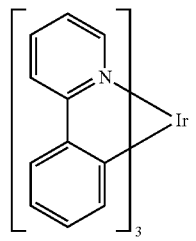<br>94928-86-6<br>T, subl.: 330-340° C.<br>Rate: approx. 5 g/h | 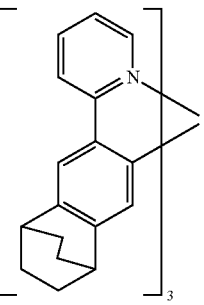<br>Ir(LB74)$_3$<br>T, subl.: 310° C.<br>Rate: approx. 9 g/h |
| Sub3 | 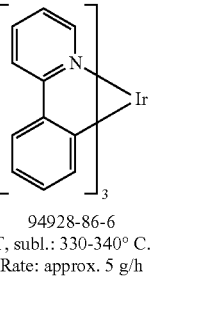<br>94928-86-6<br>T, subl.: 330-340° C.<br>Rate: approx. 5 g/h | 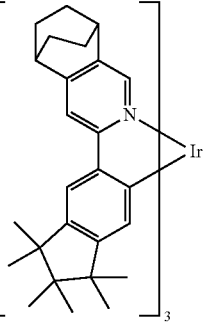<br>Ir(LB85)$_3$<br>T, subl.: 340° C.<br>Rate: approx. 11 g/h |

-continued

| Ex. | Comparative complex | Complex |
|---|---|---|
| Sub4 | 337526-98-4<br>T, subl.: 400° C.<br>Rate: <0.5 g/h<br>Partial decomposition | Ir(LB94)₃<br>T, subl.: 400° C.<br>Rate: ~5 g/h<br>No decomposition |
| Sub5 | 435293-93-9<br>T, subl.: 390° C.<br>Rate: <0.5 g/h<br>Partial decomposition | T, subl.: 380° C.<br>Rate: ~6 g/h<br>No decomposition |

Example: Production of OLEDs

2) Further Vacuum-Processed Devices

TABLE 1

Structure of the OLEDs

| Ex. | HTL2 Thickness | EBL Thickness | EML Thickness | HBL Thickness | ETL Thickness |
|---|---|---|---|---|---|
| Red OLEDs | | | | | |
| D-IrR2 | HTM 280 nm | — | M7:M8:Ir-R2 (60%:30%:10%) 35 nm | — | ETM1:ETM2 (50%:50%) 40 nm |
| D-IrR3 | HTM 280 nm | — | M7:M8:Ir-R3 (60%:30%:10%) 35 nm | — | ETM1:ETM2 (50%:50%) 40 nm |
| D-Ir(LB5)₃ | HTM 280 nm | — | M7:M8:Ir(LB5)₃ (60%:30%:10%) 35 nm | — | ETM1:ETM2 (50%:50%) 40 nm |
| D-Ir(LB6)₃ | HTM 280 nm | — | M7:M8:Ir(LB6)₃ (60%:30%:10%) 35 nm | — | ETM1:ETM2 (50%:50%) 40 nm |
| D-Ir(LB12)₃ | HTM 280 nm | — | M7:M8:Ir(LB12)₃ (30%:60%:10%) 35 nm | HBM2 10 nm | ETM1:ETM2 (50%:50%) 40 nm |
| D-Ir(LB13)₃ | HTM 280 nm | — | M7:M8:Ir(LB13)₃ (60%:30%:10%) 35 nm | — | ETM1:ETM2 (50%:50%) 40 nm |
| D-Ir(LB19)₃ | HTM 280 nm | — | M7:M8:Ir(LB19)₃ (60%:30%:10%) 35 nm | — | ETM1:ETM2 (50%:50%) 40 nm |
| D-Ir(LB20)₃ | HTM 280 nm | — | M7:M8:Ir(LB20)₃ (60%:30%:10%) 35 nm | — | ETM1:ETM2 (50%:50%) 40 nm |
| D-Ir(LB57)₃ | HTM 280 nm | — | M7:M8:Ir(LB57)₃ (60%:30%:10%) 35 nm | — | ETM1:ETM2 (50%:50%) 40 nm |
| D-Ir(LB68)₃ | HTM 280 nm | — | M7:M8:Ir(LB68)₃ (60%:30%:10%) 35 nm | — | ETM1:ETM2 (50%:50%) 40 nm |
| D-Ir503 | HTM 280 nm | — | M7:M8:Ir503 (60%:30%:10%) 35 nm | — | ETM1:ETM2 (50%:50%) 40 nm |
| D-507 | HTM 280 nm | — | M7:M8:Ir507 (60%:30%:10%) 35 nm | — | ETM1:ETM2 (50%:50%) 40 nm |
| D-509 | HTM 280 nm | — | M7:M8:Ir509 (60%:30%:10%) 35 nm | — | ETM1:ETM2 (50%:50%) 40 nm |
| D-510 | HTM 280 nm | — | M7:M8:Ir510 (58%:30%:12%) 35 nm | — | ETM1:ETM2 (50%:50%) 40 nm |

TABLE 1-continued

| | Structure of the OLEDs | | | | |
|---|---|---|---|---|---|
| Ex. | HTL2 Thickness | EBL Thickness | EML Thickness | HBL Thickness | ETL Thickness |
| D-521 | HTM 280 nm | — | M7:M8:Ir521 (60%:30%:10%) 35 nm | — | ETM1:ETM2 (50%:50%) 40 nm |
| D-Ir540 | HTM 280 nm | — | M7:M8:Ir540 (60%:30%:10%) 35 nm | — | ETM1:ETM2 (50%:50%) 40 nm |
| D-Ir541 | HTM 280 nm | — | M7:M8:Ir541 (60%:30%:10%) 35 nm | — | ETM1:ETM2 (50%:50%) 40 nm |
| D-Ir542 | HTM 280 nm | — | M7:M8:Ir542 (60%:30%:10%) 35 nm | — | ETM1:ETM2 (50%:50%) 40 nm |
| D-Ir543 | HTM 280 nm | — | M7:M8:Ir543 (60%:30%:10%) 35 nm | — | ETM1:ETM2 (50%:50%) 40 nm |
| D-Ir544 | HTM 280 nm | — | M7:M8:Ir544 (60%:30%:10%) 35 nm | — | ETM1:ETM2 (50%:50%) 40 nm |
| D-Ir546 | HTM 280 nm | — | M7:M8:Ir546 (60%:30%:10%) 35 nm | — | ETM1:ETM2 (50%:50%) 40 nm |
| D-Ir548 | HTM 280 nm | — | M7:M8:Ir548 (60%:30%:10%) 35 nm | — | ETM1:ETM2 (50%:50%) 40 nm |
| D-Ir551 | HTM 280 nm | — | M7:M8:Ir551 (60%:35%:5%) 35 nm | — | ETM1:ETM2 (50%:50%) 40 nm |
| D-Pt002 | HTM 280 nm | — | M7:M8:Pt002 (60%:30%:10%) 35 nm | HBM1 5 nm | ETM1:ETM2 (50%:50%) 40 nm |
| Yellow OLEDs | | | | | |
| D-Ir-Y1 | HTM 250 nm | — | M7:M8:Ir-Y1 (58%:30%:12%) 25 nm | — | ETM1:ETM2 (50%:50%) 45 nm |
| D-Ir-Y2 | HTM 250 nm | — | M7:M8:Ir-Y2 (62%:30%:8%) 25 nm | — | ETM1:ETM2 (50%:50%) 45 nm |
| D-Ir(LB7)$_3$ | HTM 230 nm | — | M7:M8:Ir(LB7)$_3$ (45%:50%:5%) 25 nm | HBM1 10 nm | ETM1:ETM2 (50%:50%) 35 nm |
| D-Ir(LB94)$_3$ | HTM 250 nm | — | M7:M8:Ir(LB94)$_3$ (65%:30%:5%) 30 nm | — | ETM1:ETM2 (50%:50%) 40 nm |
| D-Ir(LB95)$_3$ | HTM 250 nm | — | M7:M8:Ir(LB95)$_3$ (65%:30%:5%) 30 nm | — | ETM1:ETM2 (50%:50%) 40 nm |
| D-Ir(LB96)$_3$ | HTM 250 nm | — | M7:M8:Ir(LB96)$_3$ (65%:30%:5%) 30 nm | — | ETM1:ETM2 (50%:50%) 40 nm |
| D-Ir(LB102)$_3$ | HTM 250 nm | — | M7:M8:Ir(LB102)$_3$ (65%:30%:5%) 30 nm | — | ETM1:ETM2 (50%:50%) 40 nm |
| D-Ir(LB103)$_3$ | HTM 250 nm | — | M7:M8:Ir(LB103)$_3$ (65%:30%:5%) 30 nm | — | ETM1:ETM2 (50%:50%) 40 nm |
| D-Ir502 | HTM 250 nm | — | M7:M8:Ir502 (62%:30%:8%) 30 nm | — | ETM1:ETM2 (50%:50%) 40 nm |
| D-Ir513 | HTM 250 nm | — | M7:M8:Ir513 (58%:30%:12%) 25 nm | — | ETM1:ETM2 (50%:50%) 40 nm |
| D-Ir517 | HTM 250 nm | — | M7:M8:Ir517 (58%:30%:12%) 30 nm | — | ETM1:ETM2 (50%:50%) 40 nm |
| D-Ir527 | HTM 250 nm | — | M7:M8:Ir527 (58%:30%:12%) 30 nm | — | ETM1:ETM2 (50%:50%) 40 nm |
| D-Ir553 | HTM 250 nm | — | M7:M8:Ir553 (58%:30%:12%) 30 nm | — | ETM1:ETM2 (50%:50%) 40 nm |

TABLE 1-continued

| | | | Structure of the OLEDs | | |
|---|---|---|---|---|---|
| Ex. | HTL2 Thickness | EBL Thickness | EML Thickness | HBL Thickness | ETL Thickness |
| | | | Green OLEDs | | |
| D-Ir-G2 | HTM 230 nm | — | M7:M8:Ir-G2 (65%:30%:5%) 25 nm | HBM2 10 nm | ETM1:ETM2 (50%:50%) 35 nm |
| D-Ir(LB8)$_3$ | HTM 230 nm | — | M7:M8:Ir(LB8)$_3$ (65%:30%:5%) 25 nm | HBM2 10 nm | ETM1:ETM2 (50%:50%) 35 nm |
| D-Ir(LB10)$_3$ | HTM 230 nm | — | M7:M8:Ir(LB10)$_3$ (65%:30%:5%) 25 nm | HBM2 10 nm | ETM1:ETM2 (50%:50%) 35 nm |
| D-Ir(LB15)$_3$ | HTM 230 nm | — | M7:M8:Ir(LB15)$_3$ (65%:30%:5%) 25 nm | HBM2 10 nm | ETM1:ETM2 (50%:50%) 35 nm |
| D-Ir(LB18)$_3$ | HTM 230 nm | — | M7:M8:Ir(LB18)$_3$ (65%:30%:5%) 25 nm | HBM2 10 nm | ETM1:ETM2 (50%:50%) 35 nm |
| D-Ir(LB74)$_3$ | HTM 230 nm | — | M7:M8:Ir(LB74)$_3$ (65%:30%:5%) 25 nm | HBM2 10 nm | ETM1:ETM2 (50%:50%) 35 nm |
| D-Ir(LB75)$_3$ | HTM 230 nm | — | M7:M8:Ir(LB75)$_3$ (65%:30%:5%) 25 nm | HBM2 10 nm | ETM1:ETM2 (50%:50%) 35 nm |
| D-Ir(LB84)$_3$ | HTM 230 nm | — | M7:M8:Ir(LB84)$_3$ (65%:30%:5%) 25 nm | HBM2 10 nm | ETM1:ETM2 (50%:50%) 35 nm |
| D-Ir(LB85)$_3$ | HTM 230 nm | — | M7:M8:Ir(LB85)$_3$ (65%:30%:5%) 25 nm | HBM2 10 nm | ETM1:ETM2 (50%:50%) 35 nm |
| D-Ir(LB86)$_3$ | HTM 230 nm | — | M7:M8:Ir(LB86)$_3$ (65%:30%:5%) 25 nm | HBM2 10 nm | ETM1:ETM2 (50%:50%) 35 nm |
| D-Ir(LB87)$_3$ | HTM 230 nm | — | M7:M8:Ir(LB87)$_3$ (65%:30%:5%) 25 nm | HBM2 10 nm | ETM1:ETM2 (50%:50%) 35 nm |
| D-Ir(LB88)$_3$ | HTM 230 nm | — | M7:M8:Ir(LB88)$_3$ (65%:30%:5%) 25 nm | HBM2 10 nm | ETM1:ETM2 (50%:50%) 35 nm |
| D-Ir(LB104)$_3$ | HTM 230 nm | — | M7:M8:Ir(LB104)$_3$ (65%:30%:5%) 25 nm | HBM2 10 nm | ETM1:ETM2 (50%:50%) 35 nm |
| D-Ir(LB105)$_3$ | HTM 230 nm | — | M7:M8:Ir(LB105)$_3$ (65%:30%:5%) 25 nm | HBM2 10 nm | ETM1:ETM2 (50%:50%) 35 nm |
| D-Ir(LB106)$_3$ | HTM 230 nm | — | M7:M8:Ir(LB106)$_3$ (65%:30%:5%) 25 nm | HBM2 10 nm | ETM1:ETM2 (50%:50%) 35 nm |
| D-Ir(LB116)$_3$ | HTM 230 nm | — | M7:M8:Ir(LB116)$_3$ (65%:30%:5%) 25 nm | HBM2 10 nm | ETM1:ETM2 (50%:50%) 35 nm |
| D-Ir(LB131)$_3$ | HTM 230 nm | — | M7:M8:Ir(LB131)$_3$ (60%:30%:10%) 25 nm | HBM2 10 nm | ETM1:ETM2 (50%:50%) 35 nm |
| D-Ir(LB132)$_3$ | HTM 230 nm | — | M7:M8:Ir(LB132)$_3$ (65%:30%:5%) 25 nm | HBM2 10 nm | ETM1:ETM2 (50%:50%) 35 nm |
| D-Ir(LB133)$_3$ | HTM 230 nm | — | M7:M8:Ir(LB133)$_3$ (65%:30%:5%) 25 nm | HBM2 10 nm | ETM1:ETM2 (50%:50%) 35 nm |
| D-Ir(LB134)$_3$ | HTM 230 nm | — | M7:M8:Ir(LB134)$_3$ (65%:30%:5%) 25 nm | HBM2 10 nm | ETM1:ETM2 (50%:50%) 35 nm |
| D-Ir(LB135)$_3$ | HTM 230 nm | — | M7:M8:Ir(LB135)$_3$ (65%:30%:5%) 25 nm | HBM2 10 nm | ETM1:ETM2 (50%:50%) 35 nm |
| D-Ir(LB136)$_3$ | HTM 230 nm | — | M7:M8:Ir(LB136)$_3$ (65%:30%:5%) 25 nm | HBM2 10 nm | ETM1:ETM2 (50%:50%) 35 nm |
| D-Ir500 | HTM 230 nm | — | M7:M8:Ir500 (65%:30%:5%) 25 nm | HBM2 10 nm | ETM1:ETM2 (50%:50%) 35 nm |
| D-Ir501 | HTM 230 nm | — | M7:M8:Ir501 (65%:30%:5%) 25 nm | HBM2 10 nm | ETM1:ETM2 (50%:50%) 35 nm |

TABLE 1-continued

| | | | Structure of the OLEDs | | |
|---|---|---|---|---|---|
| Ex. | HTL2 Thickness | EBL Thickness | EML Thickness | HBL Thickness | ETL Thickness |
| D-Ir505 | HTM 230 nm | — | M7:M8:Ir505 (65%:30%:5%) 25 nm | HBM2 10 nm | ETM1:ETM2 (50%:50%) 35 nm |
| D-Ir508 | HTM 230 nm | — | M7:M8:Ir508 (65%:30%:5%) 25 nm | HBM2 10 nm | ETM1:ETM2 (50%:50%) 35 nm |
| D-Ir512 | HTM 230 nm | — | M7:M8:Ir512 (65%:30%:5%) 25 nm | HBM2 10 nm | ETM1:ETM2 (50%:50%) 35 nm |
| D-Ir515 | HTM 230 nm | — | M7:M8:Ir515 (65%:30%:5%) 25 nm | HBM2 10 nm | ETM1:ETM2 (50%:50%) 35 nm |
| D-Ir516 | HTM 230 nm | — | M7:M8:Ir516 (65%:30%:5%) 25 nm | HBM2 10 nm | ETM1:ETM2 (50%:50%) 35 nm |
| D-Ir518 | HTM 230 nm | — | M7:M8:Ir518 (65%:30%:5%) 25 nm | HBM2 10 nm | ETM1:ETM2 (50%:50%) 35 nm |
| D-Ir530 | HTM 230 nm | — | M7:M8:Ir530 (65%:30%:5%) 25 nm | HBM2 10 nm | ETM1:ETM2 (50%:50%) 35 nm |
| D-Ir533 | HTM 230 nm | — | M7:M8:Ir533 (65%:30%:5%) 25 nm | HBM2 10 nm | ETM1:ETM2 (50%:50%) 35 nm |
| D-Ir534 | HTM 230 nm | — | M7:M8:Ir534 (65%:30%:5%) 25 nm | HBM2 10 nm | ETM1:ETM2 (50%:50%) 35 nm |
| D-Ir538 | HTM 230 nm | — | M7:M8:Ir538 (65%:30%:5%) 25 nm | HBM2 10 nm | ETM1:ETM2 (50%:50%) 35 nm |
| D-Ir800 | HTM 230 nm | — | M7:M8:Ir800 (45%:45%:10%) 25 nm | HBM2 10 nm | ETM1:ETM2 (50%:50%) 35 nm |
| D-Ir804 | HTM 230 nm | — | M7:M8:Ir804 (45%:45%:10%) 25 nm | HBM2 10 nm | ETM1:ETM2 (50%:50%) 35 nm |
| D-Ir805 | HTM 230 nm | — | M7:M8:Ir805 (45%:45%:10%) 25 nm | HBM2 10 nm | ETM1:ETM2 (50%:50%) 35 nm |
| D-Pt001 | HTM 230 nm | — | M7:M8:Pt001 (65%:30%:5%) 25 nm | HBM2 10 nm | ETM1:ETM2 (50%:50%) 35 nm |
| D-Pt003 | HTM 230 nm | — | M7:M8:Pt003 (65%:30%:5%) 25 nm | HBM2 10 nm | ETM1:ETM2 (50%:50%) 35 nm |
| D-Pt(LB107) | HTM 230 nm | — | M7:M8:Pt(LB107) (65%:30%:5%) 25 nm | HBM2 10 nm | ETM1:ETM2 (50%:50%) 35 nm |
| D-Pt(LB108) | HTM 230 nm | — | M7:M8:Pt(LB108) (65%:30%:5%) 25 nm | HBM2 10 nm | ETM1:ETM2 (50%:50%) 35 nm |
| D-Pt(LB109) | HTM 230 nm | — | M7:M8:Pt(LB109) (65%:30%:5%) 25 nm | HBM2 10 nm | ETM1:ETM2 (50%:50%) 35 nm |
| D-Pt(LB110) | HTM 230 nm | — | M7:M8:Pt(LB110) (65%:30%:5%) 25 nm | HBM2 10 nm | ETM1:ETM2 (50%:50%) 35 nm |
| Blue OLEDs | | | | | |
| D-Ir-B2 | HTM 190 nm | EBM 10 nm | M10:M4:Ir-B2 (45%:45%:10%) 25 nm | HBM1 10 nm | ETM1:ETM2 (50%:50%) 15 nm |
| D-Ir(LB33)$_3$ | HTM 190 nm | EBM 10 nm | M1:M4:Ir(LB33)$_3$ (45%:45%:10%) 25 nm | HBM1 10 nm | ETM1:ETM2 (50%:50%) 15 nm |
| D-Ir(LB35)$_3$ | HTM 190 nm | EBM 10 nm | M1:M4:Ir(LB35)$_3$ (50%:40%:10%) 25 nm | HBM1 10 nm | ETM1:ETM2 (50%:50%) 15 nm |
| D-Ir(LB42)$_3$ | HTM 190 nm | EBM 10 nm | M1:M4:Ir(LB42)$_3$ (50%:40%:10%) 25 nm | HBM1 10 nm | ETM1:ETM2 (50%:50%) 15 nm |
| D-Ir(LB43)$_3$ | HTM 190 nm | EBM 10 nm | M10:M4:Ir(LB43)$_3$ (45%:45%:10%) 25 nm | HBM1 10 nm | ETM1:ETM2 (50%:50%) 15 nm |

TABLE 1-continued

Structure of the OLEDs

| Ex. | HTL2 Thickness | EBL Thickness | EML Thickness | HBL Thickness | ETL Thickness |
|---|---|---|---|---|---|
| D-Ir(LB44)$_3$ | HTM 190 nm | EBM 10 nm | M10:M4:Ir(LB44)$_3$ (45%:45%:10%) 25 nm | HBM1 10 nm | ETM1:ETM2 (50%:50%) 15 nm |
| D-Ir(LB52)$_3$ | HTM 190 nm | EBM 10 nm | M1:M4:Ir(LB52)$_3$ (50%:40%:10%) 25 nm | HBM1 10 nm | ETM1:ETM2 (50%:50%) 15 nm |
| D-Ir(LB54)$_3$ | HTM 190 nm | EBM 10 nm | M10:M4:Ir(LB54)$_3$ (50%:40%:10%) 25 nm | HBM1 10 nm | ETM1:ETM2 (50%:50%) 15 nm |
| D-Ir(LB56)$_3$ | HTM 190 nm | EBM 10 nm | M10:M4:Ir(LB56)$_3$ (60%:35%:5%) 25 nm | HBM1 10 nm | ETM1:ETM2 (50%:50%) 15 nm |
| D-Ir(LB83)$_3$ | HTM 190 nm | EBM 10 nm | M1:M4:Ir(LB83)$_3$ (60%:35%:5%) 25 nm | HBM1 10 nm | ETM1:ETM2 (50%:50%) 15 nm |
| D-Ir(LB120)$_3$ | HTM 190 nm | EBM 10 nm | M1:M4:Ir(LB120)$_3$ (60%:30%:10%) 25 nm | HBM1 10 nm | ETM1:ETM2 (50%:50%) 15 nm |
| D-Ir(LB123)$_3$ | HTM 190 nm | EBM 10 nm | M1:M4:Ir(LB123)$_3$ (60%:30%:10%) 25 nm | HBM1 10 nm | ETM1:ETM2 (50%:50%) 15 nm |
| D-Ir(LB127)$_3$ | HTM 190 nm | EBM 10 nm | M1:M4:Ir(LB127)$_3$ (60%:35%:5%) 25 nm | HBM1 10 nm | ETM1:ETM2 (50%:50%) 15 nm |
| D-Ir(LB129)$_3$ | HTM 190 nm | EBM 10 nm | M1:M4:Ir(LB129)$_3$ (60%:35%:5%) 25 nm | HBM1 10 nm | ETM1:ETM2 (50%:50%) 15 nm |
| Ir(535) | HTM 190 nm | EBM 10 nm | M1:M4:Ir535 (50%:40%:10%) 25 nm | HBM1 10 nm | ETM1:ETM2 (50%:50%) 15 nm |
| Pt004 | HTM 190 nm | EBM 10 nm | M1:M4:Pt004 (50%:40%:10%) 25 nm | HBM1 10 nm | ETM1:ETM2 (50%:50%) 15 nm |
| Pt(LB111) | HTM 190 nm | EBM 10 nm | M10:M4:Pt(LB111) (45%:45%:10%) 25 nm | HBM1 10 nm | ETM1:ETM2 (50%:50%) 15 nm |
| Pt(LB112) | HTM 190 nm | EBM 10 nm | M10:M4:Pt(LB112) (45%:45%:10%) 25 nm | HBM1 10 nm | ETM1:ETM2 (50%:50%) 15 nm |

TABLE 2

Results of the vacuum-processed OLEDs

| Ex. | EQE (%) 1000 cd/m$^2$ | Voltage (V) 1000 cd/m$^2$ | CIE x/y 1000 cd/m$^2$ | LT80 (h) 1000 cd/m$^2$ |
|---|---|---|---|---|
| Red OLEDs | | | | |
| D-IrR2 | 19.0 | 3.2 | 0.66/0.34 | 25000 |
| D-IrR3 | 16.5 | 3.1 | 0.63/0.37 | 19000 |
| D-Ir(LB5)$_3$ | 19.5 | 2.9 | 0.65/0.34 | 15000 |
| D-Ir(LB6)$_3$ | 18.6 | 3.0 | 0.70/0.30 | — |
| D-Ir(LB12)$_3$ | 16.3 | 3.5 | 0.68/0.31 | — |
| D-Ir(LB13)$_3$ | 19.3 | 3.0 | 0.65/0.35 | 18000 |
| D-Ir(LB19)$_3$ | 18.4 | 3.2 | 0.69/0.30 | 12000 |
| D-Ir(LB20)$_3$ | 19.4 | 3.1 | 0.65/0.35 | 19000 |
| D-Ir(LB57)$_3$ | 17.8 | 3.1 | 0.66/0.34 | 10000 |
| D-Ir(LB68)$_3$ | 18.8 | 3.2 | 0.63/0.35 | 13000 |
| D-Ir503 | 19.4 | 3.1 | 0.64/0.35 | 23000 |
| D-Ir507 | 16.8 | 3.2 | 0.63/0.36 | — |
| D-Ir509 | 16.6 | 3.2 | 0.62/0.38 | — |
| D-Ir510 | 19.2 | 3.1 | 0.63/0.35 | 26000 |
| D-Ir521 | 19.0 | 3.0 | 0.64/0.35 | — |
| D-Ir540 | 17.0 | 3.0 | 0.67/0.32 | — |
| D-Ir541 | 19.8 | 3.1 | 0.67/0.33 | 30000 |
| D-Ir542 | 19.3 | 2.9 | 0.66/0.34 | — |
| D-Ir543 | 19.5 | 3.0 | 0.67/0.33 | 27000 |
| D-Ir544 | 19.7 | 3.0 | 0.65/0.34 | — |
| D-Ir546 | 18.9 | 3.1 | 0.64/0.36 | — |
| D-Ir548 | 20.0 | 3.3 | 0.66/0.34 | 29500 |
| D-Ir551 | 17.4 | 3.0 | 0.65/0.34 | 19500 |
| D-Pt002 | 16.9 | 3.4 | 0.67/0.32 | — |
| Yellow OLEDs | | | | |
| D-Ir-Y1 | 19.7 | 3.0 | 0.39/0.61 | 32000 |
| D-Ir(LB7)$_3$ | 21.3 | 3.2 | 0.41/0.58 | — |
| D-Ir(LB94)$_3$ | 20.0 | 3.1 | 0.43/0.55 | 40000 |
| D-Ir(LB95)$_3$ | 19.8 | 3.0 | 0.43/0.56 | 45000 |
| D-Ir(LB96)$_3$ | 20.5 | 3.0 | 0.43/0.56 | 38000 |
| D-Ir(LB102)$_3$ | 20.2 | 3.1 | 0.43/0.56 | 35000 |
| D-Ir(LB103)$_3$ | 20.1 | 3.3 | 0.41/0.58 | 32000 |
| D-Ir502 | 24.2 | 2.8 | 0.44/0.55 | 40000 |
| D-Ir513 | 22.0 | 3.0 | 0.41/0.57 | 38000 |
| D-Ir517 | 21.1 | 3.2 | 0.39/0.60 | 33000 |
| D-Ir527 | 24.6 | 2.9 | 0.46/0.54 | 44000 |
| D-Ir553 | 19.9 | 3.2 | 0.48/0.52 | 35000 |
| Green OLEDs | | | | |
| D-Ir-G2 | 19.1 | 3.2 | 0.35/0.61 | 19000 |
| D-Ir(LB8)$_3$ | 24.5 | 3.3 | 0.35/0.62 | 25000 |
| D-Ir(LB10)$_3$ | 23.9 | 3.3 | 0.33/0.64 | 22000 |
| D-Ir(LB15)$_3$ | 24.6 | 3.3 | 0.35/0.62 | 27000 |
| D-Ir(LB18)$_3$ | 24.5 | 3.3 | 0.35/0.62 | 22000 |

TABLE 2-continued

Results of the vacuum-processed OLEDs

| Ex. | EQE (%) 1000 cd/m$^2$ | Voltage (V) 1000 cd/m$^2$ | CIE x/y 1000 cd/m$^2$ | |
|---|---|---|---|---|
| D-Ir(LB74)$_3$ | 22.3 | 3.1 | 0.33/0.63 | 24000 |
| D-Ir(LB75)$_3$ | 22.8 | 3.1 | 0.33/0.64 | 26000 |
| D-Ir(LB84)$_3$ | 24.3 | 3.3 | 0.34/0.62 | 24000 |
| D-Ir(LB85)$_3$ | 24.4 | 3.3 | 0.34/0.62 | 24000 |
| D-Ir(LB86)$_3$ | 24.0 | 3.4 | 0.30/0.63 | 19000 |
| D-Ir(LB87)$_3$ | 24.5 | 3.3 | 0.34/0.62 | 25000 |
| D-Ir(LB88)$_3$ | 24.2 | 3.2 | 0.34/0.62 | — |
| D-Ir(LB104)$_3$ | 20.7 | 3.4 | 0.38/0.60 | 20000 |
| D-Ir(LB105)$_3$ | 18.7 | 3.5 | 0.37/0.60 | — |
| D-Ir(LB106)$_3$ | 19.6 | 3.5 | 0.39/0.58 | — |
| D-Ir(LB116)$_3$ | 20.1 | 3.4 | 0.41/0.56 | — |
| D-Ir(LB131)$_3$ | 21.8 | 3.3 | 0.35/0.62 | — |
| D-Ir(LB132)$_3$ | 23.0 | 3.3 | 0.34/0.64 | 26000 |
| D-Ir(LB133)$_3$ | 22.8 | 3.4 | 0.33/0.62 | 24000 |
| D-Ir(LB134)$_3$ | 23.3 | 3.3 | 0.36/0.61 | 24000 |
| D-Ir(LB135)$_3$ | 22.8 | 3.2 | 0.35/0.62 | — |
| D-Ir(LB136)$_3$ | 21.0 | 3.3 | 0.39/0.58 | — |
| D-Ir500 | 23.5 | 3.1 | 0.33/0.64 | 22000 |
| D-Ir501 | 24.5 | 3.1 | 0.36/0.62 | 28000 |
| D-Ir505 | 24.6 | 3.1 | 0.36/0.62 | 30000 |
| D-Ir508 | 23.0 | 3.4 | 0.18/0.54 | — |
| D-Ir512 | 24.1 | 3.1 | 0.34/0.63 | 23000 |
| D-Ir515 | 24.3 | 3.3 | 0.33/0.63 | 25000 |
| D-Ir516 | 24.1 | 3.2 | 0.33/0.63 | — |
| D-Ir518 | 24.2 | 3.3 | 0.34/0.63 | 24000 |
| D-Ir530 | 24.4 | 3.3 | 0.34/0.63 | 24000 |
| D-Ir533 | 24.0 | 3.2 | 0.34/0.63 | 26000 |
| D-Ir534 | 24.2 | 3.4 | 0.33/0.63 | 26000 |
| D-Ir538 | 22.2 | 3.2 | 0.39/0.59 | — |
| D-Ir800 | 22.3 | 3.5 | 0.16/0.40 | — |
| D-Ir804 | 22.7 | 3.4 | 0.18/0.52 | — |
| D-Ir805 | 22.5 | 3.4 | 0.18/0.55 | — |
| D-Pt001 | 17.1 | 3.2 | 0.31/0.60 | — |
| D-Pt003 | 18.0 | 3.3 | 0.31/0.62 | — |
| D-Pt(LB107) | 18.9 | 3.1 | 0.35/0.62 | 13000 |
| D-Pt(LB108) | 19.7 | 3.1 | 0.36/0.62 | — |
| D-Pt(LB109) | 20.4 | 3.2 | 0.35/0.62 | — |
| D-Pt(LB110) | 20.7 | 3.2 | 0.36/0.62 | 18000 |
| | | | | LT50 (h) 1000 cd/m$^2$ |
| Blue OLEDs | | | | |
| D-Ir-B2 | 3.1 | 5.1 | 0.16/0.07 | 50 |
| D-Ir(LB33)$_3$ | 21.5 | 3.9 | 0.17/0.40 | 1800 |
| D-Ir(LB35)$_3$ | 20.6 | 4.6 | 0.17/0.36 | — |
| D-Ir(LB42)$_3$ | 20.8 | 4.1 | 0.17/0.38 | — |
| D-Ir(LB43)$_3$ | 9.1 | 5.4 | 0.15/0.12 | 100 |
| D-Ir(LB44)$_3$ | 9.3 | 5.3 | 0.15/0.15 | — |
| D-Ir(LB52)$_3$ | 7.2 | 6.0 | 0.15/0.10 | — |
| D-Ir(LB54)$_3$ | 6.9 | 6.0 | 0.15/0.09 | — |
| D-Ir(LB56)$_3$ | 23.0 | 3.8 | 0.15/0.33 | 1100 |
| D-Ir(LB83)$_3$ | 22.1 | 3.9 | 0.15/0.27 | 800 |
| D-Ir(LB120)$_3$ | 19.1 | 4.5 | 0.16/0.31 | 500 |
| D-Ir(LB123)$_3$ | 19.4 | 4.6 | 0.16/0.32 | — |
| D-Ir(LB127)$_3$ | 21.3 | 4.4 | 0.23/0.60 | — |
| D-Ir(LB129)$_3$ | 21.6 | 4.6 | 0.22/0.61 | 10000 |
| Ir535 | 19.8 | 4.4 | 0.16/0.37 | — |
| Pt004 | 17.5 | 4.0 | 0.18/0.43 | — |
| Pt(LB111) | 10.1 | 5.1 | 0.15/0.17 | — |
| Pt(LB112) | 12.1 | 5.0 | 0.15/0.23 | — |

3) Solution-Processed Devices

A: From Soluble Functional Materials

The iridium complexes according to the invention can also be processed from solution, where they result in OLEDs which are significantly simpler as far as the process is concerned, compared with the vacuum-processed OLEDs, with nevertheless good properties. The production of components of this type is based on the production of polymeric light-emitting diodes (PLEDs), which has already been described many times in the literature (for example in WO 2004/037887). The structure is composed of substrate/ITO/PEDOT (80 nm)/interlayer (80 nm)/emission layer (80 nm)/cathode. To this end, use is made of substrates from Technoprint (soda-lime glass), to which the ITO structure (indium tin oxide, a transparent, conductive anode) is applied. The substrates are cleaned with DI water and a detergent (Deconex 15 PF) in a clean room and then activated by a UV/ozone plasma treatment. An 80 nm layer of PEDOT (PEDOT is a polythiophene derivative (Baytron P VAI 4083sp.) from H. C. Starck, Goslar, which is supplied as an aqueous dispersion) is then applied as buffer layer by spin coating, likewise in the clean room. The spin rate required depends on the degree of dilution and the specific spin coater geometry (typically for 80 nm: 4500 rpm). In order to remove residual water from the layer, the substrates are dried by heating on a hotplate at 180° C. for 10 minutes. The interlayer used serves for hole injection, in this case HIL-012 from Merck is used. The interlayer may alternatively also be replaced by one or more layers, which merely have to satisfy the condition of not being detached again by the subsequent processing step of EML deposition from solution. In order to produce the emission layer, the emitters according to the invention are dissolved in toluene together with the matrix materials. The typical solids content of such solutions is between 16 and 25 g/l if, as here, the typical layer thickness of 80 nm for a device is to be achieved by means of spin coating. The solution-processed devices of type 1 comprise an emission layer comprising (polystyrene): M5:M6:Ir(L)$_3$ (20%:30%:40%:10%) and those of type 2 comprise an emission layer comprising (polystyrene): M5:M6:Ir(LB3)$_3$:Ir(L)$_3$ (20%:20%:40%:15%: 5%). The emission layer is applied by spin coating in an inert-gas atmosphere, in the present case argon, and dried by heating at 130° C. for 30 min. Finally, a cathode is applied by vapour deposition from barium (5 nm) and then aluminium (100 nm) (high-purity metals from Aldrich, particularly barium 99.99% (Order No. 474711); vapour-deposition equipment from Lesker, inter alia, typical vapour-deposition pressure 5×10$^{-6}$ mbar). Optionally, firstly a hole-blocking layer and then an electron-transport layer and only then the cathode (for example Al or LiF/Al) can be applied by vacuum vapour deposition. In order to protect the device against air and atmospheric moisture, the device is finally encapsulated and then characterised. The OLED examples given have not yet been optimised, Table 4 summarises the data obtained.

TABLE 4

Results with solution-processed materials

| Ex. | Emitter Device | EQE (%) 1000 cd/m$^2$ | Voltage (V) 1000 cd/m$^2$ | CIE x/y 1000 cd/m$^2$ |
|---|---|---|---|---|
| Red OLEDs | | | | |
| Sol-D-Ir-R2 | Ir-R2 Type 2 | 18.0 | 3.8 | 0.66/0.34 |
| Sol-D-Ir(LB14)$_3$ | Ir(LB14)$_3$ Type 1 | 19.2 | 3.9 | 0.65/0.35 |
| Sol-D-Ir(LB69)$_3$ | Ir(LB69)$_3$ Type 1 | 19.5 | 3.6 | 0.67/0.33 |
| Sol-D-Ir(LB71)$_3$ | Ir(LB71)$_3$ Type 1 | 19.0 | 3.8 | 0.65/0.35 |
| Sol-D-Ir511 | Ir511 Type 1 | 21.3 | 3.7 | 0.62/0.37 |
| Sol-D-Ir525 | Ir525 Type 1 | 20.1 | 3.9 | 0.66/0.34 |

TABLE 4-continued

Results with solution-processed materials

| Ex. | Emitter Device | EQE (%) 1000 cd/m² | Voltage (V) 1000 cd/m² | CIE x/y 1000 cd/m² |
|---|---|---|---|---|
| Sol-D-Ir545 | Ir545 Type 2 | 18.8 | 3.9 | 0.66/0.34 |
| Sol-D-Ir547 | Ir547 Type 2 | 17.5 | 3.5 | 0.68/0.32 |
| Sol-D-Ir549 | Ir549 Type 2 | 19.3 | 4.0 | 0.65/0.35 |
| Sol-D-Ir550 | Ir550 Type 2 | 19.5 | 4.0 | 0.66/0.34 |
| Sol-D-Ir552 | Ir552 Type 2 | 17.9 | 3.9 | 0.69/0.31 |
| Sol-D-Ir607 | Ir607 Type 2 | 16.8 | 3.9 | 0.67/0.32 |
| Sol-D-Ir608 | Ir608 Type 2 | 18.6 | 3.7 | 0.65/0.35 |
| Yellow OLEDs of type 1 | | | | |
| Sol-D-Ir-Y3 | Ir-Y3 | 19.3 | 4.0 | 0.48/0.49 |
| Sol-D-Ir(LB3)₃ | Ir(LB3)₃ | 22.1 | 4.1 | 0.49/0.50 |
| Sol-D-Ir(LB9)₃ | Ir(LB9)₃ | 21.8 | 4.1 | 0.48/0.52 |
| Sol-D-Ir(LB76)₃ | Ir(LB76)₃ | 20.8 | 4.0 | 0.55/0.44 |
| Sol-D-Ir(LB77)₃ | Ir(LB77)₃ | 22.0 | 4.1 | 0.51/0.48 |
| Sol-D-Ir(LB78)₃ | Ir(LB78)₃ | 22.5 | 4.3 | 0.51/0.48 |
| Sol-D-Ir(LB79)₃ | Ir(LB79)₃ | 20.9 | 3.9 | 0.48/0.48 |
| Sol-D-Ir(LB81)₃ | Ir(LB81)₃ | 21.3 | 4.2 | 0.47/0.52 |
| Sol-D-Ir504 | Ir504 | 21.3 | 4.0 | 0.46/0.53 |
| Sol-D-Ir514 | Ir514 | 20.7 | 4.2 | 0.49/0.50 |
| Sol-D-Ir520 | Ir520 | 21.3 | 4.0 | 0.47/0.52 |
| Sol-D-Ir522 | Ir522 | 21.0 | 4.0 | 0.47/0.53 |
| Sol-D-Ir528 | Ir528 | 20.9 | 4.2 | 0.47/0.53 |
| Sol-D-Ir529 | Ir529 | 19.8 | 4.4 | 0.40/0.56 |
| Sol-D-Ir531 | Ir531 | 20.3 | 4.2 | 0.49/0.50 |
| Sol-D-Ir602 | Ir602 | 20.9 | 3.9 | 0.43/0.56 |
| Sol-D-Ir603 | Ir603 | 20.7 | 4.1 | 0.45/0.55 |
| Sol-D-Ir604 | Ir604 | 21.0 | 4.0 | 0.45/0.55 |
| Sol-D-Ir609 | Ir609 | 20.7 | 4.0 | 0.46/0.53 |
| Sol-D-Ir612 | Ir612 | 20.5 | 4.1 | 0.47/0.52 |
| Green OLEDs of type 1 | | | | |
| Sol-D-Ir-G3 | Ir-G3 | 18.5 | 4.3 | 0.34/0.62 |
| Sol-D-Ir(LB1)₃ | Ir(LB1)₃ | 20.7 | 4.5 | 0.38/0.59 |
| Sol-D-Ir(LB11)₃ | Ir(LB11)₃ | 21.0 | 4.5 | 0.36/0.62 |
| Sol-D-Ir(LB18)₃ | Ir(LB18)₃ | 20.9 | 4.6 | 0.38/0.59 |
| Sol-D-Ir(LB80)₃ | Ir(LB80)₃ | 20.2 | 4.5 | 0.37/0.60 |
| Sol-D-Ir(LB90)₃ | Ir(LB90)₃ | 20.5 | 4.6 | 0.34/0.62 |
| Sol-D-Ir(LB91)₃ | Ir(LB91)₃ | 21.2 | 4.5 | 0.34/0.64 |
| Sol-D-Ir(LB92)₃ | Ir(LB92)₃ | 21.2 | 4.6 | 0.34/0.64 |
| Sol-D-Ir(LB93)₃ | Ir(LB93)₃ | 21.7 | 4.7 | 0.34/0.64 |
| Sol-D-Ir(LB128)₃ | Ir(LB128)₃ | 13.8 | 4.6 | 0.23/0.60 |
| Sol-D-Ir(LB132)₃ | Ir(LB132)₃ | 21.0 | 4.6 | 0.35/0.63 |
| Sol-D-Ir506 | Ir506 | 20.3 | 4.5 | 0.34/0.63 |
| Sol-D-Ir519 | Ir519 | 20.0 | 4.6 | 0.36/0.61 |
| Sol-D-Ir523 | Ir523 | 20.9 | 4.6 | 0.34/0.63 |
| Sol-D-Ir524 | Ir524 | 14.6 | 4.8 | 0.24/0.58 |
| Sol-D-Ir532 | Ir532 | 20.7 | 4.6 | 0.36/0.61 |
| Sol-D-Ir539 | Ir539 | 19.7 | 4.5 | 0.33/0.65 |
| Sol-D-Ir600 | Ir600 | 20.0 | 4.5 | 0.36/0.64 |
| Sol-D-Ir610 | Ir610 | 20.5 | 4.4 | 0.32/0.64 |
| Sol-D-Ir611 | Ir611 | 20.4 | 4.5 | 0.33/0.65 |
| Sol-D-Ir613 | Ir613 | 20.7 | 4.5 | 0.36/0.62 |
| Sol-D-Ir614 | Ir614 | 20.3 | 4.5 | 0.34/0.64 |
| Sol-D-Ir701 | Ir701 | 19.9 | 4.4 | 0.33/0.65 |
| Sol-D-Ir703 | Ir703 | 21.0 | 4.4 | 0.34/0.64 |

B: From Polymeric Functional Materials

Production of the OLEDs as described under A: For the production of the emission layer, the polymers according to the invention are dissolved in toluene. The typical solids content of such solutions is between 10 and 15 g/l if, as here, the typical layer thickness of 80 nm for a device is to be achieved by means of spin coating. The said OLED examples have not yet been optimised, Table 5 summarises the data obtained.

TABLE 5

Results with solution-processed materials

| Ex. | Polymer | EQE (%) 1000 cd/m² | Voltage (V) 1000 cd/m² | CIE x/y 1000 cd/m² |
|---|---|---|---|---|
| Yellow OLEDs | | | | |
| D-P2 | P2 | 19.4 | 3.6 | 0.43/0.57 |
| D-P4 | P4 | 21.4 | 3.7 | 0.46/0.53 |
| Green OLEDs | | | | |
| D-P1 | P1 | 19.8 | 4.1 | 0.34/0.61 |
| D-P3 | P3 | 20.1 | 4.3 | 0.32/0.63 |
| D-P5 | P5 | 21.6 | 4.3 | 0.33/0.64 |

4) White-Emitting OLED9

A white-emitting OLED having the following layer structure is produced in accordance with the general processes from 1):

TABLE 6

Structure of the white OLEDs

| Ex. | HTL2 Thickness | EML Red Thickness | EML Blue Thickness | EML Green Thickness | HBL Thickness | ETL |
|---|---|---|---|---|---|---|
| D-W1 | HTM 230 nm | EBM:Ir541 (97%:3%) 9 nm | M1:M3:Ir(LB55)₃ (45%:50%:5%) 8 nm | M3:Ir(LB74)₃ (95%:5%) 7 nm | M3 10 nm | ETM1:ETM2 (50%:50%) 30 nm |

TABLE 7

| | Device results | | | |
|---|---|---|---|---|
| Ex. | EQE (%) 1000 cd/m² | Voltage (V) 1000 cd/m² | CIE x/y 1000 cd/m² | LT50 (h) 1000 cd/m² |
| D-W1 | 21.8 | 5.8 | 0.41/0.39 | 5500 |

The invention claimed is:

1. A compound of formula (1):

$$M(L)_n(L')_m \qquad (1)$$

comprising a moiety $M(L)_n$ of formula (2):

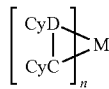

(2)

wherein:

M is iridium or platinum;

CyC is an aryl group having 6-18 aromatic ring atoms or a heteroaryl group having 5 to 18 aromatic ring atoms or a fluorene or azafluorene group, each of which is coordinated to M via a carbon atom and each of which is optionally substituted by one or more radicals R and each of which is connected to CyD via a covalent bond;

CyD is a heteroaryl group having 5 to 18 aromatic ring atoms, which is coordinated to M via a neutral nitrogen atom or via a carbene carbon atom and which is optionally substituted by one or more radicals R and which is connected to CyC via a covalent bond;

R is on each occurrence, identically or differently, H, D, F, Cl, Br, I, $N(R^1)_2$, CN, $NO_2$, OH, $COOR^1$, $C(=O)N(R^1)_2$, $Si(R^1)_3$, $B(OR^1)_2$, $C(=O)R^1$, $P(=O)(R^1)_2$, $S(=O)R^1$, $S(=O)_2R^1$, $OSO_2R^1$, a straight-chain alkyl, alkoxy, or thioalkoxy group having 1 to 20 C atoms, or an alkenyl or alkynyl group having 2 to 20 C atoms, or a branched or cyclic alkyl, alkoxy, or thioalkoxy group having 3 to 20 C atoms, each of which is optionally substituted by one or more radicals $R^1$, wherein one or more non-adjacent $CH_2$ groups are optionally replaced by $R^1C=CR^1$, $C\equiv C$, $Si(R^1)_2$, $C=O$, $NR^1$, O, S, or $CONR^1$, and wherein one or more H atoms are optionally replaced by D, F, Cl, Br, I, or CN, or an aromatic ring system having 6 to 40 aromatic ring atoms or a hetero-aromatic ring system having 5 to 40 aromatic ring atoms, which are each optionally substituted by one or more radicals $R^1$, or an aryloxy group having 6 to 40 aromatic ring atoms or a heteroaryloxy group having 5 to 40 aromatic ring atoms, which are each optionally substituted by one or more radicals $R^1$, or an aralkyl group having 6 to 40 aromatic ring atoms or a heteroalkyl group having 5 to 40 aromatic ring atoms, which are each optionally substituted by one or more radicals $R^1$, or a diarylamino group, diheteroarylamino group, or arylheteroarylamino group having 10 to 40 aromatic ring atoms, which is optionally substituted by one or more radicals $R^1$; wherein two adjacent radicals R optionally define a mono- or polycyclic, aliphatic, aromatic, or heteroaromatic ring system with one another; and wherein two radicals R, one of which is bonded to CyD and the other of which is bonded to CyC, optionally define a mono- or polycyclic, aliphatic, aromatic, or heteroaromatic ring system with one another; or wherein CyC and/or CyD contain two adjacent carbon atoms, which are substituted by radicals R such that that the two carbon atoms, together with the substituents R, form a structure of formula (3):

(3)

wherein the dashed bonds indicate the linking of the two carbon atoms in the ligand;

$A^1$ and $A^2$
are, identically or differently on each occurrence, $CR^2$ or N;

$A^3$ and $A^4$
are, identically or differently on each occurrence, an alkylene group having 2 or 3 C atoms optionally substituted by one or more radicals $R^3$ and wherein one carbon atom is optionally replaced by oxygen;

with the proviso that no two heteroatoms in $A^1$-$A^3$-$A^2$ and $A^1$-$A^4$-$A^2$ are bonded directly to one another;

$R^1$, $R^2$, and $R^3$
are on each occurrence, identically or differently, H, D, F, Cl, Br, I, $N(R^4)_2$, CN, $NO_2$, $Si(R^4)_3$, $B(OR^4)_2$, $C(=O)R^4$, $P(=O)(R^4)_2$, $S(=O)R^4$, $S(=O)_2R^4$, $OSO_2R^4$, a straight-chain alkyl, alkoxy, or thioalkoxy group having 1 to 20 C atoms, or an alkenyl or alkynyl group having 2 to 20 C atoms, or a branched or cyclic alkyl, alkoxy, or thioalkoxy group having 3 to 20 C atoms, each of which is optionally substituted by one or more radicals $R^4$, wherein one or more non-adjacent $CH_2$ groups are optionally replaced by $R^4C=CR^4$, $C\equiv C$, $Si(R^4)_2$, $C=O$, $NR^4$, O, S, or $CONR^4$, and wherein one or more H atoms are optionally replaced by D, F, Cl, Br, I, CN, or $NO_2$, or an aromatic ring system having 6 to 40 aromatic ring atoms or a heteroaromatic ring system having 5 to 40 aromatic ring atoms, which are each optionally substituted by one or more radicals $R^4$, or an aryloxy group having 6 to 40 aromatic ring atoms or a heteroaryloxy group having 5 to 40 aromatic ring atoms, which are each optionally substituted by one or more radicals $R^4$, or an aralkyl group having 6 to 40 aromatic ring atoms or a heteroaralkyl group having 5 to 40 aromatic ring atoms, which are each optionally substituted by one or more radicals $R^4$, or a diarylamino group, diheteroarylamino group, or arylheteroarylamino group having 10 to 40 aromatic ring atoms, which is optionally substituted by one or more radicals $R^4$; wherein two or more adjacent radicals $R^1$ optionally define a mono- or polycyclic, aliphatic, aromatic, or heteroaromatic ring system with one another and/or two radicals $R^3$ optionally define a mono- or polycyclic, aliphatic ring system with one another, wherein the two radicals $R^3$ are optionally bonded to $A^3$ and $A^4$, respectively;

$R^4$ is on each occurrence, identically or differently, H, D, F, or an aliphatic hydrocarbon radical having 1 to 20 C atoms, an aromatic hydrocarbon radical having 6 to 20 C atoms, and/or a heteroaromatic hydrocarbon radical having 1 to 20 C atoms, wherein one or more H atoms is optionally replaced by F; wherein two or more substituents R⁴ optionally define a mono- or polycyclic ring system with one another;

L' is, identically or differently on each occurrence, a ligand;

n is 1, 2, or 3;

m is 0, 1, 2, 3, or 4;

wherein a plurality of ligands L are optionally linked to one another or L is optionally linked to L' via a single bond or a divalent or trivalent bridge so as to form a tridentate, tetradentate, pentadentate, or hexadentate ligand system;

a substituent R is optionally additionally coordinated to M;

wherein the moiety of formula (2) comprises at least one structural unit of formula (3), wherein M is iridium(III), n is 1, and four monodentate or two bidentate or one bidentate and two monodentate or one tridentate and one monodentate or one tetradentate ligand L' is coordinated to the iridium, or wherein n is 2 and one bidentate or two monodentate ligands L' are coordinated to the iridium, or wherein n is 3 and m is 0, or wherein M is platinum(II) and n is 1 and one bidentate or two monodentate ligands L' are coordinated to the platinum, or wherein that n is 2 and m is 0.

2. The compound of claim 1, wherein CyC is selected from the group consisting of structures of formulae (CyC-1) through (CyC-19), wherein the group CyC is in each case bonded to CyD at the position denoted by # and is coordinated to M at the position denoted by *:

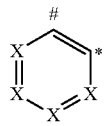
(CyC-1)

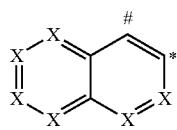
(CyC-2)

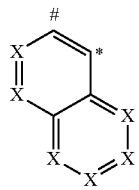
(CyC-3)

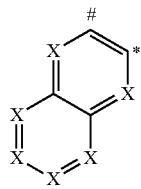
(CyC-4)

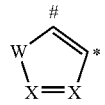
(CyC-5)

-continued

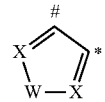
(CyC-6)

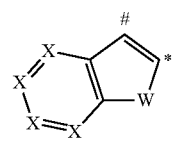
(CyC-7)

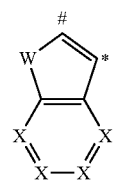
(CyC-8)

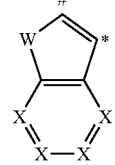
(CyC-9)

(CyC-10)

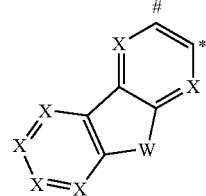
(CyC-11)

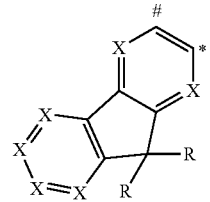
(CyC-12)

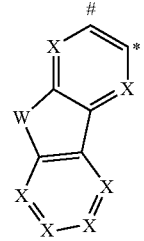
(CyC-12)

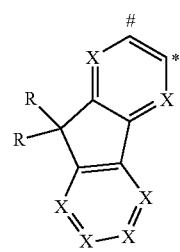
(CyC-13)

-continued
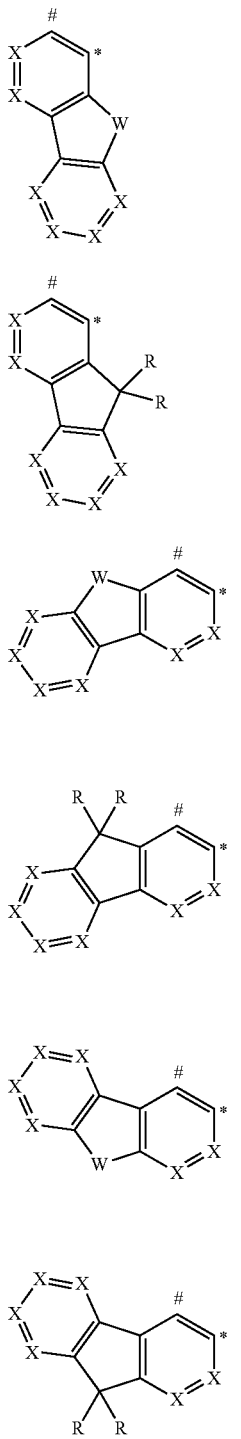
(CyC-14)
(CyC-15)
(CyC-16)
(CyC-17)
(CyC-18)
(CyC-19)
wherein:
X is on each occurrence, identically or differently, CR or N; and
W is on each occurrence, identically or differently, NR, O, S, or $C(R)_2$.
3. The compound of claim 2, wherein CyC is selected from the group consisting of structures of formulae (CyC-1a) through (CyC-19a):
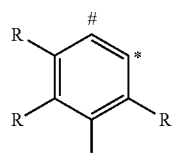
(CyC-1a)
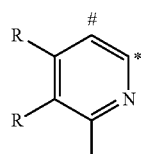
(CyC-1b)
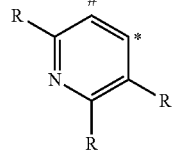
(CyC-1c)
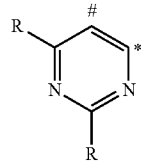
(CyC-1d)
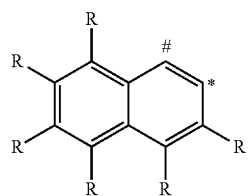
(CyC-2a)
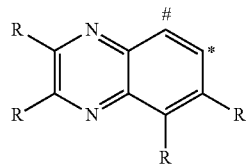
(CyC-2b)
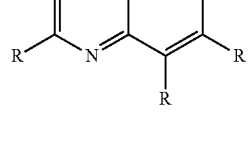
(CyC-3a)
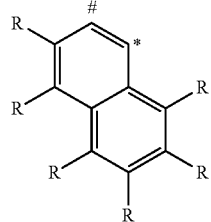
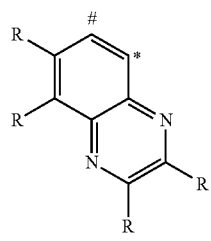
(CyC-3b)

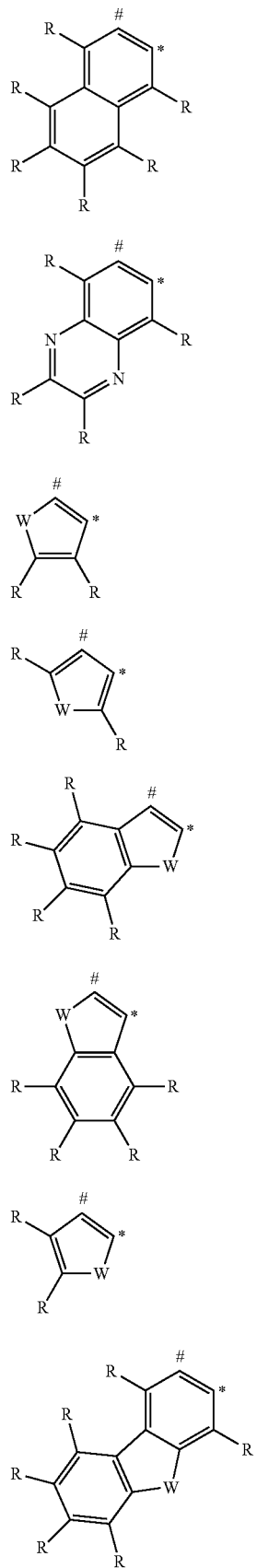
(CyC-4a)
(CyC-4b)
(CyC-5a)
(CyC-6a)
(CyC-7a)
(CyC-8a)
(CyC-9a)
(CyC-10a)
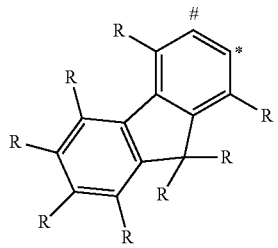 (CyC-11a)
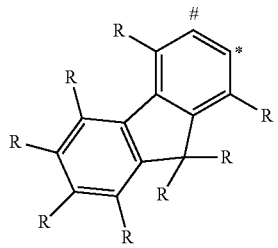 (CyC-12a)
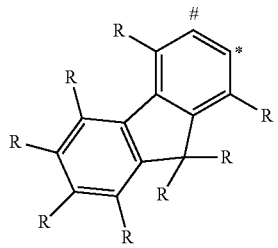 (CyC-13a)
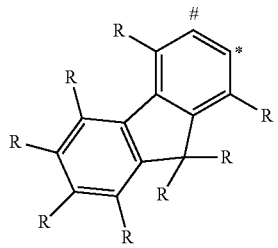 (CyC-14a)
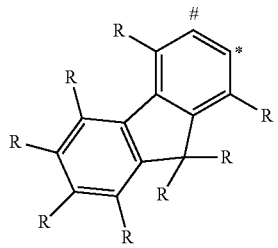 (CyC-15a)
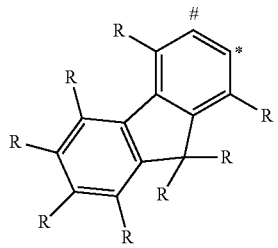 (CyC-16a)

-continued

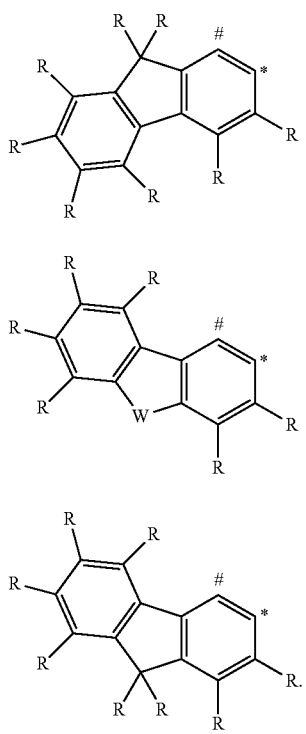

(CyC-17a)

(CyC-18a)

(CyC-19a)

4. The compound of claim 1, wherein CyD is selected from the group consisting of structures of formulae (CyD-1) through (CyD-10), wherein the group CyD is in each case bonded to CyC at the position denoted by # and is coordinated to M at the position denoted by *:

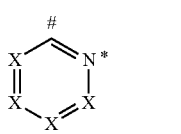 (CyD-1)

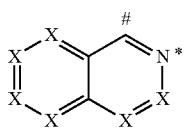 (CyD-2)

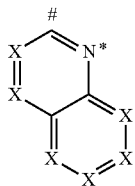 (CyD-3)

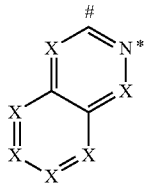 (CyD-4)

-continued

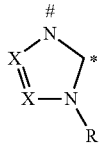 (CyD-5)

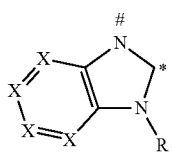 (CyD-6)

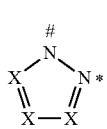 (CyD-7)

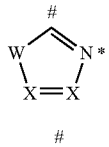 (CyD-8)

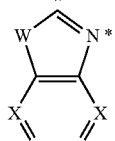 (CyD-9)

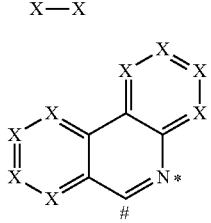 (CyD-10)

wherein:
X is on each occurrence, identically or differently, CR or N; and
W is on each occurrence, identically or differently, NR, O, S, or C(R)$_2$.

5. The compound of claim 4, wherein CyD is selected from the group consisting of structures of formulae (CyD-1a) through (CyD-10a):

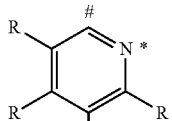 (CyD-1a)

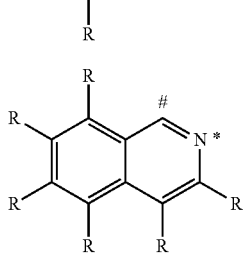 (CyD-2a)

-continued (CyD-3a) 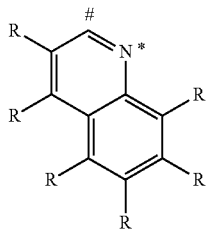

(CyD-3b) 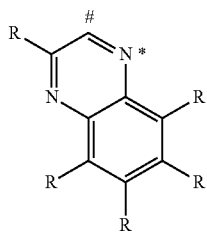

(CyD-4a) 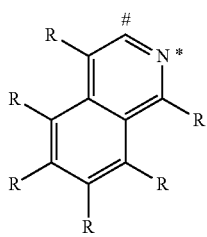

(CyD-5a) 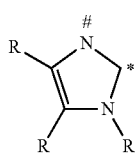

(CyD-6a) 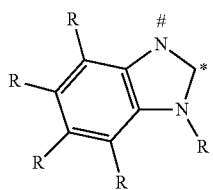

(CyD-7a) 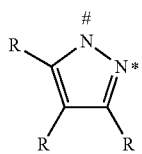

(CyD-8a) 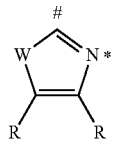

(CyD-9a) 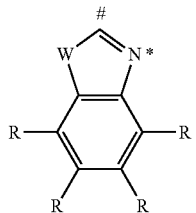

-continued (CyD-10a) 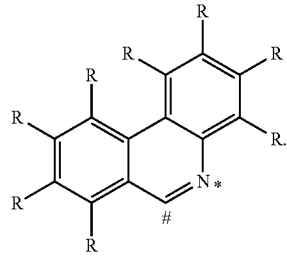

6. The compound of claim 1, wherein the radicals R on CyC and CyD together define a ring and the ligands L are selected from the group consisting of ligands (L1) and (L2):

(L1) 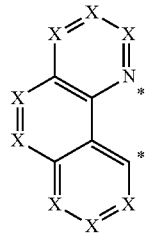

(L2) 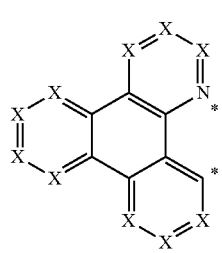

wherein:

X is on each occurrence, identically or differently, CR or N; and

* denotes the position of the coordination to M.

7. The compound of claim 1, wherein CyC is selected from the group consisting of structures of formulae (CyC-1-1) through (CyC-19-1) and CyD is selected from the group consisting of structures of formulae (CyD1-1-1) through (CyD-10-1) or (CyD1-10-2) through (CyD-10-4), wherein the ligands L are selected from the group consisting of ligands (L1-1) through (L2-7):

(CyC-1-1) 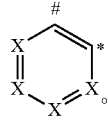

(CyC-1-2) 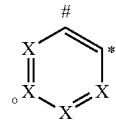

-continued
(CyC-2-1) 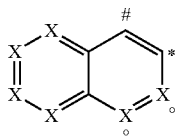
(CyC-2-2) 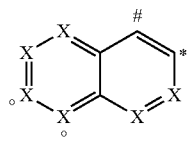
(CyC-2-3) 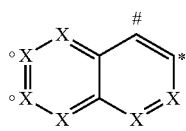
(CyC-3-1) 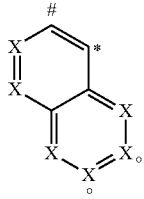
(CyC-3-2) 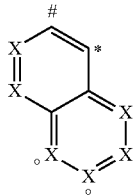
(CyC-4-1) 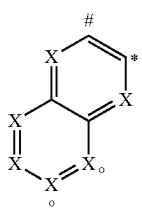
(CyC-4-2) 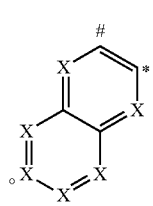
(CyC-4-3) 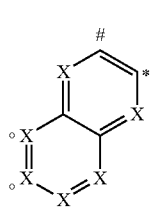
-continued
(CyC-5-1) 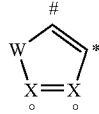
(CyC-7-1) 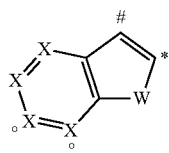
(CyC-7-2) 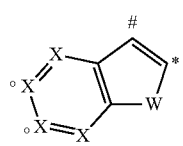
(CyC-7-3) 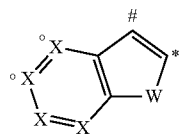
(CyC-8-1) 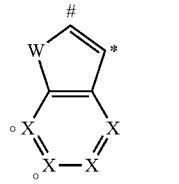
(CyC-8-2) 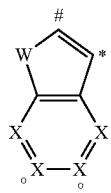
(CyC-8-3) 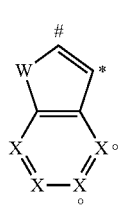
(CyC-9-1) 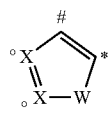

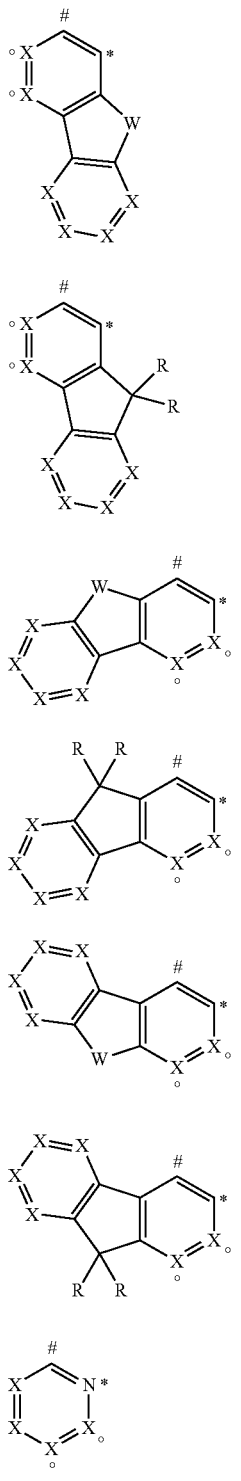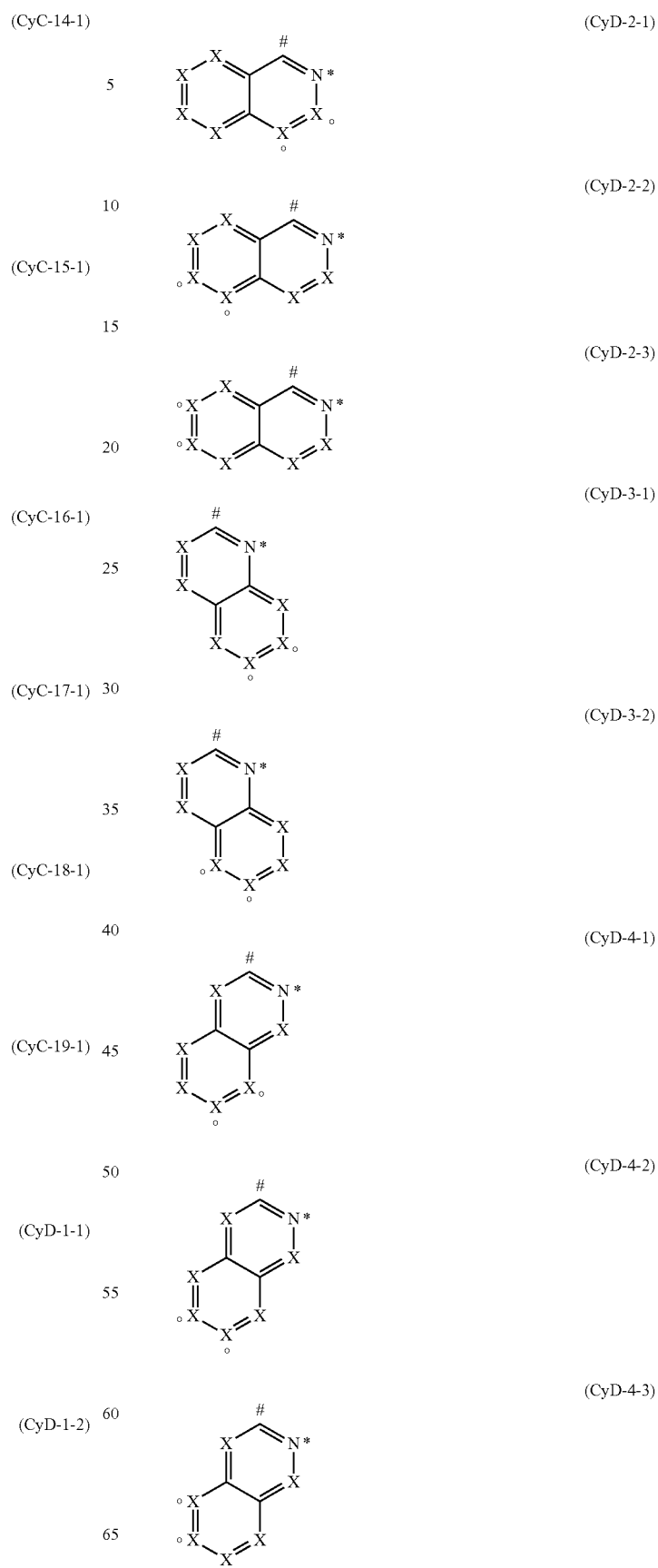

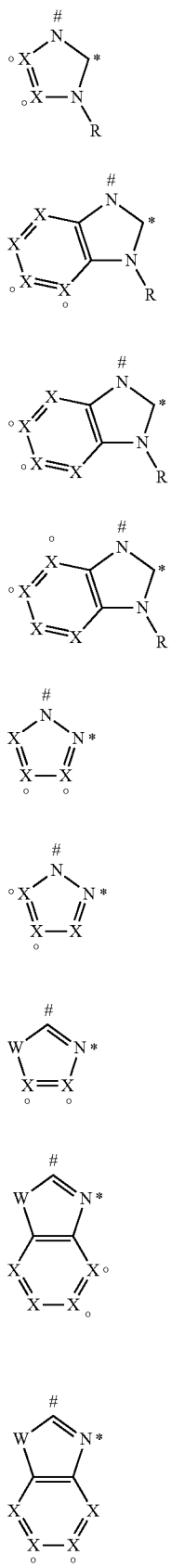
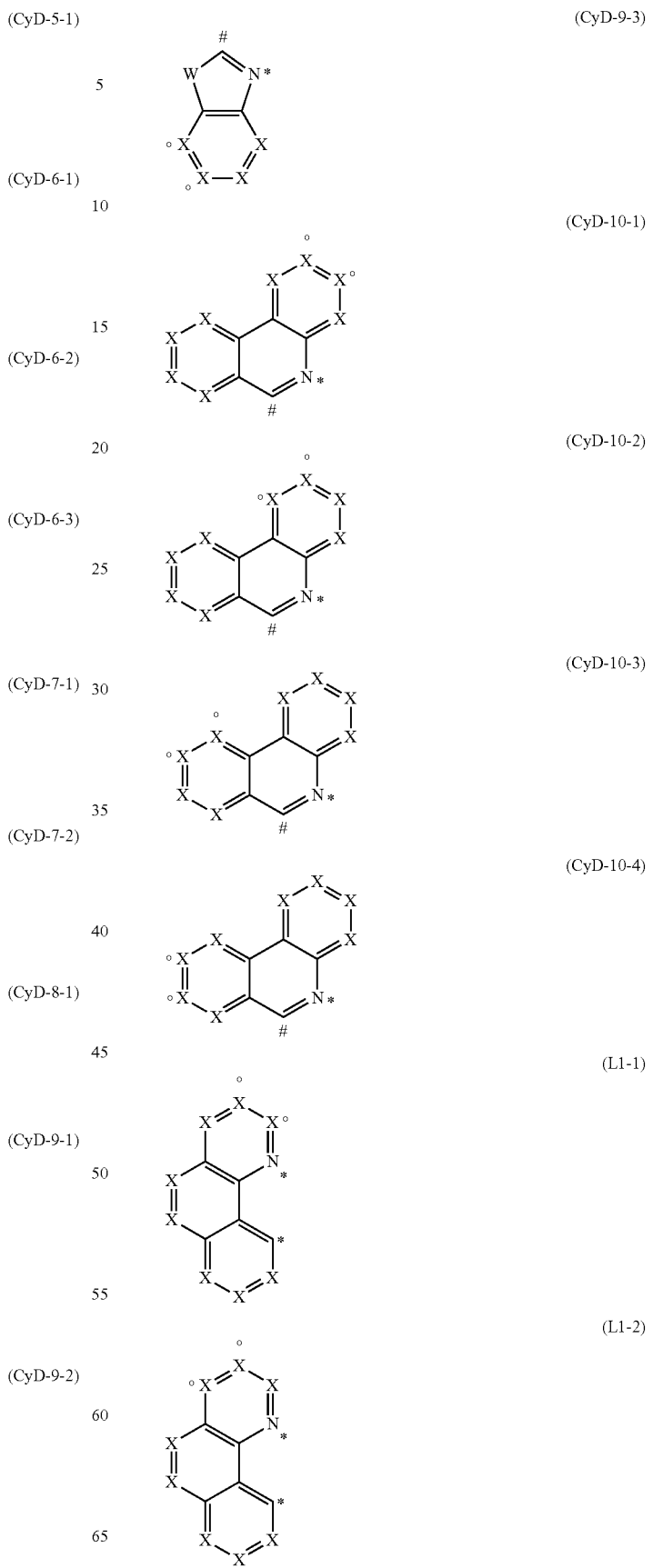

(L1-3) 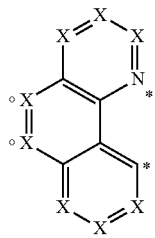

(L1-4) 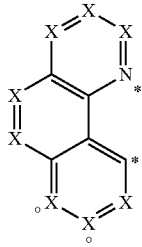

(L1-5) 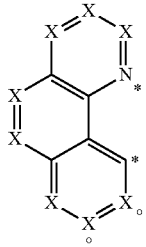

(L2-1) 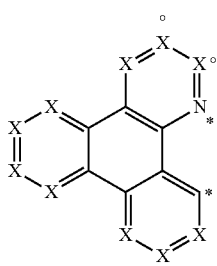

(L2-2) 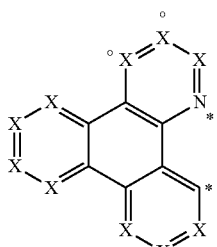

(L2-3) 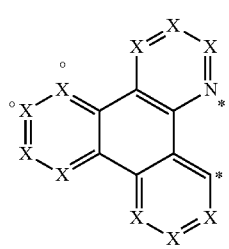

(L2-4) 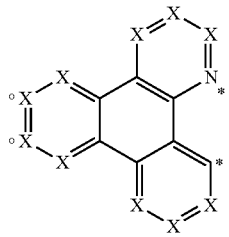

(L2-5) 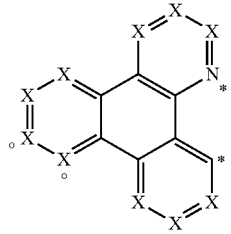

(L2-6) 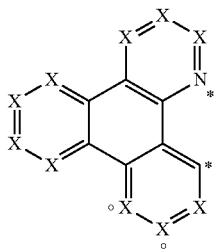

(L2-7) 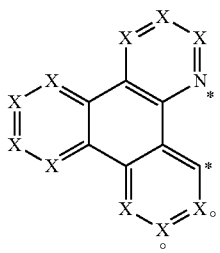

wherein:

X is on each occurrence, identically or differently, CR or N;

W is on each occurrence, identically or differently, NR, O, S, or $C(R)_2$; and in each case denotes the positions which are CR, wherein the respective radicals R, together with the C atoms to which they are bonded, define a structure of formula (3), and wherein the group CyD is in each case bonded to CyC at the position denoted by # and is coordinated to M at the position denoted by *.

8. The compound of claim 1, wherein $A^1$ and $A^2$ in formula (3) are both, identically or differently, $CR^2$ or wherein $A^1$ and $A^2$ are both N.

9. The compound of claim 1, wherein $A^3$ and $A^4$ are, identically or differently on each occurrence, an alkylene group having 2 or 3 carbon atoms, wherein the alkylene group is optionally substituted by one or more radicals $R^3$.

10. The compound of claim 1, wherein $R^2$ and $R^3$ are selected, independently of one another, identically or differently on each occurrence, from the group consisting of H, D, F, a straight-chain alkyl group having 1 to 10 C atoms, which is optionally substituted by one or more radicals $R^4$, a branched or cyclic alkyl group having 3 to 10 C atoms, which is optionally substituted by one or more radicals $R^4$, and an aromatic ring system having 6 to 12 aromatic ring atoms or a heteroaromatic ring system having 5 to 12 aromatic ring atoms, which are each optionally substituted by one or more radicals $R^4$; wherein two radicals $R^3$ optionally define a ring a polycyclic, aliphatic ring system with one another, wherein a radical $R^3$ may be bonded to $A^3$ and a radical $R^3$ may be bonded to $A^4$.

11. The compound of claim 1, wherein the structure of formula (3) is selected from the group consisting of structures of formulae (4), (5), and (6):

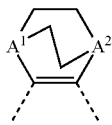
(4)

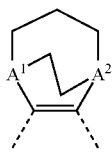
(5)

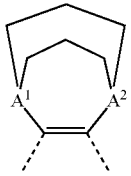
(6)

wherein the ethylene groups or propylene groups are optionally substituted by one or more radicals $R^3$.

12. The compound of claim 1, wherein the structure of formula (3) is selected from the group consisting of structures of formulae (4a), (5a), (6a), (4b), and (6b):

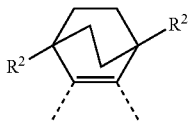
(4a)

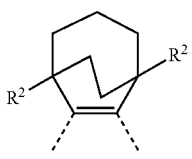
(5a)

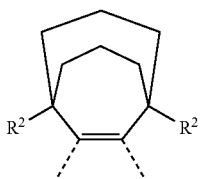
(6a)

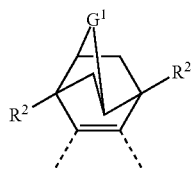
(4b)

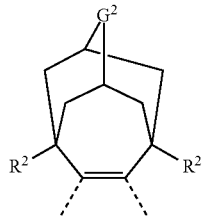
(6b)

wherein
$G^1$ is an ethylene group optionally substituted by one or more groups $R^4$; and
$G^2$ is a single bond, a methylene group, or an ethylene group, wherein the methylene and ethylene group is optionally substituted by one or more groups $R^4$, or an oxygen atom.

13. The compound of claim 1, wherein L' is selected, identically or differently on each occurrence, from the group consisting of carbon monoxide, nitrogen monoxide, alkyl cyanides, aryl cyanides, alkyl isocyanides, aryl isocyanides, amines, phosphines, phosphites, arsines, stibines, nitrogen-containing heterocycles, carbenes, hydride, deuteride, halides, alkylacetylides, arylacetylides, cyanide, cyanate, isocyanate, thio-cyanate, isothiocyanate, aliphatic alcoholates, aromatic alcoholates, aliphatic thioalcoholates, aromatic thioalcoholates, amides, carboxylates, aryl groups, $O^{2-}$, $S^{2-}$, carbides, nitrenes, imines, 1,3-diketonates derived from 1,3-diketones, 3-ketonates derived from 3-ketoesters, salicyliminates, borates of nitrogen-containing heterocycles, and monoanionic ligands which form a cyclometallated five-membered ring or six-membered ring having at least one metal-carbon bond with M.

14. A process for preparing a compound of claim 1 comprising reacting a free ligand L and optionally L' with a metal alkoxide of formula (69), a metal ketoketonate of formula (70), a metal halide of the formula (71), a dimeric metal complex of formula (72), a metal complex of formula (73), or an iridium compound which carries both alkoxide and/or halide and/or hydroxyl and also ketoketonate radicals:

$M(OR)_n$ (69)

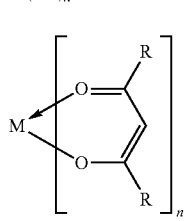
(70)

$MHal_n$ (71)

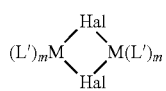
(72)

-continued

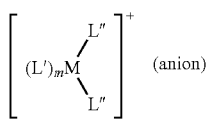
(73)

wherein

Hal is F, Cl, Br or I;

L" is an alcohol or a nitrile; and (Anion) is a non-coordinating anion.

15. An oligomer, polymer, or dendrimer comprising one or more compounds of claim 1, wherein one or more bonds are present from the compound to the polymer, oligomer, or dendrimer.

16. A formulation comprising at least one compound of claim 1 or an oligomer, polymer, or dendrimer comprising one or more of said compounds, wherein one or more bonds are present from the compound to the polymer, oligomer, or dendrimer, and at least one further compound and/or at least one solvent.

17. An electronic device comprising at least one compound of claim 1 or an oligomer, polymer, or dendrimer comprising one or more of said compounds, wherein one or more bonds are present from the compound to the polymer, oligomer, or dendrimer, wherein the electronic device is selected from the group consisting of organic electroluminescent devices, organic integrated circuits, organic field-effect transistors, organic thin-film transistors, organic light-emitting transistors, organic solar cells, organic optical detectors, organic photoreceptors, organic field-quench devices, light-emitting electrochemical cells, and organic laser diodes.

18. The electronic device of claim 17, wherein the electronic device is an organic electroluminescent device and wherein the compound is employed as an emitting compound in one or more emitting layers.

* * * * *